(12) United States Patent
Picard

(10) Patent No.: US 8,848,571 B2
(45) Date of Patent: *Sep. 30, 2014

(54) USE OF MINIMAL PROPAGATION DELAY PATH TO OPTIMIZE A MESH NETWORK

(71) Applicant: Itron, Inc., Liberty Lake, WA (US)

(72) Inventor: Gilles Picard, Thiais (FR)

(73) Assignee: Itron, Inc., Liberty Lake, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/780,001

(22) Filed: Feb. 28, 2013

(65) Prior Publication Data

US 2013/0181848 A1 Jul. 18, 2013

Related U.S. Application Data

(63) Continuation of application No. 12/902,853, filed on Oct. 12, 2010, now Pat. No. 8,391,177, which is a
(Continued)

(51) Int. Cl.
*G08C 19/16* (2006.01)
*H04W 40/00* (2009.01)
(Continued)

(52) U.S. Cl.
CPC ............. *G08C 19/16* (2013.01); *Y04S 20/42* (2013.01); *Y04S 20/322* (2013.01); *Y02B 90/243* (2013.01); *H04W 40/005* (2013.01); *Y04S 20/36* (2013.01); *Y02B 90/246* (2013.01); *G01D 4/004* (2013.01); *H04W 40/10* (2013.01); *G01D 4/006* (2013.01); *H04L 45/127* (2013.01); *H04W 56/00* (2013.01); *Y02B 90/242* (2013.01); *H04B 1/7143* (2013.01); *Y04S 20/325* (2013.01); *H04W 40/248* (2013.01); *H04B 17/0057* (2013.01); *H04W 48/12* (2013.01); *H04W 84/18* (2013.01); *H04W 40/22* (2013.01); *H04W 8/005* (2013.01)

USPC .................................... 370/252; 340/870.03

(58) Field of Classification Search
USPC ..................... 370/252, 238, 229, 230.1, 315; 340/870.01, 870.02, 870.03
See application file for complete search history.

(56) References Cited

U.S. PATENT DOCUMENTS

| 4,799,062 A | 1/1989 | Sanderford, Jr. et al. |
| 4,977,577 A | 12/1990 | Arthur et al. |

(Continued)

FOREIGN PATENT DOCUMENTS

| WO | WO 03/015452 | 2/2003 |
| WO | WO 03/090411 A1 | 10/2003 |

(Continued)

OTHER PUBLICATIONS

Luigi Iannone et al., "Cross-Layer Routing in Wireless Mesh Networks", Université Pierre et Marie Curie (no date available).

(Continued)

*Primary Examiner* — Brian D Nguyen
(74) *Attorney, Agent, or Firm* — Dority & Manning, P.A.

(57) ABSTRACT

The present technology relates to protocols relative to utility meters associated with an open operational framework. More particularly, the present subject matter relates to protocol subject matter for advanced metering infrastructure, adaptable to various international standards, while economically supporting a 2-way mesh network solution in a wireless environment, such as for operating in a residential electricity meter field. The present subject matter supports meters within an ANSI standard C12.22/C12.19 system while economically supporting a 2-way mesh network solution in a wireless environment, such as for operating in a residential electricity meter field, all to permit cell-based adaptive insertion of C12.22 meters within an open framework. Particular present features relate to the use of minimal propagation delay path to optimize a mesh network.

21 Claims, 44 Drawing Sheets

Related U.S. Application Data continuation of application No. 11/900,202, filed on Sep. 10, 2007, now Pat. No. 7,843,834.

(60) Provisional application No. 60/845,056, filed on Sep. 15, 2006, provisional application No. 60/845,994, filed on Sep. 20, 2006.

(51) Int. Cl.

| | |
|---|---|
| *G01D 4/00* | (2006.01) |
| *H04L 12/721* | (2013.01) |
| *H04W 56/00* | (2009.01) |
| *H04B 1/7143* | (2011.01) |
| *H04W 40/24* | (2009.01) |
| *H04B 17/00* | (2006.01) |
| *H04W 40/22* | (2009.01) |
| *H04W 8/00* | (2009.01) |
| *H04W 40/10* | (2009.01) |
| *H04W 48/12* | (2009.01) |
| *H04W 84/18* | (2009.01) |

(56) References Cited

U.S. PATENT DOCUMENTS

| | | |
|---|---|---|
| 4,998,102 A | 3/1991 | Wyler et al. |
| 5,005,142 A | 4/1991 | Lipchak et al. |
| 5,067,136 A | 11/1991 | Arthur et al. |
| 5,095,493 A | 3/1992 | Arthur et al. |
| 5,119,396 A | 6/1992 | Snderford, Jr. |
| 5,166,927 A | 11/1992 | Iida et al. |
| 5,198,796 A | 3/1993 | Hessling, Jr. |
| 5,265,120 A | 11/1993 | Sanderford, Jr. |
| 5,310,075 A | 5/1994 | Wyler |
| 5,311,541 A | 5/1994 | Sanderford, Jr. |
| 5,377,222 A | 12/1994 | Sanderford, Jr. |
| 5,377,232 A | 12/1994 | Davidov et al. |
| 5,457,713 A | 10/1995 | Sanderford, Jr. et al. |
| 5,486,805 A | 1/1996 | Mak |
| 5,509,027 A | 4/1996 | Vook et al. |
| 5,598,427 A | 1/1997 | Arthur et al. |
| 5,604,768 A | 2/1997 | Fulton |
| 5,626,755 A | 5/1997 | Keyser et al. |
| 5,661,750 A | 8/1997 | Fulton |
| 5,668,828 A | 9/1997 | Sanderford, Jr. et al. |
| 5,696,441 A | 12/1997 | Mak et al. |
| RE35,829 E | 6/1998 | Sanderford, Jr. |
| 5,802,311 A | 9/1998 | Wronski |
| 5,907,491 A | 5/1999 | Canada et al. |
| 5,907,559 A | 5/1999 | Shuman et al. |
| 5,920,589 A | 7/1999 | Rouquette et al. |
| 5,926,531 A | 7/1999 | Petite |
| 5,933,072 A | 8/1999 | Kelley |
| 5,953,368 A | 9/1999 | Sanderford et al. |
| 5,987,058 A | 11/1999 | Sanderford et al. |
| 6,028,522 A | 2/2000 | Petite |
| 6,031,883 A | 2/2000 | Sanderford, Jr. et al. |
| 6,044,062 A | 3/2000 | Brownrigg et al. |
| 6,047,016 A | 4/2000 | Ramberg et al. |
| 6,078,251 A | 6/2000 | Landt et al. |
| 6,088,689 A | 7/2000 | Kohn et al. |
| 6,100,816 A | 8/2000 | Moore |
| 6,163,276 A | 12/2000 | Irving et al. |
| 6,178,197 B1 | 1/2001 | Froelich et al. |
| 6,181,258 B1 | 1/2001 | Summers et al. |
| 6,195,018 B1 | 2/2001 | Ragle et al. |
| 6,204,808 B1 | 3/2001 | Bloebaum et al. |
| 6,218,953 B1 | 4/2001 | Petite |
| 6,232,885 B1 | 5/2001 | Ridenour et al. |
| 6,233,327 B1 | 5/2001 | Petite |
| 6,246,677 B1 | 6/2001 | Nap et al. |
| 6,249,516 B1 | 6/2001 | Brownrigg et al. |
| 6,263,009 B1 | 7/2001 | Ramberg et al. |
| 6,321,271 B1 | 11/2001 | Kodialam et al. |
| 6,335,953 B1 | 1/2002 | Sanderford, Jr. et al. |
| 6,349,094 B1 | 2/2002 | Vastano et al. |
| 6,363,057 B1 | 3/2002 | Ardalan et al. |
| 6,369,769 B1 | 4/2002 | Nap et al. |
| 6,377,609 B1 | 4/2002 | Brennan, Jr. |
| 6,396,839 B1 | 5/2002 | Ardalan et al. |
| 6,424,270 B1 | 7/2002 | Ali |
| 6,426,027 B1 | 7/2002 | Scarborough, III et al. |
| 6,430,268 B1 | 8/2002 | Petite |
| 6,437,692 B1 | 8/2002 | Petite et al. |
| 6,452,986 B1 | 9/2002 | Luxford et al. |
| 6,456,644 B1 | 9/2002 | Ramberg et al. |
| 6,538,577 B1 | 3/2003 | Ehrke et al. |
| 6,604,434 B1 | 8/2003 | Hamilton et al. |
| 6,612,188 B2 | 9/2003 | Hamilton |
| 6,617,879 B1 | 9/2003 | Chung |
| 6,617,976 B2 | 9/2003 | Walden et al. |
| 6,617,978 B2 | 9/2003 | Ridenour et al. |
| 6,618,578 B1 | 9/2003 | Petite |
| 6,626,048 B1 | 9/2003 | Dam Es et al. |
| 6,628,764 B1 | 9/2003 | Petite |
| 6,639,939 B1 | 10/2003 | Naden et al. |
| 6,650,249 B2 | 11/2003 | Meyer et al. |
| 6,657,552 B2 | 12/2003 | Belski et al. |
| 6,671,586 B2 | 12/2003 | David et al. |
| 6,700,902 B1 | 3/2004 | Meyer |
| 6,704,301 B2 | 3/2004 | Chari et al. |
| 6,734,663 B2 | 5/2004 | Fye et al. |
| 6,735,178 B1 | 5/2004 | Srivastava et al. |
| 6,747,557 B1 | 6/2004 | Petite et al. |
| 6,747,981 B2 | 6/2004 | Ardalan et al. |
| 6,763,013 B2 | 7/2004 | Kennedy |
| 6,778,099 B1 | 8/2004 | Meyer et al. |
| 6,784,806 B1 | 8/2004 | Lee et al. |
| 6,784,807 B2 | 8/2004 | Petite et al. |
| 6,816,538 B2 | 11/2004 | Shuey et al. |
| 6,836,108 B1 | 12/2004 | Balko et al. |
| 6,836,737 B2 | 12/2004 | Petite et al. |
| 6,842,460 B1 | 1/2005 | Olkkonen et al. |
| 6,850,197 B2 | 2/2005 | Paun |
| 6,859,186 B2 | 2/2005 | Lizalek et al. |
| 6,862,498 B2 | 3/2005 | David et al. |
| 6,867,707 B1 | 3/2005 | Kelley et al. |
| 6,885,309 B1 | 4/2005 | Van Heteren |
| 6,891,838 B1 | 5/2005 | Petite et al. |
| 6,894,975 B1 | 5/2005 | Partyka |
| 6,900,737 B1 | 5/2005 | Ardalan et al. |
| 6,914,533 B2 | 7/2005 | Petite |
| 6,914,893 B2 | 7/2005 | Petite |
| 6,918,311 B2 | 7/2005 | Nathan |
| 6,928,263 B2 | 8/2005 | Blake et al. |
| 6,931,445 B2 | 8/2005 | Davis |
| 6,940,396 B2 | 9/2005 | Hammond et al. |
| 6,965,575 B2 | 11/2005 | Srikrishna et al. |
| 6,972,555 B2 | 12/2005 | Balko et al. |
| 6,982,651 B2 | 1/2006 | Fischer |
| 7,012,546 B1 | 3/2006 | Zigdon et al. |
| 7,020,701 B1 | 3/2006 | Gelvin et al. |
| 7,031,945 B1 | 4/2006 | Donner |
| 7,046,682 B2 | 5/2006 | Carpenter et al. |
| 7,054,271 B2 | 5/2006 | Brownrigg et al. |
| 7,062,227 B2 | 6/2006 | Chevalier et al. |
| 7,065,045 B2 | 6/2006 | Jefferies et al. |
| 7,103,511 B2 | 9/2006 | Petite |
| 7,126,494 B2 | 10/2006 | Ardalan et al. |
| 7,142,123 B1 | 11/2006 | Kates |
| 7,234,000 B2 | 6/2007 | McEachern et al. |
| 7,498,953 B2 | 3/2009 | Salser et al. |
| 7,583,202 B2 | 9/2009 | Robinson et al. |
| 7,653,394 B2 | 1/2010 | McMillin |
| 7,676,195 B2 | 3/2010 | Ratiu et al. |
| 7,802,015 B2 | 9/2010 | Cheifot et al. |
| 7,840,178 B2 | 11/2010 | Hellman |
| 7,843,834 B2 | 11/2010 | Picard |
| 2001/0046225 A1 | 11/2001 | Schwaller et al. |
| 2002/0010641 A1 | 1/2002 | Stevens et al. |
| 2002/0019725 A1 | 2/2002 | Petite |
| 2002/0037716 A1 | 3/2002 | McKenna et al. |
| 2002/0146985 A1 | 10/2002 | Naden |
| 2002/0159385 A1 | 10/2002 | Susnow et al. |

(56) References Cited

U.S. PATENT DOCUMENTS

| | | |
|---|---|---|
| 2002/0169643 A1 | 11/2002 | Petite et al. |
| 2002/0186749 A1 | 12/2002 | Jones |
| 2003/0033394 A1 | 2/2003 | Stine |
| 2003/0037167 A1 | 2/2003 | Garcia-Luna-Aceves et al. |
| 2003/0048199 A1 | 3/2003 | Zigdon et al. |
| 2003/0063723 A1 | 4/2003 | Booth et al. |
| 2003/0078029 A1 | 4/2003 | Petite |
| 2003/0093484 A1 | 5/2003 | Petite |
| 2003/0103486 A1 | 6/2003 | Salt et al. |
| 2003/0179149 A1 | 9/2003 | Savage et al. |
| 2004/0004555 A1 | 1/2004 | Martin |
| 2004/0008663 A1 | 1/2004 | Srikrishna et al. |
| 2004/0040368 A1 | 3/2004 | Guckenberger et al. |
| 2004/0053639 A1 | 3/2004 | Petite et al. |
| 2004/0061623 A1 | 4/2004 | Tootoonian Mashhad et al. |
| 2004/0062224 A1 | 4/2004 | Brownrigg et al. |
| 2004/0085928 A1 | 5/2004 | Chari et al. |
| 2004/0088083 A1 | 5/2004 | Davis et al. |
| 2004/0131125 A1 | 7/2004 | Sanderford, Jr. et al. |
| 2004/0170217 A1 | 9/2004 | Ho |
| 2004/0183687 A1 | 9/2004 | Petite et al. |
| 2004/0192415 A1 | 9/2004 | Luglio et al. |
| 2004/0193998 A1 | 9/2004 | Blackburn et al. |
| 2004/0215412 A1 | 10/2004 | Yoshida et al. |
| 2004/0218616 A1 | 11/2004 | Ardalan et al. |
| 2004/0246907 A1* | 12/2004 | Hoffmann ............... 370/252 |
| 2004/0252701 A1 | 12/2004 | Anandakumar et al. |
| 2004/0264379 A1 | 12/2004 | Srikrishna et al. |
| 2004/0264435 A1 | 12/2004 | Chari et al. |
| 2005/0018751 A1 | 1/2005 | Roy et al. |
| 2005/0024235 A1 | 2/2005 | Shuey et al. |
| 2005/0030199 A1 | 2/2005 | Petite et al. |
| 2005/0036487 A1 | 2/2005 | Srikrishna |
| 2005/0043059 A1 | 2/2005 | Petite et al. |
| 2005/0043860 A1 | 2/2005 | Petite |
| 2005/0052290 A1 | 3/2005 | Naden et al. |
| 2005/0052328 A1 | 3/2005 | De Angelis |
| 2005/0053047 A1 | 3/2005 | Osterloh et al. |
| 2005/0068970 A1 | 3/2005 | Srikrishna et al. |
| 2005/0074015 A1 | 4/2005 | Chari et al. |
| 2005/0105524 A1 | 5/2005 | Stevens et al. |
| 2005/0129005 A1 | 6/2005 | Srikrishna et al. |
| 2005/0147097 A1 | 7/2005 | Chari et al. |
| 2005/0163144 A1 | 7/2005 | Srikrishna et al. |
| 2005/0169020 A1 | 8/2005 | Knill |
| 2005/0171696 A1 | 8/2005 | Naden et al. |
| 2005/0172024 A1 | 8/2005 | Cheifot et al. |
| 2005/0190055 A1 | 9/2005 | Petite |
| 2005/0195768 A1 | 9/2005 | Petite et al. |
| 2005/0195775 A1 | 9/2005 | Petite et al. |
| 2005/0201397 A1 | 9/2005 | Petite |
| 2005/0218873 A1 | 10/2005 | Shuey et al. |
| 2005/0226179 A1 | 10/2005 | Behroozi |
| 2005/0227615 A1 | 10/2005 | Sakoda |
| 2005/0243867 A1 | 11/2005 | Petite |
| 2005/0251401 A1 | 11/2005 | Shuey |
| 2005/0251403 A1 | 11/2005 | Shuey |
| 2005/0270173 A1 | 12/2005 | Boaz |
| 2005/0271006 A1 | 12/2005 | Chari et al. |
| 2005/0278440 A1 | 12/2005 | Scoggins |
| 2006/0002350 A1 | 1/2006 | Behroozi |
| 2006/0007863 A1* | 1/2006 | Naghian ............... 370/238 |
| 2006/0012935 A1 | 1/2006 | Murphy |
| 2006/0018303 A1 | 1/2006 | Sugiarto et al. |
| 2006/0038548 A1 | 2/2006 | Shuey |
| 2006/0039280 A1 | 2/2006 | Anandakumar et al. |
| 2006/0039450 A1 | 2/2006 | Fulton et al. |
| 2006/0043961 A1 | 3/2006 | Loy |
| 2006/0071810 A1 | 4/2006 | Scoggins et al. |
| 2006/0071812 A1* | 4/2006 | Mason et al. ............ 340/870.02 |
| 2006/0195610 A1 | 8/2006 | Cole et al. |
| 2006/0203105 A1* | 9/2006 | Srinivasan ............... 348/231.4 |
| 2006/0205358 A1 | 9/2006 | Itoh et al. |
| 2006/0217936 A1 | 9/2006 | Mason et al. |
| 2006/0246913 A1 | 11/2006 | Merboth et al. |
| 2006/0253700 A1* | 11/2006 | Della-Libera et al. ........ 713/151 |
| 2007/0028122 A1 | 2/2007 | Chuang |
| 2007/0050523 A1 | 3/2007 | Emeott et al. |
| 2007/0067121 A1* | 3/2007 | Przydatek et al. ............ 702/57 |
| 2007/0073866 A1 | 3/2007 | Rudran et al. |
| 2007/0076649 A1 | 4/2007 | Lin et al. |
| 2007/0121521 A1 | 5/2007 | D'Amico et al. |
| 2007/0176789 A1 | 8/2007 | Kim |
| 2007/0229256 A1 | 10/2007 | Seal et al. |
| 2007/0236362 A1 | 10/2007 | Brian et al. |
| 2008/0068212 A1 | 3/2008 | Tay et al. |
| 2008/0095075 A1 | 4/2008 | Monier |
| 2008/0250154 A1 | 10/2008 | Sun et al. |
| 2009/0016293 A1 | 1/2009 | Kang et al. |
| 2009/0146839 A1 | 6/2009 | Reddy et al. |
| 2010/0164719 A1 | 7/2010 | George et al. |

FOREIGN PATENT DOCUMENTS

| | | |
|---|---|---|
| WO | WO 2006/083696 A2 | 8/2006 |
| WO | WO 2006/096854 A2 | 9/2006 |

OTHER PUBLICATIONS

A. Ebenezer Jeyakumar et al., "Genetic Algorithm for Optimal Design of Delay Bounded WDM Multicast Networks", Government College of Technology (no date available).

Tanenbaum, A.S., "Computer Networks, Shortest Path Routing, Multipath Routing" Section 5.2 (Routing Algorithms), pp. 289-307, Jan. 1, 1988, *Computer Networks*, Prentice Hall, Englewood Cliffs, NJ.

Hui Zang et al., "Dynamic Lightpath Establishment in Wavelength-Routed WDM Networks", *IEEE Communications*, Sep. 2001.

Younis, M. et al., "Energy-Aware Routing in Cluster-Based Sensor Networks", Oct. 11, 2002, Proceedings of the 10th IEEE International Symposium on Modeling, Analysis & Simulation of Computer & Telecommunications Systems (MASCOTS'02), Piscataway, New Jersey.

Mario Catalani, "Polymatrix and Generalized Polynacci Numbers", Department of Economics, University of Torino, Torino, Italy, Oct. 14, 2002.

UlaUlaş C. Kozat et al, "Network Layer Support for Service Discovery in Mobile Ad Hoc Networks", INFOCOM 2003, Twenty-Second Annual Joint Conference of the IEE Computer and Communications, IEEE Societies, Mar. 30-Apr. 3, 2003.

Marco Conti et al., "MobileMAN Architecture, Protocols and Services", Mobile Metropolitan Ad hoc Networks, Sep. 2003.

Yu, Gwo-Jong et al., "A Minimum Delay Routing Protocol for Bluetooth Radio Networks", presented at the Aletheia International Symposium of Mathematical Sciences, Aletheia University, Taiwan, pp. 291-314, Tamsui Oxford Journal of Mathematical Sciences, vol. 20, No. 2, 2004.

"Technical Overview of Time Synchronized Mesh Protocol (TSMP)", Dust Networks, Document No. 025-0003-01, Jun. 20, 2006.

International Search Report and Written Opinion of the ISA for PCT International Application No. PCT/US07/20022 issued Jun. 26, 2008.

European Search Report for European Application No. EP 09 15 6694 dated Apr. 22, 2010.

Extended European Search Report dated Sep. 7, 2010 for EP Application No. 09156691.9 (search completed Aug. 24, 2010).

Chia-Bin Jerry Hsiung, "Optimal Topology Discovery for Automatic Meter Reading Using Power Line Carrier", University of Auckland, Auckland, New Zealand (date of publication unavailable).

Sudha Krishnamurthy et al., "RESTORE: A Real-Time Event Correlation and Storage Service for Sensor Networks" (date of publication unavailable).

U.S. Appl. No. 13/295,435 Aug. 1, 2013 Office Action.

Feb. 18, 2014 Office Action issued in EP Patent Application No. 09 156 691.9.

Jan. 2, 2014 Office Action issued for U.S. Appl. No. 13/833,252.

Apr. 30, 2014 Office Action issued in U.S. Appl. No. 13/295,435.

Jun. 17, 2014 Office Action issued in U.S. Appl. No. 13/088,702.

* cited by examiner

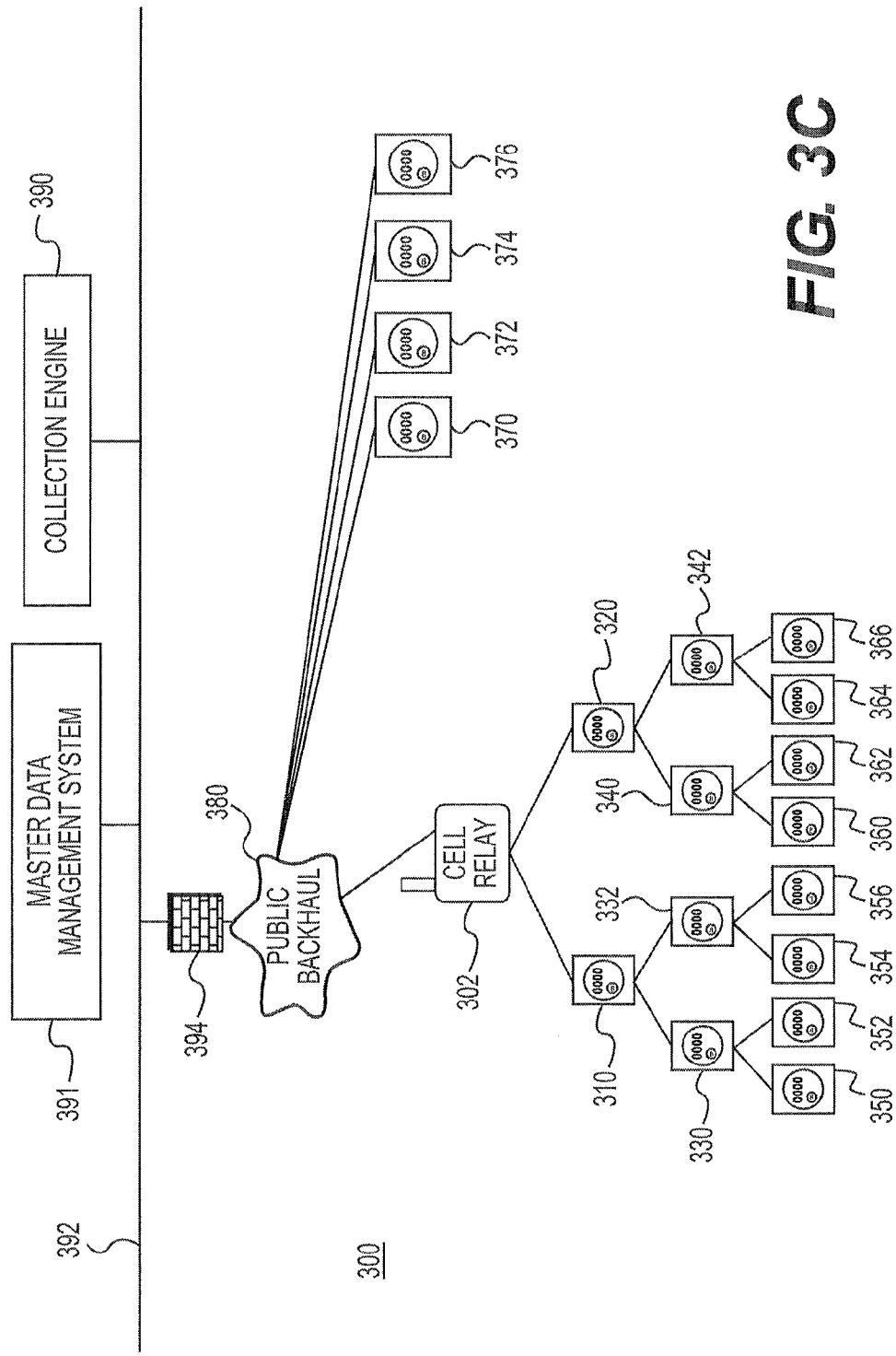

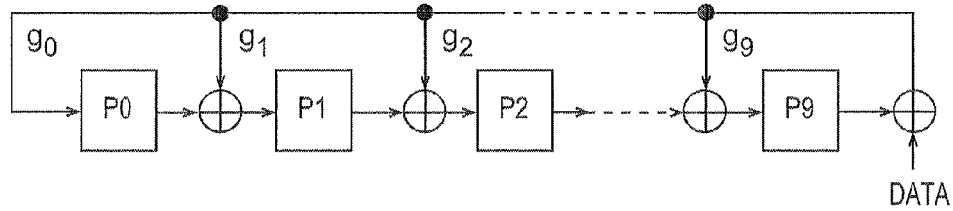
FIG. 8
| PREAMBLE | | PHY HEADER | | | | | | FRAME BODY |
|---|---|---|---|---|---|---|---|---|
| SYNCH | SFD | UID | RSD | LENGTH | UID C | RSD C | LENGTH C | MPDU+FEC |
| 4 B | 2 B | 4 b | 2 b | 10 b | 4 b | 2 b | 10 b | VARIABLE |
FIG. 9
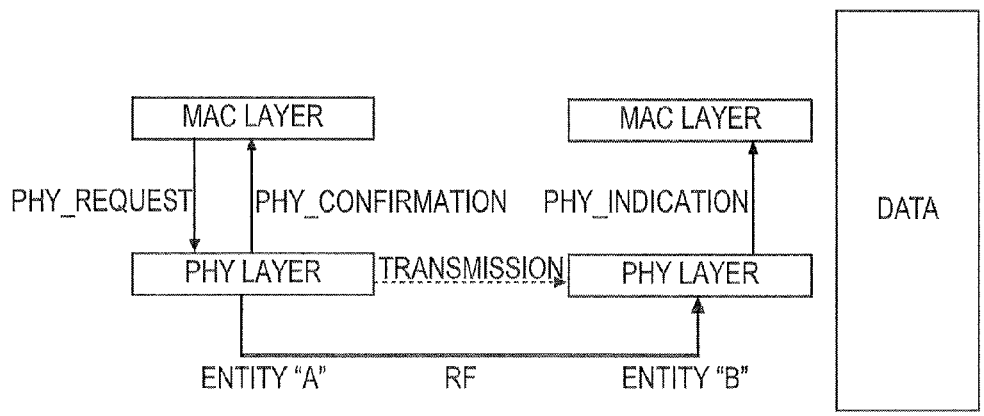
FIG. 10

| BASIC HOPPING SEQUENCE NUMBER | PRIMITIVE ELEMENT |
|---|---|
| 0 | 2 |
| 1 | 3 |
| 2 | 5 |
| 3 | 8 |
| 4 | 12 |
| 5 | 14 |
| 6 | 18 |
| 7 | 19 |
| 8 | 20 |
| 9 | 21 |
| 11 | 22 |
| 11 | 26 |
| 12 | 27 |
| 13 | 31 |
| 14 | 32 |
| 15 | 33 |

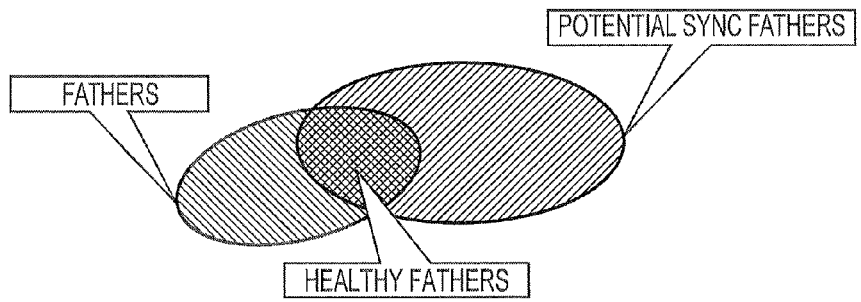

FIG. 21A

| VALUE (HEX) | CONNECTIVITY DEGREE | NUMBER OF POTENTIAL SYNC FATHERS SYNCHRONIZED MODE | NUMBER OF POTENTIAL SYNC FATHERS NON SYNCHRONIZED MODE |
|---|---|---|---|
| 00 | NONE | 0 | 0 |
| 01 | WEAK | 1 FATHER, 0 BROTHER | 1 NEIGHBOR |
| 10 | GOOD | X FATHERS $1 \leq X < MAC\_EXCELLENT\_CONNECTIVITY\_THRESHOLD$ IF X=1, AT LEAST 1 BROTHER | $2 \leq X < MAC\_EXCELLENT\_CONNECTIVITY\_THRESHOLD$ NEIGHBORS |
| 11 | EXCELLENT | X FATHERS $X \geq MAC\_EXCELLENT\_CONNECTIVITY\_THRESHOLD$ | $X \geq MAC\_EXCELLENT\_CONNECTIVITY\_THRESHOLD$ NEIGHBORS |

FIG. 21B

|  | NEIGHBOR 1 | NEIGHBOR 2 | NEIGHBOR 3 |
|---|---|---|---|
| EP_GPD | 1000 | 1200 | 1100 |
| LVL | 8 | 6 | 4 |
| CSI | 0 | 0 | 0 |
| SYNC_DISC_MERIT | 1400 | 1500 | 1300 |

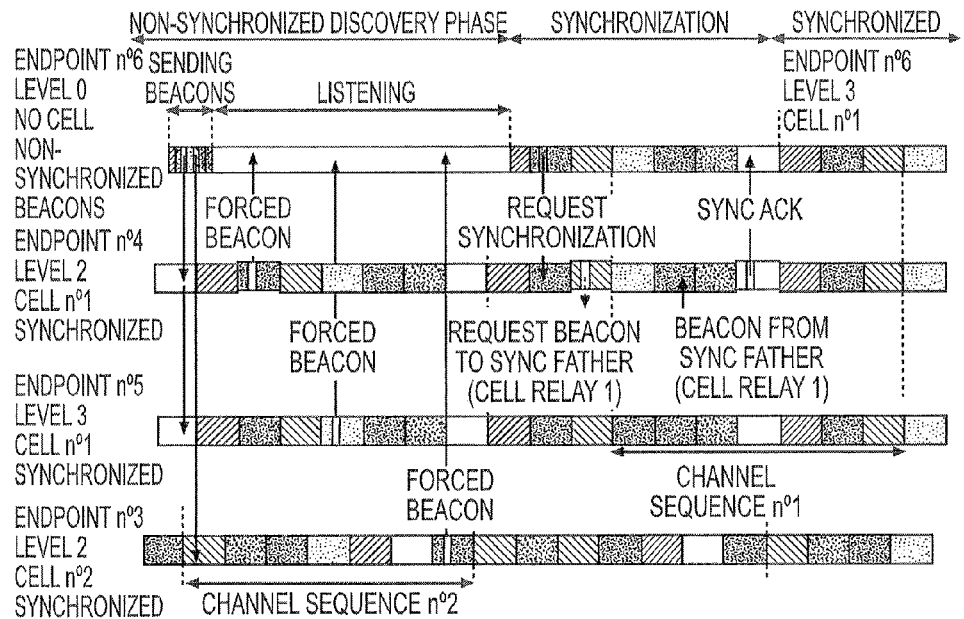
FIG. 25
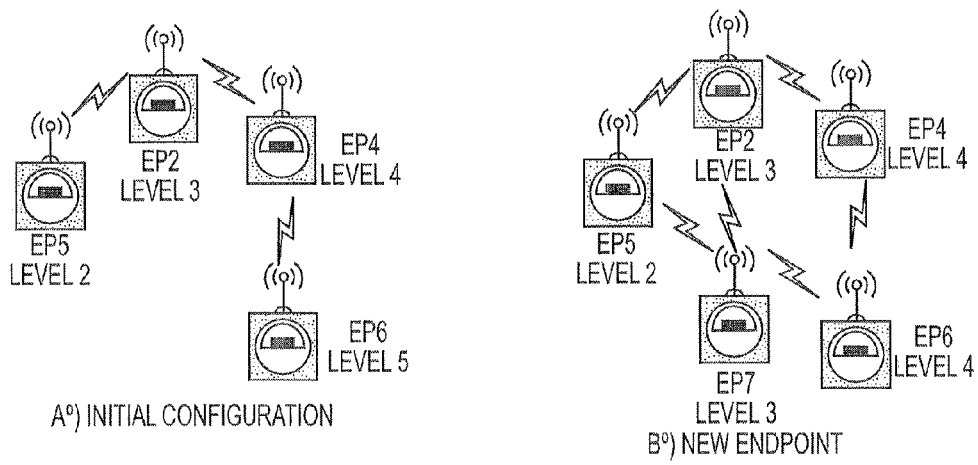
FIG. 26A   FIG. 26B

| MESSAGE TYPE | COMMENTS |
|---|---|
| ACKNOWLEDGMENTS | THIS INCLUDES THE (N)ACK AND SYNC (N)NACK |
| SYNC RQST | USED WHEN NOT SYNCHRONIZED OR WHEN CHANGING LEVEL OR CELL. IF AN EP IS NOT SYNCHRONIZED (LEVEL 0) THEN IT SHOULD REFUSE ANY MESSAGE OR SYNCHRONIZATION REQUEST (SEND A NON-ACKNOWLEDGEMENT) |
| RQST BEACON | USED TO VERIFY THAT A FATHER IS STILL PRESENT |
| DATA (LPDU) | THIS INCLUDES ALL PACKETS COMING THROUGH THE LLC LAYER: API DATA, NEIGHBORS' LIST, POWER OUTAGE NOTIFICATION (OF ANOTHER EP)... |
| BEACONS | THIS INCLUDES UNFORCED BEACON USED TO GIVE SYNCHRONIZATION INFORMATION WHEN NO OTHER MESSAGE IS SCHEDULED AND FORCED BEACONS USED IN RESPONSE TO A DISCOVERY BEACON |

*FIG. 32*

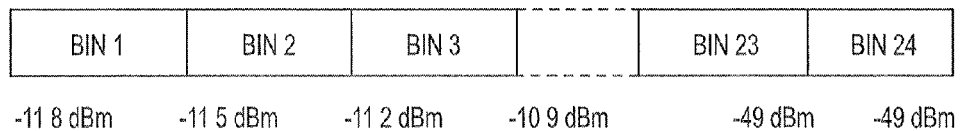

*FIG. 33*

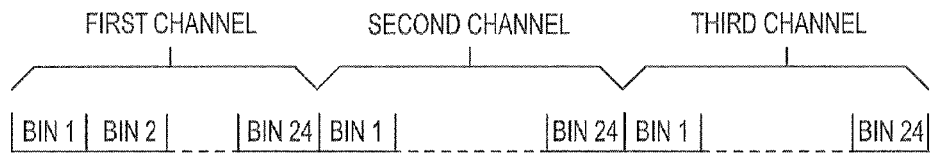

MAC HEADER COMMON SECTION

| LV | FT | SA | RS | RSD | CD | CS | RSD | LVL | RSD | GPD | RSD | SACT | TSN | CELL | FID | OID | DA |
|----|----|----|----|-----|----|----|----|-----|----|-----|----|------|-----|------|-----|-----|-----|
| 4b | 4b | 4B | 1b | 1b | 2b | 4b | 2b | 6b | 4b | 12b | 4b | 12b | 2B | 2B | 1B | 1B | 4B |

MAC HEADER DYNAMIC SECTION

FRAME BODY

| LPDU |
|------|
| VARIABLE |

MAC HEADER DYNAMIC SECTION

| HFN | RITP | RXC | NDB |
|-----|------|-----|-----|
| 1B | 4B | 1B | 1B |

FCS

| CRC |
|-----|
| 4B |

FIG. 36

| VALUE | FRAME TYPE |
|-------|------------|
| 0000 | OUTAGE |
| 0001 | ACK |
| 0010 | NACK |
| 0011 | SYNC ACK |
| 0100 | SYNC NACK |
| 0101 | SYNC REQUEST |
| 0110 | REQUEST BEACON |
| 0111 | RESERVED |

| VALUE | FRAME TYPE |
|-------|------------|
| 1000 | RESERVED |
| 1001 | BROADCAST DATA |
| 1010 | ITP |
| 1011 | MONOCAST DATA |
| 1100 | BEACON |
| 1101 | DISCOVERY BEACON |
| 1110 | RESERVED |
| 1111 | RESERVED |

| LV | FT | SA | RS | RSD | CD | CSI | RSD | LVL | RSD | GPD | RSD | SACT | TSN | CELL | CRC |
|---|---|---|---|---|---|---|---|---|---|---|---|---|---|---|---|
| 4b | 4b | 4B | 1b | 1b | 2b | 4b | 2b | 6b | 4b | 12b | 4b | 12b | 2B | 2B | 4B |

FIG. 37

| LV | FT | SA | RS | RSD | CD | CSI | RSD | LVL | RSD | GPD | RSD | SACT | TSN | CELL | FID | DA | CRC |
|---|---|---|---|---|---|---|---|---|---|---|---|---|---|---|---|---|---|
| 4b | 4b | 4B | 1b | 1b | 2b | 4b | 2b | 6b | 4b | 12b | 4b | 12b | 2B | 2B | 1B | 4B | 4B |

FIG. 38

| LV | FT | SA | RS | RSD | CD | CSI | RSD | LVL | RSD | GPD | RSD | SACT | TSN | CELL | FID | DA | CRC |
|---|---|---|---|---|---|---|---|---|---|---|---|---|---|---|---|---|---|
| 4b | 4b | 4B | 1b | 1b | 2b | 4b | 2b | 6b | 4b | 12b | 4b | 12b | 2B | 2B | 1B | 4B | 4B |

FIG. 39

| LV | FT | SA | RS | RSD | CD | CSI | RSD | LVL | RSD | GPD | RSD | SACT | TSN | CELL | FID | HFN | RITP | DA | CRC |
|---|---|---|---|---|---|---|---|---|---|---|---|---|---|---|---|---|---|---|---|
| 4b | 4b | 4B | 1b | 1b | 2b | 4b | 2b | 6b | 4b | 12b | 4b | 12b | 2B | 2B | 1B | 4B | 4B | 4B | 4B |

FIG. 40

| LV | FT | SA | RS | RSD | CD | CSI | RSD | LVL | RSD | GPD | RSD | SACT | TSN | CELL | DA | CRC |
|---|---|---|---|---|---|---|---|---|---|---|---|---|---|---|---|---|
| 4b | 4b | 4B | 1b | 1b | 2b | 4b | 2b | 6b | 4b | 12b | 4b | 12b | 2B | 2B | 4B | 4B |

FIG. 41

| LV | FT | SA | RS | RSD | CD | CSI | RSD | LVL | RSD | GPD | RSD | SACT | TSN | CELL | FID | DA | LPDU | CRC |
|---|---|---|---|---|---|---|---|---|---|---|---|---|---|---|---|---|---|---|
| 4b | 4b | 4B | 1b | 1b | 2b | 4b | 2b | 6b | 4b | 12b | 4b | 12b | 2B | 2B | 1B | 4B | VARIABLE | 4B |

*FIG. 42*

| LV | FT | SA | RS | RSD | CD | CSI | RSD | LVL | RSD | GPD | RSD | SACT | TSN | CELL | LPDU | CRC |
|---|---|---|---|---|---|---|---|---|---|---|---|---|---|---|---|---|
| 4b | 4b | 4B | 1b | 1b | 2b | 4b | 2b | 6b | 4b | 12b | 4b | 12b | 2B | 2B | VARIABLE | 4B |

*FIG. 43*

| LV | FT | SA | RS | RSD | CD | CSI | RSD | LVL | RSD | GPD | RSD | SACT | TSN | CELL | HFN | RITP | CRC |
|---|---|---|---|---|---|---|---|---|---|---|---|---|---|---|---|---|---|
| 4b | 4b | 4B | 1b | 1b | 2b | 4b | 2b | 6b | 4b | 12b | 4b | 12b | 2B | 2B | 1B | 4B | 4B |

*FIG. 44*

| LV | FT | SA | RxC | NDB | CELL | CRC |
|---|---|---|---|---|---|---|
| 4b | 4b | 4B | 1B | 1B | 2B | 4B |

*FIG. 45*

| LV | FT | SA | OID | CRC |
|---|---|---|---|---|
| 4b | 4b | 4B | 1B | 4B |

*FIG. 46*

| LLC PARAMETER | DEFAULT VALUE | UNIT |
|---|---|---|
| DUPLICATION_TABLE_SIZE | 10 | MESSAGES |
| MAX_MESSAGE_LENGTH | 352 | BYTES |
| MAX_NB_OF_PACKETS | 2 | MESSAGES |
| MAX_NB_OF_DOWNLINK_TRANSMISSIONS | 30 | ATTEMPTS |
| MAX_NB_OF_UPLINK_TRANSMISSIONS | 15 | ATTEMPTS |
| MAX_PACKET_LENGTH | 176 | BYTES |
| MESSAGE_TIMEOUT | TBD | TBD |
| NUMBER_OF_BROADCAST_TRANSMISSIONS | 5 | ATTEMPTS |
| TX_RETRY_EXP_OFFSET | 2 | |
| TX_RETRY_EXP_RANGE | 5 | ATTEMPTS |
| TX_RETRY_EXP_START | 5 | ATTEMPTS |

*FIG. 49*

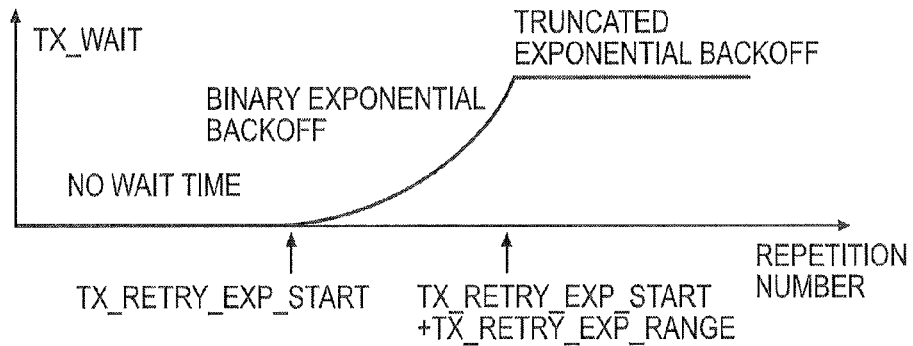
FIG. 50
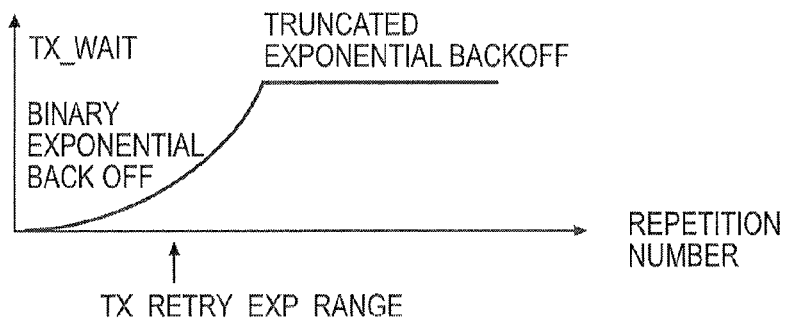
FIG. 51
| MESSAGE NUMBER (LLC FID) | PACKET NUMBER | SENDER ADDRESS |
|---|---|---|
| 105 | 0 | 10 |
| 99 | 2 | 11 |
| 99 | 1 | 11 |
| 99 | 0 | 11 |
FIG. 52
| LLC HEADER | | | | | FRAME BODY |
|---|---|---|---|---|---|
| LV | RSD | FID | NOP | PN | NETPDU |
| 4 b | 4 b | 1 B | 4 b | 4 b | VARIABLE |
FIG. 53

| NET PARAMETER | DEFAULT VALUE | UNIT |
|---|---|---|
| BROADCAST LIFE EXPECTANCY | 2 | HYPERFRAMES |
| CR DUPLICATION TABLE SIZE | 500 | SAVED ENTRIES |
| DOWNLINK LIFE EXPECTANCY | 29 | HYPERFRAMES |
| ENDPOINT TIMEOUT | 24 | HOURS |
| EP DUPLICATION TABLE SIZE | 30 | SAVED ENTRIES |
| MAX Nb OF Eps | 1000 | ENDPOINTS |
| MAX REGISTRATION ATTEMPTS | 5 | - |
| Nb OF FATHERS ROUTING | 4 | FATHERS |
| Nb OF ENDPOINTS NEIGHBOR LIST | 3 | ENDPOINTS |
| NEIGHBOR LIST FIRST TIME | 5 | MINUTES |
| NEIGHBOR LIST MAX PERIOD | 12 | HOURS |
| NEIGHBOR LIST MIN PERIOD | 1 | HOURS |
| REG CONFIG SEND PERIOD | 3 | SECONDS |
| REGISTRATION RETRY | 1 | HOUR |
| REGISTRATION_SEND_MAX | 10 | MINUTES |
| REGISTRATION_SEND_MIN | 5 | MINUTES |
| UPLINK_LIFE_EXPECTANCY | 29 | HYPERFRAMES |

*FIG. 55*

| MESSAGE NUMBER (NET FID) | SENDER ADDRESS |
|---|---|
| 105 | 0 |
| 99 | 11 |
| 96 | 11 |
| 99 | 12 |

| ENDPOINT ADDRESS | 1ST NEIGHBOR ADDRESS | 2ND NEIGHBOR ADDRESS | 3RD NEIGHBOR ADDRESS |
|---|---|---|---|
| CM | | | |
| | CM | 3 | |
| 3 | CM | 2 | |
| 4 | 3 | 5 | |
| 5 | 3 | 2 | 4 |
| 6 | 2 | 7 | |
| 7 | | 5 | 6 |
| 8 | 7 | 5 | 4 |
| 9 | 6 | 7 | |
| 10 | 8 | 11 | |
| 11 | 4 | 5 | 8 |

FIG. 57B

| CELL SIZE | CSI | CELL SIZE | CSI | CELL SIZE | CSI |
|---|---|---|---|---|---|
| 0% - 10% | 0 | 55% - 60% | 6 | 85% - 90% | 12 |
| 10% - 20% | 1 | 60% - 65% | 7 | 90% - 95% | 13 |
| 20% - 30% | 2 | 65% - 70% | 8 | 95% - 99.9% | 14 |
| 30% - 40% | 3 | 70% - 75% | 9 | MAX_NB_OF_EPS | 15 |
| 40% - 50% | 4 | 75% - 80% | 10 | - | - |
| 50% - 55% | 5 | 80% - 85% | 11 | - | - |

FIG. 57C

| THE CELL MASTER RECEIVES | CELL SIZE | NODE IN ROUTING TABLE? | ACTION ON DATA | ACTION ON ROUTING TABLE | OTHER ACTION |
|---|---|---|---|---|---|
| AN UPLINK MESSAGE | FULL | YES | FORWARD | N/A | - |
| AN UPLINK MESSAGE | FULL | NO | DUMP (TBC) | N/A | NOTE: ANSWER WOULD BE IMPOSSIBLE! |
| AN UPLINK MESSAGE | NOT FULL | YES | FORWARD | N/A | - |
| AN UPLINK MESSAGE | NOT FULL | NO | DUMP (TBC) | N/A | NOTE: ANSWER WOULD BE IMPOSSIBLE! |
| A CELL REGISTRATION REQUEST | FULL | YES | N/A | UPDATE | SEND A CELL REGISTRATION CONFIRMATION |
| A CELL REGISTRATION REQUEST | FULL | NO | N/A | NONE | SEND A CELL OUT NOTIFICATION |
| A CELL REGISTRATION REQUEST | NOT FULL | YES | N/A | UPDATE | SEND A CELL REGISTRATION CONFIRMATION |
| A CELL REGISTRATION REQUEST | NOT FULL | NO | N/A | ADD NODE AND UPDATE | SEND A CELL REGISTRATION CONFIRMATION |
| A NEIGHBOR LIST | FULL | YES | N/A | UPDATE | - |
| A NEIGHBOR LIST | FULL | NO | N/A | NONE | SEND CELL OUT NOTIFICATION |
| A NEIGHBOR LIST | NOT FULL | YES | N/A | UPDATE | - |
| A NEIGHBOR LIST | NOT FULL | NO | N/A | ADD NODE AND UPDATE | UPDATE CSI |
| AN UPLINK MESSAGE WITH A NEIGHBOR LIST | FULL | YES | FORWARD | UPDATE | - |
| AN UPLINK MESSAGE WITH A NEIGHBOR LIST | FULL | NO | DUMP (TBC) | NONE | SEND A CELL OUT NOTIFICATION |
| AN UPLINK MESSAGE WITH A NEIGHBOR LIST | NOT FULL | YES | FORWARD | UPDATE | - |
| AN UPLINK MESSAGE WITH A NEIGHBOR LIST | NOT FULL | NO | FORWARD | ADD NODE AND UPDATE | UPDATE CSI |
| A REQUEST TO SEND A DOWNLINK MESSAGE | ANY | YES | SEND | N/A | - |
| A REQUEST TO SEND A DOWNLINK MESSAGE | ANY | NO | DISCARD | N/A | REPLY WITH FAILURE TO CELL RELAY'S API |
| A CELL LEAVING NOTIFICATION | ANY | YES | N/A | REMOVE | UPDATE CSI |
| A CELL LEAVING NOTIFICATION | ANY | NO | N/A | NONE | - |

*FIG. 57D*

| NET HEADER COMMON SECTION | NET HEADER DYNAMIC SECTION | | | | | | | | | |
|---|---|---|---|---|---|---|---|---|---|---|
| LV | FT | ORG | FID | HFN | PL | PATH | RSD | NBN | NA | BRKS |
| 4 b | 4 b | 4 B | 2 B | 1 B | 1 B | 4*PL B | 6 b | 2 b | 4 B | 4 B |

| NET HEADER DYNAMIC SECTION | | | | | FRAME BODY |
|---|---|---|---|---|---|
| BRKD | DW FD | DW FID | OID | OT | APIPDU |
| 4 B | 4 B | 2 B | 2 B | 4 B | VARIABLE |

FIG. 58

| VALUE | FRAME TYPE | VALUE | FRAME TYPE |
|---|---|---|---|
| 0000 | UPLINK | 1000 | CELL REGISTRATION CONFIRMATION |
| 0001 | DOWNLINK | 1001 | CELL OUT NOTIFICATION |
| 0010 | BROADCAST | 1010 | CELL LEAVING NOTIFICATION |
| 0011 | BROKEN LINK | 1011 | RESERVED |
| 0100 | NEIGHBOR LIST | 1100 | RESERVED |
| 0101 | OUTAGE | 1101 | RESERVED |
| 0110 | UPLINK WITH NEIGHBOR LIST | 1110 | RESERVED |
| 0111 | CELL REGISTRATION REQUEST | 1111 | TRACE |

FIG. 59

| LV | FT | ORG | FID | HFN | APIPDU |
|---|---|---|---|---|---|
| 4 b | 4 b | 4 B | 2 B | 1 B | VARIABLE |

FIG. 60

| LV | FT | FID | HFN | PL | HOP-N | HOP-(N-1) | ... | HOP-2 | HOP-1 | APIPDU |
|---|---|---|---|---|---|---|---|---|---|---|
| 4 b | 4 b | 2 B | 1 B | 1 B | 4 B | 4 B | ... | 4 B | 4 B | VARIABLE |

FIG. 61

| LV | FT | ORG | FID | HFN | RSD | NBN | NA1 | NA2 | NA3 |
|---|---|---|---|---|---|---|---|---|---|
| 4 b | 4 b | 4 B | 2 B | 1 B | 6 b | 2 b | 4 B | 4 B | 4 B |

*FIG. 62*

| LV | FT | ORG | FID | HFN | RSD | NBN | NA1 | NA2 | NA3 | APIPDU |
|---|---|---|---|---|---|---|---|---|---|---|
| 4 b | 4 b | 4 B | 2 B | 1 B | 6 b | 2 b | 4 B | 4 B | 4 B | VARIABLE |

*FIG. 63*

| LV | FT | FID | HFN | APIPDU |
|---|---|---|---|---|
| 4 b | 4 b | 2 B | 1 B | VARIABLE |

*FIG. 64*

| LV | FT | FID | PL | HOP-N | HOP-(N+1) | ... | HOP-2 | HOP-1 |
|---|---|---|---|---|---|---|---|---|
| 4 b | 4 b | 2 B | 1 B | 4 B | 4 B | ... | 4 B | 4 B |

*FIG. 65*

| LV | FT | FID | BRKS | BRKD | DW FD | DW FID | APIPDU |
|---|---|---|---|---|---|---|---|
| 4 b | 4 b | 2 B | 4 B | 4 B | 4 B | 2 B | VARIABLE |

*FIG. 66*

| LV | FT | ORG | OID | OT |
|----|----|-----|-----|-----|
| 4b | 4b | 4 B | 2 B | 4 B |

| LV | FT | ORG | FID | HFN |
|----|----|-----|-----|-----|
| 4b | 4b | 4 B | 2 B | 1 B |

| WHAT HAPPENED | POSSIBLE CAUSE | SOLUTION |
|---|---|---|
| ACK RECEIVED | Sufficient propagation conditions, no interference | (NOT APPLICABLE) |
| NO (N)ACK RECEIVED | Signal too weak/Rayleigh fading (1) | Try with another channel, no need to wait, if the problem recurs, increase the wait time |
| NO (N)ACK RECEIVED | External collision, interference (2) | Try with another channel, no need to wait, if the problem recurs, increase the wait time |
| NO (N)ACK RECEIVED | Internal collision, traffic load too high (3) | Try again after a random number of time slots, if the problem recurs, increase the wait time |
| NACK RECEIVED | Remote endpoint input buffer full (4) | Try another path or wait a fixed number of time slots and try again, if the problem recurs, increase the wait time |

*FIG. 74*

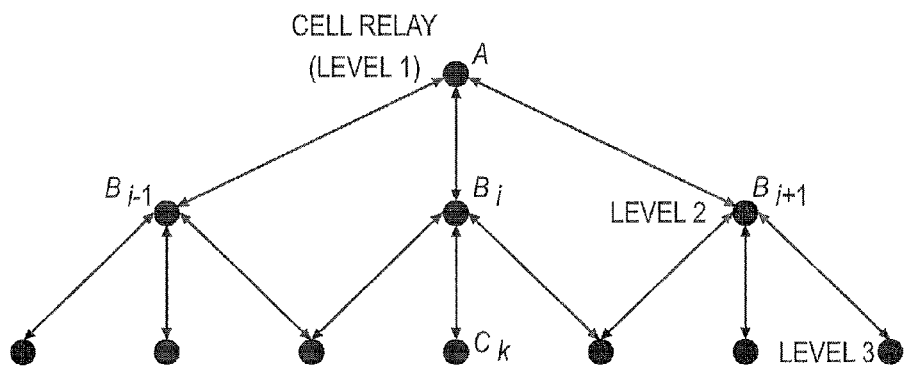

*FIG. 75*

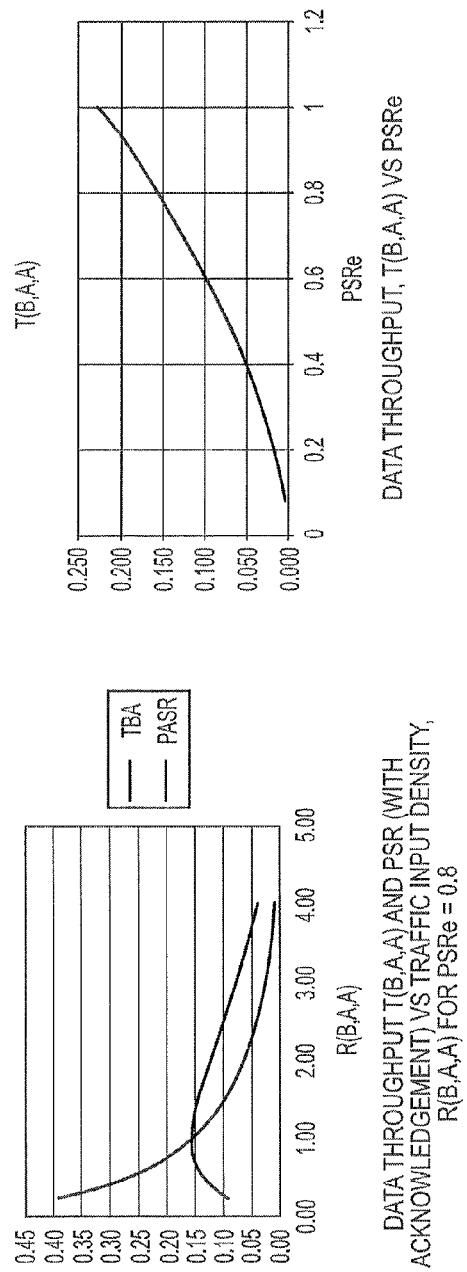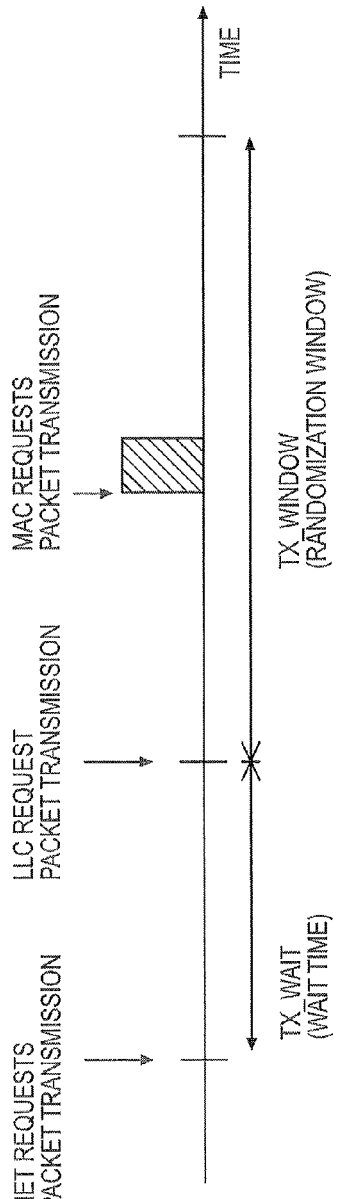
FIG. 76
FIG. 77
FIG. 78

USE OF MINIMAL PROPAGATION DELAY PATH TO OPTIMIZE A MESH NETWORK

PRIORITY CLAIMS

This application is a continuation of prior U.S. patent application Ser. No. 12/902,853 filed Oct. 12, 2010, to be issued Mar. 5, 2013 as U.S. Pat. No. 8,391,177 entitled "USE OF MINIMAL PROPAGATION DELAY PATH TO OPTIMIZE A MESH NETWORK", which is a continuation of U.S. patent application Ser. No. 11/900,202 filed Sep. 10, 2007, issued Nov. 30, 2010 as U.S. Pat. No. 7,843,834 and bearing the same title, which claims the benefit of two previously filed U.S. Provisional Patent Applications entitled "METERING RF LAN PROTOCOL AND CELL/NODE UTILIZATION AND MANAGEMENT," respectively assigned U.S. Ser. No. 60/845,056, as filed Sep. 15, 2006, and assigned U.S. Ser. No. 60/845,994, as filed Sep. 20, 2006, all of which are hereby incorporated herein by reference in their entireties for all purposes. Any disclaimer that may have occurred during prosecution of the above-referenced application(s) is hereby expressly rescinded.

FIELD OF THE INVENTION

The present technology relates to protocols relative to utility meters associated with an open operational framework. More particularly, the present subject matter relates to protocol subject matter for advanced metering infrastructure, adaptable to various international standards, while economically supporting a 2-way mesh network solution in a wireless environment, such as for operating in a residential electricity meter field.

BACKGROUND OF THE INVENTION

The general object of metrology is to monitor one or more selected physical phenomena to permit a record of monitored events. Such basic purpose of metrology can be applied to a variety of metering devices used in a number of contexts. One broad area of measurement relates, for example, to utility meters. Such role may also specifically include, in such context, the monitoring of the consumption or production of a variety of forms of energy or other commodities, for example, including but not limited to, electricity, water, gas, or oil.

More particularly concerning electricity meters, mechanical forms of registers have been historically used for outputting accumulated electricity consumption data. Such an approach provided a relatively dependable field device, especially for the basic or relatively lower level task of simply monitoring accumulated kilowatt-hour consumption.

The foregoing basic mechanical form of register was typically limited in its mode of output, so that only a very basic or lower level metrology function was achieved. Subsequently, electronic forms of metrology devices began to be introduced, to permit relatively higher levels of monitoring, involving different forms and modes of data.

In the context of electricity meters specifically, for a variety of management and billing purposes, it became desirable to obtain usage data beyond the basic kilowatt-hour consumption readings available with many electricity meters. For example, additional desired data included rate of electricity consumption, or date and time of consumption (so-called "time of use" data). Solid state devices provided on printed circuit boards, for example, utilizing programmable integrated circuit components, have provided effective tools for implementing many of such higher level monitoring functions desired in the electricity meter context.

In addition to the beneficial introduction of electronic forms of metrology, a variety of electronic registers have been introduced with certain advantages. Still further, other forms of data output have been introduced and are beneficial for certain applications, including wired transmissions, data output via radio frequency transmission, pulse output of data, and telephone line connection via such as modems or cellular linkups.

The advent of such variety and alternatives has often required utility companies to make choices about which technologies to utilize. Such choices have from time to time been made based on philosophical points and preferences and/or based on practical points such as, training and familiarity of field personnel with specific designs.

Another aspect of the progression of technology in such area of metrology is that various retrofit arrangements have been instituted. For example, some attempts have been made to provide basic metering devices with selected more advanced features without having to completely change or replace the basic meter in the field. For example, attempts have been made to outfit a basically mechanical metering device with electronic output of data, such as for facilitating radio telemetry linkages.

Another aspect of the electricity meter industry is that utility companies have large-scale requirements, sometimes involving literally hundreds of thousands of individual meter installations, or data points. Implementing incremental changes in technology, such as retrofitting new features into existing equipment, or attempting to implement changes to basic components which make various components not interchangeable with other configurations already in the field, can generate considerable industry problems.

Electricity meters typically include input circuitry for receiving voltage and current signals at the electrical service. Input circuitry of whatever type or specific design for receiving the electrical service current signals is referred to herein generally as current acquisition circuitry, while input circuitry of whatever type or design for receiving the electrical service voltage signals is referred to herein generally as voltage acquisition circuitry.

Electricity meter input circuitry may be provided with capabilities of monitoring one or more phases, depending on whether monitoring is to be provided in a single or multiphase environment. Moreover, it is desirable that selectively configurable circuitry may be provided so as to enable the provision of new, alternative or upgraded services or processing capabilities within an existing metering device. Such variations in desired monitoring environments or capabilities, however, lead to the requirement that a number of different metrology configurations be devised to accommodate the number of phases required or desired to be monitored or to provide alternative, additional or upgraded processing capability within a utility meter.

More recently a new ANSI protocol, ANSI C12.22, is being developed that may be used to permit open protocol communications among metrology devices from various manufacturers. C12.22 is the designation of the latest subclass of the ANSI C12.xx family of Meter Communication and Data standards presently under development. Presently defined standards include ANSI C12.18 relating to protocol specifications for Type 2 optical ports; ANSI C12.19 relating to Utility industry Meter Data Table definitions; and ANSI C12.21 relating to Plain Old Telephone Service (POTS) transport of C12.19 Data Tables definition. It should be appreciated that while the remainder of the present discussion may describe C12.22 as a standard protocol, that, at least at the time of filing the present application, such protocol is still being developed so that the present disclosure is actually intended to describe an open protocol that may be used as a communications protocol for networked metrology and is referred to for discussion purposes as the C12.22 standard or C12.22 protocol.

C12.22 is an application layer protocol that provides for the transport of C12.19 data tables over any network medium. Current standards for the C12.22 protocol include: authentication and encryption features; addressing methodology providing unique identifiers for corporate, communication, and end device entities; self describing data models; and message routing over heterogeneous networks.

Much as HTTP protocol provides for a common application layer for web browsers, C12.22 provides for a common application layer for metering devices. Benefits of using such a standard include the provision of: a methodology for both session and session-less communications; common data encryption and security; a common addressing mechanism for use over both proprietary and non-proprietary network mediums; interoperability among metering devices within a common communication environment; system integration with third-party devices through common interfaces and gateway abstraction; both 2-way and 1-way communications with end devices; and enhanced security, reliability and speed for transferring meter data over heterogeneous networks.

To understand why utilities are keenly interested in open protocol communications; consider the process and ease of sending e-mails from a laptop computer or a smart phone. Internet providers depend on the use of open protocols to provide e-mail service. E-mails are sent and received as long as e-mail addresses are valid, mailboxes are not full, and communication paths are functional. Most e-mail users have the option of choosing among several Internet providers and several technologies, from dial-up to cellular to broadband, depending mostly on the cost, speed, and mobility. The e-mail addresses are in a common format, and the protocols call for the e-mail to be carried by communication carriers without changing the e-mail. The open protocol laid out in the ANSI C.12.22 standard provides the same opportunity for meter communications over networks.

In addition, the desire for increased mesh network operational capabilities as well as other considerations including, but not limited to, a desire to provide improved capabilities for individual metrology components in an open operational framework, leads to requirements for interfacing such components with mesh network system applications.

As such, it is desired to provide an improved protocol for advanced metering infrastructure applications in an open operational framework.

While various aspects and alternative embodiments may be known in the field of utility metering, no one design has emerged that generally encompasses the above-referenced characteristics and other desirable features associated with utility metering technology as herein presented.

SUMMARY OF THE INVENTION

In view of the recognized features encountered in the prior art and addressed by the present subject matter, improved apparatus and corresponding methodology allowing advanced metering infrastructure in an open operational framework have been provided.

In an exemplary arrangement, methodology and corresponding apparatus have been provided to permit transmission of information between a utility meter and an operational application through a frequency hopping network operated in accordance with present protocol subject matter.

In one of its simpler forms, the present technology provides an improved network and meter protocols.

One positive aspect of the present subject matter is that it supports meters within an ANSI standard C12.22/C12.19 system while economically supporting a 2-way mesh network solution in a wireless environment, such as for operating in a residential electricity meter field, all to permit cell-based adaptive insertion of C12.22 meters within an open framework.

Another positive aspect of the present subject matter is that it provides for cell isolation through quasi-orthogonal sequences in a frequency hopping network. Some additional positive aspects relating to a network operated per the present protocol subject matter relate to real time clock distribution and recovery, uplink routing without requiring a routing table, and the handling of Beacon Requests and Registered State bit resolving to avoid circular routes.

Still additional positive aspects of the present protocol subject matter as relates to cell or node utilization or management in a mesh network, relate to cell size management, to Number-of-sons' management, to crystal drift compensation in a mesh network, to broadcast acknowledgement features, and to Traffic Load Control in a Mesh Network.

Additional aspects of the present subject matter relate to Embedded RF environmental evaluation tool features to gauge the performance need of RF transceivers, Downlink routing mechanisms, Outage notification system features, the use of minimal propagation delay path to optimize a mesh network, and operation at the node level of a Discovery Phase in a frequency hopping network.

An exemplary present methodology relates to a method for optimizing an advanced metering system mesh network. Such an exemplary method may comprise establishing a network including a central facility root node and a plurality of node devices, at least some of which node devices comprise metrology devices; configuring the network for bi-directional communications between the central facility root node and each of the plurality of node devices; computing an average local propagation delay for each one-hop link; computing the total propagation delay along each path to the central facility root node; selecting at each node device the shortest value of total propagation delay to define its own global propagation delay value; and conducting communications using the path corresponding to the selected value. With such an exemplary method, communications among nodes within the network may be optimized.

Still another present exemplary methodology relates to a method for optimizing an advanced metering system mesh network. Such present exemplary methodology may comprise establishing a network including a central facility root node and a plurality of node devices, at least some of which node devices comprise metrology devices; configuring the network for bi-directional communications between the central facility root node and each of the plurality of node devices; computing an average local propagation delay for each one-hop link; propagating global propagation delay information from the central facility root node to each of the node devices on a step by step basis; storing global propagation delay information at each node device; and conducting communications using a path corresponding to the shortest value of total propagation delay based on the stored global propagation delay information and the average local propagation delay. With such methodology, each node device may advantageously select a communications path based only on knowledge of its own average local propagation delay and the global propagation delay information from immediate neighbor node devices.

Still further present exemplary methodologies are provided by alternatively incorporating various present features. One example is the further inclusion of each node making available its own global propagation delay value by updating its message header. In still further alternatives, present exemplary methodologies may include the average local propagation delay being derived by maintaining a record of all communication attempts with each one of the plurality of node devices in the direction of the central facility root node; and computing a statistical communication success rate for each one of the plurality of node devices.

In certain present alternatives, the average local propagation delay for each one-hop link is computed using the relationship:

$$D = T_d + T_r\left(\frac{1-P}{P}\right)$$

where D is the average local propagation delay, $T_d$ is the time needed by a packet to travel from a transmitter to a receiver, P is the packet success rate, and $T_r$ is the wait time between transmissions. In certain present exemplary alternative methodologies, the packet success rate may be updated after each packet transmission attempt with a sliding average using the relationship:

$$P(n) = \frac{PS(n)}{N_{av}} + \frac{N_{av}-1}{N_{av}}P(n-1)$$

where P(n) is the packet success rate for a given node n, $N_{av}$ is the number of transmissions used to compute the average, and PS(n) is an indication of success or failure at attempt n where PS(n)=0 if transmission n failed and PS(n)=1 if transmission n succeeded. In such alternative methods, the propagation delay of any link may be updated using the relationship:

$$D_r(n) = \begin{cases} \dfrac{N_{av}D_r(n-1)+1}{N_{av}-1} & \text{if } PS(n) = 0 \\ \dfrac{(N_{av}-1)D_r(n-1)}{D_r(n-1)+N_{av}} & \text{if } PS(n) = 1 \end{cases}$$

where Dr(n) is the propagation delay of a link for transmission n and PS(n) is an indication of success or failure at attempt n where PS(n)=0 if transmission n failed and PS(n)=1 if transmission n succeeded.

It is to be understood that the present subject matter equally pertains to corresponding apparatus subject matter. One exemplary present embodiment relates to an advanced metering system mesh network, comprising a central facility root node; and a plurality of node devices. Preferably, in such exemplary embodiment, each node device is configured for bi-directional communications with the central facility root node, and at least some of which node devices comprise metrology devices. In such exemplary embodiment, each node device is further configured to compute an average propagation delay for each one-hop link to itself in the mesh network and to select the shortest transmission path to the central facility root node based only on its own computed average propagation delay and global propagation delay information stored in its immediate neighbors. With such an arrangement, communications between the central facility root node and the plurality of node devices may advantageously be optimized. Other features as expressed herein may be provided in other combinations, likewise forming exemplary present embodiments.

Additional objects and advantages of the present subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments and uses of the present subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents including combinations of features, parts, or steps or configurations thereof not expressly shown in the figures or stated in the detailed description of such figures. Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which:

FIG. 3C illustrates an exemplary Advanced Metering System deployment incorporating various of both apparatus and methodology aspects of the present subject matter;

FIG. 8 depicts REED-SOLOMON ENCODER subject matter;

FIG. 9 depicts PHY FRAME subject matter;

FIG. 10 depicts PHYSICAL LAYER SERVICES subject matter;

FIG. 21A depicts Potential SYNC fathers and healthy fathers for a synchronized node subject matter;

FIG. 21B depicts Connectivity Degree subject matter;

FIG. 25 depicts SYNCHRONIZATION PROCESS EXAMPLE subject matter;

FIGS. 26A and 26B respectively depict one example of an Initial Configuration and one example of a new endpoint, both illustrative of circumstances of one endpoint finding a better endpoint for communication purposes, per present subject matter;

FIG. 32 depicts present protocol subject matter MESSAGES PRIORITY LIST subject matter;

FIG. 33 depicts RSSI PDF subject matter;

FIG. 34 depicts RSSI PDF REPORT subject matter;

FIG. 35 depicts MAC FRAME subject matter;

FIG. 36 depicts MAC FRAME TYPE subject matter;

FIG. 37 depicts BEACON subject matter;

FIG. 38 depicts SYNC REQUEST subject matter;

FIG. 39 depicts ACK-NACK-SYNC NACK subject matter;

FIG. 40 depicts SYNC ACK subject matter;

FIG. 41 depicts REQUEST BEACON subject matter;

FIG. 42 depicts MONOCAST DATA subject matter;

FIG. 43 depicts MULTICAST DATA subject matter;

FIG. 44 depicts ITP subject matter;

FIG. 45 depicts DISCOVERY BEACON subject matter;

FIG. 46 depicts OUTAGE subject matter;

FIG. 49 depicts LLC PARAMETER DEFAULT VALUES subject matter;

FIG. 50 depicts DELAYED TRUNCATED BINARY EXPONENTIAL BACKOFF FOR TRANSMISSION RETRIES IF PACKETS ARE NOT ACKNOWLEDGED subject matter;

FIG. 51 depicts TRUNCATED BINARY EXPONENTIAL BACKOFF FOR TRANSMISSION RETRIES IF PACKETS ARE NEGATIVELY ACKNOWLEDGED subject matter;

FIG. 52 depicts LLC DUPLICATION TABLE subject matter;

FIG. 53 depicts LLC FRAME subject matter;

FIG. 55 depicts NET LAYER PARAMETER DEFAULT VALUES subject matter;

FIG. 57B depicts CR Routing Table subject matter for a Downlink routing example;

FIG. 57C depicts Cell Size Indicator (% of NET_Max_Nb_of_EPs) subject matter;

FIG. 57D depicts Cell Master actions when cell is full or node not in routing table subject matter;

FIG. 58 depicts NET FRAME subject matter;

FIG. 59 depicts NET FRAME TYPE subject matter;

FIG. 60 depicts UPLINK FRAME subject matter;

FIG. 61 depicts DOWNLINK FRAME subject matter;

FIG. 62 depicts NEIGHBOR LIST subject matter;

FIG. 63 depicts UPLINK WITH NEIGHBOR LIST FRAME subject matter;

FIG. 64 depicts BROADCAST subject matter;

FIG. 65 depicts CELL OUT NOTIFICATION subject matter;

FIG. 66 depicts BROKEN LINK subject matter;

FIG. 74 depicts TRANSMISSION FAILURE CAUSES AND SOLUTIONS subject matter;

FIG. 75 depicts MODEL FOR THE TRAFFIC LOAD AT THE CELL RELAY subject matter;

FIG. 76 depicts DATA THROUGHPUT, T(B,A,A) AND PSR (WITH ACKNOWLEDGEMENT) VS TRAFFIC INPUT DENSITY, R(B,A,A) FOR PSRE=0.8 subject matter;

FIG. 77 depicts DATA THROUGHPUT, T(B,A,A) VS PSRE subject matter;

FIG. 78 depicts WAIT TIME AND RANDOMIZATION WINDOW FOR THE (RE-)TRANSMISSION OF A PACKET subject matter;

Figure 1:
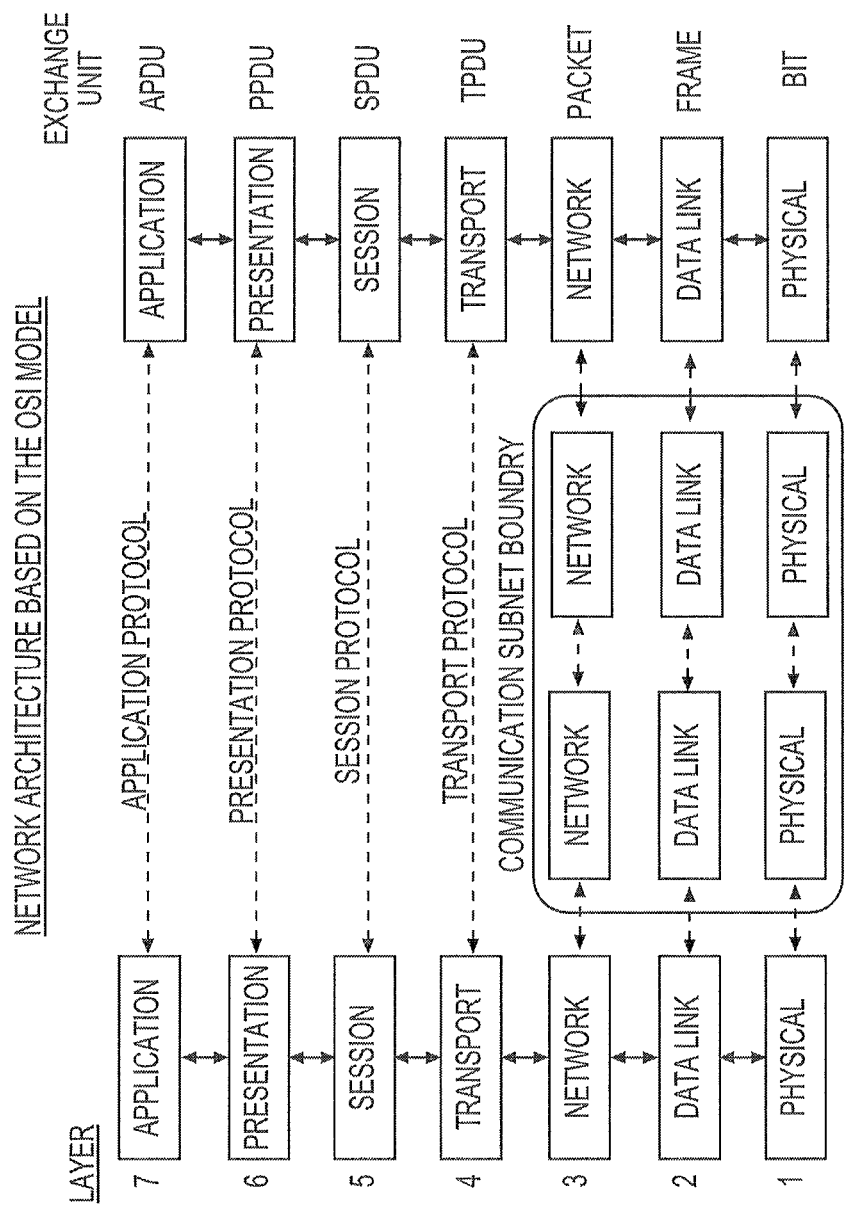
FIG. 1 depicts OSI MODEL subject matter.

Repeat use of reference characters throughout the present specification and appended drawings is intended to represent same or analogous features, elements, or steps of the present subject matter.

DETAILED DESCRIPTION OF THE PREFERRED EMBODIMENTS

Various discussion herein makes us of and/or relies on abbreviations and acronyms, having the intended meanings as set forth in the appended Table of Definitions, which forms part of the present disclosure.

A reference model for interconnection of open systems (referred to as OSI—Open Systems Interconnection) has been described by ISO (the International Standards Organization). Such model, represented by present FIG. 1, is a functional decomposition of a communication system. In other words, the different layers perform different functions. A layer N offers services to the layer above N+1, by enhancing the services offered to this layer N by the underlying layer N−1. Such architecture allows further modifications on one layer without changing the others. Moreover, it allows compatibility between different protocols based on the same principle.

Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Figure 2A:
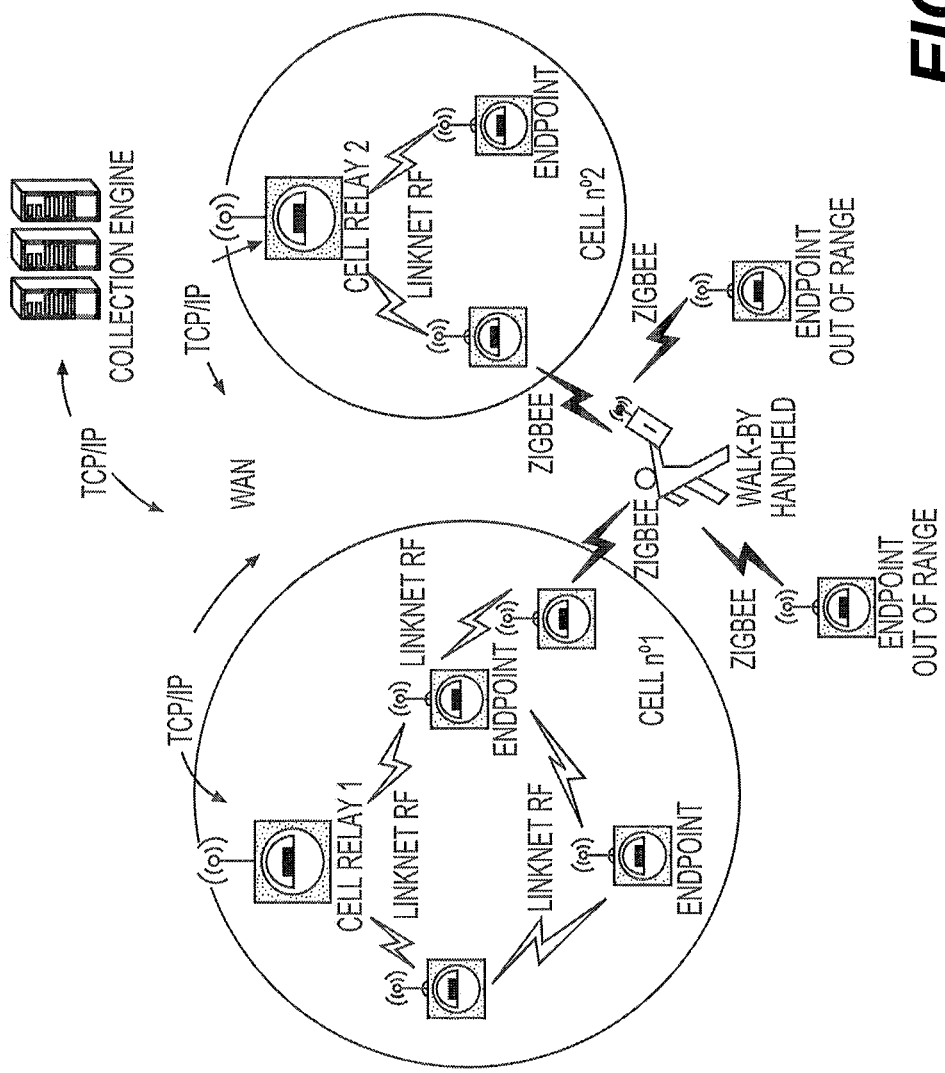
FIG. 2A depicts NETWORK ARCHITECTURE subject matter.

The present subject matter network and protocol architecture may be described as based on a tree with four kinds of elements, spread on cells, represented by present FIG. 2A. At the top of such architecture is a Collection Engine, which acts as a central database. It knows all the cells and their contents, that is, the cell where each meter is and its address. It also collects monthly data from every endpoint and it allows access to any meter in the network. The user can request or send data to a single meter or broadcast information. The Collection Engine can communicate with the router of the selected cell by TCP/IP protocol inside Internet network.

In such tree hierarchy, just below the Collection Engine stand routers of the cells, referred to as the Cell Relays. There is one Cell Relay for each cell and it is the gateway between individual meters in the cell and the Collection Engine. The Cell Relay contains a routing table of all the meters in its cell. It can also forward data in the two directions, that is, between the Collection Engine and the endpoints. It also assumes the role of synchronizing the cell.

At the bottom of such tree are located so-called Endpoints (EPs). They can transmit and receive metering information. In addition, each one of them can act as a relay for distant endpoints with no additional hardware.

The last indicated module of such four kinds of elements is the Walk-By unit, a Zigbee handheld that can communicate with orphans or configure the subject protocol parameters. This module doesn't itself contain the subject protocol. It uses the Zigbee part of the register to communicate with it.

Therefore, the subject network uses 3 media, which are the subject RF link, a Zigbee RF Link, and a TCP/IP link, all as represented per present FIG. 2A.

Figure 2B:
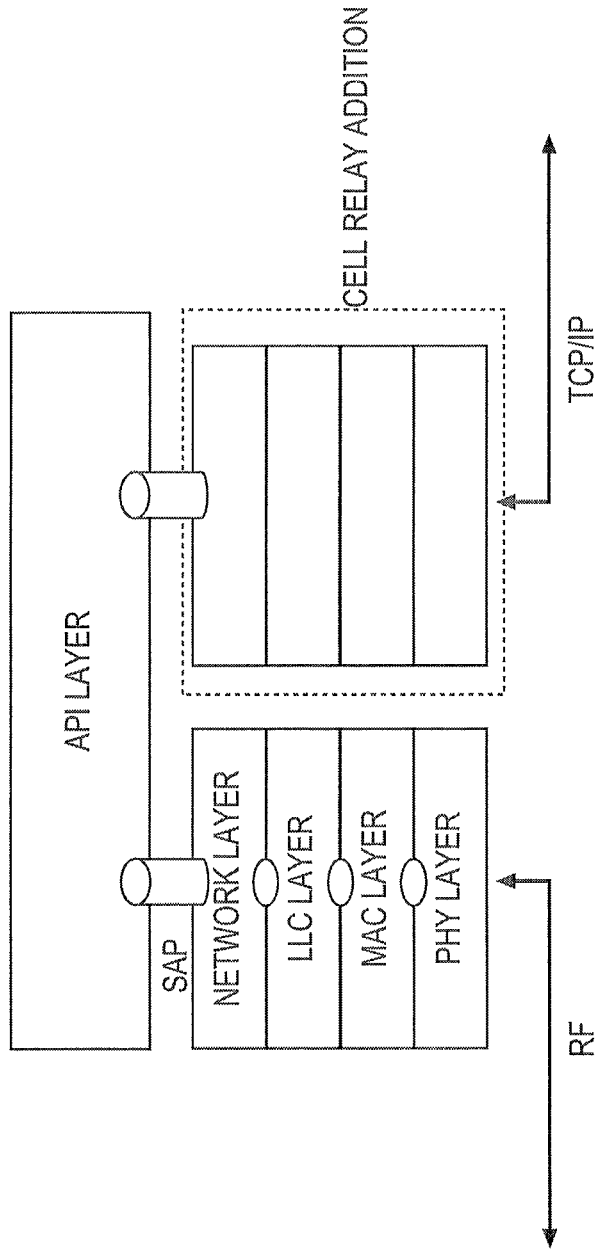
FIG. 2B depicts LAYER MODEL subject matter.

Present FIG. 2B represents in part the subject protocol, which in part is based on the 3 first layers of the subject layer model, respectively labeled as: Physical, Data Link and Network Layer. Such Data Link Layer is further divided into 2 sub-layers, MAC (Medium-Access Control) and LLC (Logical-Link Control). As represented, each layer can communicate by way of the SAP (Service Access Point) with layers just below and just above. FIG. 2B represents the layer model of an EP (endpoint) incorporating a cell relay module option. On the top of the stack, the API layer is communicating with the meter itself to exchange metering data or with the Cell Relay application. The left stack represents the Cell Master while the right one is the Cell Relay WAN section (or Cell Relay board).

The following discussion describes each layer of present FIG. 2B, including their respective functionalities and services.

The Application Layer Interface (API) is not itself part of the subject protocol, but from a network point of view it is the layer just above. One main goal of the present subject matter is to transport data from the API layer. In one exemplary embodiment, in the AMI network the API layer could follow the C12.22 protocol, as discussed throughout the present disclosure. However, it is to be understood that the present subject matter could also work with another API layer.

The network layer is the highest layer of the present protocol subject matter. It is in charge of routing the packets to their final destination. To be able to do this it manages a table of its 1-hop neighbors obtained through the MAC layer. For an uplink message (towards the cell relay (CR)), this table allows the NET layer to send the message to the best 1-hop neighbor of lower level. The NET layer of the next endpoint repeats this operation until it reaches the cell relay (lowest level in the cell).

The cell relay (or cell master) NET layer is preferably one exception since it is the only one that can send a message to any endpoint (EP) in the cell; it is possible because the CR NET has all the neighbor (or father) tables of the cell and thus is able to send a message with all the addresses (the whole path) in the header. The CR (or CM) NET layer can also send a broadcast message to all EPs in the cell. For this each NET layer sends this message to all its sons.

The Logical Link Control (LLC) layer is mainly in charge of repetition of messages that have not been heard (including in the case of broadcast) and of fragmentation of messages that are too long. It also filters duplicated messages, in both directions, to not overburden the NET layer or the RF link, Finally, it is often used as just a link between the NET and MAC layers.

The Medium Access Control (MAC) layer handles the largest number of tasks or functions. First, the MAC layer is the synchronization manager. When the power is turned on it tries to find a cell and once connected to it, it adjusts its level to stay in contact with the best possible father.

It is to be understood by those of ordinary skill in the art that various terms may be used to describe certain functional relationships. For example, the terms father or parent may be used interchangeably relative to the terms son or child. Choice of such terms herein is not meant to convey particular limitations or meaning beyond the context in which they are presented, as will be understood by those of ordinary skill in the art.

Among the layers of the subject protocol, the MAC layer is the only one to have a notion of time. The subject protocol time is divided into Time Slots (TS) and the MAC layer aligns them with the ones of its fathers, which do the same until operation of the cell relay (which is the time reference in the network). Such synchronization is done through time information included by the MAC layers in the header of all packets. If there is no traffic the MAC layer sends beacons so that its sons can stay synchronized with him.

Another task of the MAC layer is to acknowledge messages received. Positive or negative acknowledgement (ACK or NACK) is possible. These are 1-hop acknowledgements. However, if the API layer needs an end-to-end acknowledgement, it needs to insert the request in the message it sends. The MAC layer also inserts several personal parameters in the header of all messages it sends. When receiving packets from its neighbors, it extracts these parameters and manages a table of its neighborhood. Part of this table is communicated to the NET layer.

Finally, the MAC layer computes a CRC (Cyclic Redundancy Check) on the packets and adds it at the end before giving it to the PHY layer for transmission or uses it upon reception of a message for error detection.

The Physical (PHY) layer is in charge of transmitting data on the RF link. It is by default in receiving mode and never decides on its own to transmit. All its instructions, including packets to send, come from the MAC layer. Before transmitting a packet it computes and adds FEC and then adds a preamble and a header to this protected packet. When it receives a packet, it removes these 2 additions before delivering the data to the MAC layer. The physical layer also provides the received packet power (RSSI) and time of reception for the MAC layer. As a last service, it can also measure and give the RSSI value on the current listening channel.

Figure 3A:
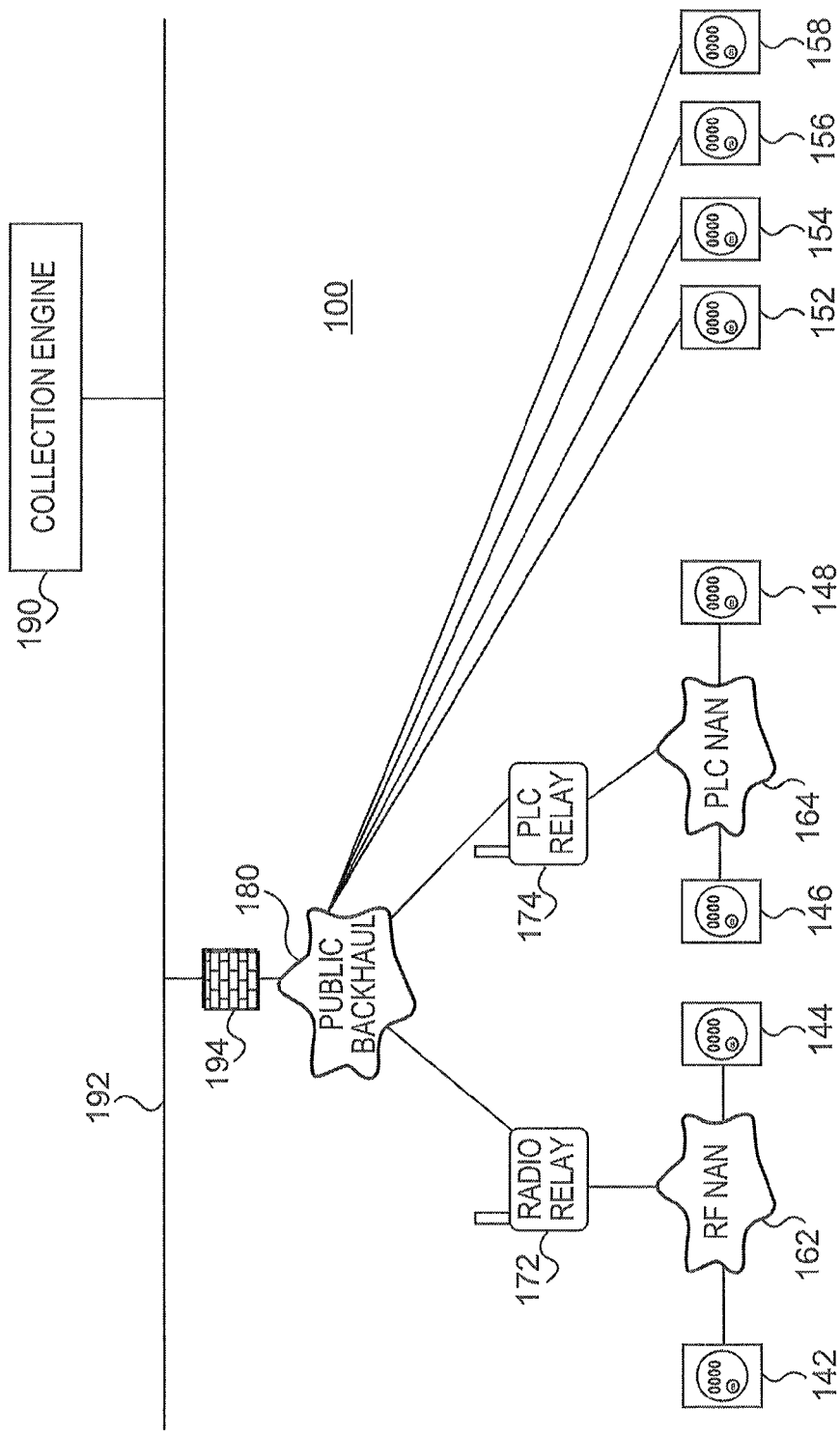
FIG. 3A is a block diagram overview illustration of an Advanced Metering System (AMS) and a representation of corresponding methodology thereof, in accordance with the present subject matter.
Figure 3B:
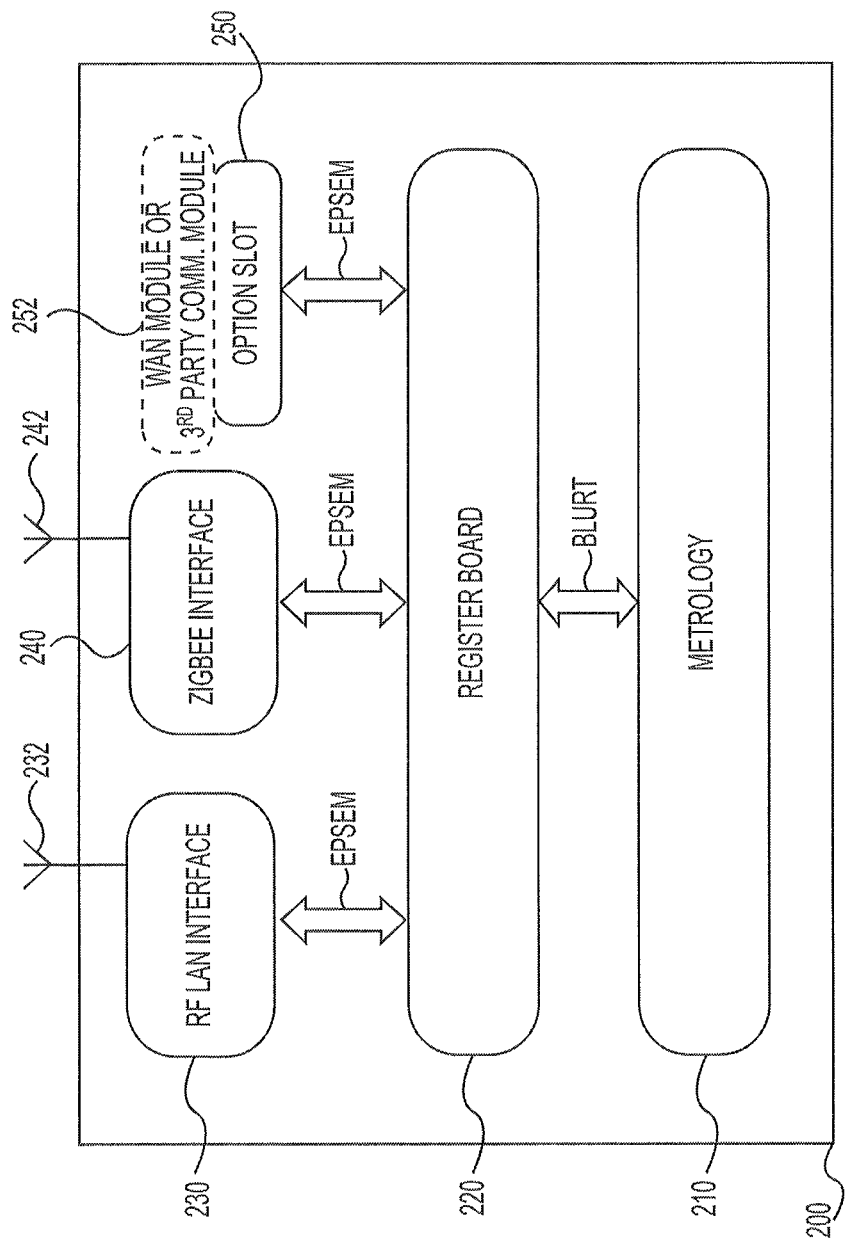
FIG. 3B illustrates a block diagram of an exemplary meter incorporating interface features in accordance with the present subject matter.

Present FIGS. 3A through 3C are concerned more particularly with exemplary apparatus and methodology for providing an interface between a meter in an advanced metering system and an application running on such a system, thereby allowing plug-n-play compatibility (i.e., interchangeability) of metrology devices in the subject open operational framework, such as for ANSI standard C12.22 meters, otherwise discussed herein. Also, present FIGS. 3D through 3F relate to exemplary apparatus and methodologies for downloading firmware through a network as discussed herein to end devices including utility meters and relays, such as for upgrading firmware in previously installed revenue meters in communication and cell/node relationships per protocol as otherwise described herein. A viral propagation methodology is disclosed as an alternative to at least portions of the broadcast methodology. Various such features may involve downloading firmware in an RF mesh network that is arranged in hierarchical layers, or a "tree"-configured arrangement, as otherwise discussed herein.

FIG. 3A is a block diagram overview illustration of an Advanced Metering System (AMS) in accordance with the present subject matter. Advanced Metering System (AMS) generally 100 in accordance with the present subject matter is designed to be a comprehensive system for providing advanced metering information and applications to utilities. AMS 100 in pertinent part is designed and built around industry standard protocols and transports, and therefore is intended to work with standards compliant components from third parties.

Major components of AMS 100 include exemplary respective meters 142, 144, 146, 148, 152, 154, 156, and 158; one or more respective radio-based networks including RF neighborhood area network (RF NAN) 162 and its accompanying Radio Relay 172, and power line communications neighborhood area network (PLC NAN) 164 and its accompanying PLC Relay 174; an IP (internet protocol) based Public Backhaul 180; and a Collection Engine 190. Other components within exemplary AMS 100 may include a utility LAN (local area network) 192 and firewall 194 through which communications signals to and from Collection Engine 190 may be transported from and to respective exemplary meters 142, 144, 146, 148, 152, 154, 156, and 158 or other devices including, but not limited to, Radio Relay 172 and PLC Relay 174.

AMS 100 is configured to be transparent in a transportation context, such that exemplary respective meters 142, 144, 146, 148, 152, 154, 156, and 158 may be interrogated using Collection Engine 190 regardless of what network infrastructure exists in-between or among such components. Moreover, due to such transparency, the meters may also respond to Collection Engine 190 in the same manner.

As represented by the illustration in FIG. 3A, Collection Engine 190 is capable of integrating Radio, PLC, and IP connected meters. To facilitate such transparency, AMS 100 operates and/or interfaces with ANSI standard C12.22 meter communication protocol for networks. C12.22 is a network transparent protocol, which allows communications across disparate and asymmetrical network substrates. C12.22 details all aspects of communications, allowing C12.22 compliant meters produced by third parties to be integrated into a single advanced metering interface (AMI) solution. AMS 100 is configured to provide meter reading as well as load control/demand response, in home messaging, and outage and restoration capabilities. All data flowing across the system is sent in the form of C12.19 tables. The system provides full two-way messaging to every device; however, many of its functions may be provided through broadcast or multicast messaging and session-less communications.

With present reference to FIG. 3B, there is illustrated a block diagram of an exemplary meter 200 incorporating interface features in accordance with the present subject matter. Meter 200 preferably incorporates several major components including Metrology 210, a Register Board 220, and one or more communications devices. In the presently illustrated exemplary configuration, meter 200 may include such as an RF LAN Interface 230 and accompanying antenna 232, and a Zigbee Interface 240 and its accompanying antenna 242. In addition, an Option Slot 250 may be provided to accommodate a third party network or communications module 252.

Metrology 210 may correspond to a solid-state device configured to provide (internal to the meter) C12.18 Blurt communications with Register Board 220. Communications within meter 200 are conducted via C12.22 Extended Protocol Specification for Electronic Metering (EPSEM) messages. The meter Register Board 220 is configured to fully support C12.19 tables and C12.22 extensions. While all meter data will be accessible via standard C12.19 tables, in order to facilitate very low bandwidth communications, manufacturers tables or stored procedures are included which provide access to specific time-bound slices of data, such as the last calendar day's worth of interval data or other customized "groupings" of data.

Meter 200 may be variously configured to provide differing communications capabilities. In exemplary configurations, one or more of GPRS, Ethernet, and RF LAN communications modules may be provided. GPRS will allow meters to be IP addressable over a public backhaul and provide more bandwidth than the meter will likely ever require, but may incur ongoing subscription costs. Ethernet connectivity can be used to bridge to third party technologies, including WiFi, WiMax, in-home gateways, and BPL (Broadband over Power Lines), without integrating any of these technologies directly into the metering device, but with the tradeoff of requiring external wiring and a two part solution. Ethernet devices may be used primarily in pilots and other special applications, and they additionally may be ideal for certain high-density RF-intolerant environments, such as meter closets.

Due to the increased complexity of managing a WAN interface, with its more sophisticated link negotiation requirements and TCP/IP (Transmission Control Protocol/Internet Protocol) stack, WAN connected meters may include an additional circuit board dedicated to WAN connectivity. Such board if used would preferably interface with meter 200 using EPSEM messages and Option Slot 250.

The availability of Option Slot 250 within meter 200 provides the advantage that it will make meter 200 available for integration with third party backhauls, such as PLC (Power Line Communications). In order for such third party devices to be integrated into AMS 100, on the other hand, third party devices will need to include both a communications board and a C12.22 compliant relay to couple communications signals from any proprietary network of the third party to an IP connection. Alternatively, third parties could integrate meter 200 into their own end-to-end solution.

The communications protocol between meter 200 and respective communications modules 230, 240, and WAN module or optional third party communications module 250, follow the C12.22 standards, allowing any third party to design to the standard and be assured of relatively straightforward integration.

Communication with the Collection Engine 190 is performed over an Internet Protocol connection. The Wide-Area-Network is a fully routable, addressable, IP network that may involve a variety of different technologies including, but not limited to, GPRS, WiFi, WiMax, Fiber, Private Ethernet, BPL, or any other connection with sufficiently high bandwidth and ability to support full two-way IP communication. Several assumptions (that is, criteria of the present subject matter) may be made regarding the IP WAN. Collection Engine 190 is preferably implemented so as to be able to communicate directly with other respective nodes on the IP WAN. While communications may be conducted through a firewall 194, it is not necessary that such be proxied, unless the proxy is itself a C12.22 node functioning as a relay between a private IP network and the public IP WAN.

Further in accordance with the present subject matter, the interface between meters and applications manager (IMA Manager) provided by the present technology facilitates communications between upper level devices including, but not limited to, Collection Engine 190 and the various respective meters and other devices within AMS 100. More particularly, the IMA Manager uses a C12.22 manager to create an Extended Protocol Specification for Electronic Meters (EPSEM) message object wrapped in an Application Control Service Element (ACSE) object, to send the message to a native network, to receive a response from the native network, and to return an ACSE object with the EPSEM response embedded. The IMA Manager preferably would then utilize the IMA for the device class in order to build an EPSEM message to be sent to the meters.

The IMA Manager will merge the EPSEM message with any necessary ApTitles to form an ACSE message and then will pass the ACSE message to the C12.22 Manager. The C12.22 Manager will then send the ACSE message to the appropriate meters. A response from a meter may be received from the network into the C12.22 Manager, which will parse the ACSE message so as to extract the ApTitle and EPSEM message. Later, the C12.22 Manager receives a response from the previous ACSE message, parses the ACSE response and sends it to the IMA Manager.

The IMA Manager processes an exception response and submits it to an exception manager, which delivers the exception to all systems that have subscribed to that exception type. The IMA Manager utilizes a Metadata store to retrieve any information about the calling ApTitle, such as the device class and EDL configuration file, and then utilizes the IMA for the device class to interpret, for example, that an outage has occurred.

The IMA Manager will inform the Exception Manager which respective meter has experienced an outage. The Exception Manager obtains a list of subscribers for the supplied Exception Type from the Metadata Store API, and then sends the message to every notification system that has subscribed to notifications of the exception's type.

The Advanced Metering System of the present technology provides a series (or plurality) of services (functionalities) to utilities. In its most basic implementation, it provides daily feeds of residential interval or TOU (Time of Use) data. Beyond such functionality, it provides power outage and restoration notifications, on-demand readings, firmware updates, load control/demand response, gas meter readings, and in-home display messages. All of such functions (services) are communicated via the C12.22 protocol. In order to optimize use of the low-bandwidth RF LAN, selected operations assume use of manufacturer procedures within the meter; however, the general C12.22 communication engine of the system is not specific to any particular tables, devices, or manufacturers. In the future, in accordance with the present subject matter, as alternate network substrates may become available, the RF LAN can very easily be swapped out with other technologies.

With present reference to FIG. 3C, it will be seen that an exemplary Advanced Metering System (AMS) generally 300 deployment has been illustrated. FIG. 3C illustrates for exemplary purposes only a single RF LAN cell, with twelve respective member nodes organized into three levels, as well as four directly connected IP meters 370, 372, 374, and 376. In such system, all respective meter devices 310, 320, 330, 332, 340, 342, 350, 352, 354, 356, 360, 362, 364, 466, 370, 372, 374, and 376, Cell Relay 302, and Collection Engine 390, have C12.22 network addresses. Collection Engine 390 may in accordance with the present subject matter have multiple C12.22 addresses to allow for separate addressing between different services (functionalities). Meter (or Master) data management system 391 is not part of the C12.22 network, but preferably it will be implemented so as to communicate over the Utility LAN 392 to Collection Engine 390 via Web Services. Communications between Cell Relay 302 and Utility LAN 392 variously involve Public Backhaul 380 and firewall 394, in a manner analogous to that discussed above in conjunction with Public Backhaul 180 and firewall 194 (FIG. 3A), as well understood by those of ordinary skill in the art.

The meter data acquisition process begins with the Meter (or Master) Data Management System 391 initiating a request for data. Such operation is done through a web services call to Collection Engine 390 and may be performed without knowledge of the configured functionality of the end-device. Collection Engine 390 analyzes the request for data, and formulates a series of C12.22 multicast (or broadcast) data requests. Such requests are then sent out either directly to the device (in the case of an IP connected meter, such as 370), or to Cell Relay 302 that relays the message out to all appropriate nodes. Broadcast and multicast messages are sent by Cell Relay 302 to all members of the cell, either via an AMS RF LAN-level broadcast, or by the Cell Relay repeating the message. For efficiency sake, the use of an RF LAN level broadcast may be preferred.

Typically these requests are sent as a call to a manufacturer's stored procedure. In C12.22, stored procedure calls are performed as writes to a predetermined table, e.g. "table 7." The stored procedure will send the default upload configured for such device. For example, a given meter may be configured to upload two channels of hourly interval data, plus its event history. Another meter might be programmed to send up its TOU registers. The stored procedure will require four parameters to be fully operative in accordance with the present subject matter: data start time, data end time, response start time, and response end time. The data start and end time are be used to select which data to send. The response start time and end time are used to determine the window within which the upstream system wants to receive the data. The various AMS enabled meters of FIG. 3C are preferably field programmable, via C12.22 tables, as to the type data to be included in a default upload.

When data is sent to Collection Engine 390, is it sent as C12.19 table self-write with the notification bit set, and the do-not-respond bit set. The result is that per the present subject matter no C12.22 acknowledgement is sent in response to the Collection Engine's broadcast, nor does the Collection Engine 390 in response to the notify-write send any response; however, the notify-write effectively serves per the present subject matter as an acknowledgement to the receipt of the broadcast.

The response processing section can use the configured data about an end device and the response message from the end device to determine the results from the device. The response processing section begins operation associated with a specific job in a task list, but can be switched between any active job that is awaiting a response. Such operation allows responses that contain logs from the device to be parsed by each job that could be waiting for an action to be completed within the end-device. Such also would allow unsolicited messages to be parsed by the IMA code and then later associated with any possible jobs, as determined by the IMA, all in accordance with the present subject matter.

While most operations will not require this, the AMS meters will support chaining a series of EPSEM messages, such as multiple table reads and writes in a single request. This is functionality that is required in the C12.22 specification, and will assist in improving the efficiency of the system, as it avoids the overhead of sending a separate message for each EPSEM command. AMS enabled devices will process each request sequentially, allowing a series of operations to be handled in a single command, each building on the next, such that a read subsequent to a write would reflect the results of the request write. If a command in an EPSEM chain cannot be completed, remaining commands in the chain are rejected with appropriate error messages, per the present subject matter.

When a respective device receives a request, it evaluates the multi-cast address specified. If the device is a member of the multicast group, it responds to the request; otherwise, it discards it. Membership in different multicast groups is determined via use of C12.22 standard table 122.

On-demand reading per the present subject matter is similar to the Daily Meter Data Acquisition Process; however, rather than sending a broadcast or multicast request, the on-demand reading process in accordance with the present subject matter communicates directly to desired respective meters. Such process begins with a user initiated an on-demand read through an AMS User Interface, or through a web services call from an upstream system. Per the present subject matter, an orchestration layer of the Collection Engine 390 begins by evaluating the current system load of the communications substrate through which the respective device is connected. Requests for an on-demand read from a saturated cell may be rejected.

Once Collection Engine 390 determines that the request can be honored, it selects per the present subject matter an appropriate communication server within the Collection Engine, and submits the command to retrieve data from the device and return it. The communications server forms a C12.22 table read request, encrypts it, and sends it to the device directly, if IP connected, or to Cell Relay 302 for RF LAN connected devices. In cases where traffic flows through the RF LAN, the Cell Relay software retrieves the message from the IP backhaul 380, and evaluates the message. The destination address (in C12.22 terminology, the called ApTitle) may be stripped off to save bandwidth on the network, relying instead on the underlying RF LAN addressing scheme for delivering the message. The Cell Relay software must also examine whether the destination ApTitle is still valid within the cell. If the destination ApTitle is no longer valid, the Cell Relay rejects the message, returning an error packet to the Collection Engine. Provided that the destination is still valid, the Cell Relay software sends the message to the device across the RF LAN, per the present subject matter.

A protocol stack for the RF LAN advantageously takes the message and constructs a node path for the message to take before actually transmitting the packet. Such pre-constructed node path allows Cell Relay 302 per the present subject matter to push a message down through the tree of the cell without creating redundant radio messages. If Collection Engine 390 wants to do an on-demand read to meter 356, it starts by sending the message to Cell Relay 302. Cell Relay 302 in turn sends out a transmission that will be heard by both respective meters 310 and 320 (in the exemplary configuration of present FIG. 3C). Meter 320 could go ahead and retransmit the message, but this wouldn't get the message to meter 356. Instead, it would simply waste bandwidth. With the node path provided to by the RF LAN protocol stack, meters 310 and 320 will hear the message, but per the present subject matter only meter 310 will retransmit the message. The retransmitted message of meter 310 will be heard by both meters 330 and 332, but only meter 332 will be in the node path, again meaning other parts of the cell (such as meters 350 and 352) won't receive a message that would be useless to them. Both meters 354 and 356 will hear the message, but it is only addressed to meter 356. As such, meter 354, per the present subject matter, will simply ignore it.

Once the message is received at the subject (i.e., intended) meter, whether via RF LAN or via IP, such meter must unpack the request and act on it. The communications module within the device will pull the C12.22 message off the network substrate and provide it to the Register Board 220 (FIG. 3B). Register Board 220 will decrypt the message based on shared keys, and then respond to the request, encrypting it and returning it to the calling ApTitle. In the case of the RF LAN, the message is simply forwarded to the next layer up in the cell. Messages are forwarded from one layer to the next until they finally reach Cell Relay 302, which relays it across the IP backhaul 380 to the communications server that initiated the transaction.

Figure 3D:
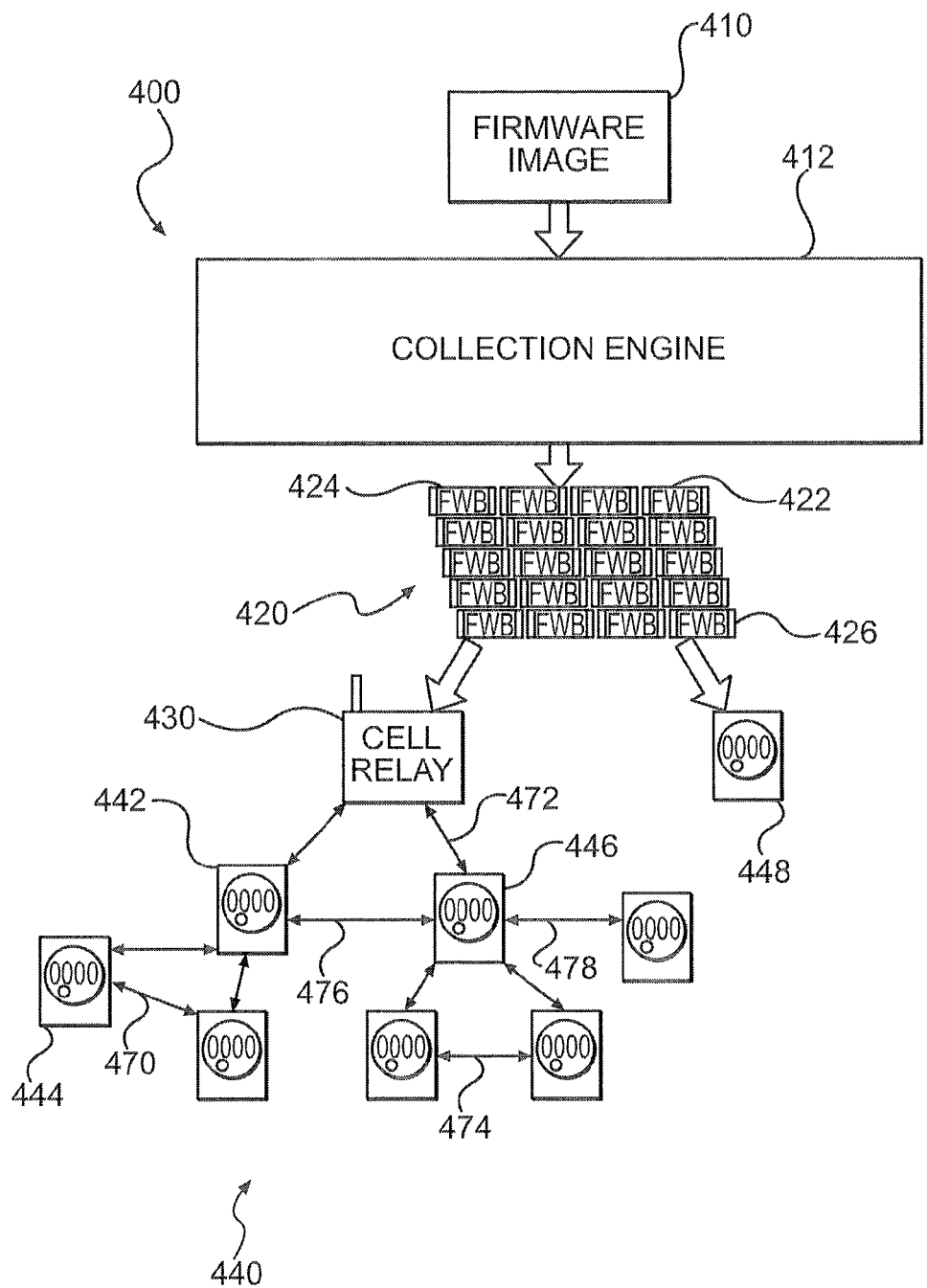
FIG. 3D schematically illustrates an exemplary methodology and corresponding apparatus for transmitting firmware to end devices in accordance with the present subject matter.

FIG. 3D schematically illustrates an exemplary configuration (representing both methodology and apparatus) for implementing one or more firmware downloads in accordance with the present technology. While for exemplary purposes, most of the discussion herewith refers to such firmware downloads as new or upgraded firmware, it is to be understood that the present subject matter is equally applicable to, and fully encompasses, any firmware downloads, regardless of their characterization. For example, it might be due to particular circumstances and/or needs that the firmware to be downloaded for or to a particular device is a return to a previous version of firmware for such device. As another example, it might be that the firmware download for a particular device is regarded as being the same version of firmware, or a corrected version thereof, presently resident and operating with such device, as a technique for in effect rebooting the device, or otherwise correcting some corrupted subject matter. All of such variations in the actual constitution and characterization of the nature and/or reasons for the subject downloads, are intended to come within in the spirit and scope of the present subject matter.

When new or upgraded firmware is to be installed within a system 400, an image 410 of the firmware to be downloaded will be provided to an Advanced Metering System (AMS) Collection Engine 412 as a binary image file. Further discussion of Collection Engine 412 is included herewith but for the present it is noted that Collection Engine 412 is responsible for breaking up the single binary image into a series 420 of discrete blocks 422 that can be distributed across a communications arrangement such as an RF LAN, or other media. In an exemplary embodiment, an ANSI C12.22 compliant media may be used. Such blocks 422 will contain a hash or checksum for the block itself to verify the block's integrity, as well as a block identifier, which is represented in FIG. 3D by the leading and trailing spaces 424 and 426, respectively.

In general, when transferring blocks, each broken down, discrete block 422 is in its entirety preferably written into a record in a manufacturer's table for firmware images. End devices 440 are configured to evaluate such blocks 422 to determine their discrete integrity by using their block level hashes. The end devices can also validate that such blocks 422 are assembled (that is, reassembled) into the correct order. Finally, each end device is able to evaluate the integrity of the overall image by evaluating the CRC (Cyclic Redundancy Check) or hash for the entire image.

The basic present process for transferring firmware image blocks 422 involves in part functionality that is similar to that used for reading data from meters. A broadcast containing the image blocks 422 is sent to meters 440. Meters 440 indicate, in a manner described further herein, that they have successfully received the image blocks 422. Meters that don't respond are retried in a recovery process to make up for any failures. Because of the critical nature of firmware images, and the large number of blocks involved, some additional control and feedback mechanisms may be desired in some instances, to logistically handle the volume of traffic.

Managing the transport of firmware blocks 422 in an environment which encounters or involves unreliable media becomes critical when transferring firmware images. In an exemplary configuration, a 384 k byte firmware image broken into 64 byte blocks will require 6,144 blocks to be transferred completely successfully before it can be loaded. When transferring blocks across an RF LAN, for example, it is relatively likely that at least one node within a given cell will fail to successfully receive a block. Such circumstances are presently addressed in two key manners. First, it is important that blocks be able to be transmitted and received in any order. Second, depending on the practical reliability of the underlying network, in accordance with present subject matter, it may in some instances be practiced to broadcast a given block several times before resorting to point-to-point transfers of image blocks. In an exemplary configuration, it has been found that upper level systems, that is the Collection Engine 412 and/or a cell relay 430, should preferably transmit the firmware image at least twice, and in some instances three or four times, before resorting to point-to-point transfer of image blocks.

With further reference to FIG. 3D, a firmware download process begins with the Collection Engine 412 sending out a broadcast message to all target nodes, calling a manufacturer's stored procedure or writing to a manufacturer's table in the device. In such context, a target node may correspond to an end device such as meter 448, cell relay 430, or meters 440 including representative meters 442, 444, and 446. Such command indicates to the device the number of firmware blocks it should expect to receive, and that it should now be in firmware download mode.

When in such firmware download mode, the device will report the number of blocks it has successfully received as part of any daily read requests. Additionally, being placed in firmware download mode resets to zero a block counter of such device. Moreover, the command includes instructions to the end devices indicating that no direct acknowledgements on the part of the meters should be made. Rather, devices acknowledge such command by reporting their success count as part of the next interrogation cycle.

Collection Engine 412 is responsible for evaluating, based on the presence of the firmware block success count, whether all of the targeted nodes have successfully entered firmware download mode. Nodes that have not switched to firmware download mode eventually are then individually contacted by the Collection Engine 412.

Once the target nodes are in firmware download mode, Collection Engine 412 will begin broadcasting firmware blocks 422 to the target nodes 440. As an alternative to transmission of the firmware blocks 422 exclusively by Collection Engine 412, it may be desirable to transfer the firmware image 410 to the cell relays 430 and then send a command to instruct them to broadcast the firmware image 410 within their respective cell. Such alternative method would be one approach to reducing public carrier back-haul costs and to allowing cell relays to better manage bandwidth within their cells.

Completion of the broadcast transfers is a process that may take several days, or even weeks, depending on whether it is being done in conjunction with other operations, In any event, after such completion, Collection Engine 412 begins evaluating the block success count of each of the target nodes. When a node has a complete set of blocks, it will record a special event in the meter history log indicating such successful completion. Most nodes should have a complete set of blocks once the broadcast transfers are complete. Nodes that are still missing blocks will need to have them transferred point-to-point. Nodes that have excessive missing blocks after the broadcast process is complete may be flagged for possible maintenance or replacement as being potentially defective.

To facilitate point-to-point transfers, Collection Engine 412 will call a second stored procedure in the device. Such second procedure, a manufacturer's stored procedure, will provide a list of missing blocks, by block number. In an exemplary embodiment, the block list will include a predetermined maximum number of blocks, and a status byte indicating whether there is more than the predetermined number of blocks missing. For example, the predetermined maximum number of blocks may be set to twenty blocks. In using such method, most meters will receive all blocks and will not need to report on individual blocks; however, those meters that are missing blocks can be interrogated for a manifest of what they still require.

Collection Engine 412 will use such missing block data provided by the respective meter 440 to perform point-to-point block transfers. Meter nodes that cannot be contacted will be reported to the system operator. Once the point-to-point retries have been completed, the devices can be instructed to enable the new firmware. The command to activate the firmware may correspond to a C12.22 manufacturer's stored procedure. If a date and time is specified, the device will activate the firmware at the specified date and time. If no date and time is provided, the device normally will be set to activate the firmware download on an immediate basis.

Successful firmware activation can involve two additional aspects. First, selected metrology devices, i.e., meters, may employ not just one, but a plurality of images related to different aspects of the device's operation. In an exemplary configuration, at least three separate firmware images may be employed: one for the meter register board, another for a neighborhood local area network (LAN) microprocessor, and a third for a home area network (HAN) processor. In a more specific exemplary configuration, the neighborhood local area network microprocessor may correspond to an RF LAN microprocessor while the home area network processor may correspond to a Zigbee processor. Each of such components will have its own firmware image that may need to be updated. Additionally, over the course of time, new metrology device versions which require different firmware may be incorporated into existing systems. In such case, a given cell may have a mixture of devices with different firmware needs. For example, the Zigbee protocol may be used for communicating with gas meters, in-home displays, load-control relays, and home thermostats.

Figure 3E:
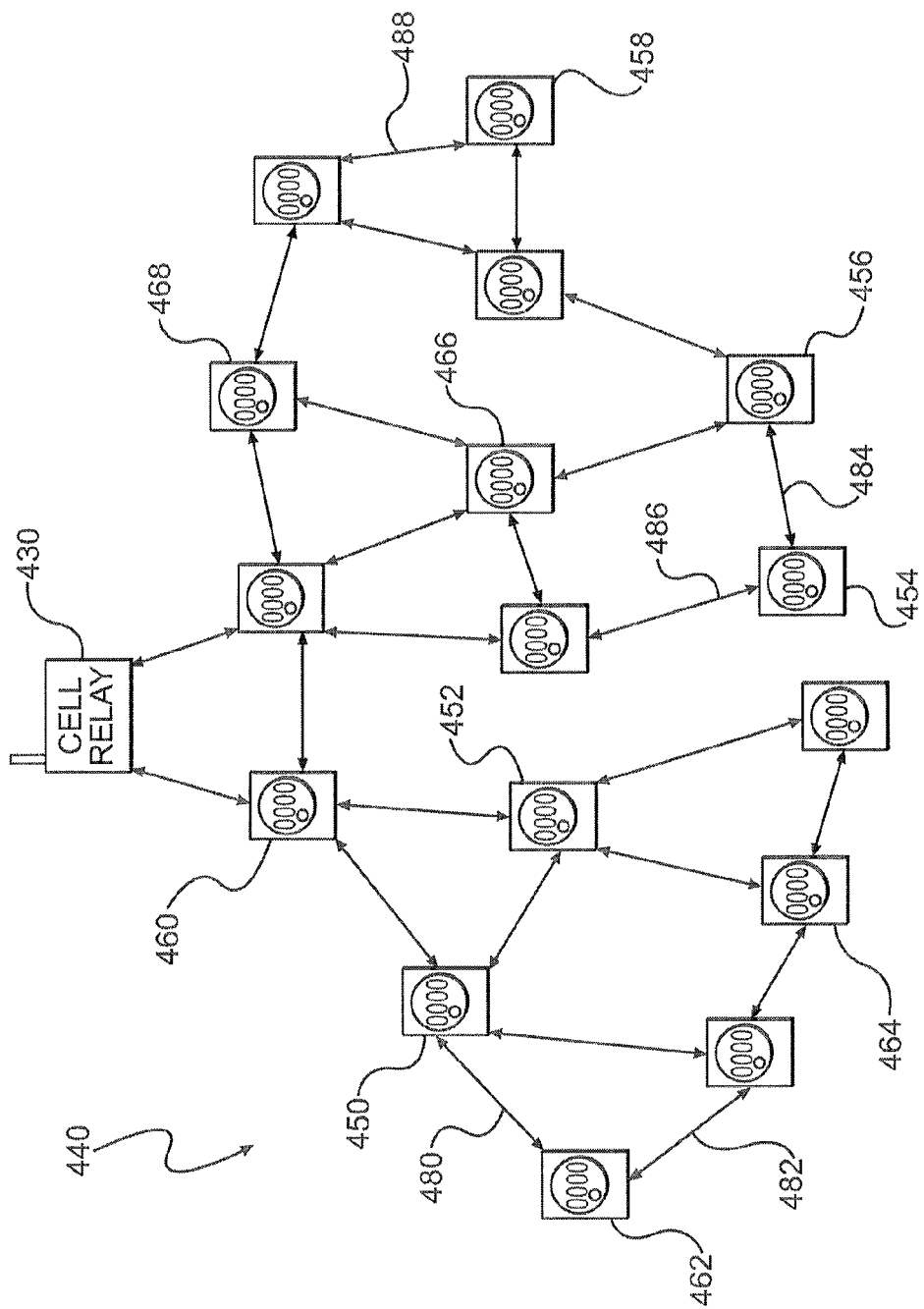
FIG. 3E schematically illustrates an exemplary methodology and corresponding apparatus for transmitting differing firmware images to selected end devices.

With reference presently to FIG. 3E, there is illustrated and represented an exemplary methodology (and corresponding apparatus) for transmitting differing firmware images to selected end devices. As illustrated in FIG. 3E, for the general group of meters 440 illustrated, a first subset of such meters illustrated with a white background (and generally represented by meters 460, 462, 464, 466, and 468) support one firmware image, while a second subset of generally illustrated meters 440 illustrated with a grey background (and generally represented by meters 450, 452, 454, 456, and 458) support another firmware image. As a result, while meters 462, 464 are under meters 450, 452 in the cell network hierarchy (or tree) and may be able to exchange firmware images with each other, the only way meters 462, 464 can receive their firmware is through meters 450, 452, which in the present example are of another device type.

In order to handle such exemplary circumstances as represented in present FIG. 3E, the firmware image distribution system is independent of the actual device for which the firmware is intended. Put another way, when an image is delivered to cell relay 430 and distributed over the RF LAN, it is distributed to all of the members of the cell that match the broadcast or multicast address used, regardless of whether the image is compatible with their particular hardware. This means that in accordance with the present technology, cell members act as hosts for the firmware. In order to update both types of meters (per the present representative example), two firmware updates will need to be distributed. Firmware will be transferred first to meters of the first subset (generally represented by meters 460, 462, 464, 466, and 468), and then activated. Secondly, firmware will be transferred to meters of the second subset (generally represented by meters 450, 452, 454, 456, and 458), and then activated. Such same mechanism can be used to download separate firmware images for individual microprocessors within the end node, as needed on a case-by-case basis per a specific implementation of the present subject matter.

Advantageously, in accordance with the present subject matter, the firmware activation code not only evaluates the integrity of the individual blocks and the overall firmware image, but it also checks whether the image is applicable to its actual hardware and for which hardware it is targeted. In general, the activation command will be sent only to the appropriate devices by using a multicast group associated with the device class. Nevertheless, checking that the image is compatible with the end device is an appropriate safeguard practiced in some embodiments in accordance with present subject matter.

With reference again to both FIGS. 3D and 3E, it will be observed that the various meters or nodes 440 are illustrated as being connected to one another by double-headed arrow lines (representatively illustrated at 470, 472, 474, 476, and 478 in FIG. 3D, and at 480, 482, 484, 486, and 488 in FIG. 3E). Such interconnections schematically illustrate a self generated network formed by the meters 440 themselves per the present subject matter, in concert with each other and cell relay 430 as the individual meters 440 are activated. Because each of the respective meters 440 is self contained with respect to the RF LAN formed, an opportunity exists to distribute upgrade software (firmware) among the various meters on a viral peer-to-peer basis.

In such foregoing viral peer-to-peer model, a firmware image may be delivered to exemplary cell relay 430. From there, Collection Engine 412 preferably may send a stored procedure command to cell relay 430, indicating that it should distribute such firmware image to the RF LAN. Collection Engine 412 also sends a command to the meter nodes within the cell using a broadcast or multicast message, instructing them that a new firmware image is available. Once such command is received, cell relay 430 makes the firmware available to its local RF LAN processor. Per the present subject matter, meter nodes 440 within such cell instruct their RF LAN processors to begin looking for blocks. At such point, the RF LAN processors take over the block transfer process. Again, per previously discussed present methodology, such blocks 422 may be sent in any order.

Such presently disclosed viral-type distribution mechanism may be very powerful and very efficient in that it may be able to make better use of the available physical bandwidth. Under such present viral peer-to-peer arrangement, individual meter nodes 440 can grab firmware images or portions of firmware images, from their immediate neighbors or parents, rather than needing to get the data directly from cell relay 430 or Collection Engine 412. As a result, one portion of the cell could be exchanging firmware blocks while another portion of the cell could be passing various messages between meter nodes 140 and cell relay 130, all without impacting each other.

Figure 3F:
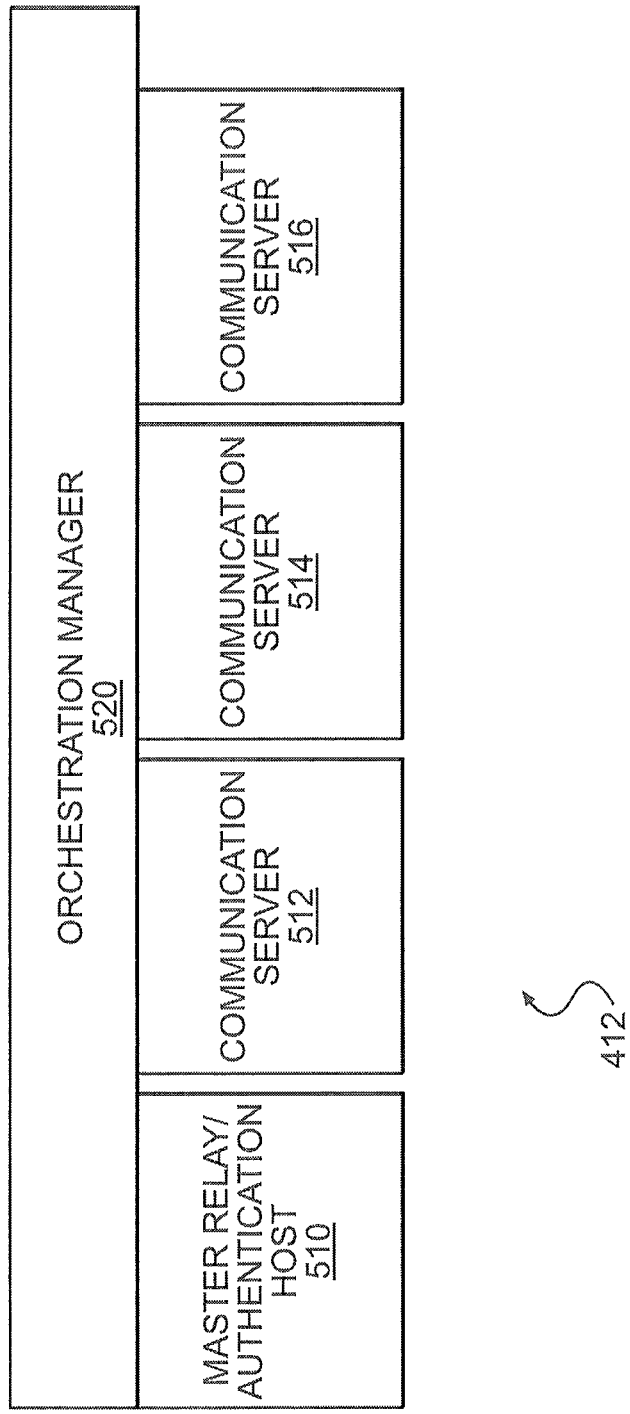
FIG. 3F illustrates a block diagram of the components of a Collection Engine in accordance with an exemplary embodiment of the present subject matter.

With reference to FIG. 3F, there is illustrated a block diagram representation of exemplary components of Collection Engine 412 in accordance with an exemplary embodiment of the present subject matter. Collection Engine 412 is a collection of software-based functionality which provides ANSI C12.22 services to the devices that comprise the C12.22 network, including one or more cell relays 430 as well as the metrology and end devices 440. Though such components are preferably software-based, those of ordinary skill in the art will appreciate various equivalent forms of implementation, providing the same functionality. Conceptually, Collection Engine 412 is comprised of three major components, the Orchestration System or Manager generally 520, the Master Relay/Authentication Host 510, and the communications server or servers (represented by illustrated components 512, 514, and 516). Collection Engine 412 is implemented preferably so as to be able to distribute work across multiple servers 512, 514, and 516 in order to facilitate scaling.

Within a C12.22 system, the Master Relay 510 is the coordinating process for the overall system. In order to send or receive C12.22 messages, respective nodes 440 must be registered with the Master Relay. However, before a respective node is allowed to register, it must be authenticated. The Authentication Host provides such functionality in the present exemplary embodiment. The Master Relay or station is responsible for the actual meter data acquisition process, communicating with the meter via C12.22 messages.

As will be understood by those of ordinary skill in the art, each of the respective major components of Collection Engine 412 is in turn made up of a series of smaller components and functionality feature sets. The Orchestration Manager or layer 520 provides coordination between such components, and presents a unified, single API (Application Layer Interface) to upstream systems. The Orchestration Manager or system 520 runs as a single master orchestration service (or functionality) and as a series of agents. Each separate physical server will have an orchestration agent to tie it into the larger system. API requests are directed to a master orchestration service (or functionality) which in turn works with the orchestration agents to ensure that requested work or methodology is performed or executed.

The Master Relay/Authentication Host 510 will provide standard C12.22 registration services/functionality as well as integrated C12.22 network authentication functionality/services. One vision for the C12.22 protocol is that, similar to DNS (Domain Name Servers), a C12.22 master relay may be created which would be shared between multiple utilities, perhaps providing services to an entire region or country. With such approach in mind, implementation of a master relay in accordance with present technology should provide full support for the use of other authentication hosts, and for sending notification messages to registered hosts. Additionally, the Orchestration Manager or layer 520 is preferably implemented so as to be able to receive notifications from master relays from other manufacturers, meaning that an implementation of the present subject matter could be realized employing a master relay from an outside source.

The representative Communications Servers 512, 514, and 516 provide communication functionality with devices, such as to parse and translate such communications, and post or return data as necessary. Communication Servers 512, 514, and 516 thus preferably may comprise a series of services/functionality to accomplish such overall functionality per the present subject matter. Within Communications Servers 512, 514, and 516 are a series of major components: a meter communications host, a data spooler, and an exception event manager. The meter communications host is responsible for listening for network communications and sending network communications. It is the component that both "speaks" C12.22 and "interprets" C12.19 table data. The data spooler and the exception event manager provide mechanisms for streaming meter data and exception events, respectively, to upstream systems.

Figure 4:
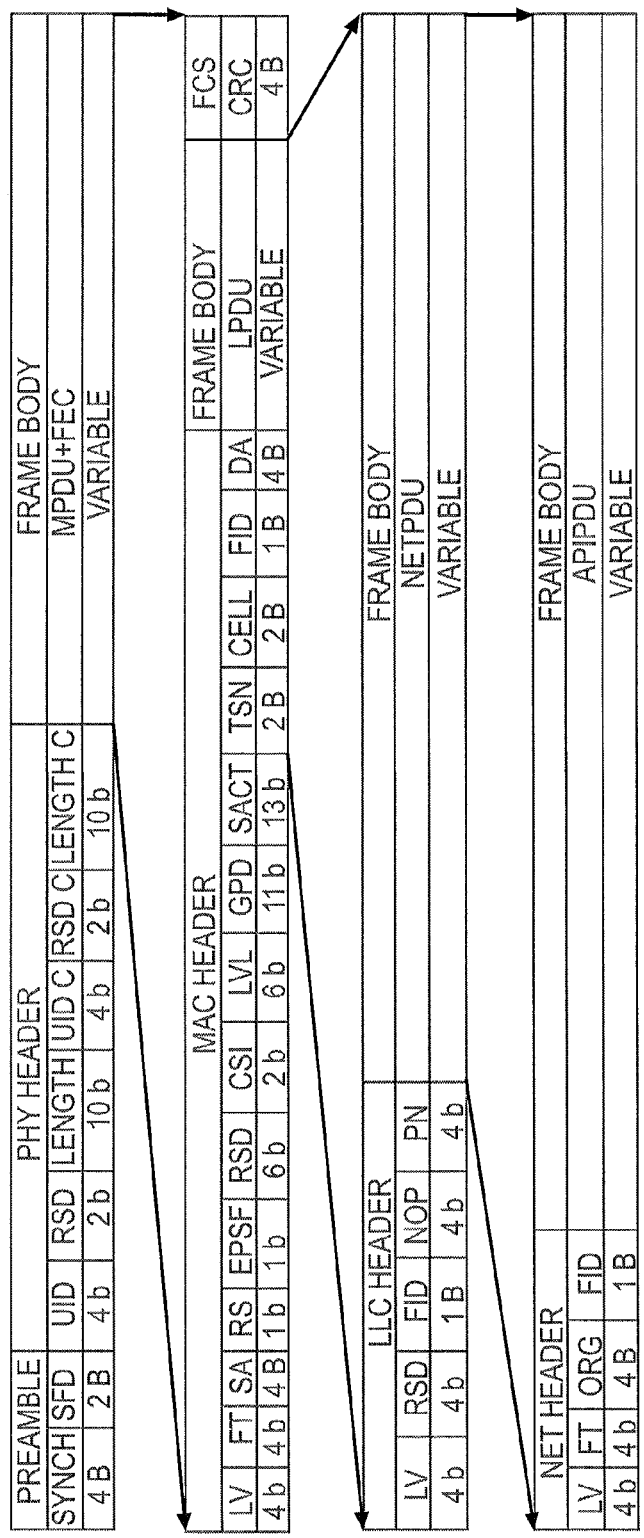
FIG. 4 depicts ENTIRE PRESENT SUBJECT MATTER FRAME FOR AN UPLINK MESSAGE subject matter.

FIG. 4 shows per present subject matter an example of an entire frame of the subject protocol for an uplink message, that is, data messages sent from a synchronized endpoint to a cell relay. Each field is explained herein per the frame description section for each respective layer.

Per the present subject matter, there are several proposed physical layers. All use Frequency Hopping Spread Spectrum technique. Each one of them is intended to be used for a specific market location (such as either for North America or for Europe) and inside a specific band, and follows the regional or local required regulations.

The physical layer termed PHY-FHSS-NA-915 is intended to be used in the 902-928 MHz ISM band in North America. It complies with pertinent FCC regulations, namely parts 15.35, 15.205, 15.209, and 15.247, and in a preferred embodiment may encompass 52 channels. Other particulars of the transmitter and receiver specifications for such 915 MHz Band, for North America, as well as the channel allocations thereof, are well known to those of ordinary skill in the art from the pertinent regulations, without requiring additional discussion herewith.

The physical layer termed PIY-FHSS-NA-2400 is intended to be used in the 2.4 GHz ISM band in North America. It complies with pertinent FCC regulations, namely parts 15.35, 15.209, 15.247 and 15.249, and in a preferred embodiment may encompass 16 channels. Other particulars of the transmitter and receiver specifications for such 2.4 GHz Band, for North America, as well as the channel allocations thereof, are also well known to those of ordinary skill in the art from the pertinent regulations, without requiring additional discussion herewith.

The physical layer termed PHY-FHSS-EU-868 is intended to be used in the 868 MHz ISM band in the European Union. It complies with pertinent ETSI regulations, namely sections 300 220 and ERC 70-03. Other particulars of the transmitter and receiver specifications for such 868 MHz ISM band in the European Union are also well known to those of ordinary skill in the art from the pertinent regulations, without requiring additional discussion herewith.

The physical layer termed PHY-FHSS-EU-2400 is intended to be used in the 2.4 GHz ISM band in the European Union. It complies with pertinent ETSI regulations, namely sections ETSI 300 228 and ERC 70-03, and in a preferred embodiment may encompass 16 channels. Other particulars of the transmitter and receiver specifications for such 2.4 GHz ISM band in the European Union are also well known to those of ordinary skill in the art from the pertinent regulations, without requiring additional discussion herewith.

With reference to the PHY Layer, this describes the adjustable (that is, "tweakable") parameters of such PHY layer. For PHY_Synch_Length: The length in bits of the Synch field, the synchronization bit sequence of the PPDU. For PHY_SFD_Value: The value of the SFD field of the PPDU. This value should be chosen with appropriate auto-correlation properties to enable a reliable start of frame detection. The recommended values are given in the following table. The most significant bit of PHY_SFD_Value is sent first on the air interface, just after the preamble. These SFD values have sufficient orthogonality to be used with the purpose of isolating several coexisting networks. For PHY_RSSI_Average_Time: The averaging time to perform the RSSI reading.

| Value Number | PHY_SFD_Value |
|---|---|
| 1 (default) | 0xB127 |
| 2 | 0x9363 |
| 3 | 0x263D |
| 4 | 0x23E5 |
| 5 | 0x0BCD |
| 6 | 0x871B |
| 7 | 0x19A7 |
| 8 | 0x94F8 |
| 9 | 0x1A67 |
| 10 | 0x25E3 |
| 11 | 0x8DD2 |
| 12 | 0x1CB6 |
| 13 | 0x895B |
| 14 | 0x26F1 |
| 15 | 0x258F |
| 16 | 0x2C76 |

PHY Parameter Default Values may be preferably regarded as follows. For PHY_Synch_Length: 32 bytes; for PHY_SFD_Value: 0xB127 (with the most significant bit being the first sent on the air interface); and for PHY_RSSI_Average_Time: 1 ms.

As far as medium access parameters, time and frequency divisions are managed with the use of the Slotted Aloha technique (details of which are well known to those of ordinary skill in the art). Time is generally divided into identical Time Slots (TS) and at each change of TS (Time Slot), the frequency hops from one channel to another channel according to a frequency hopping sequence. MAC layer is in charge of synchronization. Since typically traffic at any point in time is low, Slotted Aloha technique is an appropriate selection. Each meter is by default in receiver mode and pushes data on the medium when it wants to speak. Such method generally may be producing a relative number of collisions but, in normal operating conditions, internal collisions are expected to be lower than collisions due to the noisy environment of ISM bands. However, the present protocol intentionally manages repetitions to compensate for such phenomenon.

The physical layer can give to the layers above it a snapshot of the link quality between the endpoint and the sender of the message. The physical layer does this by measuring the Received Signal Strength Indicator (RSSI) during the message reception. Such reading is processed during the reception of the synchronization bits, which are an alternating zero-one sequence. This is an average reading over PHY_RSSI_Average_Time ms. When the physical layer detects the Start Frame Delimiter, it stops the reading of RSSI and saves the value to give it later to the MAC layer together with the received message.

The RSSI is also a measurement of the interference level on a given channel when used outside the reception of a present protocol network message. This is used for instance in the environment analysis processes.

In all cases, the RSSI value sent to the MAC layer by the physical layer is preferably not a mere reading of the RSSI register of a transceiver chipset. The value is preferably processed to reflect the actual power level of the incoming signal, that is, LNA gain and filter insertion losses should be taken into account in the RSSI value forwarded to the MAC layer.

The RSSI is formatted as a single signed byte. The value is given in dBm. Its theoretical range is therefore from −128 dBm to +127 dBm.

Data is preferably transmitted in the little endian format (Least Significant Bit first). Bit ordering is also done with the least significant bit first.

The Forward Error Correction (FEC) used by the physical layer is an interleaved Reed-Solomon (38,28) code with symbols in Galois Field (GF)(256). The steps for encoding are:
  If the MPDU length is greater than 28 bytes, divide the MPDU in N 28-byte blocks. If the MPDU length is not a multiple of 28, the last block will be shorter.
  For each one of these blocks, compute the 10 redundancy bytes with the RS (38.28) code. If necessary, the last block is zero padded to allow the use of the same computation algorithm for all the blocks.
  Write the data blocks and the redundancy bytes in the interleave table. Each block occupies a row in this table.
  Build the LPDU starting from the first column of the interleave table and finishing with the last one. The zeros introduced in the last block serve the purpose of encoding only, they are not sent on the air interface. The length field of the PHY header includes the FEC but doesn't include the zero padding, it is computed with Length=38*$N$−(number of zeros added in block $N$)

Figure 5:
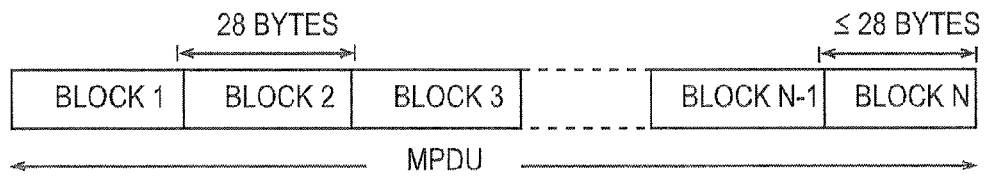
FIG. 5 depicts DATA BLOCKS FOR FEC ENCODING/DECODING subject matter.

FIG. 5 illustrates the fragmentation of the MPDU into blocks prior to Reed-Solomon encoding; in other words, FIG. 5 shows data blocks for FEC encoding/decoding.

Figure 6:
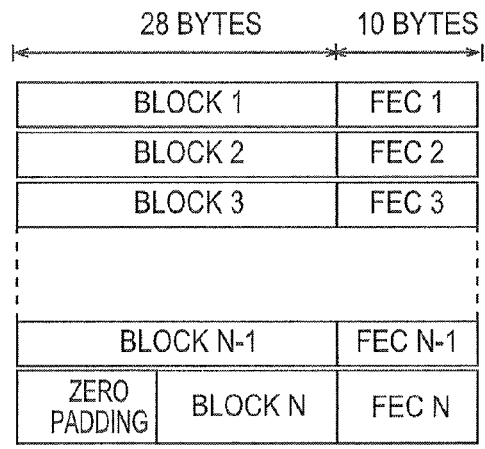
FIG. 6 depicts INTERLEAVE TABLE FOR FEC ENCODING/DECODING subject matter.
Figure 7:
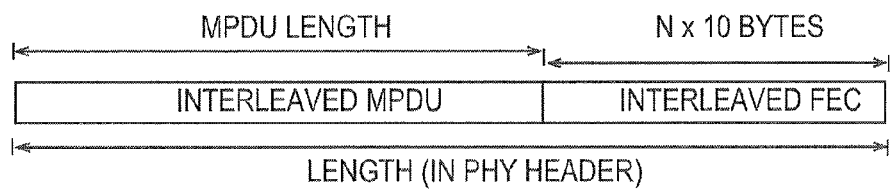
FIG. 7 depicts MPDU AFTER INTERLEAVING AND REED-SOLOMON ENCODING subject matter.

FIG. 6 shows a present exemplary interleave table structure for FEC encoding/decoding. Such interleaving is done bytewise, that is, the first byte of block 1 is sent, then the first byte of block 2. Such operation is continued until the last FEC byte is sent. After such Reed-Solomon encoding and interleaving, the redundancy bytes are at the end of the frame as shown per present FIG. 7.

The steps for decoding are the same as for such encoding but in reverse order:
  Fill in the interleave table beginning with the first column. From the length field of the PHY header and the block size, it is possible to know where zero padding needs to be inserted.
  For each row in the interleave table, correct the errors with the RS (38,28) code.
  Strip off the FEC and reassemble the MPDU.

The Reed-Solomon coding preferably used in the present protocol is an RS (38,28) code. It is a shortened version of an RS (255,245) code with symbols in GF (256). This means that the symbols of the code are bytes and that for each block of 28 bytes, there are appended 10 additional redundancy bytes. This code has a Hamming distance of 11 and allows the correction of 5 erroneous bytes per block.

More particularly, each byte of the message is considered as an element of GF (256). Reference herein to such elements will be as symbols. All the operations made with such symbols (addition, subtraction, multiplication and division) should be made according to the additive and multiplicative laws of the Galois field GF (256), constructed with the primitive polynomial $p(x)=x^8+x^7+x^2+x+1$. A symbol of GF (256) has several useful representations: a binary representation $\{b_7 b_6 b_5 b_4 b_3 b_2 b_1 b_0\}$, a polynomial representation $b_7\alpha^7+b_6\alpha^6+b_5\alpha^5+b_4\alpha^4+b_3\alpha^3+b_2\alpha^2+b_1\alpha+b_0$ and an exponential representation $\alpha^m$. In the last two representations, $\alpha$ is a primitive element such that $p(\alpha)=0$. The binary or polynomial representation is useful for addition and the exponential representation is useful for multiplication. All GF(256) elements, except zero, have an exponential representation, the complete field can written as the set GF(256)=$\{0, 1, \alpha, \alpha^2, \alpha^3, \ldots, \alpha^{253}, \alpha^{254}\}$. The conversion between the two representations is done with a look-up table. For the implementation of the encoder/decoder, it is necessary to add and multiply the symbols in GF(256). Addition is readily performed with the binary or polynomial representation of the symbols. The operation is equivalent to a modulo 2 addition of each bit, for instance 0010 1100+1000 1111=1010 0011

Multiplication is relatively more difficult because a conversion to the exponential form of the symbol is necessary. A look-up table is preferably used for such purpose. As an example, the following a multiplication of the two symbols of the previous example 0010 1100×1000 1111

The first symbol (44) has the exponential representation $\alpha^{190}$, the second symbol (143) has the exponential representation $\alpha^{90}$. The product is $\alpha^{190}\alpha^{90}=\alpha^{280}=\alpha^{255+25}=\alpha^{25}$ because $\alpha^{255}=1$. Such table can be used in the other way to convert the result in binary form and obtain 44*143=226.

With reference to the present Reed-Solomon Encoder as preferably implemented in accordance with present subject matter, conforming to the established convention in coding theory, one would use here the polynomial representation for the messages. That means that the present 28-symbol data block, $\{u_{27},u_{26},u_{25}, \ldots u_1,u_0\}$, can be written $u(x)=u_{27}x^{27}+u_{26}x^{26}+ \ldots +u_3x^3+u_2x^2+u_1x+u_0$. The symbol $u_{27}$ is the first symbol written in the interleave table, which is filled from left to right. The 38-symbol code word (message+redundancy symbols) can be written $c(x)=c_{37}x^{37}+c_{36}x^{36}+ \ldots +c_3x^3+c_2x^2+c_1x+c_0$. The Reed-Solomon encoding process is equivalent to a division of the message by a generator polynomial $G(x)$. This can be implemented with a linear feedback shift register as shown in present FIG. 8. This is similar to, but different from a conventional CRC encoder. The difference is that in the present subject matter each multiplication by a coefficient and each addition has to be understood as multiplication and addition in GF (256).

In the shift register implementation represented in present FIG. 8, the $g_i$ are elements of GF (256). The shift register is first initialized with zeros. The symbols of the message are then shifted into the register, beginning with $u_{27}$ and finishing with $u_0$. After the whole data block has been pushed into the shift register, the content of the register is the remainder of the division. These symbols are the FEC symbols and they are appended to the initial message in the following way $\{u_{27},u_{26},u_{25}, \ldots u_1,u_0,p_9,p_8,p_7,p_6,p_5,p_4,p_3,p_2,p_1,p_0\}$ As with conventional CRC computing, the multiplicative factors in the shift register are given by the coefficients of a polynomial:

$G(x)=g_0+g_1x+g_2x^2+g_3x^3+g_4x^4+g_5x^5+g_6x^6+g_7x^7+g_8x^8+g_9x^9+x^{10}$

In our case this polynomial is:

$G(x)=(x-\alpha)(x-\alpha^2)(x-\alpha^3)(x-\alpha^4)(x-\alpha^5)(x-\alpha^6)(x-\alpha^7)(x-\alpha^8)(x-\alpha^9)(x-\alpha^{10})$ Once such polynomial is developed to find the gi coefficients, the result is $G(x)=\alpha^{55}+\alpha^{120}x+\alpha^{57}x^2+\alpha^{126}x^3+\alpha^{136}x^4+\alpha^{198}x^5+\alpha^{125}x^6+\alpha^{104}x^7+\alpha^{24}x^8+\alpha^{76}x^9+x^{10}$ The first step of the Reed-Solomon decoding process is the syndrome computation. For a 38-byte received block, 10 syndromes are preferably computed. If the received message is $\{r_{37},r_{36}, \ldots r_2,r_1,r_0\}$, the following polynomial representation applies:

$R(x)=r_{37}x^{37}+r_{36}x^{36}+ \ldots +r_1x+r_0$

The 10 syndromes $\{S_1,S_2,\ldots,S_{10}\}$ will be computed with $R(x)$ as shown below:

$S_i=R(\alpha^i)$, for $1 \leq i \leq 10$

If the 10 syndromes are equal to zero, there is no detectable error in the message and the decoding process stops here. There is of course a possibility for an undetectable error but preferably this will be detected later by the CRC.

The second step of the Reed-Solomon decoding process is the computation of the error locator polynomial. This polynomial has the following form:

$ELP(x)=1+ELP_1x+ELP_2x^2+ \ldots ELP_\nu x^\nu$, $\nu \leq 5$

The degree of such polynomial is not known beforehand because it depends on the number of errors in the received message. To compute the coefficients of $ELP(x)$, an iterative algorithm is used, the Berlekamp-Massey algorithm. A pseudo-code description of such algorithm is as follows:

```
Input: S₁, S₂, ... , S₁₀           (the syndromes)
Initialization:
        Len=0
        ELP(x)=1                    (the current error locator polynominal)
        PELP(x)=1                   (the previous error locator polynominal)
        j=1
        dₘ=1                        (the previous discrepancy)
for k=1 to 10

(compute discrepancy)
        d = Sₖ + Σᵢ₌₁^Len ELPᵢSₖ₋ᵢ if d=0                          (no change in polynominal)
            j=j+1
    else
            if 2Len ≥ k then
                    ELP(x) = ELP(x) − ddₘ⁻¹xʲPELP(x)
                    j=j+1
            else
                    temp(x)=ELP(x)    (temporary storage)
                    ELP(x) = ELP(x) − ddₘ⁻¹xʲPELP(x)
                    Len=k−Len
                    PELP(x)=temp(x)
                    dₘ=d
                    j=1
            end
end
```

Once the error locator polynomial has been computed, the roots of such polynomial are found. To find such roots, ELP (x) is computed for every non zero z in GF (256) until ν roots are found, where ν is the degree of the error locator polynomial. If less than ν roots are found, the errors are uncorrectable and the whole packet must be rejected. The inverse of the roots of ELP(x) are called the error locators. An error locator indicates the position of an error in the message, as follows.

$$ELP(Y) = 0,$$

$$Y \in GF(256) \Rightarrow X = \frac{1}{Y} \text{ is the error locator}$$

$$\Rightarrow \text{if } X = \alpha^k, \text{ the symbol in position } k \text{ is corrupted}$$

As an example, it is found that $ELP(\alpha^{235})=0$, $\alpha^{-235}$ is an error locator. The inverse of $\alpha^{235}$ is computed, which is $\alpha^{-235}=\alpha^{255}\alpha^{-235}=\alpha^{20}$. It is concluded in such exemplary instance that the symbol in position 20 is corrupted, that is, $r_{20}$ in the sequence $\{r_{37}, r_{36}, \ldots r_2, r_1, r_0\}$. At this stage of the decoding process, if the error pattern is correctable, the positions of all corrupted symbols in the block are known. The set of error locators is:

$$\{X_1, X_2, \ldots X_\nu\}, ELP(X_i^{-1})=0$$

One present technique to potentially speed up the computation of the roots of ELP(x) is to try only the elements of GF (256) that will point to errors within the block, that is: $\{1, \alpha^{-1}, \alpha^{-2}, \alpha^{-3}, \ldots, \alpha^{-37}\}$.

The next step preferably per the present subject matter is to correct the errors. Such involves computing the error evaluator polynomial, defined by the following:

$$EEP(x)=S(x)ELP(x)\mod(x^{10})$$

where a new polynomial is introduced whose coefficients are the syndromes $$S(x)=S_1+S_2x+S_3x^2+\ldots+S_{10}x^9$$

The mod $(x^{10})$ in the definition of EEP(x) means that all terms of degree 10 or higher are discarded. It also involves use of a polynomial called the formal derivative of the error locator polynomial, as follows:

$$DER\_ELP(x)=ELP_1+ELP_3x^2+ELP_5x^4$$

The error on the symbol indicated by the error locator $X_k$ is given by $$\text{Error}(k) = \frac{EEP(X_k^{-1})}{DER\_ELP(X_k^{-1})}$$

The corrected symbol is $$\text{New value of symbol} = \text{Old value of symbol} + \text{Error}(k)$$

The format of the physical layer frame is represented by present FIG. 9. The Synch field of the Preamble (see FIG. 9) of the physical layer frame is composed of an alternating zero-one sequence. It is intended to allow the remote receiver to detect the presence of an incoming message and to perform a data clock recovery. It indicates an imminent frame and it is also advantageously used by the receiver to measure the power strength (RSSI) of the received signal.

The Synch field length is given by the PHY layer parameter PHY_Synch_Length. The default value for this parameter is 32 bits (4 bytes).

The Start of Frame Delimiter (SFD) field (see FIG. 9) is two-bytes long. It signals the end of the preamble and the beginning of the PHY header. It has a predefined fixed value given by the PHY layer parameter PHY_SFD_Value. If several networks operated by different utilities coexist in the same area, it is possible per the present subject matter to assign a specific SFD value to each network. As only the packets with the right SFD value are considered, this will prevent an endpoint from processing the packets intended for another network. When used in conjunction with the Utility ID, such feature advantageously increases the possible number of networks coexisting in the same area.

Still further per present features, as an option the SFD detection can be configured per present subject matter to accept the packet if only 15 of the 16 bits match PHY_SFD_Value. When used with FEC, such alternative serves to increase noise immunity per the present subject matter.

With reference to the PHY Header (see FIG. 9), the Utility ID bits allow the distinction of the different utilities that use this protocol at the same location. It advantageously avoids a utility entering into a cell belonging to one of its competitors. When the UID of the packet doesn't match with the UID defined in the endpoint, the received packet is discarded. The subsequent two bits of the packet are preferably reserved, that is, not used initially, to preserve future uses, and should preferably be set to 0.

The Length bits indicate the length of the MPDU, in bytes. When the indicated number of bytes is received, the physical layer (if the outcome of the FEC decoding is a valid packet) indicates the arrival of a complete frame to the MAC layer, which will verify its integrity (CRC). Then the PHY layer, which is by default in receiving mode, looks for the next preamble.

To add some robustness to the PHY header that has no CRC, the fields UID, RSD and Length are preferably complemented bit by bit, per the present subject matter. If the complemented fields don't match with the associated fields, the received packet is discarded.

With reference to the Frame Body (see FIG. 9), the MAC Protocol Data Unit (MPDU) contains all the information required at the MAC layer level. The Frame Body also contained redundant bytes, added according to the FEC algorithm explained hereinabove.

In the description herein of each layer in the document, interface and services with the upper layer are presented in the same way. A figure shows the different interactions between the layers. There are three different flows of information between them, namely, requests, confirmations, and indications. These different internal communications are then explained.

Regarding Requests, Layer-Name_Request-Name, are the services offered by layer to the layer above. When the service is not needed by the layer just above but by the one, two, or three times upper, the in-between layers should forward the service. The user may optionally shortcut the middle layers if desired for particular embodiments.

Regarding Confirmations, Layer-Name_Confirmation-Name, are answers of the requests. Every request has a unique confirmation per the present subject matter. Confirmations are not always sent immediately after a request; it depends on the service. The preferred approach is establish a number to the request and then give the same number when the confirmation is sent, in order to avoid misunderstanding. Note that the number associated to the request need not be correlated to the ID of the frames to send.

Regarding Indications, Layer-Name_Indication-Name, are sent by a layer to the layer above, they are not a response to a request, they usually report an event. The layer that sends an indication doesn't expect any confirmation.

Further with respect to interfacing and services among layers, the physical layer is in charge of sending and receiving radio packets on the medium. Therefore, per present subject matter, by default, the physical layer is in receive mode. As soon a packet is transmitted, the physical layer switches back to the receive mode. Channel changes are preferably requested by the upper layer, the MAC layer. The physical layer also manages the transceiver concerning its communication interface, channel calibration, PLL lock status, RSSI reading, and mode selection. In the transmit (Tx) mode, it computes an FCS (based on RS code) and adds it to the packet; it then adds a physical header (PHY-Header), and a preamble. Finally, it codes and modulates the radio packet at the required rate and frequency. In the Receive (Rx) mode, it listens to the medium until it finds a preamble. As soon as it recognizes the Start of Frame Delimiter at the end of the preamble, it saves the reception time (SACT) and measures the input power strength (RSSI). Then it demodulates and decodes the radio packet. After removing the preamble and the header, it corrects the packet if needed (and if it is possible) and indicates to the MAC layer the arrival of a new message. Dating of the message should be accurate enough to enable the proper operation of the protocol, as otherwise discussed herein with reference to the MAC layer.

The physical layer proposes different services, as represented by FIG. 10.

In conjunction with PHY Requests, referenced as PHY_Request_Send, the objective is to send a packet over the RF link at a specified channel and at given time. The requisite Input arguments are: MPDU, Channel, and Time to send the packet. The operation may be described as follows. The MAC layer requests from the PHY layer to send a packet. The channel is given with the request. The PHY layer sends the packet at the time indicated by the MAC. Timing information can be given by several alternative ways per the present subject matter, which the user is free to decide. As soon as the packet is transmitted, the physical layer switches back to receive mode on the time slot's default channel and confirms to the MAC layer the status of the transmission.

In conjunction with PHY Requests to change channel, referenced as PHY_Request_Change_Channel, the objective is to change the listening channel. The requisite Input arguments are Channel information. The operation may be described as follows. The MAC layer requests from the PHY layer to change the default receiving channel immediately.

In conjunction with PHY Requests to Read an RSSI value, referenced as PHY_Request_Read_RSSI, the objective is to read the RSSI value. There are no requisite Input arguments. The operation may be described as follows. The subject request asks for the PHY layer to read immediately the RSSI instantaneous value on the current channel.

In conjunction with PHY Requests to either start or stop, referenced as PHY_Request_Start_Stop_Rx, the objective is either to Start or Stop listening on the current default channel. The requisite Input arguments are whether to Start or Stop. Such operation may be described as follows. This request asks for the PHY layer to start or stop immediately to listening on the current default channel. Preferably, per present subject matter, the Stop request is mainly used when a power outage is detected to save energy.

In conjunction with PHY Confirmation, referenced as PHY_Confirmation_Send, the objective is the Answer of a PHY_Request_Send. The requisite Output arguments are the Status byte. The operation may be descried as confirming the status of a transmitted message. It can be Send_Ack, PLL_Unlock or any kind of errors.

In conjunction with PHY Change Confirmation, referenced as PHY_Confirmation_Change_Channel; the objective is the Answer of a PHY_Request_Change_Channel. The requisite Output arguments are the Status byte. The operation may be descried as confirming the status of the Change Channel Request. It can be Ack, PLL_Unlock or any kind of errors.

In conjunction with PHY Read Confirmation, referenced as PHY_Confirmation_Read_RSSI, the objective is the Answer of a PHY_Request_Read_RSSI. The requisite Output arguments are RSSI. The operation may be described as the PHY layer returns the current RSSI value. The value is one signed character, expressed in dBm.

In conjunction with PHY Confirmation of Start or Stop Reception, referenced as PHY_Confirmation_Start_Stop_Rx, the objective is the Answer of a PHY_Request_Start_Stop_Rx. The requisite Input arguments are the Status byte. The operation may be described as just confirms if the request has been well performed.

In conjunction with certain PHY Indications, referenced as PHY_Indication_Received, the objective is to Indicate the reception of an incoming packet. The requisite Output arguments are MPDU, SACT, and RSSI. The operation may be described as after the reception of a message, the PHY layer removes its header and gives the MPDU to the MAC layer. The PHY layer also indicated the RSSI measured during the reception and the SACT value (see MAC layer chapter for the definition of the SACT) when the SFD has been captured.

The Data Link layer is divided into two sub-layers, the MAC layer and the LLC layer. The MAC layer has various tasks, by which it organizes data transmission on the RF channels and manages the synchronization.

Specifically, with reference to Cyclic Redundancy Check (CRC), the first role of the MAC layer is to detect errors in the received datagram. Prior to transmission, the MAC layer computes a CRC based on the packet to be transmitted, and it adds them at the end of the packet. Due to that function, at the reception of the packet, the MAC layer has the ability to accept or discard messages depending on the value of the codes.

The second task of the MAC layer is the assembling and disassembling of the datagram. The MAC layer knows what kind of message the meter has received, who has sent (SA) it and for whom it is addressed (DA). Therefore, the MAC layer also performs acknowledgements. When a message is received, an acknowledgement message is transmitted back in the same time slot with an ACK or NACK argument, and with the frame number. This acknowledgement message will not be further acknowledged; the MAC layer provides acknowledgment at each hop of the message but there is no MAC end-to-end acknowledgment.

Another task is the neighborhood management. Due to the received messages and their header, the MAC layer manages a table, where several indications about the 1-hop neighbors are saved. When a neighbor hasn't transmitted anything for a long time, it is considered as having left and it is removed from the table. This table is used for several purposes, like synchronization. It is also shared with the network layer to allow message routing.

Another task performed by the MAC layer is the management of synchronization. The MAC layer readjusts the start of time slots in listening traffic and in receiving synchronization packets. Because it knows time division and the frequency hopping sequence, it can choose the channel to use. To synchronize with the other endpoints, if there is no traffic, the MAC layer sends periodic beacons.

The following describes parameters of the MAC layer, more specifically listing a variety of parameters which are adjustable (that is, tweakable). It provides a description of each parameter and some comments on how to modify their value (effect, limits . . . ) and/or their relations with other parameters. Depending on the location and the band in which the present protocol subject matter operates, the default values of the MAC parameters change, as will be understood by those of ordinary skill in the art without requiring additional detailed discussion thereof.

MAC_Beacon_Period_SYNC
Description: The period of the beacons sent by a synchronized endpoint when it has no other messages to send. It corresponds to the maximal allowed period of radio inactivity.
Comments: The value of this parameter depends on the clock drift and on the time slot margins. It should allow the network to stay synchronized even if several beacons are not heard (i.e. it should be smaller than MAC_Neighbor_Timeout). The more important the clock drift is, the shorter the beacon period should be. The beacons are not sent exactly at each period but are randomized in order to avoid beacon collisions.

MAC_CELL_Leaving_Process_Duration:
Description: The time interval between the reception of a SYNC_ACK from another cell (considered better by the endpoint) and the moment the endpoint actually switches cell.

MAC_CELL_Switch_Hysteresis
Description: This parameter defines the hysteresis in the decision process for cell switching.

MAC_CELL_Weight_CSI
Description: In the cell switching process, this parameter defines the weight of the cell size in cell selection.

MAC_CELL_Weight_GPD
Description: In the cell switching process, this parameter defines the weight of the GPD in cell selection.

MAC_CELL_Weight_Level
Description: In the cell switching process, this parameter defines the weight of the level in cell selection.

MAC_Clock_Accuracy:
Description: This is the crystal accuracy defined to include all influential parameters (tolerance, temperature and aging).
Comment: The better the clock accuracy is, the easier the synchronization is maintained.

MAC_Discovery_Beacon_Period:
Description: The period between two discovery beacons sent during the discovery phase.
Comment: This should be larger than the time needed to send one discovery beacon. It is also dependent on how quickly the firmware/hardware can handle the transmission of a beacon.

MAC_Excellent_Connectivity_Threshold:
Description: The minimum number of SYNC fathers from which a node is considered to have an excellent connectivity degree.

MAC_FW_Accuracy:
Description: The accuracy of the firmware for dating the actual sending/reception of a message.
Comment: This depends on the MCU and clock frequency.

MAC_GPD_TD:
Description: This parameter is used to model the fixed propagation delay through each node of the network. It is used to compute the GPD (Global average Propagation Delay).
Comments: Increasing the value of this parameter will make the system give an advantage to the paths with fewer hops.

MAC_HFC_Max:
Description: Specifies the span of the hyperframe counter.

MAC_HF_Length:
Description: The length in time slots of a hyperframe.
A hyperframe is a succession of time slots that follows the hopping hyper-sequence.
Comment: This length is the product of the super-sequence length by the number of channels.
HF_Length=Number_of_Channels*Hopping_Super_Sequence_Length MAC_Hopping_Super_Sequence_Length:
Description: The length of a frequency hopping super-sequence, also the number of basic hopping sequences used in a hyper-sequence.

MAC_Listening_Window_Length:
Description: Length of the listening window during the discovery phase
Comments: Increasing this length will decrease the probability of collision between forced beacons but will slow down the discovery process if several discovery phases are needed to find a SYNC father.

MAC_LPD_Max:
Description: Maximum possible value for the LPD (Local average Propagation Delay).

MAC_LPD_NAVG:
Description: The sliding average window length used to compute the LPD (Local average Propagation Delay).
Comment: this window must be smaller than the MAC_Neighbor_Timeout value.

MAC_LPD_RSSI:
Description: Factor used to initialize the LPD (Local average Propagation Delay) from the RSSI reading.

MAC_LPD_Switch:
Description: Factor used to initialize the LPD (Local average Propagation Delay) from the RSSI reading.

MAC_Max_Discovery_Phase_Period:
Description: The maximum period between two discovery phases for a non-synchronized endpoint.
Comment: This is used after MAC_Max_Nb_of_Discovery_Phases unsuccessful discovery phases and should be much larger than MAC_Min_Discovery_Phase_Period.

MAC_Max_Nb_of_Discovery_Phases:
Description: The maximum number of unsuccessful discovery phases before increasing their period.
Comments: The reason for this parameter is to quiet down orphaned endpoints. It should be set high enough to make it possible for an endpoint to discover several cells.

MAC_Max_Nb_of_Neighbors:
Description: The maximum size of the MAC Neighbor Table.

MAC_Max_Nb_of_SYNC_Request:
Description: The maximum number of times an endpoint tries to send a SYNC request to each potential SYNC father.

MAC_Max_Nb_of_Transmitted_Bytes_sTS:
Description: The maximum number of bytes that can be transmitted during a sub time slot. This includes the entire packet, i.e., MPDU, PHY header and preamble.
Comment: This value, combined with the data rate, affects the Sub_TS length.

MAC_Max_Nb_of_Transmitted_Bytes_TS:
Description: The maximum number of bytes that can be transmitted during a time slot. This includes the entire packet, i.e., MPDU, PHY header and preamble.
Comment: This value depends on the data rate, the time slot length and the time slot margins.

MAC_Max_Packet_Length:
Description: The maximum length of PDU packets (expressed in bytes) that the MAC layer authorizes the upper layer to send (the LPDU length).

Comment: MAC_Max_Packet_Length=MAC_Max_Nb_of_Transmitted_Bytes_TS−(Preamble+PHY_header+FEC+MAC_Header+FCS).

MAC_Min_Discovery_Phase_Period:
Description: The minimum period between two discovery phases for a non-synchronized endpoint.
Comment: This should be larger than the time needed to send the discovery beacons plus MAC_Listening_Window_Length.

MAC_Nb_of_Basic_Hopping_Sequences:
Description: The number of basic frequency hopping sequences that an endpoint can generate. Each hopping sequence is a succession of all the predefined channels. Each one of the MAC_Number_of_Channels channels appears once and only once in this succession.
Comment: This value should be greater than MAC_Hopping_Super_Sequence_Length.

MAC_Nb_of_Sub_TS:
Description: The number of sub time slots in a time slot. The beginning of a Sub-TS marks the potential beginning of the transmission of a packet.
Comments: The number of Sub-TS is ((TS_Length-2*TS_Margin)/Sub_TS_Length). It is assumed that the length values are chosen to make this is an integer.

MAC_Max_nb_of_downlink_buffered_packets:
Description: The maximum number of packets that an endpoint can save into its memory. It concerns only the packets going from the Cell Master to the endpoints (Downlink).

MAC_Max_nb_of_uplink_buffered_packets:
Description: The maximum number of packets that an endpoint can save into its memory. It concerns only the packets going from endpoints to the Cell Master (Uplink).

MAC_Neighbor_Timeout:
Description: The time limit for the MAC layer to decide that an endpoint is not a neighbor anymore because the last reception happened more than MAC_Neighbor_Timeout ago.
Comments: This depends on the clock drift and the time slot margins. An endpoint should not be considered a neighbor if there is a chance it is no longer synchronized.

MAC_Number_of_Channels:
Description: The number of channels used in the basic frequency hopping sequences.
Comments: The minimum value for this parameter is fixed by the spread spectrum regulations: 15, 20, 25 or 50 channels depending on countries and smart frequency hopping features.

MAC_RSSI_Sampling_Rate:
Description: Frequency of RSSI reads during the environment analysis for the computation of averaged RSSI and RSSI auto-correlation function.

MAC_RXI_Decay:
Description: This constant is used to compute the Reception Rate Indicator (RXI). The RXI is periodically multiplied by this constant to make the indicator decay in time when no message is received.

MAC_RXI_Increment:
Description: This constant is used to compute the Reception Rate Indicator (RXI). Upon reception of a message from a neighbor, its RXI is incremented by this constant.

MAC_RXI_Threshold:
Description: RXI values above this threshold are considered to be an indication of a reliable link. This is used in the computation of figures of merit for the choice of synchronization fathers.

MAC_SACT_Resolution:
Description: The value of the least significant bit of the SACT timer when the value of this timer is exchanged between endpoints.
Comment: The SACT timer can be locally implemented with a higher resolution given by the parameter MAC_FW_Accuracy.

MAC_Sub_TS_Length:
Description: The length of a Sub_TS. It corresponds to the maximum length of the biggest MAC message (preamble+PHY header+FEC+MAC header+FCS).
Comment: It should be rounded up to obtain an integer number of Sub_TS per TS.

MAC_SYNC_Disc_Weight_CSI
Description: In the discovery phase, this parameter defines the weight of the CSI of neighbors in the synchronization father selection process.

MAC_SYNC_Disc_Weight_GPD
Description: In the discovery phase, this parameter defines the weight of the GPD of neighbors in the synchronization father selection process.

MAC_SYNC_Disc_Weight_Level
Description: In the discovery phase, this parameter defines the weight of the level of neighbors in the synchronization father selection process.

MAC_SYNC_Father_Request_Beacon_Threshold:
Description: Duration used to determine if an endpoint is still in synchronization with a father before accepting that another endpoint gets synchronized with it. If a message from a healthy father has been received within this time, there is no need to request a beacon from it before answering a SYNC request.
Comment: This value must be smaller than MAC_Beacon_Period_SYNC.

MAC_SYNC_Request_Period:
Description: The minimum period between two different SYNC requests sent to the same potential SYNC father.

MAC_Traffic_Density_max
Description: Any endpoint in the mesh will adjust its transmission randomization window in order to avoid creating a traffic input density above that limit for each one of its fathers.
Comments: The value of this parameter should always be less than one. Values close to one can improve the maximum throughput of the system but increase the risk of jamming the data traffic with collisions.

MAC_Traffic_Monitoring_Window
Description: Length of the sliding average window used by an endpoint to monitor the traffic of neighbors. This length is expressed in time slots units.

MAC_TS_Length:
Description: The length of a time slot. During the entire time slot, the same channel will be set except for sending forced beacons.
Comments: The maximum TS_Length value may be fixed by spread spectrum regulations in some countries, (e.g., 400 ms for the PHY-FHSS-NA-915). The default length corresponds to ((Max_Nb_of_Transmitted_Bytes_TS*8)/Bit_Rate)+2*TS_Margin.

MAC_TS_Margin:
Description: The duration of each time interval at the extremities of a time slot when an endpoint is not allowed to transmit. When in receive mode, the endpoint should be listening across the whole time slot, including these intervals, in order to be able to complete the reception of a message coming from a neighbor with slightly misaligned time slots.

Comment: The TS_Margin value depends on the worst clock drift between two endpoints and between two received messages. Wider margins allow for more crystal drift or more time between messages but decrease the maximum number of transmitted bytes per TS and thus the throughput of the system.

MAC_Tx_Window_max:

Description: The maximum value for the randomization window used by an endpoint to transmit its data packets.

Comments: Only one packet should normally be transmitted in a randomization window and the position of the packet within this window is random. The protocol does not forbid short packets to be transmitted in the same window but this must also follow the rules of priority.

MAC_Tx_Window_min:

Description: The minimum value for the randomization window used by an endpoint to transmit its data packets.

MAC_Unsynchronized_Timeout:

Description: Duration after which an endpoint still in discovery phase will reset its notion of forbidden cell (and number of discovery phases it already tried).

MAC_Warm_Start_Discovery_Duration:

Description: Number of discovery phases during which an endpoint with a preferred cell tries to synchronize only with it.

Comments: This value should be large enough to ensure a high probability of finding the same cell after an outage but small enough to not delay the possible synchronization with another cell if the preferred one is no longer available. This does not affect the notion of forbidden cell.

MAC_Xdrift_Filter_A, MAC_Xdrift_Filter_B:

Description: These are the filter coefficients for crystal drift correction.

Comments: Modifying these coefficients will make the filter step response slower or faster. A faster step response can be desirable to speed up the frequency synchronization of the nodes. Any modification of these parameters should be done carefully to avoid making the system unstable, see the relevant appendix.

MAC_Xdrift_LeapTS

Description: This is the interval between leap time slots. Every MAC_Xdrift_LeapTS time slots, the SACT is loaded with its initial value plus a small correction to compensate for the drift of the crystal.

Comments: Large values of this parameter will increase the resolution of the crystal drift compensation, but will also increase the importance of the correction to be applied at each leap time slot. Large values of MAC_Xdrift_LeapTS should only be used with good crystals in order to avoid a desynchronization between two leap time slots.

MAC_Xdrift_Tmin:

Description: This is the minimum time interval over which the clock corrections need to be summed before a new crystal drift correction value can be computed.

Comments: The value of this parameter depends on the average error made when the clock (SACT) is adjusted from incoming packets. If uncertainties in the time of arrival of packets are important, this parameter should be increased to average out the uncertainties.

Depending on the local regulations and the frequency band in which the protocol operates, the default values of the MAC parameters change. The following table gives default values for the parameters related to the general or internal operation of the MAC layer as well as traffic load management.

| MAC Parameters MAC_ | MAC-NA-915 | AC-NA-2400 | AC-EU-868 | MAC-EU-2400 | Units |
| --- | --- | --- | --- | --- | --- |
| Clock_Accuracy | ±20 | | | | ppm |
| FW_Accuracy | 34 | | | | µs |
| HFC_Max | 255 | | | | hyperframes |
| HF_Length | 832 | | | | TS |
| Hopping_Super_Sequence_Length | 16 | | | | basic seq |
| Max_Nb_of_Transmitted_Bytes_sTS | 48 | | | | bytes |
| Max_Nb_of_Transmitted_Bytes_TS | 288 | | | | bytes |
| Max_nb_of_downlink_buffered_packets | 5 | | | | packets |
| Max_nb_of_uplink_buffered_packets | 5 | | | | packets |
| Max_Packet_Length | 176 | | | | bytes |
| Nb_of_Basic_Hopping_Sequences | 16 | | | | sequences |
| Nb_of_Sub_TS | 6 | | | | sub-TS |
| Number_of_Channels | 52 | 5 | | 15 | channels |
| RSSI_Sampling_Rate | 66.667 | | | | Hz |
| SACT_Resolution | 100 | | | | µs |
| Sub_TS_Length | 20 | | | | ms |
| Traffic_Density_max | 0.8 | | | | — |
| Traffic_Monitoring_Window | 256 | | | | TS |
| TS_Length | 150 | | | | ms |
| TS_Margin | 15 | | | | ms |
| Tx_Window_max | 256 | | | | TS |
| Tx_Window_min | 10 | | | | TS |
| Xdrift_Filter_A | 1/16 | | | | — |
| Xdrift_Filter_B | 0.732 | | | | — |
| Xdrift_LeapTS | 256 | | | | TS |
| Xdrift_Tmin | 3 | | | | min |

The next table gives default values for the parameters related to the discovery phase.

| MAC Parameters MAC__ | MAC-NA-915 | MAC-NA-2400 | MAC-EU-868 | MAC-EU-2400 | Units |
|---|---|---|---|---|---|
| Discovery__Beacon__Period | 20 | | | | ms |
| Listening__Window__Length | 2.5 | | | | s |
| Max__Discovery__Phase__Period | 30 | | | | s |
| Max__Nb__of__Discovery__Phases | 156 | | | | Phases |
| Min__Discovery__Phase__Period | 3.7 | | | | s |
| Warm__Start__Discovery__Duration | 104 | | | | Phases |

The next table gives default values for the parameters related to synchronization, synchronization father choice, cell choice and neighbor table management.

| MAC Parameters MAC__ | MAC-NA-915 | MAC-NA-2400 | MAC-EU-868 | MAC-EU-2400 | Units |
|---|---|---|---|---|---|
| Beacon__Period__SYNC | 625 | | | | TS |
| CELL__Leaving__Process__Duration | 60 | | | | seconds |
| CELL__Switch__Hysteresis | 400 | | | | — |
| CELL__Weight__CSI | 128 | | | | — |
| CELL__Weight__GPD | 1 | | | | — |
| CELL__Weight__Level | 0 | | | | — |
| Excellent__Connectivity__Threshold | 3 | | | | potential SYNC fathers |
| GPD__TD | 8 | | | | — |
| LPD__NAVG | 32 | | | | — |
| LPD__Max | 255 | | | | — |
| LPD__Switch | −70 | | | | dBm |
| LPD__RSSI | 3 | | | | — |
| Max__Nb__of__Neighbors | 10 | | | | neighbors |
| Max__Nb__of__SYNC__Request | 10 | | | | attempts |
| Neighbor__Timeout | 10 | | | | minutes |
| RSSI__Var | 225 | | | | — |
| RXI__Decay | 0.9 | | | | — |
| RXI__Increment | 20 | | | | — |
| RXI__Threshold | 80 | | | | — |
| SP__CD1 | 100 | | | | — |
| SP__LPD1 | 200 | | | | — |
| SP__LPD2 | 1000 | | | | — |
| SP__LPD3 | 4000 | | | | — |
| SP__RXI1 | 400 | | | | — |
| SP__RXI2 | 2000 | | | | — |
| SYNC__Disc__Weight__CSI | 128 | | | | — |
| SYNC__Disc__Weight__GPD | 1 | | | | — |
| SYNC__Disc__Weight__Level | 50 | | | | — |
| SYNC__Father__Request__Beacon__Threshold | 625 | | | | TS |
| SYNC__Merit__Hyst1 | 50 | | | | — |
| SYNC__Merit__Hyst2 | 150 | | | | — |
| SYNC__Request__Period | 10 | | | | TS |
| SYNC__Top__N | 10 | | | | — |
| Unsynchronized__Timeout | 2 | | | | days |

The following generally discusses frequency and time division facets of the present subject matter. In particular, the present protocol subject matter is based on a frequency hopping system for better interference immunity and to be in accordance with the spread spectrum regulations in some countries. In North America, a frequency hopping system allows a transmitted power higher than a system using a single narrow channel. It means that frequency and time will be divided. To establish an RF link between two nodes, two conditions have to be respected, which are that the two entities have to operate at the same frequency and at the same time. The protocol respects these two conditions by adopting a time slot scheme.

Figure 11:
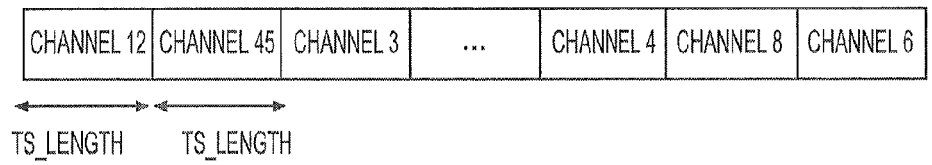
FIG. 11 depicts TIME AND FREQUENCY DIVISION subject matter.

The time frame is divided per present subject matter into regular time slots, each one operating on a different frequency. In the United States, the FCC rules (Part 15.247) specify that for a FHSS system, the average time of occupancy on any frequency shall not be greater than 0.4 second in a 20-second window. In Europe, the same limitation applies in the 2.4 GHz band. On the other hand, there is no dwell time per channel limitation in the 868 MHz band. Devices operating in the 868 MHz band shall comply with a general duty cycle limit that is averaged over all the channels used by the system. For the present subject matter, the duration of a time slot has been sized to contain one single maximum-size message, as represented by present FIG. 11.

Applicable FUSS regulations also specify the minimum number of frequencies that have to be used. In North America, in the 915 MHz band, if the channels are less than 250 kHz wide, the minimum number of channels is 50. For the 2.4 GHz band, in North America as well as in Europe, at least 15 channels are required. There is an exception to such rules. In particular, in the 2.4 GHz European band, at least 20 channels are required if an adaptive frequency hopping strategy is used. Adaptive frequency hopping allows the selection of the best channels to avoid interference. On the other hand, there is no minimum number of channels in the 868 MHz European band. The more channels there are in the system, the higher the isolation between adjacent cells will be, but the longer will be the synchronization time.

In order to make an RF communication possible, any two nodes of the network need to know precisely which channel to use in every time slot. To make such operation possible, the channel use is organized according to a frequency hopping sequence known by all the endpoints belonging to the network. Such sequence is designed to use all the channels equally on average.

Figure 12:
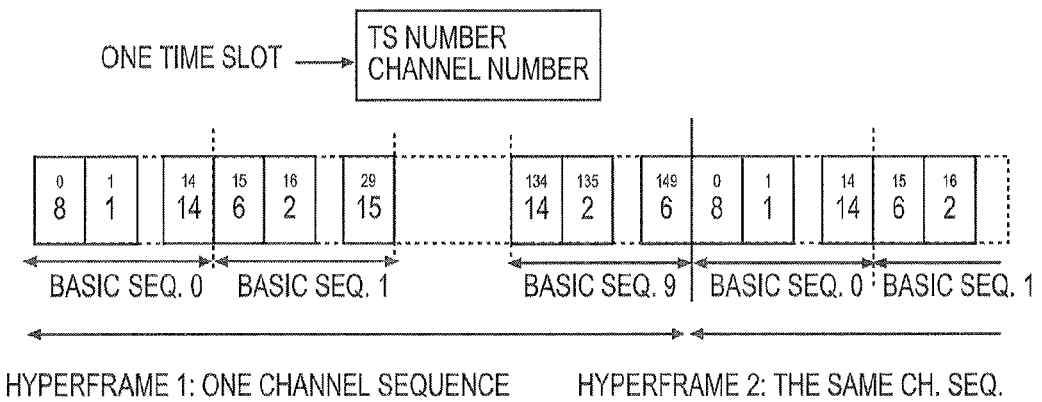
FIG. 12 depicts HYPERFRAME AND CHANNEL SEQUENCE (15 CHANNELS, 10 BASIC SEQUENCES) subject matter.

To provide isolation between adjacent cells, each cell has its own frequency hopping sequence. Such sequence per present subject matter is discovered by all the endpoints of the cell during the synchronization process. To add more isolation between the cells, it has been chosen per present subject matter to organize the hopping pattern into hyperframes. See also present FIG. 12 representing present hyperframe and channel sequence subject matter, based on 15 exemplary channels, with 10 basic sequences. Such a hyperframe technique follows a frequency hopping hyper-sequence built with several different basic frequency hopping sequences, which make a longer sequence but always with the same sub-set of channels. The sequence is now constituted with K different basic sequences, which means MAC_HF_Length=K*MAC_Number_of_Channels time slots. Such present approach also adds a better immunity to jammers. In a given cell, all the hyperframes are preferably identical per present subject matter. Once the system has swept across a hyperframe, it repeats the same sequence in a periodic way.

With respect to present channel sequence assignment, per the present subject matter, all the endpoints know the different channel sequences that can be used but only one channel sequence is used by cell. The channel sequence is given by the cell relay. The sequence is computed by the knowledge of the specific algorithm which uses the C12.22 address of the cell relay as seed. To change the hopping sequence in a cell, the collection engine has to change the address of the cell relay.

If there are several cell relays in the same area, it is imperative that they follow different channel sequences. Only one cell relay is possible by cell (because cell relays are not synchronized with each other). On the contrary, per present subject matter, a high number of different cells can operate in the same area because they don't hear each other most of the time.

The cell number given to the cell relay is transmitted and forwarded to all the endpoints in the cell, per present subject matter. Such field is used to generate the hopping sequence, as otherwise described herein.

Cell isolation is achieved per present subject matter preferably through quasi-orthogonal sequences in a frequency hopping network. More particularly, in accordance with present subject matter, two nested pseudo-random sequences are utilized to isolate cells in a frequency hopping spread spectrum network. The inner sequence is generated with Galois field arithmetic and the outer sequence is a Fibonacci sequence that uses the cell unique address as a seed.

The present protocol subject matter is based on frequency hopping spread spectrum (FHSS) for better interference immunity and compliance with radio regulations in some countries. In a typical FHSS system all the nodes hop their channel frequency according to the same pseudo-random sequence in order to be perfectly synchronized for both reception and transmission. The frequency hopping pattern is the rule that assigns a channel number to each time slot of the slotted Aloha protocol. Such pattern is periodic, and it will repeat itself indefinitely.

As it is very difficult to maintain a good synchronization for a very large number of nodes, the system of the present subject matter is advantageously divided into cells. Each cell contains a limited number of nodes and has its own pseudo-random sequence for transceiver synchronization. Per present subject matter, all the nodes inside a cell are synchronized with each other but the different cells are not synchronized with each other. Technical problems of such approach which are addressed per the present subject matter include how to find a simple way to generate a pseudo-random sequence for each cell, and how to make sure that these sequences will be unique and provide sufficient isolation between adjacent cells.

The present subject matter combines the use of Galois field arithmetic and Fibonacci sequences to generate pseudo-random sequences. The resulting sequence is the combination of two nested sequences. The inner one is generated by Galois field arithmetic and the outer one is generated by a Fibonacci sequence using the cell address as a seed. The cell address is unique to each cell and will lead to completely different sequences for any two adjacent cells even if the addresses differ only by one.

The following is a formal description of the present hopping pattern construction subject matter.

The inner hopping sequence is constructed with a Galois field of order p, where p is a prime number. Addition and multiplication in this field are to be carried out modulo p. This Galois field is $$GF(p)=\{0,1,2,3,\ldots,p-1\}$$

In any Galois field, one can find primitive elements. An element is said to be primitive if its successive powers generate all the non-zero elements of the field. If $\alpha$ is a primitive element of the field, the field can be written as follows:

$$GF(p)=\{0,1,\alpha,\alpha^2,\alpha^3,\ldots \alpha^{p-2}\}$$

To create the inner hopping sequence from this, only the non-zero elements of the field are selected and definition as follows is established of the ordered (p−1)-tuple $(1,\alpha,\alpha^2, \alpha^3, \ldots \alpha^{p-2})$. The length of the inner hopping sequence (the number of hops in the sequence), is equal to the number of channels used by the system, N=p−1. The RF link will use several different inner hopping sequences. Each one of such sequences will be generated by its own primitive element. K different primitive elements are selected to generate K different inner hopping sequences. Such primitive elements are $(\alpha_0,\alpha_1,\alpha_2,\ldots \alpha_{K-1})$.

The inner hopping sequences are numbered from 0 to K−1. The k-th hopping sequence is generated by the k-th primitive element and its expression is:

$$IHS(k)=(1,\alpha_k,\alpha_k^2,\alpha_k^3,\ldots \alpha_k^{N-1})$$

Or, in a compact form $$IHS(k,n)=\alpha_k^n,\ k=0,1,2,\ldots K-1,\ n=0,1,2,\ldots N-1$$

Where IHS(k, n) is the channel number of the n-th hop of the k-th inner hopping sequence and $\alpha_k$ is the primitive element of the k-th inner hopping sequence.

The outer hopping sequence is intended per present subject matter to provide a hopping pattern which is unique to each cell. To make the pattern unique, the outer hopping sequence is built with a Fibonacci sequence using the cell identifier as a seed, as follows:

$OHS(0)$=Cell Identifier(0)

$OHS(1)$=Cell Identifier(1)

$OHS(n)=OHS(n-1)+OHS(n-2), n=2,3,4,\ldots,M-1$

Here the cell identifier is broken up into two parts: the most significant and the least significant part. The integer M is the length of the outer sequence As a present alternative, any extension of this process is possible per present subject matter. For example, one can break up the cell identifier in four parts and use a Tetranacci sequence, as follows:

$OHS(n)$=Cell Identifier$(n), n=0,1,2,3$ $OHS(n)=OHS(n-1)+OHS(n-2)+OHS(n-3)+OHS(n-4), n=4,\ldots,M-1$ The elements of the outer sequence are used to select a specific N-hop inner frequency hopping sequence. For such purpose, the Fibonacci sequence elements are computed with modulo arithmetic in order to map into the set of available hopping sequences. From the inner sequence and the outer sequence the resulting hopping hyper sequence is obtained with the following nesting procedure:

$\{[IHS(OHS(0), 0), IHS(OHS(0), 1), \ldots,$ $IHS(OHS(0), N-1)], [IHS(OHS(1), 0), IHS(OHS(1), 1),$ $\ldots, IHS(OHS(1), N-1)], \ldots [IHS(OHS(M-1), 0),$ $IHS(OHS(M-1), 1), \ldots, IHS(OHS(M-1), N-1)]\}$ As the computation of high powers of a primitive element can be difficult to implement on a microprocessor, it is recommended per present subject matter to compute the inner hopping sequence iteratively. With the first hop always designated as 1, each successive hop can be easily computed from the preceding hop by the following equation.

$$\begin{cases} IHS(k, 0) = 1 & n = 0 \\ IHS(k, n) = \alpha_k IHS(k, n-1), & k = 0, 1, 2, \ldots, K-1, n = 1, 2, \ldots N-1 \end{cases}$$

This inner hopping sequence is very readily computed with only the knowledge of the previous hop and the hopping sequence number. This is intended per present subject matter to be computed before each hop, avoiding the need to store all the possible hopping sequences in memory.

The use of two nested sequences per the present subject matter advantageously improves spreading and interference immunity. Also, a simple, iterative way to compute the hopping sequences is provided, a simple way to generate hopping sequences unique to each cell is provided, a simple way to isolate the cells is provided, and the iterative implementation leads to very low memory and computation load requirements.

The hopping super-sequence of the present subject matter is intended to provide a hopping pattern which is unique to each cell. To make the pattern unique, the hopping super-sequence is built with a Fibonacci sequence using the cell identifier CELL as a seed. CELL is a 2-byte address. That is first broken up into four 4-bit numbers, as follows:

$$\begin{cases} \text{CELL}(15, 14, 13, 12) = C_{id}(0) \\ \text{CELL}(11, 10, 9, 8) = C_{id}(1) \\ \text{CELL}(7, 6, 5, 4) = C_{id}(2) \\ \text{CELL}(3, 2, 1, 0) = C_{id}(3) \end{cases}$$

The Fibonacci sequence is then constructed with the following:

$C_{id}(n)=C_{id}(n-1)+C_{id}(n-2)+C_{id}(n-3)+C_{id}(n-4),$
$n=4,5,\ldots,M+3$

In that sum all the additions should be carried out modulo 16. Each term in the sequence is then an integer between 0 and 15, as follows:

$0 \le C_{id}(n) \le 15$

The integer M is the length of the super-sequence. One of ordinary skill in the art will observe that this particular indication is not a bona fide Fibonacci sequence because four terms are used in the sum instead of two. Some authors have coined the word Tetranacci to name such a sequence. The hopping super-sequence will be:

$HSS=(C_{id}(4), C_{id}(5), \ldots, C_{id}(M+3))$

This can also be written:

$HSS(n)=C_{id}(n+4), 0 \le n \le M-1$

The elements of the super-sequence are used to select a specific N-hop basic frequency hopping sequence. If K=16, each element of the Fibonacci sequence points naturally to a hopping sequence. This is the case for the PHY-FHSS-NA-915 physical layer. If less than 16 basic hopping sequences are available, The Fibonacci sequence elements are converted to modulo K integers in order to map into the set of available hopping sequences, as follows:

$HSS(n)=\text{MOD}(C_{id}(n+4), K), 0 \le n \le M-1$

Given the hopping super-sequence:

$HSS=(HSS(0), HSS(1), \ldots HSS(M-1))$

And the set of K basic hopping sequences:

$HS(k)=(HS(k,0), HS(k,1), \ldots HS(k,N-1)), 0 \le k \le K-1$

The hyper-sequence is constructed in the following way:

$\{[HS(HSS(0), 0), HS(HSS(0), 1), \ldots,$ $HS(HSS(0), N-1)], [HS(HSS(1), 0), HS(HSS(1), 1),$ $\ldots, HS(HSS(1), N-1)], \ldots [HS(HSS(M-1), 0),$ $HS(HSS(M-1), 1), \ldots, HS(HSS(M-1), N-1)]\}$ This M*N-hop hyper-sequence repeats itself indefinitely in a periodic way. During the first time slot, the endpoint's transceiver will use the frequency indicated by the first element of this hyper-sequence for both transmission and reception activities. For the second time slot, it will use the second element and so on.

The length of the hyper-sequence, M*N, is related to the MAC layer parameter:

$M*N$=MAC_HF_Length

A special case is worth mentioning. If the cell identifier is empty, that is, if it contains only zeros, the super-sequence will be a constant sequence of zeros. In this case the hyper-sequence reduces to the repetition of the first basic hopping sequence as follows:

$[HS(0,0), HS(0,1), \ldots, HS(0,N-1)]$

Figures 13, 14:
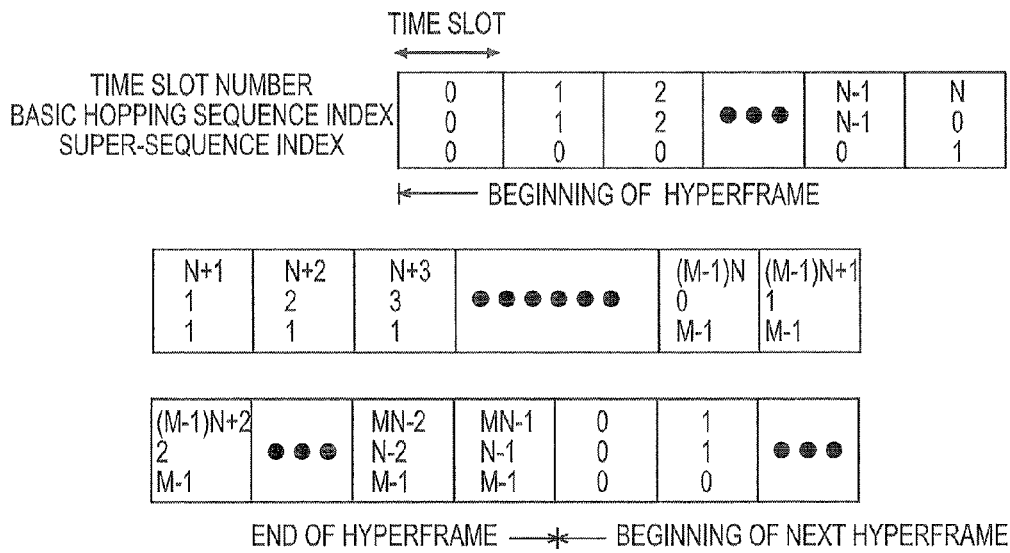
FIG. 13 depicts HYPERFRAME STRUCTURE subject matter.
FIG. 14 depicts PRIMITIVE ELEMENTS FOR PHY-FHSS-NA-915 BASIC HOPPING SEQUENCES subject matter.

The succession of M*N time slots using the channels given by this hyper-sequence is called a hyperframe. Present FIG. 13 illustrates a present exemplary structure of a hyperframe. The basic hopping sequence index is the hop number within each basic hopping sequence and the super-sequence index specifies the position within the super-sequence.

The hyper-sequence of the present subject matter has been designed to avoid having two different cells working with the same hopping pattern, provided they have different cell identifiers as defined herein. As it is likely that two adjacent cells will have close cell identifiers, it has been checked that the proposed algorithm leads to two very different hopping patterns even if the cell identifiers differ by only one bit.

These sequences are nevertheless not totally orthogonal and some collisions are unavoidable. One should also keep in mind that the clocks of adjacent cells will drift with respect to each other. The consequence is that two super-sequences that differ only by a cyclic permutation will not necessarily provide cell isolation in a reliable way. The probability for this to happen is however believed to be very low.

For the physical layer of the exemplary embodiment PHY-FHSS-NA-915 (regarding 915 MHz), the number of channels is:

$N$=MAC_Number_of_Channels=52

The number of basic hopping sequences is K=16, the super-sequence length is M=16 and the hyper-sequence length is:

$M*N$=MAC_HF_Length=52×16=832

Present FIG. 14 gives the primitive elements for the K basic hopping sequences for a PHY-FHSS-NA-915 exemplary embodiment.

The basic hopping sequence generation rule is, for each of the 16 sequences $$\begin{cases} HS(k, 0) = 1 & n = 0 \\ HS(k, n) = \text{MOD}(\alpha_k HS(k, n-1), 53), & k = 0, 1, 2, \ldots, 15, n = 1, 2, \ldots 51 \end{cases}$$

As an example, this is the detail for generation of the basic hopping sequence number 2. From the table of FIG. 14, the primitive element for the basic hopping sequence number 2 is 5. The sequence will be computed by:

$$\begin{cases} HS(2, 0) = 1 & n = 0 \\ HS(2, n) = \text{MOD}(5 * HS(2, n-1), 53), & n = 1, 2, \ldots 51 \end{cases}$$

The first hop is always:
HS(2,0)=1 (channel number 1 will be used)
The second hop is:
HS(2,1)=modulo(5*1;53)=5 (channel number 5 used as example)
The third hop is:
HS(2,2)=modulo(5*5;53)=25 (channel number 25 used as example)
The fourth hop is:
HS(2,3)=modulo(5*25;53)=modulo(125;53)=125−2*53=19
The fifth hop is:
HS(2,4)=modulo(5*19;53)=modulo(95;53)=95−53=42
The sixth hop is:
HS(2,5)=modulo(5*42;53)=modulo(210;53)=210−3*53=51

Such process continues until the 52 hops are computed.

With reference to conducting communications with an adjacent cell, whether the hopping sequence should be implemented by a modulo n multiplication or by a table look-up is a question of trade-off between computation speed and memory. Although the iterative approach has been suggested above, either choice may be made by the user, in accordance with the present subject matter, without adversely affecting the broader aspects of the present protocol subject matter.

There is a situation where the conditions of such trade-off are different. When an endpoint wants to communicate with another endpoint belonging to a different cell, there is a need for it to be able to quickly compute the hopping pattern of the new cell in order to be able to chime in with the right frequency in the middle of the hopping pattern. If the iterative multiplication process is used in such case, it would lead to a number of modulo p multiplications as large as the hop number in the basic sequence. If this is in a given instance an excessive burden for the microcontroller, the present subject matter may alternatively use the exponentiation by squaring algorithm to speed up the computation. Such algorithm, adapted from cryptographic computations, can be applied iteratively and will lead to a number of operations proportional to the logarithm in base two of the hop number. The gain on computation time is therefore relatively large.

The exponentiation by squaring algorithm consists in the iterative application of the following equation:

$$x^n = \begin{cases} x & n = 1 \\ (x^2)^{\frac{n}{2}} & n \text{ even} \\ x(x^2)^{\frac{n-1}{2}} & n \text{ odd} \\ & n > 1 \end{cases}$$

This algorithm will be used to compute the channel frequency starting from the following expression of the hopping sequence:

$HS(k,n)=\alpha_k^n$

The following example is based on computing the channel number for the hop number 33 of the basic sequence number 7 of the PHY-FUSS-NA-915 physical layer.

From the above-referenced table (FIG. 14), the basic hopping sequence number 7 uses the primitive element 19. Therefore, is computed:

$HS(7, 33)=\alpha_7^{33}=19^{33}$

A first application of the algorithm leads to:

$HS(7,33)=19 \times 19^{32}=19(19^2)^{16} (\text{mod } 53)$

Now performing the first squaring: $19^2=361=43$ (mod 53) and on to the next step:

$HS(7,33)=19(43)^{16}=19(43^2)^8 (\text{mod } 53)$

Second squaring: $43^2=1849=47$ (mod 53)

$HS(7,33)=19(47)^8=19(47^2)^4 (\text{mod } 53)$

Third squaring: $47^2=2209=36$ (mod 53)

$HS(7,33)=19(36)^4=19(36^2)^2 (\text{mod } 53)$

Fourth squaring: $36^2=1296=24 \pmod{53}$ $HS(7,33)=19(24)^2 \pmod{53}$

Fifth squaring: $24^2=576=46 \pmod{53}$
And a final multiplication:

$HS(7,33)=19 \times 46=874=26 \pmod{53}$

Even though the channel number is 26, the subject exemplary computation has been computed in only 6 operations instead of 32.

With reference to message positions and sub time slots, messages will have very different lengths. At one extremity, one would find MAC messages, such as beacons, which occupy a small percentage of the time slot duration, and at the other extremity, one would find messages from above layers, which occupy a complete time slot.

The TS length has been sized to contain one message of the maximum size, MAC_Max_Nb_of_Transmitted_Bytes. If the API layer requests a longer message, the LLC will fragment this message in packets. Of course, each packet will not exceed MAC_Max_Nb_of_Transmitted_Bytes (PHY header and preamble included), as otherwise also referenced in conjunction with the LLC layer description.

Figure 15:
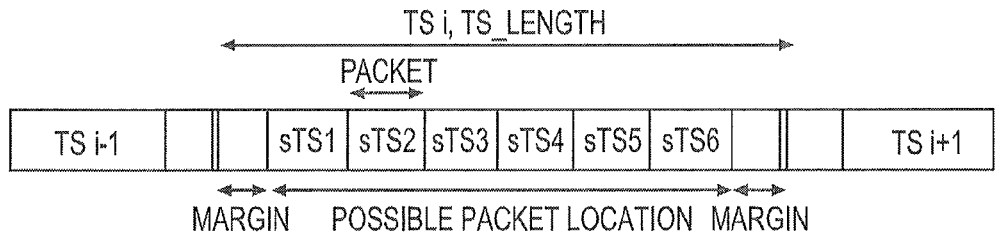
FIG. 15 depicts TS MARGINS AND SUB TIME SLOTS subject matter.

The MAC messages are the shortest messages that can be sent. Since the physical layer is by default in receiving mode, packets can be received in a timeslot where a packet has been sent. To limit the number of collisions inside a TS between the received and transmitted packets, timeslots are divided in sub-timeslots (Sub_TS) of equal sizes (MAC_Sub_TS_Length). Their size is set to fit in the longest of the MAC messages. For example, in FIG. 15 (showing TS margins and Sub Time Slots), up to 6 beacons from different neighbors can be received in a single TS.

The maximum size of a message that can fit into a sub time slot is Max_Nb_of_Transmitted_Bytes_sTS. If a message is too long to fit in one sub time slot, it will use several, but it will always start at the beginning of a sub time slot in order to occupy a minimum number of them. This is actually the concept of slotted aloha access which is here applied to the sub time slot structure of a time slot.

When a message should be sent, the selection of the Sub_TS number is randomized between the second and last sub-TS for a MAC message; A LPDU message will always start at the beginning of a TS (so in the first sub-TS).

Another aspect in the division of a TS, is the TS margins. At the beginning and at the end of each TS, a part of it has to be free of transmissions. If transmissions are not allowed in this part of the TS, receptions are.

These margins give the possibility of communication between two endpoints that are not perfectly synchronized. Length of these margins, MAC_TS_Margin, reflects the maximum authorized error of time synchronization between two resynchronizations, in the worst-case scenario (maximum clock errors, several missed beacons, no traffic, etc.).

The network per the present subject matter is divided into cells, where the traffic is expected to be low. Moreover, the network operates in an ISM band, where many other users occupy the same medium (with the same rules). So, the probability of collision due to the external environment is likely to be higher than the probability of collision within the subject network itself. That's why the slotted Aloha algorithm is appropriate to manage the access to the medium. The entire cell is synchronized in time and frequency (as described herein). When an endpoint wants to speak, it just pushes its message onto the medium on a random time slot. The recipient will receive the message because it is synchronized and because by default, an endpoint is listening to the medium (Physical Layer is, by default, in receive mode). Obviously, a collision occurs when two close endpoints want to speak in the same time slot, but this is solved by a repetition of the messages, repetition managed by the LLC layer. When pushing a data on the medium, the MAC layer doesn't care if it is an Uplink or Downlink message; the bit rate and all other parameters are the same for both ways. Data transmission is non-hierarchical and symmetrical.

Because channels are equally represented and because data can be pushed onto any time slot, the present protocol subject matter respects the uniform occupancy of the media over the band.

It is very important that the traffic remains very low to ensure a good working of the Slotted Aloha access. Slotted Aloha would allow up to 35% data load if the subject network were alone on the media. In a real-life situation, 3% data load is more adequate.

Each time a packet is received from a neighbor, the physical layer makes available an RSSI reading for that packet. For each neighbor in its neighbor table, the MAC layer will compute an average value of this RSSI with a Kalman filter. This filter will give an accurate estimate of the average RSSI as soon as a few RSSI readings will be available. The following pseudo-code gives the details of this algorithm:

```
Upon reception of a packet from neighbor X
If this is the first packet received from X, then
  RSSI_Average = current RSSI reading for that packet
  RSSI_Cov = 255
Else compute the new RSSI_Average with
```

$$KG = \frac{(\text{Old RSSI\_Cov})}{(\text{Old RSSI\_Cov}) + \text{MAC\_RSSI\_Var}}$$

```
  New RSSI_Average = (1−KG)(Old RSSI_Average) + KG(Current RSSI reading)
  New RSSI_Cov = (1 − KG)(Old RSSI_Cov)
End if
Update the neighbor table with the new RSSI_Average value and the new RSSI_Cov value.
```

RSSI_Cov is the estimate of the covariance of the RSSI, it has to be kept in memory for each neighbor as well as the average RSSI, RSSI_Average. RSSI_Var is a MAC layer parameter that corresponds to an estimate of the RSSI variance. RSSI and RSSI_Average are 1-byte two's complement coded variables. Their range extends from −128 dBm to +127 dBm. RSSI_Cov is a 1-byte positive variable. KG is the Kalman gain, it is an intermediate result in the Kalman filter computation and its value is always less than one.

The Average RSSI gives a fair indication of the received signal quality, even in environments plagued with Rayleigh fading. As explained in another section of this document, this Average RSSI participates in the choice of the best synchronization father.

It is the task of the MAC layer to update the LPD (Local average Propagation Delay) associated with each neighbor and to compute the GPD (Global average Propagation Delay) from the endpoint to the Cell Relay via each neighbor. These values are used to sort and select neighbors. They are used to select the best access for synchronization or to make a choice between different available cells. The network layer will use these values to choose the best path for uplink (routing packets).

After every packet transmission that requires an acknowledgement, the MAC layer will know if the packet transmission was successful or not. If a positive or negative acknowledgement is received, the transmission will be considered successful. If no acknowledgement is received, the transmission will be considered to have failed. For every neighbor in its neighbor list, the MAC layer will update the individual LPD values as shown below:

$$\text{New } LPD = \begin{cases} \dfrac{MAC\_LPD\_NAVG \times \text{Old } LPD + 16}{MAC\_LPD\_NAVG - 1} & \text{if transmission failed} \\ \dfrac{16(MAC\_LPD\_NAVG - 1) \times \text{Old } LPD}{\text{Old } LPD + 16 \times MAC\_LPD\_NAVG} & \text{if transmission succeeded} \end{cases}$$

In these equations the MAC parameter MAC_LPD_NAVG is an integer value that determines the depth of the sliding average window. A scaling factor of 16 has been introduced to allow an integer representation of LPD. The maximum allowed value for LPD is LPD_Max, any LPD computed value above LPD_Max should be truncated to LPD_Max. Note1: LPD is an integer and when the computation gives a number with decimals, these decimals should be truncated. Note2: the new LPD must always be different from the old one (except when the values are zero or LPD_Max). If the new LPD equals the old one and there was a failure the new LPD should be incremented by one; if there was a success of transmission then the LPD should be decremented by one.

The GPD (Global average Propagation Delay) is the average propagation delay between the endpoint and its associated Cell Relay. The network will compute this value step by step from the Cell Relay down to the endpoint. To avoid confusion, one can consider the following notation:

EP_GPD(X)=Global Propagation Delay between the endpoint and the Cell Master if traffic is routed through the neighbor X.

An endpoint can compute the GPD to the Cell Relay via each one of its neighbors according to the following equation:

EP_GPD(X)=GPD of neighbor X+LPD between endpoint and neighbor X+MAC_GPD_TD

MAC_GPD_TD is a MAC layer parameter introduced to model the fixed propagation delay through each node of the network (see appendix on path selection algorithm). The best one of these values will be called the endpoint GPD.

GPD=Min{EP_GPD(X)} for all neighbors X that are registered fathers

This GPD value will be included in the MAC header to make this information available to other endpoints. The allowed values for GPD are the integers between zero and 4095.

The node should update its GPD when it changes level or switches to another cell. The endpoint needs also to check if its GPD has not changed at each reception of a message from one of its fathers. In a more general way, an endpoint should always keep the lowest GPD it can, among its registered fathers (from the same cell).

At start-up the LPD values in the neighbor list should be initialized according to the RSSI value of the first message received from these neighbors. The initialization follows this rule:

$$LPD = \begin{cases} 0 & \text{if } RSSI \geq LPD\_Switch \\ \text{Min}[-(RSSI - LPD\_Switch)LPD\_RSSI, LPD\_Max] & \text{if } RSSI < LPD\_Switch \end{cases}$$

where LPD_RSSI and LPD_Switch are MAC layer parameters.

Stated another way, the present protocol subject matter provides advantageously for uplink routing without requiring a routing table. Such is achieved by addressing the main uplink path in the subject network. Such communication is used to convey the data, from every node of the network to a single extraction point. The challenge associated with such feature and presently achieved is for a node to find the path towards the extraction point without the knowledge of the network topology, that is, without a routing table. Following the objective of reaching the extraction point in a shortest time, the traffic should also be relatively spread so as to avoid peaks, as the traffic becomes more dense close to the extraction point.

Conceptually, per present subject matter, the synchronization process has given a level to every node in the network. Such level represents the number of hops between the node and the extraction point. Each node has a certain number of neighbor with a lower level (closer to extraction point), called fathers (or, parents) of the node; equal level, called brothers; and higher level (further from extraction point) called sons.

In accordance with present subject matter, a node should preferably propagate an uplink message to one of its fathers, which means a closer node from the head of the network. The message will at the end converge on the extraction point. The selected father to route an uplink message is belonging to the best father list. Fathers belonging to such list are those with the best GPD. Computation of the Global Propagation Delay, GPD, is otherwise explained herein. The lowest GPD indicates the shortest path in time. The selected father is not necessarily always the one with the best GPD. The node sends uplink messages randomly to one of these best fathers with a probability for each father inversely proportional to its GPD.

Advantageously, practice of such aspects of the present subject matter achieves the benefits that the shortest paths are selected, knowledge concerning only one hop neighbors is sufficient for the achievement, nodes don't need knowledge of the entire network, so that there are no routing table in the nodes, which results in a relatively large savings on required memory. In addition, generally speaking, traffic is spread over the network, due to randomization between fathers.

One aspect of the present protocol subject matter advantageously provides for real time clock distribution and recovery, particularly applicable in a network, for example, otherwise based on the slotted Aloha protocol.

Generally speaking, time is presently divided into time slots (TS) and the nodes send packets inside these time slots. The frequency used for communication changes at each TS according to a determined pattern: the hyperframe. A number, the Time Slot Number (TSN), is incremented at each TS and it rollovers when it reaches the hyperframe length, at which point the frequency pattern repeats itself. A second number, the HyperFrame Number (HFN), is also associated and incremented with each hyperframe.

Nodes are grouped in cell around a concentrator (or root node) and these 2 numbers are common to all the nodes in the cell; this way their transmitters are always set on the same RF frequency. These 2 numbers will be used by the nodes to refresh their "real-time" clock upon receiving a specific message which originates from the root node. Effectively the distribution of the clock will be done from the root node (extraction point of the nodes' data), which is connected to the internet and thus has access to an accurate real time clock (for example, NTP standard).

Generally, nodes operate with crystals, which results in limited accuracy. The present challenge which is successfully addressed herewith is to refresh periodically the time in each node before its clock drifts beyond the desired accuracy. Since the propagation is not instantaneous the system has to take the propagation delay into account.

The present solution is to advantageously broadcast regularly a timestamp (RITP) provided by the chosen real time clock. The creation of the timestamp will always be done at the root node level when the TSN and HFN of the cell are both zero. This broadcast will also contain the hyperframe number (HFN) corresponding to the initial broadcast by the root node; this allows detection of an overflow of HFN and adapt the RITP value in consequence. This message, following the broadcast protocol, will reach all nodes in the cell; the HFN maximum value is designed for the rollover to be much over the maximum propagation delay of this real time clock distribution.

When a node receives this broadcast it can update its "real-time" clock using the following formula:

$$\text{Absolute time} = (TSN + HFN * \text{hyperframe\_length}) * \text{Timeslot\_Length} + RITP$$

Where the hyperframe length is expressed in number of timeslots and the timeslot length is a time unit (note 150 ms in the present exemplary case). Note: if the HFN of reception is lower than the HFN included in the broadcast then there was a rollover and the RITP timestamp must be updated by adding HFN rollover value*hyperframe_length*Timeslot_Length. Such present solution gives an absolute time with a resolution equal to the time slot length.

When a node just synchronizes in a new network, the RITP timestamp (and HFN corresponding) is given in the synchronization acknowledgement. This way the new node has access to real time without waiting for the next ITP broadcast. Note: This assumes that the RITP broadcast is done each time HFN=TSN=0 to avoid more than one rollover of the HFN number.

Such aspects of the present protocol subject matter advantageously provides a simple way, even while using slotted Aloha architecture, to distribute a real time clock to all the nodes with a resolution of one Time Slot (despite the delay of propagation). It also allows a fast recovery of the real time clock immediately upon synchronizing to a new network.

Figure 16:
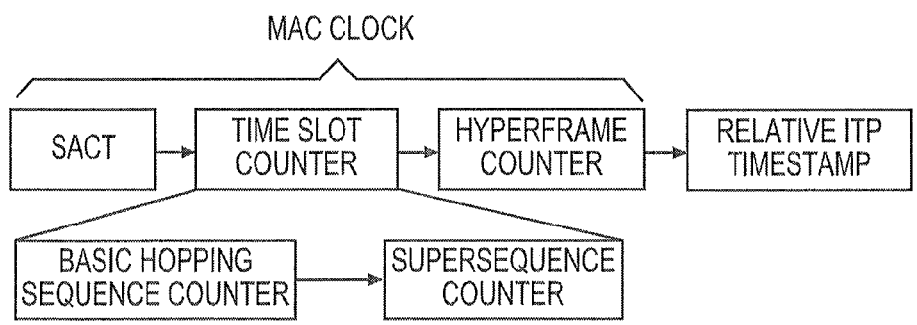
FIG. 16 depicts PROTOCOL TIME KEEPING STRUCTURE subject matter.

Therefore, per present subject matter, time management in the MAC layer is performed with the use of several counters. FIG. 16 illustrates the global structure of such present protocol time keeping structure counters, while the following provides some additional description for each one of such counters.

As to the Slotted Aloha Countdown Timer (SACT), at the beginning of each time slot such timer is loaded with a value corresponding to the default time slot length, MAC_TS_Length. When this timer reaches the value zero, a new time slot begins. Every MAC_Xdrift_LeapTS time slots, the SACT is loaded with the value MAC_TS_Length plus a small correction to compensate for the drift of the crystal (see description of leap time slots in the chapter on drift correction).

The SACT is locally implemented with a resolution specified by the parameter MAC_FW_Accuracy but when SACT values are exchanged between endpoints or included in the MAC header for synchronization purpose, the SACT is defined with a resolution of MAC_SACT_Resolution μs.

The content of the Time Slot Counter is the time slot number (TSN). At the beginning of each time slot this counter is incremented. Its value runs from zero to MAC_HF_Length−1. MAC_HF_Length is the number of time slots in a hyperframe.

The content of the Hyperframe Counter is the hyperframe number (HFN). At the beginning of each hyperframe this counter is incremented. Its value runs from zero to MAC_HFC_Max−1. MAC_HFC_Max is the number of hyperframes spanned by the MAC Clock.

The Time Slot Counter can be split in two cascaded counters, the Basic Hopping Sequence Counter and the Super-Sequence Counter. The content of the Basic Hopping Sequence Counter indicates the position within a basic hopping sequence. At the beginning of each time slot this counter is incremented. Its value runs from zero to MAC_Number_of_Channels−1. MAC_Number_of_Channels is the number of channels used in a basic hopping sequence. The content of the Super-Sequence Counter indicates the position within the hopping super-sequence. When a basic hopping sequence is completed, this counter is incremented. Its value runs from zero to (MAC_HF_Length/MAC_Number_of_Channels−1).

The Relative ITP timestamp (RITP) is initialized to zero at start-up. Once absolute time information is obtained from the network or from the application, this counter can be updated. At each overflow of the hyperframe counter the Relative ITP timestamp must be updated as otherwise explained herein. This timestamp can be implemented with the standard NTP (Network Time Protocol) format or with a shortened version of the standard NTP format according to the required accuracy and span.

Figure 17:
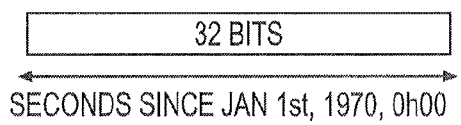
FIG. 17 depicts STANDARD ITP TIMESTAMP FORMAT subject matter.

Present FIG. 17 generally represents a standard ITP (Itron Time Protocol) timestamp format. From the above-referenced present protocol time management structure, one can define several time values. Two which are given here, will be useful for several purposes, and they are the absolute time and the relative time.

The absolute time corresponds to the real time clock of the application. It can be used to date any event in an absolute way. Its resolution is the time slot length. In terms of the time keeping counters, the absolute time value is given by the formula already referenced hereinabove.

In contrast, the relative time is used to measure durations on a time scale smaller than the span of the MAC clock. This time has a higher resolution because it uses the SACT. In terms of the time keeping counters, the relative time value is given by:

$$\text{Relative time} = (TS\_Length - SACT*\text{"SACT time units"}) + (TSN + HFN * MAC\_HF\_Length) * TS\_Length$$

The SACT time units depend on the implementation and are given by the parameters MAC_FW_Accuracy or MAC_SACT_Resolution. The span of this relative clock is given by Span of MAC clock=MAC_HFC_Max*MAC_HF_Length*MAC_TS_Length At each overflow of the Hyperframe Counter, the Relative ITP timestamp needs to be updated as follows:

$$(\text{New value of RITP}) = (\text{Old value of RITP}) + (\text{Span of MAC clock})$$

An operation of generating an absolute timestamp is needed when the MAC layer has to inform the LLC layer that a new real time clock value has been delivered by the network. The timestamp value computed in such instance is the absolute time at the moment the MAC layer sends to the upper layers the indication of new timestamp arrival, as follows:

$$\text{Absolute ITP timestamp} = (TSN + HFN * MAC\_HF\_Length) * MAC\_TS\_Length + RITP$$

Relative to generation of a value for the Relative ITP timestamp, when the application communicates an ITP timestamp value to the MAC layer, the MAC layer will need to reference this timestamp to the MAC clock (TSN and HFN) and store the resulting value in its Relative ITP timestamp register. This will occur for instance in a Cell Relay when the application will need to true up the real time clocks of the cell. The RITP value will be computed with the following equation:

$$RITP = (ITP\ timestamp\ value) - (TSN + HFN * MAC\_HF\_Length) * MAC\_TS\_Length$$

Relative to present protocol subject matter Time Synchronization Services, there are two ways to propagate the time over an entire cell: at synchronization phase and by periodical update. The present absolute time subject matter will be used both inside the present network protocol subject matter itself (at the MAC layer) and at the application level (in this example, energy metering).

Each cell relay has an NTP client which allows it to receive an NTP timestamp from the WAN. It uses this NTP value to update its RITP. The cell relay sends periodically ITP broadcast messages to the entire cell, with exactly the same process as a "regular" broadcast message. This ITP broadcast message contains the RITP information, base of the time re-generation in endpoints. Each time an EP receives such a message, it reads and updates the RITP and forward the message to its sons.

The second way to acquire the RITP field is during the synchronization process. When an EP wakes up after a power failure, it no longer has any notion of time. The RITP field is given inside a SYNC ACK message after the EP requests synchronization with a synchronized neighbor. Thus, as soon an EP is synchronized, it advantageously knows the time per the present protocol subject matter.

In one aspect of the present subject matter, an objective advantageously achieved is to true up the real time clocks in every node of a cell. There is no requisite Input argument. The operation is described in the context of a service that is only used in a Cell Relay. The Cell Relay MAC layer builds an ITP broadcast packet. The MAC header of this packet contains the value of the RITP together with the HFN at the moment the packet is created. This packet is broadcast with the usual broadcast rules defined in this protocol. This broadcast will allow each recipient node to update its own Relative ITP timestamp. The recipient nodes will use the HFN value included in the packet to detect a possible overflow of the MAC clock since the ITP broadcast packet creation. The span of the MAC clock should be much longer than the expected travel time of a packet through the meshed network in order to avoid ambiguities.

In another aspect of the present subject matter, an objective advantageously achieved is the provision of a service which allows the application layer (through LLC and NET) to update the Relative ITP timestamp of the MAC layer. The requisite Input argument involves the Absolute ITP timestamp. The operation is again described in the context of a service that is only used in a Cell Relay. The MAC layer uses the absolute ITP timestamp to compute a Relative ITP timestamp value. The MAC layer then updates its RITP register with this computed value (See "Generation of a value for the Relative ITP timestamp" above). This service is usually called before an ITP broadcast. It is distinct from the ITP broadcast service in order to avoid the uncontrolled aging of a timestamp in a packet waiting in a queue.

Still another aspect of the present subject matter is advantageous achievement of an objection of indicating to the application layer (through LLC and NET) that an ITP broadcast has been received. The requisite Output arguments are Absolute ITP timestamp, RITP, and The description of the operation is that the recipient endpoint retrieves the RITP and HFN values from the MAC header. It then compares the HFN value in the message header to its own HFN. This allows the MAC layer to detect a possible overflow of the Hyperframe Counter since the creation of the ITP broadcast packet. If no HFC overflow occurred, it writes the RITP value in its own RITP register. If an overflow occurred, it increments the RITP value with the span of the MAC clock and writes the result in its RITP register. The MAC layer then computes an absolute ITP timestamp (See "Generation of an absolute timestamp" above) and sends to the LLC layer an indication with this absolute ITP timestamp as argument. This indication informs the LLC layer that the RITP has been updated in the MAC layer and gives to the LLC layer the value of a timestamp that can be used to update the real time clock of the application. The ITP broadcast packet is then forwarded to the endpoint's sons according to the usual broadcast rules. The RITP and HFN values retrieved from the ITP broadcast packet MAC header are also sent to the LLC layer with the purpose of allowing the reconstruction of the packet for the follow-up of the broadcast.

Another objective advantageously achieved with the present protocol subject matter allows an endpoint to obtain the value of the RITP and the value of the Hyperframe counter from its father at synchronization. Such operation is actually a part of the synchronization process, as otherwise discussed herein. However, for the sake of present clarity, it is simply noted that when an endpoint receives an acknowledgement to its synchronization request, it will update its RITP and HFN from the information contained in that acknowledgement.

An important aspect in a mesh network using a frequency hopping sequence is the synchronization process. Indeed, once every EP in the cell knows the channel sequence and the current TS in the sequence, they need to periodically maintain such information up-to-date. Due to clock drift, such information can become corrupted with time. Re-synchronization of the clock of every EP is therefore needed.

When the subject network is switched on for the first time, no components know when the time slots begin and which frequency to use. As in all synchronized systems, a metronome or equivalent operation is needed. The cell relay (or Cell Master) is the preferred such component in the present protocol subject matter because it is always considered as "synchronized". For the other endpoints, per the present subject matter, the synchronization is hierarchical. Endpoints which can hear the relay (Cell Master) become synchronized, and then it is their turn to synchronize their neighbors. During such process, a level is given to each endpoint, which indicates how many hops they are from the cell relay (Cell Master).

Figure 18:
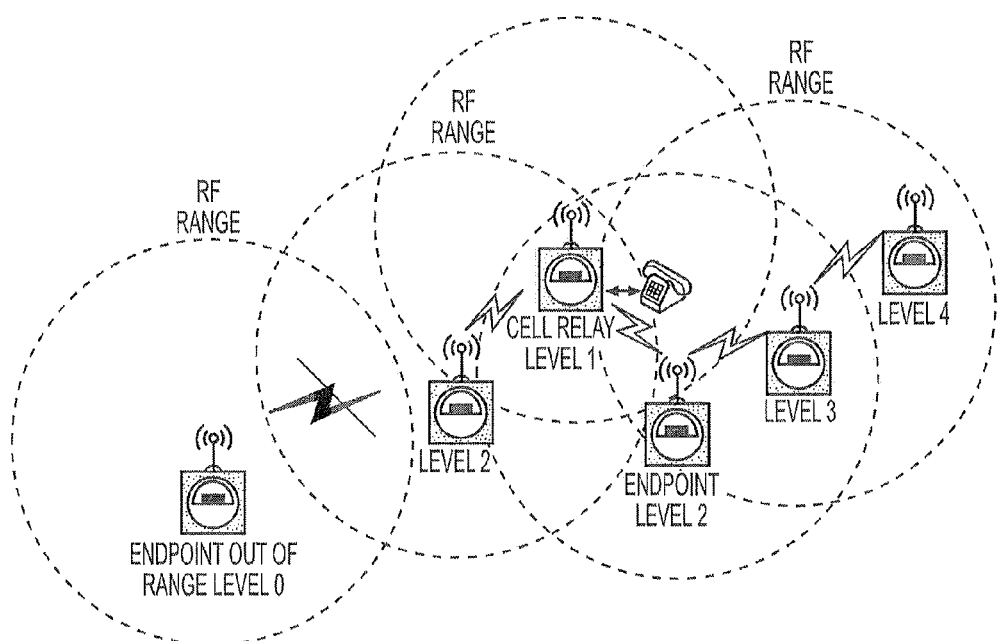
FIG. 18 depicts SYNCHRONIZATION AND LEVELS subject matter.

A relay has a level "1"; a non-synchronized endpoint has a level "0"; and an endpoint that is at N hops from the cell relay has a level "N+1". The respective levels relative to present synchronization protocol are represented in present FIG. 18.

To summarize terminology as otherwise referenced herein, an endpoint which is:

Level N compared to an EP level N−x, x>=1, is called a son (or child)

Level N compared to an EP level N+x, x>=1, is called a father (or parent)

Level N compared to an EP level N is called a brother (or sibling)

Level 0 is called an orphan

Figure 19:
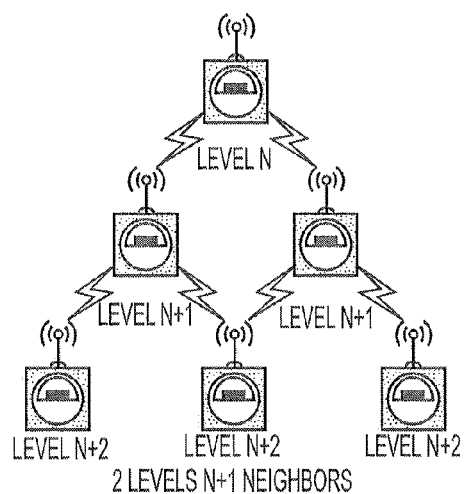
FIG. 19 depicts HIERARCHICAL SYNCHRONIZATION subject matter.

Present FIG. 19 represents the hierarchical synchronization aspects of the present subject matter, such that an endpoint keeps its synchronization from any synchronized neighbor that respects the following conditions:

- The neighbor should belong to the same cell (same channel sequence)
- The neighbor should be a father, i.e. it should have a higher hierarchical position (a lower level number).

Such conditions give the possibility for an endpoint to have more than one source for synchronization information. This is possible because, at the end, everybody in the cell will have the same time base. It also allows a level N endpoint to synchronize itself with a level N−2 endpoint (see the conditions to change level as otherwise referenced herein).

The maximum level in a cell is 63. It is limited by the number of bits (6) allocated to this field in the messages. As a result of the rules above, an EP of level 63 cannot be used for synchronization.

Figure 20:
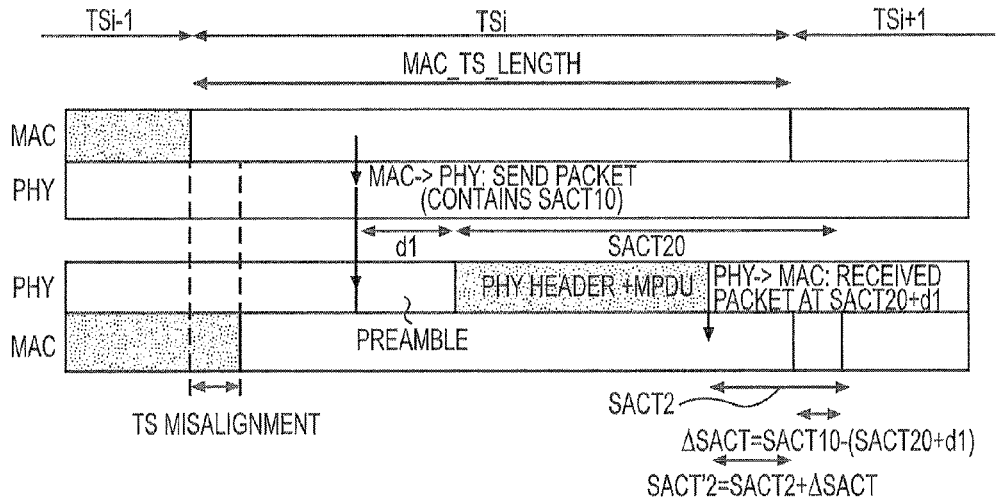
FIG. 20 depicts RE-SYNCHRONIZATION BETWEEN ENDPOINTS subject matter.

Present FIG. 20 represent various aspects of the present protocol subject matter as relates to resynchronization between endpoints (EPs). Per present subject matter, an EP advantageously resynchronizes itself each time it receives a message from one of its fathers, by re-computing the beginning of its next time slot. At each beginning of time slot, a countdown timer called Slotted Aloha Countdown Timer, SACT, is set with the MAC_TS_Length value. When such timer reaches 0, the MAC layer switches to the next timeslot. The resynchronization process consists in re-computing the value of the SACT to align the sons' timeslots on the fathers' ones. This resynchronization is performed with the following algorithm:

- The length of the preamble (including the SFD field) is predefined and the bit rate is known. Therefore, the duration, d1, of the preamble can be readily computed.
- On the transmitter side, the sender indicates in the MAC header the SACT value, SACT10, corresponding to the beginning of the physical transmission of the packet (i.e. the time between the transmission of the first bit of the packet and the next time slot change, as measured in SACT time units).
- On the receiver side, as soon as the SFD is detected, the physical layer of the recipient endpoint reads its timer value, SACT20, and deduces SACT20+d1, the SACT value when the sender began the transmission of its message.
- The physical layer indicates to the MAC layer that it has received a message at SACT20+d1. The MAC layer also reads the timer value SACT10 contained in the MAC header.
- Then at any moment, the MAC layer can update its timer value, SACT2, by added the correction $\Delta$SACT.

$$SACT'2=SACT2+\Delta SACT$$

$$\Delta SACT=SACT10-(SACT20+d1)$$

Advantageously per such present operations, the endpoint auto adjusts the next time slot, which compensates for the internal drift of the device. By following such present process at each received message from a higher-level endpoint, the endpoint drastically decreases the probability of losing its synchronization.

Each time an endpoint receives a message from a neighbor endpoint, the MAC layer records two time values in the neighbor table: the SACT value read from the sender MAC header (SACT10 above) and the reception time of the packet. These values can then be used at any moment when the endpoint decides to synchronize with that neighbor.

The SACT is defined with a resolution of MAC_SACT_Resolution μs.

Dating received and transmitted messages should be accurate enough to allow the present protocol to work properly, and especially for the resynchronization process to work correctly. The crystal clock of the system should be chosen at ±MAC_Crystal_Accuracy ppm and the firmware has to date the message at ±MAC_FW_Accuracy μs. Dating a received message should be done by taking a snapshot of the SACT countdown timer when the SFD field is detected by the PHY layer, as it is otherwise explained herein.

A sender should also date the message and include the SACT value in the MAC header.

It is a difficult task to precisely compute the SACT at the exact moment when the PHY layer will send the first bit. Indeed, in the meantime, the MAC layer will have to build the header, compute the CRC and then give the message to the PHY layer; and then the PHY layer will have to add its header and configure the RF transmitter. It is an aspect of the present subject matter that it is preferable for a given implementation thereof (such as in producing the actual firmware to be used), to estimate a worst case time between the moment of the dating and the planned transmission, and set a timer with such time. During such allocation of time, the MAC and PHY layers should have enough time to prepare the packet. The PHY layer will then wait during the remaining time and send the first bit as soon as the timer reaches the defined value.

For a particular implementation using an off-the-shelf transceiver approach, it is noted that dating at the SFD reception is typically the most simple and preferred thing to do. If it is more convenient for a given implementation to date at another moment inside the message, the user is free to do so per the present subject matter, as long as remembering to take into account the length of the message.

When an endpoint receives a message, it can easily compute the beginning of the next time slot. But such information alone is not enough since the channel of the next time slot is not known at that moment. The endpoint will find this information in the MAC header. Three fields are important for the synchronization process. The first one is the level of the sender: (Re)-synchronization is only allowed with the fathers. The two other fields are the time slot number and cell address. As every endpoint can compute the channel sequence from the cell address contained in the header, and because the time slot number informs on where the sender is in this hyper sequence, the recipient can find the channel that the sender will use in the next time slot.

Such three fields are present in all the messages: beacons or other messages. So every message can be used for synchronization. The time slot number field has another use. Even if an endpoint receives a message on an adjacent channel, it will know the actual channel on which the message has been sent.

An EP re-synchronizes itself each time it receives a message from a SYNC father, whatever the nature of the message. If there is no traffic, dedicated messages (presently referred to as beacons) are sent periodically by every synchronized EP. If the traffic is dense enough compared to the default beacon periodicity, beacons are not sent. It can be viewed as a timer with the initial value MAC_Beacon_Periodicity_SYNC. Each time a packet is sent, the timer is restarted from the beginning. If the timer reaches '0', a beacon is sent.

Several parameters permit the computation of beacon periodicity of synchronized EPs. The most important is the clock accuracy of the EP. It is mainly dependent on the accuracy of the crystal (or oscillator) and of the firmware clock. Another parameter is the number of beacons one can assume a system can miss, due to collisions, jammers, etc. The last parameter is the maximum drift the system is authorized to have between 2 levels. For such computation, one may consider the worst case, when an EP has only one SYNC father.

$$\text{Beacon\_Periodicity\_SYNC} = \frac{\text{TS\_Margin}}{2*\text{Clock\_Accuracy}*(\text{Max\_Nb\_of\_Missed\_Beacons}+1)*\text{TS\_Length}}$$

Example

TS_Margin=15 ms
Clock_Accuracy=±20 ppm
Max_Nb_of_Missed_Beacons=3 missed beacons
TS_Length=150 ms
→Beacon_Periodicity_SYNC=625 TS (this corresponds to 1 min 34 s)

In a low traffic situation with many endpoints transmitting periodic beacons, there is a significant probability that two endpoints will choose the same time slot and sub time slot to transmit their beacons. This probability increases roughly as the square of the number of endpoints and would be close to one in a cluster of 100 endpoints. This would lead to recurring collisions between those beacons. To prevent this situation, the actual transmission time of the beacons should be randomized within a ±20%, i.e. around 125 time slot (for MAC_Beacon_Period_SYNC=625) window while keeping the average periodicity defined above.

The Cell Size Indicator, CSI, is a 4-bit field contained in each MAC layer. This field value is set by the Cell Master depending on the size of the cell (determined by the number of entries in a NET Cell Master routing table). This will require an internal message from the NET layer of the Cell Master to its MAC layer. This field, like the GPD, will propagate with each message from the Cell Master. At each received message from one of its fathers, or from endpoints which were fathers, the node updates its CSI looking at the MAC header value. An endpoint (other than the Cell Master) always keeps the highest value of CSI among its fathers belonging to the same cell.

The algorithms to choose a cell during discovery phase and to switch cell will consist in selecting the best father according to their term. The CSI is one of the parameters used to determine this term. The values for the CSI are given in the network layer section.

Alternatively per the present subject matter, the CSI propagation could be based on the last message received from a father. Such approach avoids keeping this extra field in the neighbor table of each EP. The tradeoff is that during the propagation of a new value of CSI, there will be much more bounces (the other way makes it faster to increase the value and slower to decrease it).

A neighbor of an endpoint is called a potential synchronization father (or potential SYNC father) for that endpoint if it complies with all of the following conditions:

The neighbor is known to the endpoint, i.e. it has been heard at least once and is still recorded in the neighbor table.
The neighbor is already synchronized (its level is different from zero).
The neighbor has a level below 63 (which is the maximum level allowed in a cell).
The neighbor is registered to a cell (RS bit=1).
The neighbor is an authorized endpoint, i.e. an endpoint that has not been flagged as forbidden (The Sync_Forbidden bit in the neighbor table should be zero).
The neighbor has at least a weak connectivity. Connectivity Degree ≥1 (CD value ≥1)
The neighbor belongs to a cell which is not forbidden.
The neighbor belongs to a cell which is not full (CSI value different from the maximum value). Note: This condition is not considered if the node is already a member of this full cell.

The forbidden character associated with a cell is set by the API layer. It can be set if the user decides that two close-by cells should never authorize endpoints from the other cell or if a cell is full. A cell can be re-authorized by the API layer. This information will also be reset if the meter stays non-synchronized for a long time, defined by the parameter MAC_Unsynchronized_Timeout.

Through a selection process described later, the more suitable potential synchronization father is chosen to become the synchronization father (or SYNC father for short). If this neighbor answers positively to the synchronization request, it becomes the actual SYNC father of the node.

It should be pointed out that the potential SYNC father conditions are evaluated at a given time. If a potential SYNC father (or a SYNC father) is not heard during MAC_Neighbor_Timeout, it will be removed from the MAC neighbor table and will be no more considered as a potential SYNC father (or SYNC father).

When an endpoint becomes synchronized with a cell, some of its potential fathers will be actual fathers and some others might be brothers or sons. On the other hand some fathers might not qualify to be potential SYNC fathers. The fathers that are also potential SYNC fathers will be called healthy fathers. Of course by definition a non synchronized endpoint has no father at all, it can only have potential SYNC fathers. FIG. 21A schematically represents Potential SYNC fathers and healthy fathers for a synchronized node.

The Connectivity Degree (CD) is a variable that measures the connectivity of a node with the network. Connectively Degree per present subject matter is represented by present FIG. 21B. The CD value of a node depends only on the number of potential SYNC fathers it has among its neighbors. If the endpoint is not yet synchronized, all potential SYNC fathers are considered for the computation of CD. On the other hand if the endpoint is synchronized, only the brothers and fathers are taken into account. Notice that a synchronized endpoint should have at least one father (inferior level) in order to be considered having connectivity (CD>0). The table below shows how a value is assigned to CD as a function of the number of potential SYNC fathers. This degree is indicated in most of the MAC headers and shared with the neighborhood. It will be used by others for synchronization decisions.

In order to maintain its clock synchronized with the network, an endpoint must receive frequent enough beacons or messages from its fathers. There is therefore a need to assess the average rate at which an endpoint receives messages from a given neighbor. This will play an important role when deciding which neighbor can act as an efficient SYNC father. Neighbors that are only heard once in a while will be deemed bad potential SYNC fathers compared to others that are regularly heard. The Reception Rate Indicator (for short RXI) is easy to implement and provides an indication of the rate at which messages are heard from a neighbor, although it is not an exact measurement of the actual reception rate.

A variable of one byte is associated with each neighbor in the neighbor table. We call this variable the RXI of the neighbor X and write RXI(X). These RXI are managed according to the following rules:

Upon reception of a message from X, increment its RXI $$RXI(X) \leftarrow Min[RXI(X)+RXI\_Increment, 255]$$

At each hyperframe start, decrement all the RXI $$RXI(X) \leftarrow RXI(X)*RXI\_Decay, \text{ for all } X \in \{\text{Neighbor table}\}$$

High values of RXI indicate that the frequency of message reception is high. Therefore, neighbors with high RXI values have an advantage in the SYNC father selection process.

Other discussion herein reflects on how an EP keeps its synchronization from the cell clock per the present subject matter, which assumed for such point of discussion that the EP was already connected. At power-up of after a loss of synchronization, an EP is considered as non-synchronized and enters in a so-called Discovery Phase.

In other words, per present subject matter, this aspect has to do with the provision of a network discovery arrangement wherein a new node with no previous knowledge of its environment is able to establish a link to an existing network. Upon wake up, such new node will preferably transmit a discovery beacon over several channels in succession and then go into a listening mode to listen for any response. The transmitted discovery beacon includes information as to a specific channel on which the new node will listen. When synchronized nodes hear the discovery beacon, they transmit a message to the new node including information necessary for the new node to synchronize with the network. The transmitted message may include time, frequency, network identifier, etc. and is transmitted at the new node indicated frequency and at random times within a listening window. The new node may then collect information and choose the best network among desired criteria and synchronize with the chosen access node in the network.

In a frequency hopping network, nodes that just powered on and start from scratch have no idea of their environment. They need to connect and to synchronize with a network, which is complicated by the fact they don't know at which frequency and which time the network operates. The Discovery Phase of the present protocol subject matter is an algorithmic approach to enable the node to quickly analyze its environment and look for the best network it can connect with, without disturbing the operating network.

Broadly speaking, additional benefits of such present subject matter include that a new neighbor finds a connection with a network in a very short time, all the neighborhood networks are discovered, and all while the neighborhood operating networks are not disturbed from their regular activities.

More specifically, as the traffic is very low inside a cell and as the cell is continuously switching from one channel to another, it can take a long time for a non-synchronized endpoint to intercept a message from a synchronized one. To accelerate this process, the non-synchronized endpoint sends discovery beacons successively on all the channels. The order of channels follows the hopping sequence generated by a cell ID of 0. There is one discovery beacon per channel in the system. The channel of the first discovery beacon should be computed randomly to ensure that two non-synchronized endpoint will not choose the same at power up. Discovery beacons are sent every MAC_Discovery_Beacon_Period ms.

Each discovery beacon contains in the MAC header the Number of remaining Discovery Beacons (NDB field) to send, and the listening channel (RxC field). After sending all the discovery beacons, the endpoint enters in a listening state during MAC_Listening_Window_Length. The listening channel is the same than the one used for the first discovery beacon. There is a high probability that synchronized EPs in the radio range of the EP will receive at least one of these discovery beacons. The reception of one of these discovery beacons forces them to send a "forced beacon" at the required channel inside the listening window. As every synchronized EP in the neighborhood will do the same pattern, the listening window should be long enough to contain most of the answers. The formula below gives the length of the listening window, for a case where the number of collisions between the neighbors' answers is minimized.

$$\text{Listening\_Window\_Length(seconds)} = \left(\frac{\text{Max\_Nb\_of\_Neighbors}}{\text{Nb\_of\_Sub\_TS}}\right) * \text{TS\_Length}$$

Example

Figure 22:
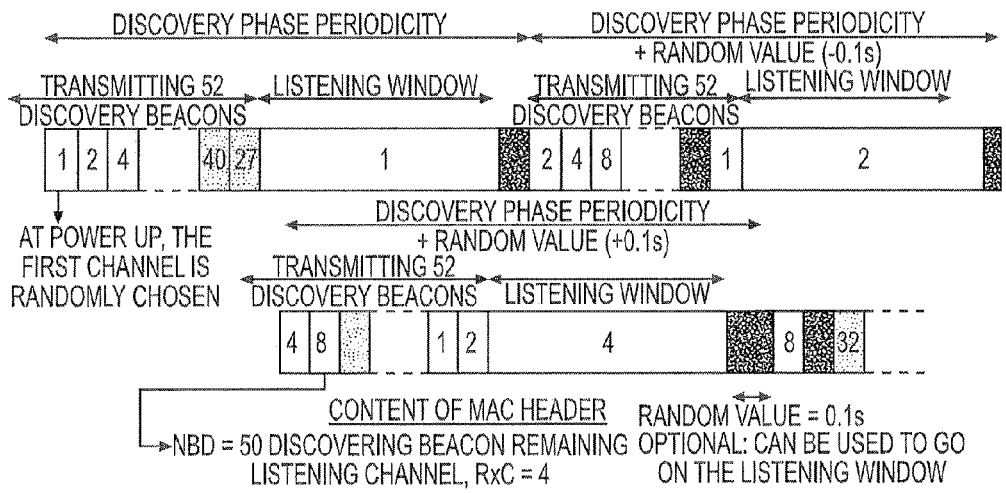
FIG. 22 depicts DISCOVERING PHASE EXAMPLE WITH BASIC FREQUENCY HOPPING SEQUENCE NUMBER 0 OF PHY-FHSS-NA-915 subject matter.

MAC_Max_Nb_of_Neighbors=100 EPs
MAC_Nb_of_Sub_TS=6 Sub_TS
MAC_TS_Length=150 ms
→MAC_Listening_Window_Length=2.5 seconds or 17 TS Present FIG. 22 represents a Discovering phase example with basic frequency hopping sequence number 0 for an embodiment operative in PHY-FHSS-NA-915.

During the listening state, information on all the neighbors that have answered, and mainly synchronization information (address, level, time, channel, cell address, GPD, and RSSI), is saved in the neighbor table of the endpoint. At the end of the listening state, if there is no answer, the next discovery phase is started after a random time (see below). The channel of the first beacon of this new discovery phase is the next one, in the hopping sequence, after the one used in the previous listening window. This process is repeated with a period of MAC_Min_Discovery_Phase_Period modulated by a random time (maximum default value is 100 ms) to avoid repetitive collisions between non-synchronized endpoints. Between the end of the listening window and the start of the new discovery phase, the endpoint can stay in listening mode. This process stops at the end of a listening period if the endpoint has received at least one answer from a potential SYNC father (if it is a warm start then this answer must come from its preferred cell; see present discussion about warm vs. cold start).

In the situation that an endpoint doesn't succeed to synchronize with one cell after MAC_Max_Nb_of_Discovery_Phases discovery phases, the period of discovery phases will be increased from MAC_Min_Discovery_Phase_Period to MAC_Max_Discovery_Phase_Period. This will prevent an orphan from polluting the RF band with useless messages. The period will be reset to its initial value if the endpoint succeeds to synchronize.

At the end of the listening window, if at least one valid answer has been received, the EP goes into the next step. An answer or data message from a neighbor will be considered as valid for synchronization purpose if it meets the potential SYNC father conditions. It can be pointed out that non-synchronized endpoints, non-registered endpoints (RS=0), endpoints of level 63, non-connected endpoints (CD=0) or endpoints from a full cell (CSI=max value) are not allowed to send forced beacons. But there is a chance that an endpoint in discovery phase hears a message intended for another endpoint, in which case it should check the potential SYNC father conditions.

The next step for this endpoint that tries to become synchronized is to choose the best access to the network. For this selection the endpoint will consider all neighbors it has received an answer from or overheard a packet from, unless they were discarded for the aforementioned reasons. Among these neighbors, it will choose the best access using a criterion based on the following principles:

Low CSI: Cells with a lower number of endpoints will be preferred to the ones that are more populated.

Low EP_GPD: Neighbors with low GPD values will be preferred. The EP_GPD of a neighbor is the Global average Propagation Delay between the endpoint and the Cell Master through the selected neighbor.

Good Level: a neighbor closer to the Cell Master will be preferred to a neighbor more hops away from the Cell Master.

The level of a neighbor, as well as its CSI, is indicated in the MAC header. The EP_GPD values, on the other hand, need to be computed. Mathematically, EP_GPD=GPD of the neighbor (as reported in its MAC header)+LPD+MAC_GPD_TD.

The Local Propagation Delay (LPD) of a neighbor is usually computed from the track record of past communication attempts with that neighbor. This algorithm is explained in a dedicated chapter. During the discovery phase, computing a LPD is however impossible because the endpoint has not yet exchanged enough messages with the neighbor to gather statistically relevant information. In this case an estimation of the LPD based on the RSSI reading is used.

In order to make a selection based on a combination of the principles mentioned above, we introduce a term to characterize the ability of a neighbor to act as a suitable synchronization source.

$$SYNC\_Disc\_Merit=EP\_GPD*MAC\_SYNC\_Disc\_Weight\_GPD+\\MAC\_SYNC\_Disc\_Weight\_Level*LVL+\\MAC\_SYNC\_Disc\_Weight\_CSI*CSI$$

There are defined three MAC layer parameters, MAC_SYNC_Disc_Weight_GPD, MAC_SYNC_Disc_Weight_Level and MAC_SYNC_Disc_Weight_CSI. The values of these parameters will depend on the importance one wants to give to the GPD, level or to the cell size in the selection process. If one sets the last two parameters to zero, only the GPD will be used to select the synchronization point.

The selection process for the best access can be summarized as follows:
1. First the endpoint computes the EP_GPD for each neighbor it has received an answer from or overheard a packet from (provided the neighbor is a potential SYNC father).
2. For each neighbor, the endpoint computes the term for synchronization, SYNC_Disc_Merit.
3. The endpoint selects the neighbor with the lowest SYNC_Disc_Merit value and synchronizes its time slots and frequency sequence with it. The neighbor table must be managed carefully in this process to allow the endpoint to back up and re-synchronize with another neighbor if necessary.
4. The endpoint then has to ask this neighbor for the permission to synchronize with it. For this purpose it sends a specific message called a synchronization request (SYNC Request).
5. If this request is not positively acknowledged, the endpoint should flag the neighbor as forbidden (set the Sync_Forbidden bit to 1 in the neighbor table) and proceed to step 3 above with the next valid neighbor in the list with the best term. Several situations can lead to this failure:
   a. The neighbor doesn't answer the SYNC request. The endpoint's MAC layer will repeat the request (for a number of attempts defined by Max_Nb_of_SYNC_Request and with a minimum period given by MAC_SYNC_Request_Period plus some randomization over a few time slots) before concluding that the neighbor is not reachable.
   b. The neighbor answers with a SYNC NACK to indicate that it refuses the synchronization request. In this case the endpoint must immediately conclude that this neighbor is not suitable for synchronization.
6. If the neighbor accepts (by sending a SYNC ACK), the endpoint updates its level and switches to synchronized mode. The SYNC ACK also contains the current hyperframe number in the cell (HFN) and the Relative ITP (RITP). The RITP will allow the endpoint to know the absolute time without waiting for an ITP broadcast message (see Time section).

Figures 23, 24:
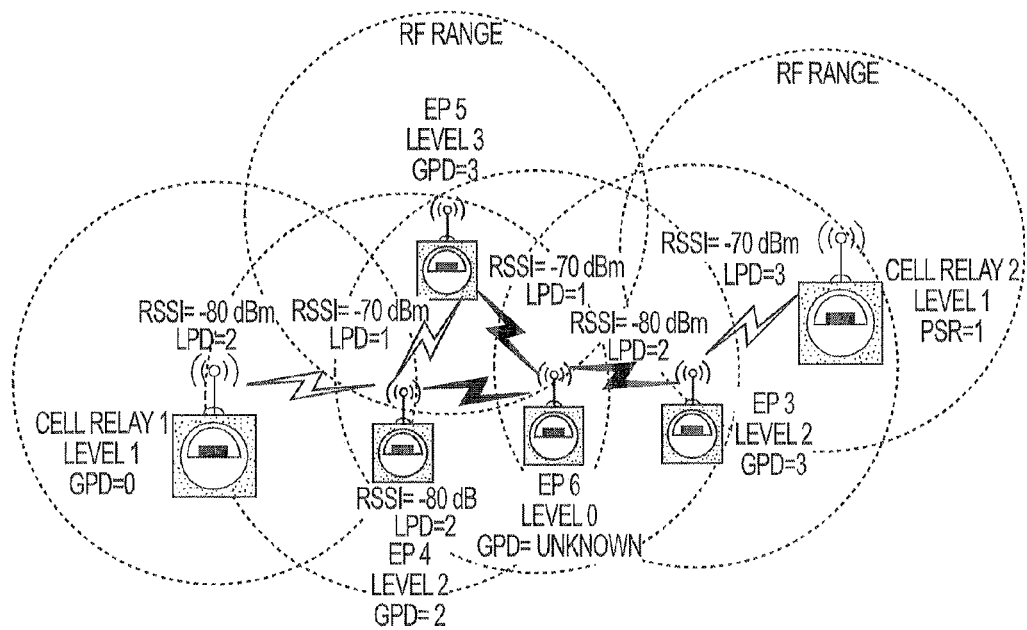
FIG. 23 depicts a Table relating to examples of preferred neighbor subject matter.
FIG. 24 depicts CONFIGURATION EXAMPLE subject matter.

The table of present FIG. 23 gives an example for the use of the term with three neighbors and MAC_SYNCDisc_Weight_GPD=1, MAC_SYNC_Disc_Weight_Level=50. In this example the preferred neighbor is the third one.

The foregoing discussion described the mechanism for a cold start, i.e. the non-synchronized endpoint had no prior knowledge of the network. When an endpoint which is already synchronized and registered with a cell experiences a power outage and is then powered on again, it can use its knowledge of the network to recover more quickly its state from before the power outage. This process is called a warm start.

For a warm start, there will be a notion of preferred cell at the MAC layer level. The preferred cell is the one the endpoint was registered with before the power outage. At first, the endpoint will consider itself already registered (RS bit set to 1) and try to connect only to its previous cell. If after a number of discovery phases (defined by Warm_Start_Discovery_Duration) it has not managed to do so, it will consider the other cells and restart the discovery phase without preferred cell as in cold start.

During the warm start, the discovery beacons contain the address of the cell that the endpoint wants to synchronize with. This is to prevent endpoints belonging to other cells from sending forced beacons and flooding the link at each discovery phase for nothing. This field is set to 0 during cold start.

It is very important that the selected neighbor checks its own connectivity to the network before acknowledging a SYNC request. Before acknowledging a SYNC Request an endpoint must check if it has received a recent message from a healthy father during the last MAC_SYNC_Father_Request_Beacon_Threshold time slots. If it is not the case, it should request a beacon from the healthy father with the best LPD:

$$MAC\_SYNC\_Father\_Request\_Beacon\_Threshold \leq \\ Beacon\_Periodicity\_SYNC$$

Upon reception of a SYNC Request an endpoint will either answer with a SYNC ACK (or SYNC NACK) or send a beacon request to one of its healthy fathers if it has not received any recent message from any of them. In this last case the endpoint doesn't answer the synchronization request immediately but waits for the neighbor to retransmit its request. By the time the same neighbor requests again synchronization, the endpoint should be able to accept the request because it will have received a recent messages from one of its own healthy fathers. In this case the endpoint will send a SYNC ACK.

The endpoint which has received the synchronization request needs either to send the synchronization acknowledgment or to request a beacon in the time slot following the SYNC Request reception.

The father which has been requested to send a beacon, has to send it in one of the next time slots following the reception of the beacon request, before MAC_SYNC_Request_Period time slots have elapsed. If this node has already planned to send another message (that has the same header information as a beacon) in this window, it doesn't need to send a beacon.

The endpoint which has been asked for synchronization will send a SYNC NACK in the following cases:
  The endpoint is not synchronized anymore (level 0)
  The endpoint has a level 63.
  The endpoint is not registered to a cell (RS bit=0)
  The endpoint has no connectivity. Connectivity Degree=0 (CD=0). The Connectivity Degree should be updated after the SYNC Request reception, mainly to refuse synchronization in the case where an endpoint tries to synchronize with its own (former) son.

Upon reception of a SYNC NACK from a neighbor, its Sync_Forbidden bit should be set to 1, which prevents further synchronization requests from being sent to this neighbor. Between successive discovery phases, the neighbor table should not be cleared in order to retain this information.

The forbidden bit associated with a neighbor should be cleared to 0 if the node notices a change in these parameters:
  The neighbor changes its level (except to 0).
  The neighbor switches to another cell.
  The neighbor becomes registered (RS bit from 0 to 1).
  The neighbor changes its connectivity degree (CD from 0 to a positive value)
  The neighbor is new in the neighbor table.

The forbidden bit of all the neighbors in the table should be cleared to 0 if:
  The node changes its level (except to 0).
  The node switches to another cell.

A complete synchronization example is provided with reference to present FIG. 24. EP6 is a new meter and it has three neighbors on two different cells. EP4 is the best endpoint to synchronize with. In this example, there are only seven different channels.

If the only SYNC father requests synchronization from one of its son, the son has to refuse immediately. The son should also realize that it has lost its synchronization. A meter, which has refused a synchronization, has to be marked (Sync_Forbidden=1) not to be asked later again. If the properties of this meter change (level, cell, power up), the mark is removed.

The present protocol subject matter advantageously provides for Beacon Requests and RS bit resolving to avoid circular routes. Such subject matter primarily applies to the environment of a tree network where the nodes are organized in cells with a concentrator (or root node) at the "head" of each cell. Each node has a level associated with its place in the cell. As otherwise referenced herein, the root node is level 1 and is always synchronized (by definition). In order to get its data to the root node a node must be synchronized in the corresponding cell.

Stated another way, the present synchronization process requires a hand check between one synchronized node and another node. A node which synchronizes on another becomes its son and the other node becomes the father of the first one. The new node level is one more than the one of its father. Therefore, all nodes have a level above 1. Nodes of the same level are called brothers. The group of fathers, brothers and sons of a node are called its neighbors. Each node keeps a table of its neighbors.

The problem successfully addressed by the present subject matter relates to when a node (node1) looses its synchronization and asks one of its brothers or sons for synchronization. If one of these nodes (for example, node 2) accepts to give synchronization to node1, then it changes level (level of node2+1). After that, another node (for example, node 3) which had node1 as father can realize it is no longer the case (since level of node1 is now over its own level) and can try to find a new father to which to synchronize. Specifically, it can ask node1, which will accept. If node 3 was the father of node 2, it will start finding a new father. Left on its own, such process can become an endless loop with nodes asking synchronization to one another without a real path to the concentrator (and thus without being actually synchronized). The main part of this problem is the delay between the new state of a node and the time its neighbors realize it.

The solution of the present subject matter is based on Synchronization information, which is present in all messages; Beacons (which are packets with only the synchronization information); and based on beacon requests (which are packets requesting a beacon from a neighbor).

One of the main parts of information for synchronization takes the form of one bit (the RS bit) which indicates if a node still has fathers (that is, the RS bit set to 1) or not. This bit is present in all packets because this information must be updated as fast as possible and thus must make use of any communication. A node will accept to give synchronization only if it has received a relatively recent message from a father (with an RS bit set to 1).

When a node receives a synchronization request (SYNC_REQUEST), it will check if it has received a recent message from one of its fathers (with RS bit set to 1). If it finds such a father then it accepts to give synchronization (SYNC_ACK). Otherwise, it sends a Beacon Request to one of its fathers with the RS bit set to one. This father will send a beacon with all its synchronization information (including RS bit) in response. The node asking for synchronization will repeat its demand and this time the node receiving the request should have received the beacon and should be able to send a synchronization acknowledgement (SYNC_ACK). If a node, has no father with RS bit set to 1 it will refuse synchronization (SYNC_NACK).

The beacon request allows nodes to refresh the information of their neighbors when they consider it is not recent enough, especially in the case another node asked them synchronization (they must be sure to still have a good connectivity before accepting). Such present solution advantageously provides a relatively fast way to propagate the synchronization information between nodes, thereby avoiding that they create a virtual circular net without an actual root. The beacon request helps refresh the knowledge of a node on its neighbors if the information is considered too old.

Present FIG. 24 illustrates a configuration example while present FIG. 25 represents a Synchronization process, both relative to a complete synchronization example per the present protocol subject matter. With further reference to present FIGS. 24 and 25, EP6 is a new meter and it has 3 neighbors on two different cells. EP4 is the best EP to synchronize with (best level, best GPD). In this example, there are only 7 different channels.

EP6, at power up, is level 0, not synchronized, and enters into its discovery phase. It sends successively beacons on the 7 channels, and its 3 neighbors receive each one a beacon, because time and frequency match at one lucky moment.

After sending all the beacons, EP 6 enters in a listening state at a frequency that it has indicated in the former beacons. The 3 neighbors react to this stimulus by sending a "forced" beacon a few (random) time slots later at the required frequency. EP 6, which listens on the green channel receives these beacons and saves synchronization information. It should be noted that during this listening phase, EP3 can intercept messages from other EPs. Due to operation of the MAC header, EP3 would be able to save their synchronization information as it does with its 3 current neighbors.

At the end of this listening phase, it is time for synchronization. Accordingly, EP6 adjusts its time slots on EP4, and requests synchronization. EP4 checks that it still has a connection with the cell relay 1, its Sync father, by requesting a beacon, and as soon it receives the beacon, sends a SYNC ACK to EP6. EP6 becomes synchronized and becomes level 3 in the cell number 1.

Note that EPs numbers 3, 4, and 5 have broken their channel sequences during 1 TS to send a forced beacon on the green channel. It is not an issue because if another EP has heard them at this moment it would have read, in the header, the channel that would have be used (CELL address, and TS number). The fact that it is another channel that has been chosen is transparent for the MAC Layer.

Present FIG. 26A represents one example of an Initial Configuration, and present FIG. 26B represents an example of a new endpoint, both illustrative of circumstances of one endpoint finding a better endpoint for communication purposes, per present subject matter as further discussed herein.

Each endpoint should indicate in the MAC neighbor table which one of its fathers has sent the SYNC ACK to grant synchronization rights. The SYNC Father flag serves this purpose.

It may happen that the communication of a node with its SYNC father or the characteristics of the SYNC father deteriorates to the point that a new SYNC father needs to be found. Two cases need to be considered.

1. The communication with the SYNC father deteriorates but the SYNC father is still a healthy father because it complies with the potential SYNC father conditions. In this case, when the endpoint runs its periodical SYNC father selection process, it may chose to discard the old SYNC father and pick up a new one which will be a better access to the network.
2. The SYNC father disappears or loses its SYNC father status. We call this a SYNC father loss, it will happen if:
    The SYNC father remains silent for too long and disappears from the neighbor table (MAC_Neighbor_Timeout).
    The SYNC father doesn't comply anymore with the potential SYNC father conditions.
    The SYNC father changes its level.
    The SYNC father moves into another cell.

In this case a SYNC father selection process is immediately triggered. It can be noted that the selection process can lead to the same father as before, the selection being made according to the potential SYNC father criteria and the subject term.

If a node changes its level after the selection of a new SYNC father, then all flags should be removed except the last one set (for the father that just sent the SYNC ACK and allowed the endpoint to change its level). An endpoint should have only one father with the SYNC Father flag set. In this case the endpoint is considered synchronized. Note that a father that is not good for synchronization can still be used for routing messages (if it is still a father).

In order to compare the relative worth of neighboring endpoints as synchronization fathers, we consider a term regarding SYNC_Merit, which is defined by SYNC_Merit=EP_GPD+SYNC_Penalty_LPD+SYNC_Penalty_RXI+SYNC_Penalty_CD This term is only computed for the neighbors that are potential SYNC fathers (see potential SYNC father conditions). The main component of this term is the EP_GPD. Additional terms are introduced to decrease the probability of choosing some neighbors that may be less suitable as synchronization fathers. The SYNC_Penalty_LPD term is necessary because the LPD has a finite range. When the LPD of a neighbor is truncated to its maximum value, LPD_Max, the actual propagation delay is not known and a constant is added to the term to take into account the risk of selecting that neighbor as a SYNC father. The SYNC_Penalty_LPD term is defined by:

$$\text{SYNC\_Penalty\_LPD} = \begin{cases} 0 & \text{if } LPD < \text{LPD\_Max} \\ SP\_LPD1 & \text{if } LPD = \text{LPD\_Max AND } RSSI > -80 \text{ dBm} \\ SP\_LPD2 & \text{if } LPD = \text{LPD\_Max AND } -100 \text{ dBm} \leq RSSI \leq -80 \text{ dBm} \\ SP\_LPD3 & \text{if } LPD = \text{LPD\_Max AND } RSSI < -100 \text{ dBm} \end{cases}$$

The SYNC_Penalty_RXI term is necessary to avoid selecting as SYNC father an endpoint whose reception rate indicator is too low, it is defined by:

$$\text{SYNC\_Penalty\_RXI} = \begin{cases} 0 & \text{if } RXI \geq \text{RXI\_Threshold} \\ SP\_RXI1 & \text{if } RXI < \text{RXI\_Threshold AND } RSSI \geq -100 \text{ dBm} \\ SP\_RXI2 & \text{if } RXI < \text{RXI\_Threshold AND } RSSI < -100 \text{ dBm} \end{cases}$$

The SYNC_Penalty_CD term introduces a preference for neighbors that have a better connectivity degree with the purpose of making the network more stable and reliable, it is defined by:

$$\text{SYNC\_Penalty\_CD} = \begin{cases} \infty & \text{if } CD = 0 \\ SP\_CD1 & \text{if } CD = 1 \\ 0 & \text{if } CD \geq 2 \end{cases}$$

The case CD=0 has been mentioned here for the sake of clarity. A neighbor with CD=0 is not, by definition, a potential SYNC father and the term will never be computed in that case.

Periodically, an endpoint will run the new SYNC father selection process to see if a better SYNC father has become available. These periodic selection processes should occur about once every hyperframe. They will be implemented in such a way that different endpoints in a cell will run the process at different times, thus avoiding too many endpoints sending a SYNC request at the same time. A random time slot number could be used for this purpose. On the other hand, when an endpoint loses its SYNC father, it should immediately begin the selection process for a new one. The selection process for this new SYNC father is described below.

The neighbor table will be analyzed to sort out the neighbors that match the potential SYNC father conditions. If endpoints belonging to other cells appear in this list, they should be removed from the list. Endpoints from other cells, when they are overheard, are dealt with according to the cell switching decision process described in this document. The term SYNC_Merit will then be computed for all the potential SYNC fathers in the list. The neighbor with the best SYNC_Merit (lowest value) is called here X. The neighbor which had the best SYNC_Merit at the time of the previous selection process is called XP. If X is different from XP, a counter, SYNC_Top, is initialized to zero. If X is identical to XP, the counter SYNC_Top is incremented. If a neighbor manages to stay at the top of the potential SYNC father list for SYNC_Top_N hyperframes or more, it is entitled to become the new SYNC father provided that this change brings an improvement of SYNC_Merit larger than SYNC_Merit_Hyst1. At any rate, if choosing X as the new SYNC father brings an improvement in term greater than SYNC_Merit_Hyst2, the endpoint should select X as the new SYNC father. A detailed step-by-step description of this selection process is given below.

Step 1: The neighbors are sorted according to the potential SYNC father conditions to make a list of potential SYNC fathers.

```
If this list is empty, then
    Discard all pending MAC messages and go into discovery phase
Else if the list contains at least one potential SYNC father
    Go to step 2
End if
```

Step 2: Compute the term, SYNC_Merit, for each potential SYNC father.
Step 3: The potential SYNC father with the lowest SYNC_Merit value is identified (X). If the endpoint has lost its SYNC father, then
Step 4: Select X as the new SYNC father (lowest SYNC_Merit). Go to step 7.
If the endpoint still has its SYNC father, then
    Step 5: SYNC father selection with temporal hysteresis according to the following algorithm:

```
If X ≠ XP, then
    SYNC_Top = 0
    XP = X
Else if X = XP, then
    SYNC_Top ← SYNC_Top +1
    Comment: SYNC_Top is only incremented once
    every hyperframe
    If {[SYNC_Top ≥ SYNC_Top_N] AND
    [SYNC_Merit(X) + SYNC_Merit_Hyst1 ≤
    SYNC_Merit(SYNC father)]},
then
        X is selected as new SYNC father
        Go to step 7
    Else
        Keep the former SYNC father
    End if
End if
```

Step 6: Look for a better SYNC father with the algorithm

```
If SYNC_Merit(X) + SYNC_Merit_Hyst2 ≤ SYNC_Merit(SYNC father), then
    Select X as new SYNC father
Else, keep the former SYNC father
End if
```

Step 7: If a new SYNC father has been selected, send a SYNC request to X and wait for acknowledgement (SYNC requests are detailed in another part of this document).

```
If the request is positively acknowledged, then
    Stop (process completed)
    Else if the request is not positively acknowledged (negatively
acknowledged or not acknowledged at all) and the endpoint has a valid
SYNC father
        Abort the process
    Else if the request is not positively acknowledged and the endpoint
has no more SYNC father
        Go to step 1
    End if
```

During step 7, if the endpoint decides to synchronize with a new father, it should:
Keep its MAC synchronization
Keep its level (in its header)
Refuse any synchronization request: send SYNC NACK
Refuse any message: send NACK (see traffic management)
Indicate in its messages that it is no longer synchronized by setting the RS bit to zero.

Many Cell Masters (relays) can coexist in the field. These Cell Masters can be part of the same network or they can belong to different networks or to different utilities. Affiliation of an endpoint to a network is indicated by the UID field in the MAC header and by the SFD value in the PHY header. An endpoint will never move to another network but it can switch to another cell belonging to the same network. A utility can install additional Cell Masters in some areas in order to increase the data throughput capability or to unburden a large cell. Additional Cell Masters will also provide alternative routing paths that will contribute to the quality of service. To allow the traffic to be spread evenly across the available cells an endpoint which is already connected to a cell should have the possibility to switch to another cell, with or without external intervention.

The method of manually asking a meter to switch to another cell is very simple, if one of the endpoint belonging to the new cell is within radio range. The user should only send a message to the endpoint that tells it that its current cell is now forbidden and that the new one is preferred. Then the endpoint will enter in a discovery phase to look for the other cell and then synchronize with it.

An endpoint should also be able to switch to another cell automatically if it considers that it will have a better position in the new cell, and therefore a better access to the WAN. This switching has to be done with some precaution, because it can perturb an entire branch of the network. For this reason, the conditions to change to another cell should be stringent, particularly if everything works properly in the current one.

Before switching to another cell, an endpoint should of course know that at least one representative of this other cell is in the neighborhood. As the physical layer is, by default, in listening mode, it happens from time to time that an endpoint receives a message from another cell. Indeed even if the hopping sequences are not the same, they are never totally orthogonal because they use the same set of channels and they are not synchronized with the same time base. Occasionally, an endpoint will transmit a message when the channels of both cells are aligned, if some endpoints belonging to the other cell are within radio range, they will hear the message. With only one message overheard from an adjacent cell, due to the parameters contained in the MAC header, an endpoint will have all the information to switch to that adjacent cell.

If the endpoint judges that the adjacent cell doesn't provide a better access to the network, it will discard the information. If this access is better, the endpoint can choose to resynchronize with the adjacent cell.

The criterion to declare that an endpoint from another cell is a better access to the network is based on several parameters:

Low CSI. The smaller cell will be preferred to the larger one in order to avoid having two adjacent cells with one full and the other one empty.

Low GPD. The access with the smaller GPD will be preferred (the value used here is the GPD between the endpoint and the Cell Master through the neighbor, which is referred to as EP_GPD).

Low Level. A cell that provides an access with fewer hops to the Cell Master will be preferred.

In order to make a selection based on a combination of the principles mentioned above, we introduce a term to compare cells with each other.

$$CELL\_Merit = MAC\_CELL\_Weight\_GPD\ EP\_GPD + MAC\_CELL\_Weight\_Level * LVL + + MAC\_CELL\_Weight\_CSI * CSI$$

There are here defined three MAC layer parameters, MAC_CELL_Weight_GPD, MAC_CELL_Weight_Level and MAC_CELL_Weight_CSI. The values of these parameters will depend on the importance one wants to give to GPD, to the level or to the cell size in the cell switching decision process. If one sets the last two parameters to zero, only the GPD will be used to compare cells. Upon overhearing a message from an adjacent cell the endpoint will compute the term, CELL_Merit for the new cell and also for its current cell. The condition for cell switching is: CELL_Merit (new cell)<CELL_Merit (current cell)−MAC_CELL_Switch_Hysteresis, where we have introduced a new MAC layer parameter, MAC_CELL_Switch_Hysteresis, whose role is to prevent a node from continuously switching back and forth between two cells. Once the endpoint has determined that the new cell is better than the current one it has to make sure that it will be accepted by the new cell before actually switching. For this purpose the endpoint will ask the endpoint from the other cell for synchronization. The SYNC Request and the SYNC (N)ACK will be exchanged as is done in other situations except that the endpoint needs to adjust its frequency and time of transmission considering the other cell operates on a different hopping sequence.

Once the new father of the endpoint that leaves the cell answers a SYNC ACK, the MAC layer needs to inform the layer above and stays in its old cell during MAC_CELL_Leaving_Process_Duration seconds before definitely leaves it. At that point, the different layers need to free their buffers and their pending actions. After the switch is done, the MAC layer informs the layer above again. This timing is necessary for the NET layer to deregister by sending a NET Cell Leaving Notification message.

An example of a complete process of cell switching is as follows:

The endpoint overhears a message from an endpoint belonging to another cell.

The endpoint saves the neighbor's parameters in its neighbor table.

The endpoint checks if this neighbor meets the potential SYNC father conditions. If not, the cell switching process is aborted.

The endpoint computes the cell switching figures of merit for its current cell and for the new cell. If the figures of merit are favorable to the new cell, the endpoint goes on with the cell switching process.

The endpoint sends a SYNC Request to the neighbor, on a forced channel and in a forced sub-TS.

If the neighbor agrees and if it has a good connectivity with its father, it then sends a SYNC acknowledgment, once again on a forced channel and in a forced sub-TS. If the neighbor doesn't agree it sends a negative acknowledgment and the cell switching process is aborted. If the neighbor needs to check its connectivity with its father, it will request a beacon and the endpoint trying to switch cell will receive no immediate acknowledgment.

If necessary, the endpoint will repeat its SYNC request until it receives an acknowledgment or until the maximum number of retries is reached. In this last case the cell switching process is aborted.

Once the SYNC ACK is received, the endpoint dumps all messages (at all layers) from its former cell.

The MAC layer informs the other layer and starts a timer with a duration of MAC_CELL_Leaving_Process_Duration seconds.

Once the timer expires, the endpoint dumps all messages (at all layers) from its former cell.

The endpoint synchronizes itself with the neighbor from the new cell. (Be careful, the hyperframe number may have change during transition period).

During this process, until the SYNC acknowledgement is received and during the transition period, the endpoint should deal with its usual communication activities in its current cell.

Keep its MAC synchronization with the current cell

Keep its level

Don't initiate a cell switching with another cell, or a SYNC father change with another endpoint.

Work as usual, keep other activities.

Yet another aspect of the present protocol subject matter advantageously relates to a feedback control loop that may be used to correct imperfections of crystal clocks, and to maintain synchronization in a frequency hopping spread spectrum (FHSS) mesh network.

As otherwise discussed herein, the present protocol is based on frequency hopping spread spectrum (FHSS) for better interference immunity and to be in compliance with the radio regulations in some countries. In a FHSS system per the present subject matter, all the nodes hop their channel frequency according to the same pseudo-random sequence in order to be perfectly synchronized for both reception and transmission. The performance of such a system is based on the ability for each node to be able to maintain such form of synchronization over time. That is the reason why the node hardware requires a crystal time reference with good stability. Because such time references are expensive, it is useful to implement a software driven compensation mechanism to improve the time stability of the nodes.

In the present exemplary network, as otherwise discussed herein, a mesh-like structure is provided wherein the cell relay is the root of the mesh and the metronome of the network. As a rule, such timing information propagated away from the root to the cell nodes. In the present protocol subject matter, each time a node communicates with another node closer to the root, it will realign its clock to be in synchronization with the network. In addition, all such consecutive clock corrections advantageously are time averaged, filtered, and processed to give information about how fast the node's clock is running with respect to the average clock of the nodes closer to the root. Such present feature allows a software correction of the node's clock rhythm that will bring it in tune with the network for a long period of time. Therefore, generally speaking, the present subject matter provides benefits of allowing the usage of relatively low cost crystals in the network nodes but with increased time stability of the network.

Figure 27:
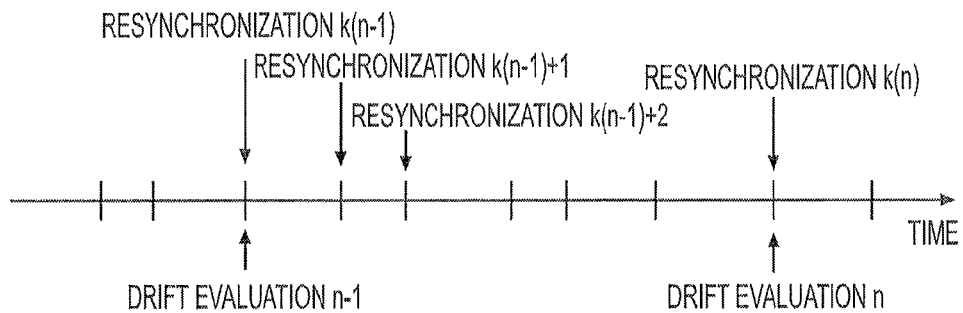
FIG. 27 depicts RESYNCHRONIZATIONS AND CRYSTAL DRIFT CORRECTIONS IN TIME subject matter.

More specifically, present FIG. 27 illustrates a typical distribution of resynchronizations and crystal drift corrections in time, per the present subject matter.

As otherwise referenced herein, good synchronization is the basis of the present protocol, wherefore an inherent limitation to that aspect would otherwise come mainly from the crystal accuracy. In order to limit the traffic and to avoid internal collisions, as few synchronization beacons as possible are sent. However, as a result, in low traffic conditions, the number of opportunities to resynchronize the clock with a father will therefore be relatively small. As a consequence, each endpoint would generally have a clock shift with the upper level. For relatively larger level numbers, such shift would become significant relative to the cell relay clock. This could lead to a loss of synchronization if the shift were allowed to grow above some limit. Moreover, as an endpoint can resynchronize its clock with several father endpoints, an averaging mechanism could be advantageously utilized.

One approach of the present subject matter as a solution is to anticipate the drift of the local crystal oscillator with respect to the father clocks. If such drift is assumed to be constant (shown to be a good assumption if the temperature doesn't change too quickly), an efficient compensation procedure can be implemented. Therefore, rather than waiting for the next resynchronization, the endpoint can adjust its time slot length to decrease the next clock resynchronization value. The compensation algorithm uses low-pass filtering to cope with multiple synchronization paths and to avoid instabilities. The detailed description of such algorithm is otherwise discussed herein.

Whenever the receiver resynchronizes its local clock, two values are recorded: the value of the correction, which is Clock_Correction(k), and the time of this resynchronization, which is Resync_Time(k). This time is given by the value of the system real-time-clock at the moment of the resynchronization. The parameter k is used here to number the successive resynchronization occurrences. From these two values and with the knowledge of the previous resynchronization time, it is theoretically possible to evaluate the relative drift of the local crystal oscillator, Xdrift. To be useful for the purpose of crystal drift compensation, these evaluations must be accurate.

Each clock correction value can be considered to be the result of two contributions. The first one is a slow drift due to a difference between the local crystal frequency and the average crystal frequency in the father endpoints. The second contribution is a random time shift occurring each time a packet travel time is estimated. This is summarized in the following equation:

Clock_Correction(k)=Xdrift[Resync_Time(k)−Resync_Time(k−1)]++δt(k)−δt(k−1)

where δt(k) is a random error due to the uncertainty in the propagation time of the packet from the transmitter MAC layer to the receiver MAC layer when resynchronization number k is performed.

To reduce the contribution of random errors, successive clock corrections are preferably summed, as follows:

Clock_Correction(k)+Clock_Correction(k+1)==Xdrift [Resync_Time(k+1)−Resync_Time(k−1)]+δt(k+1)−δt(k−1)

It is readily understood per the present disclosure that, in the evaluation of the crystal drift, the contribution of these random errors will become increasingly smaller as successive clock corrections are summed, as follows:

$$Xdrift = \frac{\left[\sum_{m=k}^{k+M} \text{Clock\_Correction}(m)\right] + \delta t(k+M) - \delta t(k-1)}{\text{Resync\_Time}(k+M) - \text{Resync\_Time}(k-1)}$$

For this reason, the successive clock correction values are summed up until they span a time larger than the minimum value specified by the MAC layer parameter MAC_Xdrift_Tmin. Once this time value is exceeded the crystal drift can be evaluated with the following:

$$Xdrift(n) = \frac{\sum_{k=k(n-1)+1}^{k(n)} \text{Clock\_Correction}(k)}{\text{Resync\_Time}(k(n)) - \text{Resync\_Time}(k(n-1))}.$$

The summation range should respect the condition:

Resync_Time(k(n))−Resync_Time(k(n−1))> MAC_Xdrift_Tmin, where MAC_Xdrift_Tmin is chosen large enough to have:

$$\frac{2\max|\delta t(k)|}{\text{MAC\_Xdrift\_Tmin}} < \text{Xdrift\_accuracy}.$$

Xdrift_accuracy is the targeted accuracy of the algorithm (about 1 ppm). MAC_Xdrift_Tmin must also be much larger than the interval between two leap time slots (as otherwise discussed herein) in order for the time integration process to smooth out the crystal drift compensation glitches.

Figure 28:
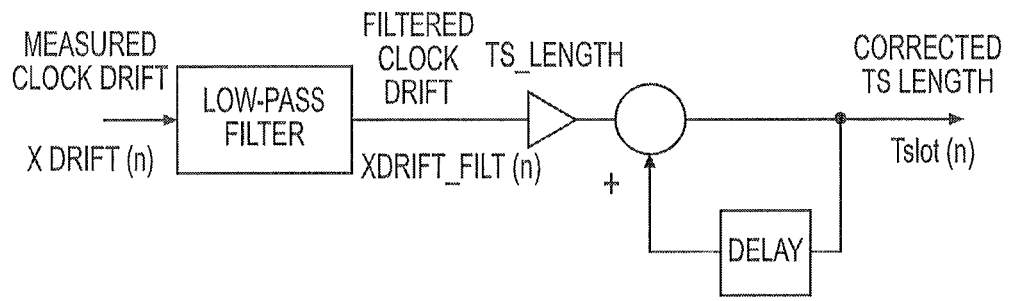
FIG. 28 depicts LOCAL CLOCK DRIFT COMPENSATION ALGORITHM subject matter.
Figure 29:
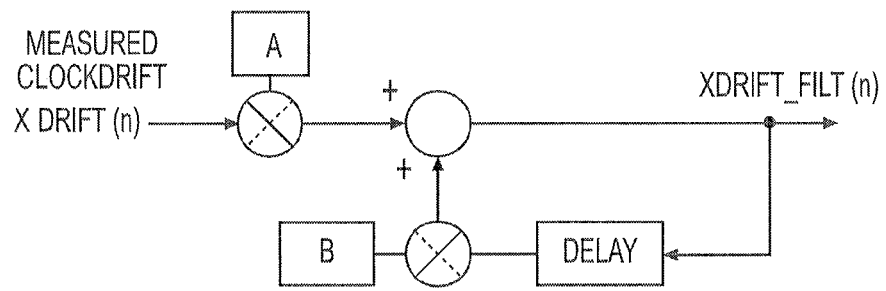
FIG. 29 depicts LOW-PASS FILTER FOR CRYSTAL DRIFT CORRECTION subject matter.

Present FIG. 28 represents in schematic format a local clock drift compensation algorithm for practice per the present protocol subject matter, while present FIG. 29 represents (also in schematic format) a low-pass filter for crystal drift correction, all in accordance with the present subject matter.

The herein referenced estimation regarding the reference drift will not be used directly to compensate for the crystal oscillator drift. In order to average over several synchronization sources and to get rid of the fluctuations, a low-pass filter (see present FIG. 29 representation) will be implemented. This low-pass filter is defined by:

Xdrift_filt(n)=A×Xdrift(n)+B×Xdrift_filt(n−1), where Xdrift_filt(n) is the filtered crystal drift estimation and A, B are the filter coefficients that will be adjusted to obtain adequate averaging and to make the resultant feedback control loop stable enough. These two filter coefficients will have values given by the following MAC layer parameters:

A=MAC_Xdrift_Filter_A

B=MAC_Xdrift_Filter_B

The instantaneous length of the system time slot $T_{slot}(n)$ is defined, and such value can be expressed as the sum of the default time slot length and a small correction term:

$T_{slot}(n)$=TS_Length+$\Delta T_{slot}(n)$

The instantaneous value of the time slot length is updated by:

$T_{slot}(n)=T_{slot}(n-1)(1+Xdrift\_filt(n))$,

As the correction is expected to be very small, one can neglect the second order term. The simplified version is:

$T_{slot}(n)=T_{slot}(n-1)+TS\_Length \times Xdrift\_filt(n)$

In practice, generally only the time slot length deviation needs to be computed:

$$\Delta T_{slot}(n) = T_{slot}(n-1) + TS\_Length \times Xdrift\_filt(n) - TS\_Length$$

This can be expressed as a function of the previous deviation:

$$\Delta T_{slot}(n) = \Delta T_{slot}(n-1) + TS\_Length \times Xdrift\_filt(n)$$

In order to make sure that the mathematical description of the algorithm represented by present FIG. 28 is well understood, the whole process is here summarized with pseudocode.

```
First initialization
Xdrift_filt = 0
Start_Time = first resynchronization time value
Sum_Clock_Corr = 0
Upon reception of a beacon or any valid message do
    Accumulate the clock correction
    Sum_Clock_Corr = Sum_Clock_Corr + Clock_Correction
    Update the time since the last crystal drift estimate
    Time_Since_Last_Xdrift_Update = Resync_Time − Start_Time
    If Time_Since_Last_Xdrift_Update < MAC_Xdrift_Tmin
        Then wait for next message
        Else do
            Compute the crystal drift
Xdrift = Sum_Clock_Corr / Time_Since_Last_Xdrift_Update
Filter the drift estimate
Xdrift_filt=A * Xdrift + B * Xdrift_filt
Update the time slot correction
ΔTslot = ΔTslot + Xdrift_filt * TS_Length
Initialize Start_Time for the next iteration
            Start_Time = last value of Resync_Time
            Initialize the clock correction accumulator for the next
            iteration
            Sum_Clock_Corr = 0
            Wait for a new message
    End
```

The accuracy required for proper crystal drift compensation is about 1 ppm. This will probably make a direct correction of the parameter MAC_TS_Length impossible, especially if the resolution of the SACT is not very high. Therefore, it is suggested, at the beginning of each time slot, to reload the countdown timer with the default time slot length value, MAC_TS_Length. Every MAC_Xdrift_LeapTS time slots, a "leap time slot" will be introduced. This is explained with the following pseudo-code:

```
If Time_Slot_Number = 0 (modulo MAC_Xdrift_LeapTS)
    Then Count_Down_Timer ← MAC_TS_Length +
    MAC_Xdrift_LeapTS * ΔTslot
    Else Count_Down_Timer ← MAC_TS_Length
End
```

In the above code, Time_Slot_Number is a number starting from 0 and incremented at each time slot, it is not the time slot number used to identify the position within a hyperframe. It should be pointed out that for optimum crystal drift compensation, the above SACT reload should be performed with the full accuracy provided by the firmware, as specified by the parameter MAC_FW_Acccuracy. The resolution of the correction algorithm depends on the leap time slot interval as shown by the following equation:

Crystal drift correction resolution =

$$\frac{LSB \text{ of } SACT}{MAC\_Xdrift\_LeapTS * MAC\_TS\_Length}$$

A resolution better or equal to 1 ppm should be targeted. On the other hand, the leap time slot interval should be small enough to avoid clock corrections larger than the time slot margin. In satisfying such criteria, the following inequality should be respected:

$$MAC\_Clock\_Accuracy << \frac{MAC\_TS\_Margin}{2 * MAC\_Xdrift\_LeapTS * MAC\_TS\_Length}$$

Part of the advantages of the present protocol subject matter is the provision of a system which itself is based on a self management and optimization system of endpoints that is organized into cells. Each cell has a Cell relay which serves the purpose of relaying all the information to and from the network to another wide area network operating on a TCPIP protocol. Due to such fact, the assimilation of an endpoint to a given cell is uncontrolled and may grow unbounded. Of course, Cell relays have resource limitations and growing beyond certain limits will overload these resources.

The present particular aspect of the present subject matter is based on certain indicators of the cell size that is communicated to all endpoints in the cell. Endpoints that are joining the network and could have the possibility to join more than one cell will use this information in the decision process of which cell to join. If the indicators are that cell A is full or close to full, cell B will be chosen per present subject matter to synchronize with even if the indications are that cell A may be a much better cell for uploading network traffic.

Although cells operate in isolation due to the quasi orthogonal frequency hopping sequences, on rare occasion's traffic will be overheard from one cell to the other for the endpoints located on the touching boundaries. In these events, the cell size indicators can be used to drive a decision to migrate from a full cell to an empty or much less full cell. Accordingly, per present subject matter otherwise discussed herein, based on such present processes, the cell sizes will be managed and balanced over time, allowing self management and optimization to continue.

More particularly, present aspects of this subject matter are applicable for embodiments configured as a tree network where the nodes are organized in cells with a concentrator (or root node) at the "head" of each cell. As otherwise discussed herein, each node has a level associated with its place in the cell. The root node is level 1 and is always synchronized (by definition). In order to get its data to the root node a node must be synchronized in the corresponding cell. The synchronization process requires a hand check between one synchronized node and another node. A node which synchronizes on another becomes its son and the other node becomes the father of the first one. The new node level is one more than the one of its father. Therefore, all nodes have a level above 1. Nodes of the same level are called brothers. The group of fathers, brothers and sons of a node are called its neighbors.

Per present subject matter, each node keeps a table of its neighbors. The information on the neighbors is used for several purposes (synchronization, routing, and the like), including the transmission of broadcast packets. Effectively, the broadcast is actually a multicast message sent to all the sons of the node. It is thus important that each node is in the neighbor table of at least one of its fathers to insure the delivery of broadcast packets. This is one of the roles of the synchronization request: by sending a synchronization acknowledgement (SYNC_ACK), a father guarantees that its new son is in its neighbor table. Per present protocol, the father of a node which sent a SYNC_ACK is called the SYNC_FATHER of this node. The SYNC_FATHER is the only father which guarantees that the node is in its neighbor table, and thus the only father which guarantees it will send a broadcast to the node. A node must always have one SYNC_FATHER.

Whenever the memory of a node is limited, likewise so is its neighbor table. The technical problem becomes when the table is full and a new node requests synchronization. The synchronized node with the full table cannot acknowledge positively the synchronization request of the new node without inserting it in the table. Any such activity could lead to a node in the cell not receiving broadcasts (if it is not in the table of another father). Unfortunately, if the synchronization right is refused, then it could lead to an orphan node (not in a cell) not being able to deliver its data. In the same way, the "father" node cannot make space for the new node by removing any of the neighbors in its table (because to do so could cause a node to not receive broadcasts).

The solution achieved by the present management protocol is primarily based on two things. First, a bit (EPSF for Enough Potential Sync Father) is sent in each packet and kept in the neighbor table for each neighbor. This bit is set to 1 by each node if the number of father and brothers in its neighbor table is above a given threshold (which is chosen to indicate that they could safely send a request to another node). The second part is the table out notification (TON) message. Based on the EPSF bit, a node receiving a new synchronization request while its neighbor table is full, can decide to remove one of its sons if this son's EPSF bit is one. But it must indicate to this son that it will no longer be in its neighbor table. Such is accomplished by sending the TON message to this son. Upon receiving this message, this son will look if this father was its SYNC_FATHER. If it was the case, then it must find another SYNC_FATHER to guarantee that it will be in the neighbor table of one of its fathers and thus receive broadcasts.

This solution provides a way to never refuse synchronization to a new node while making sure that all nodes are in the neighbor table of one of their fathers, and thus making sure that they will receive broadcast packets.

When it comes to neighborhood management and neighborhood information per the present protocol subject matter, the MAC layer is in charge of management vis-à-vis neighbors. Accordingly, each time an endpoint receives a message, it also saves or updates the parameter of the sender on a list. Therefore, per present subject matter, only 1-hop neighbor parameters are known and saved in the endpoint. The Cell relay is the only device that knows status of the endpoints belonging to its cell, but it is managed with the neighbor list in the network layer.

The MAC layer not only will manage its own neighbor table but will also indicate to the upper layers (particularly to the NET layer, by way of the LLC layer) some of the changes when they occur (for example, inclusion of a new neighbor).

The MAC Neighbor table contains parameters of the neighbors. It is limited in size by the variable Max_Nb_of_Neighbors. For each neighbor the parameters are:

Address, 4 bytes (The MAC Address of the neighbor).
Level, 1 byte (The last known level of the neighbor. The level is 0 if the neighbor is not synchronized. Level 1 is the cell relay).
Average RSSI, 1 byte (RSSI is measured during the reception and indicated by the physical layer. The saved value is an average value of RSSI over a sliding window with this neighbor).
Cell Relay Address, 2 bytes (The cell to which the neighbor belongs).
Last TS (Time Slot) number, 2 bytes (The time slot where the last reception occurred. With the channel sequence information, it gives the last channel).
Last Reception Time, 4 bytes (The time where the last reception occurred. The reference of this time is free to the implementation. It is however suggested to be the power-up time of the node).
Delta SACT, ΔSACT, 2 bytes (The SACT difference between the EP and this neighbor. This value is refreshed each time a message is received from this neighbor. This indicates the misalignment between the 2 EPs).
GPD, 2 bytes (The Global average Propagation Delay between the neighbor and the cell relay. This value is indicated in the MAC header).
LPD, 1 byte (The Local average Propagation Delay between the EP and the neighbor).
Last reception rate update (Last time the reception rate of this EP was updated).
Received rate indicator, RXI, 1 byte (It provides an indication of the frequency the endpoint receives messages from this neighbor. It will prevent the endpoint from synchronizing with a neighbor that is barely heard).
Sync_Forbidden, 1 bit (A flag indicating that this endpoint has refused synchronization).
Sync_Father, 1 bit (A flag indicating that this neighbor allowed the endpoint to get synchronized. Only one neighbor can have this bit set. It is set when the SYNC ACK is received. When an endpoint changes its level, it should clear all flags except the ones assigned to the neighbor it just synchronized with. An endpoint should have a father with the SYNC Father bit set in order to consider itself synchronized).
Sync_Son, 1 bit (A flag indicating that the EP has allowed this neighbor to be synchronized with it. This flag should be removed if the level of this neighbor changes).
Registered, 1 bit (A flag indicating that this neighbor is registered to a cell).
Enough_Potential_Sync_Fathers, 1 bit (A flag indicating if this neighbor has a number of brothers and fathers that it can Synchronize with (Sync_Forbidden bit=0), that is greater than MAC_Good_Number_of_Potential_Sync_Fathers).
Father Acknowledged load, ($S_{Ack}$) 1 byte (Average number of acknowledgements received from this father excluding the acknowledgments intended for the EP itself. This is maintained only if the EP is a father. This is used to estimate the load of this father, which in turn will be used to determine the randomization window for transmission).
CSI, 2 bits (The Cell Size Indicator of this neighbor).

Due to memory limitations, the neighbor table has a finite size and cannot contain more than Max_Nb_of_Neighbors entries. It is therefore necessary to get rid of some entries as they become useless for the operation of the network.

The neighbor table is managed according to the following general principles:
- Only neighbors that satisfy the potential SYNC father conditions will be added to the table.
- As long as the table is not full, any new neighbor that satisfies the potential SYNC father conditions will be added to the table.
- If the table is full when a new potential SYNC father arrives, the new neighbor will take the place of a less important one, if such a neighbor exits. The importance of a node in the neighbor table is based on the synchronization term. If there is no possibility to free some space in the table, the information on that new neighbor will be discarded.
- Nodes from which nothing has been received for a long period of time will be considered to have left the 1-hop neighborhood. If no message has been received from a neighbor for a period of time longer than MAC_Neighbor_Timeout, the neighbor will be removed from the neighbor table.
- If an endpoint goes back in discovery phase, switches to another cell or experiences a power outage, all the entries of the neighbor table should be deleted.

The process of freeing up space in the table can be further detailed as follows. It should be pointed out that this process is not carried out on an ongoing basis but only when a new potential SYNC father needs to be inserted in a table which is already full.
- Check the potential SYNC father conditions. If some entries do not match anymore the potential SYNC father conditions, they can be deleted from the table.
- The most important neighbors in the table are the ones with the lower synchronization term. If a node needs to be taken out, the one with the highest term should be removed (see exception for SYNC father below).
- Of course if the new neighbor has a worse term than the worst node in the table, the new neighbor is discarded.

If an endpoint is not synchronized, any neighbor that match the potential SYNC father criterions can be added to its neighbor table. The relative importance of these entries will be defined according to the term for the discovery phase, SYNC_Disc_Merit.

If the endpoint is in a cold start process, only the neighbors belonging to the preferred cell will be allowed into the neighbor table. If the endpoint is in a warm start process, all potential SYNC fathers, whatever the cell they belong to, will be allowed into the table.

If an endpoint is synchronized, the importance of the entries is based on the synchronization term (SYNC_Merit). If a node needs to be taken out, the one with the highest SYNC_Merit should be removed. There is one exception to this rule: the SYNC father cannot be removed from the table. If a father needs to be removed when the SYNC father happens to have the worst SYNC_Merit, the next-to-worst should be removed.

The synchronization term depends, among other parameters, on the reception rate indicator, RXI. As newcomers have a low RXI, this will create a hysteresis for the inclusion of new neighbors in the table. This will limit the coming and going in the table.

In synchronized mode, nodes from other cells are not entered into the table. They are evaluated on the fly to check if they could offer a better synchronization point.

Figure 30A:
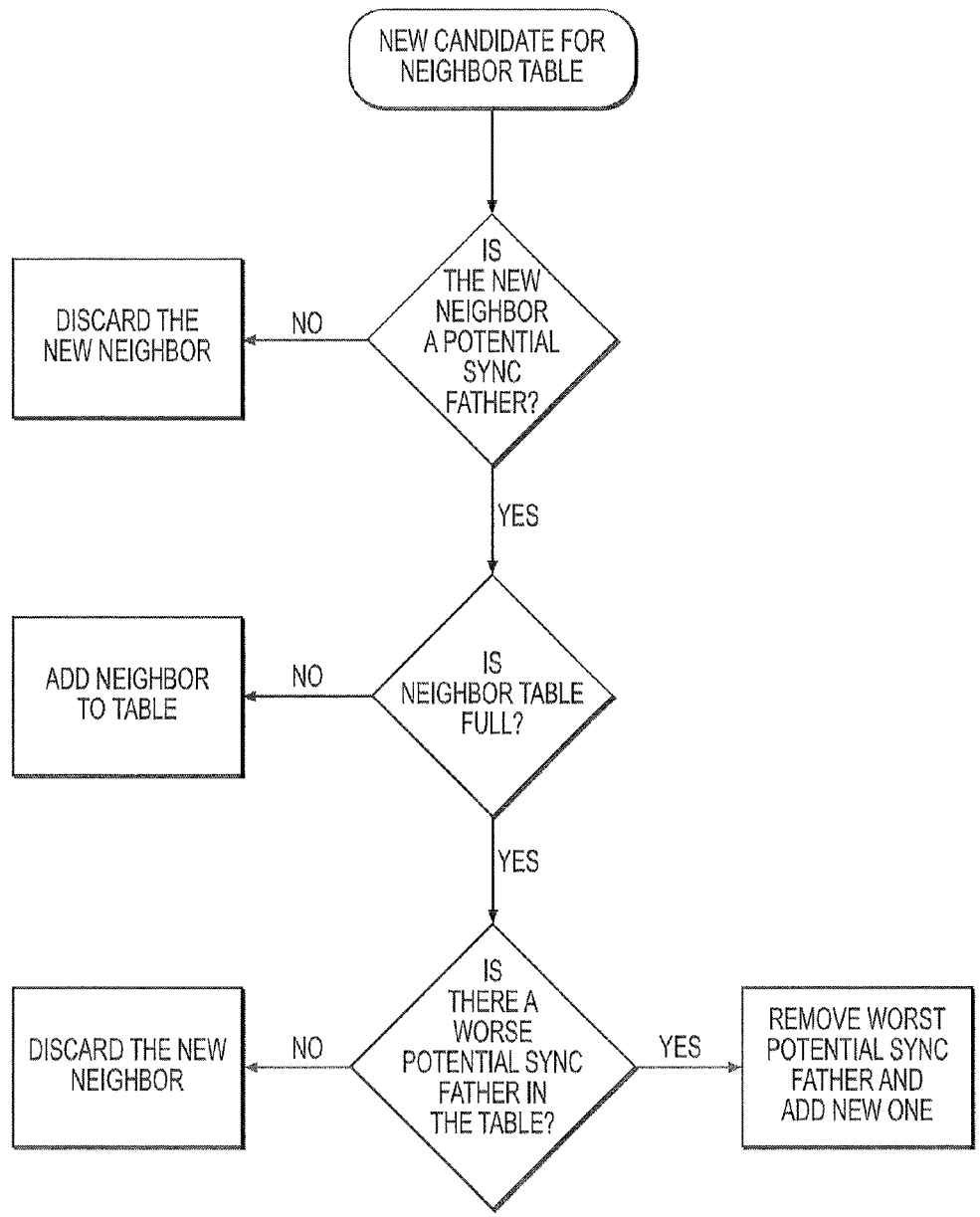
FIG. 30A depicts Neighbor Table Management subject matter.

Present FIG. 30A also depicts in flowchart format present neighbor table management.

Endpoints have fixed MAC addresses and can potentially synchronize and connect to any cell. However, the protocol should take into account that some cells are forbidden. This can be the case if the user/utility wants to control the repartition of endpoints in different cells, or merely if a user doesn't want to share its network with another user/utility (this last case is normally handled by having different Utility IDs in the PHY header). In order to manage the membership of a cell, a Cell Address uniquely identifies each cell.

From the MAC layer standpoint, a node can be synchronized with any cell. It is therefore the role of the API layer to tell the MAC layer whether a cell is authorized or not. This information is then kept at the MAC layer level, which will not consider a forbidden cell for synchronization.

All the forbidden cells are re-authorized by the MAC layer if the endpoint stays non-synchronized for a period of time longer than MAC_Unsynchronized_Timeout.

In cold start, once the node is synchronized, it informs the API layer of this successful synchronization indicating the corresponding cell address. The API layer should then inform the MAC layer when the endpoint becomes registered. The MAC layer will not authorize other nodes to synchronize with itself if it is not registered. As soon a the node is registered, the MAC layer will save the cell address and use it as preferred cell in case of warm start.

In warm start, the node looks for its preferred cell. If it succeeds to find the cell and synchronize with one of its members, the MAC layer will consider itself already registered (RS bit=1), and will immediately authorize the synchronization requests of its neighbors. The API layer needs to tell the MAC layer whether this assumption was correct or not.

The warm start will accelerate the synchronization process of a cell after a large-scale power outage.

In general, per the present protocol subject matter, two kinds of messages are acknowledged: Monocast Data containing LPDU from LLC layer, and SYNC requests. Monocast Data are acknowledged (or not) with ACK (or NACK) messages and SYNC requests by SYNC ACK (or SYNC NACK) messages.

ACK, NACK, SYNC ACK and SYNC NACK must be sent in the time slot of the reception of the corresponding packet. More precisely, the acknowledgement should be sent in the last sub-time slot.

Each message that should be acknowledged has a MAC frame ID (FID), inserted in the MAC header. The (non-) acknowledgment message will mention this frame ID in its own MAC header. The MAC frame ID is a counter, incremented by the MAC layer at each sending of Monocast Data or SYNC request.

For each LPDU the LLC asked to send, the MAC layer will indicate back if the Monocast Data message has been acknowledged (ACK), non-acknowledged (NACK), or not acknowledged (neither ACK, nor NACK received).

The Broadcast Data messages are not acknowledged. They are not addressed to any node in particular and thus contain no destination address in their MAC header, or MAC frame ID. When the Broadcast Data message has been sent, the MAC layer will notify it to the LLC layer.

The present protocol subject matter advantageously uses a 32-bit CRC (Cyclic Redundancy Check) to avoid message corruption by either of noise or interference. The CRC is computed by the sender on the entire MAC header and LPDU and placed at the end of the frame. On the receiver side, the value of the CRC is used to verify the message validity. If the CRC matches the message, the frame is accepted. If it does not match, it is discarded.

The CRC used is the standard 32-bit IEEE 802.3 CRC. Present FIG. 30 provides a schematic representation of a typical CRC 32-bit implementation. The generator polynomial of such CRC is:

$$G(x)=x^{32}+x^{26}+x^{23}+x^{22}+x^{16}+x^{12}+x^{11}+x^{10}+x^8+x^7+x^5+x^4+x^2+x+1$$

The CRC is computed with a linear feedback shift register initialized to 0xFFFFFFFF (or any equivalent implementation). The computation begins with the first byte of the MAC header and ends with the last byte of the LPDU. Each byte is fed into the shift register with the least significant bit first. At the end of the polynomial division, the shift register contains the remainder of the division. The first byte to be shifted out of this register corresponds to the first redundancy byte. It is interpreted least significant bit first and should be complemented to one before being appended to the LPDU.

With reference to security, the present protocol subject matter preferably does not provide any encryption service. As such, the datagrams are preferably sent on the air interface without encryption. However, that is not to say that the present protocol subject matter is not a secure protocol. It is in fact a designed protocol, the physical layer for which uses a FHSS technique with a very long frequency-hopping pattern. Eavesdropping on such a system would require a significant engineering effort. This intrinsic security is further enhanced by the use of Fibonacci sequences to make the hopping pattern different in each cell.

Should such approach to security be considered insufficient for some critical applications, it is within the scope of the present subject matter to supplement such security by encrypting the user data in the applicative layers.

Certain advantageous aspects of the present subject matter relate to what may be regarded generally as network traffic regulation, or more specifically as network traffic load control. In particular, procedures are provided to avoid conditions under which the traffic load grows above a point of gridlock in a slotted Aloha mesh network. In certain aspects, the present procedures use the monitoring of received acknowledgements to evaluate the traffic density. At least several identifiable benefits of such present methodologies are that it allows the uplink traffic in a mesh network to flow in optimal conditions, and it avoids traffic gridlock due to operation of the network beyond its limit.

Per present subject matter, traffic load control is used to limit traffic in order to avoid using the channel beyond its optimal traffic density. This is necessary because the present protocol subject matter operates as a slotted Aloha system, and for such a system, traffic density above some limit can increase the collision rate to an unacceptable level and completely block the data flow (that is, data flow becomes gridlocked). The present traffic control preferably is used only for the upload traffic, from endpoints to the cell relay (or Cell Master).

More particularly, the present traffic load control subject matter is applicable to generally any mesh network with a node acting as a data extraction point. The data traffic from the individual nodes to this extraction point is regarded as the uplink traffic. As such uplink traffic generated in the network grows higher, internal collisions between packets will occur. At some point, such internal collisions will be frequent enough to degrade the effective throughput of the system. The relation between collision probability and effective throughput is well known from slotted Aloha theory. Textbook theory deals with the case where no external jammer is present. Here the situation is more difficult to analyze because there are both types of collisions at the same time, that is, internal collisions due to internal traffic, and external collisions with the other users of the band.

Accordingly, the present subject matter advantageously introduces a control mechanism to slow down the data traffic when it grows above some limit. The nodes need to be able to temporarily hold off transmissions and store messages in a buffer when they detect that the channel is too busy. This traffic load control will prevent the nodes from using the channel beyond its optimal traffic density. If this is not done, the traffic density can increase the collision rate to an unacceptable level that will not only decrease the performance but that may completely block the data flow.

Figures 30B, 31:
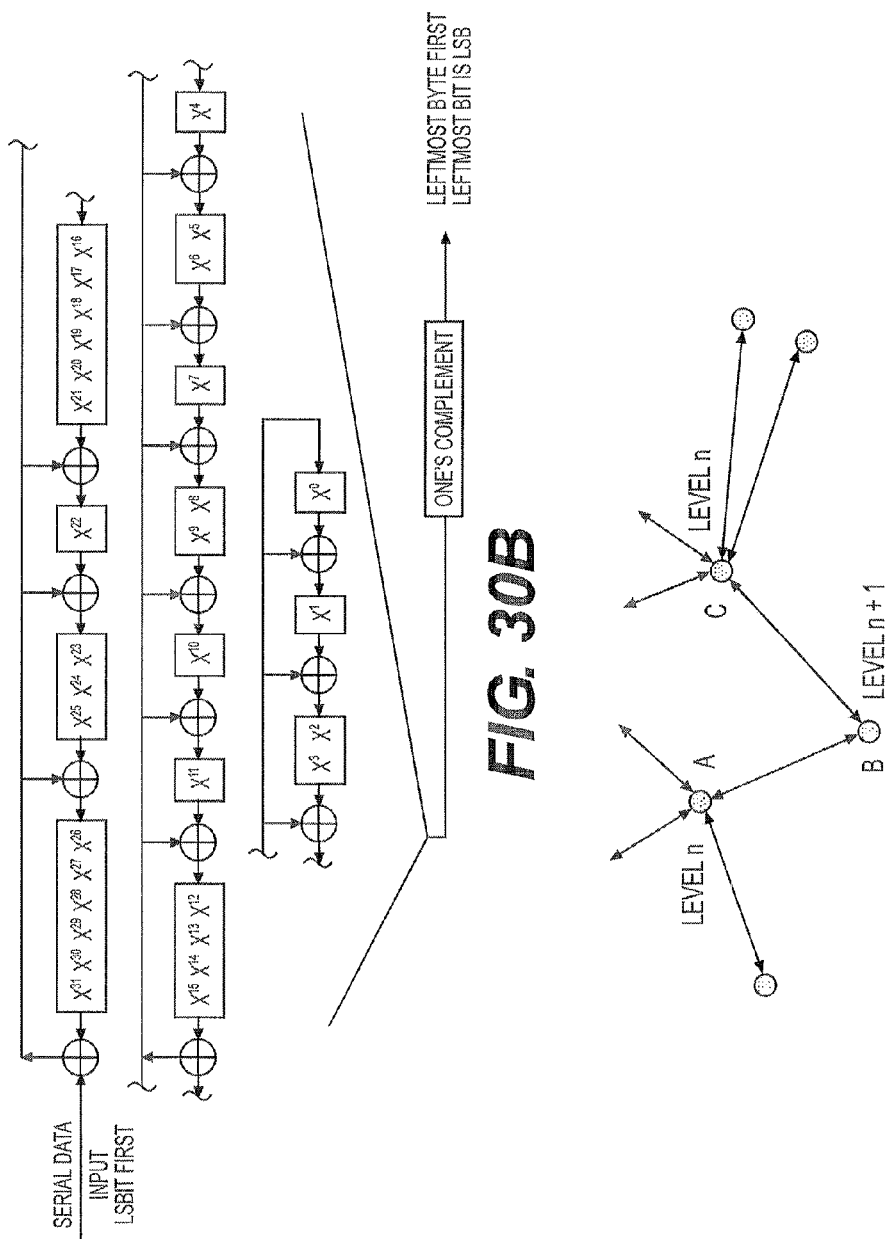
FIG. 30B depicts TYPICAL CRC32 IMPLEMENTATION subject matter.
FIG. 31 depicts TRAFFIC LOAD MONITORING: NODE B IS LISTENING TO THE (N)ACK MESSAGES FROM ITS FATHERS A AND C subject matter.

Therefore, per the present subject matter, in order to control properly the traffic load, an endpoint needs to evaluate the amount of traffic going through the network. For present description purposes, a first node within the radio range of a second node and in the direction of the extraction point for the second node, will be called a father node relative to such second node. Present FIG. 31 is a schematic representation of the present subject matter traffic load monitoring, where a given node B is listening to the (N)ACK messages from its fathers A and C. For the afore-mentioned traffic load control purposes, an exemplary endpoint (node B in exemplary FIG. 31) will record the acknowledgments transmitted by its fathers A and C and not intended for itself. Such acknowledgments will give enough information to assess the traffic load because in the present protocol, a node has to acknowledge all the data packets it receives. This approach is consistent with the fact that traffic management will be mainly used by the endpoints directly communicating with a cell relay, from which only acknowledgments are transmitted in an upload situation. However, such information is nevertheless not enough because a node needs to be able to distinguish between a low traffic situation that generates only a few acknowledgements and a very high traffic situation that also generates few acknowledgements because most of the packets are lost due to collisions. For this purpose, preferably each node will record all the communication attempts with the father nodes and will compute an average communication success rate. Combining both the rate of acknowledgments overheard and the communication success rate, a node will be able to estimate the traffic density in an unambiguous way.

In a formal way, one can define the traffic input density $R_A$ as the average number of data packets arriving at node A (FIG. 31) in one time slot. This concept is useful to measure how busy is node A. It is also known from slotted Aloha theory that the traffic input density has an optimal value. If the traffic input density grows above that optimal value, the throughput goes down due to collisions. All the data packets arriving at node A are considered in the definition of traffic input density, whether they are successfully received or not. However, for practical reasons, packets emanating from node B are preferably excluded (since the focus is currently on trying to derive a behavior rule for such node B). Also defined are the average number of acknowledgments emanating form node A and overheard by node B (excluding those intended for node B) in one time slot, $S_A$. The communication success rate from node B to node A is called $CSR_{BA}$ and $Q_B$ is defined as the probability for node B to be in listening state. From elementary probability theory it can be shown that the estimation for the traffic input density at node A is given by the following:

$$R_A = \frac{S_A}{CSR_{BA} Q_B}$$

To avoid overflowing a node with packets beyond the optimal traffic input density, the transmission rate of packets is limited per the present subject matter. For this, there is defined a maximum traffic input density, $R_{MAX}$. From slotted Aloha theory, this should be equal to one, but to be conservative by design, it is preferable to use a smaller value. The total traffic input density at node A is the sum of the estimated traffic density $R_A$ and the traffic that node B will generate for node A. Node B will modulate the traffic it generates for node A in order to prevent the total traffic input density at node A from exceeding the maximum allowed value $R_{MAX}$.

A straightforward way per present subject matter to implement this limitation is to send the messages at a random time within a randomization window of length $T_W$. The length of the randomization window should respect the following condition:

$$\frac{1}{T_W} + R_A \le R_{MAX},$$

where $T_W$ is expressed in time slot units.

Per present subject matter, if a node has several fathers, preferably it should size the length of its randomization window according to the father with the highest traffic input density, even if the packet is not intended for this father.

The following tasks preferably are performed in every node of the network. They are to monitor all acknowledgments overheard from the father nodes; to record all the communication successes/failures with every father node; to keep a record of the time spent in transmission or listening state; to compute the probability for the receiver to be listening, Q; for every father node, to compute the communication success rate CSR and to compute the estimated traffic input density, R; and to slow down of hold off transmissions if the traffic input density for the busiest father becomes too large.

All such average variables (input traffic density, rate of overheard acknowledgments, communication success rate and probability for a node to be listening) can be computed with a sliding average algorithm to avoid using excessive microprocessor memory.

Referring to such subject matter in somewhat different terms, per present subject matter, a defined maximum traffic input density may be referred to as MAC_Traffic_Density_max, such that the total traffic input density at endpoint A, now including the traffic from B to A is given by:

$$\frac{1}{\text{Tx\_Window}} + R_A = \text{MAC\_Traffic\_Density\_max}$$

Where Tx_Window is the length in time slots of the randomization window used to transmit a packet. The data packet will be transmitted in a randomly chosen time slot within this randomization window. It follows an equation to compute the length of this window as a function of three readily measured parameters:

$$\text{Tx\_Window} = \frac{1}{\text{MAC\_Traffic\_Density\_max} - R_A}$$

with $R_A = S_{ackA}(1+LPD_{BA})/Q_B$
where $LPD_{BA}$ is the local propagation delay from B to A, $Q_B$ is the probability for endpoint B to be in receiving state and $S_{ackA}$ is the average number of acknowledgments transmitted by A and received by B by time slot. For practical purposes, the length of Tx_Window needs to be bounded. The outcome of this calculation will be truncated in order to always be in the following range:

MAC_Tx_Window_min ≤ Tx_Window ≤ MAC_Tx_Window_max.

The randomization window length will then be computed with the following:

$$\text{Tx\_Window} = \begin{cases} \text{round}\left[\min\left(\frac{1}{R_{Amax} - R_A}, \text{MAC\_Tx\_Window\_max}\right)\right] & \text{if } R_A < R_{Amax} \\ \text{MAC\_Tx\_Window\_max} & \text{if } R_A \ge R_{Amax} \end{cases}$$

where it is used $R_{Amax}$ @MAC_Traffic_Density_max. The endpoint has to monitor the traffic for each one of its fathers in order to have an up-to-date value of $S_{ackA}$. At the end of each time slot, the endpoint computes new values of the $S_{ackA}$ parameters in its table of neighbors. This has to be done systematically, whether a packet from that neighbor was received or not. We use for this a sliding average window as defined below:

$$S_{ackA}(n) = \frac{N_{TMW} - 1}{N_{TMW}} S_{ackA}(n-1) + \begin{cases} 0 & \text{if no } (N)ACK \text{ is recieved from } A \\ \frac{1}{N_{TMW}} & \text{if a } (N)ACK \text{ is recieved from } A \end{cases}$$

In that formula n refers to the time slot number and $N_{TMW}$ is the number of time slots in the traffic monitoring window. This number is given by the MAC layer parameter $N_{TMW}$ @MAC_Traffic_Monitoring_Window. $Q_B$ is also updated at each time slot with the following:

$$Q_B(n) = \frac{N_{TMW} - 1}{N_{TMW}} Q_B(n-1) + \begin{cases} 0 & \text{if endpoint in } Tx \text{ mode} \\ \frac{1}{N_{TMW}} & \text{if endpoint in } Rx \text{ mode} \end{cases}$$

Of course, if an endpoint has several fathers, it should always size the length of its randomization window according to the father with the highest traffic input density, even if the packet is not intended for this father.

Due to hardware cost, the memory size to save messages will not be unlimited from a system point of view. Packets during their travel between endpoint and Cell Master are buffered into nodes. To avoid standing in front of irresolvable blocked traffic situations, when memory is full, packets storage should follow some important guidelines.

Packets storage should be divided into two categories:

Packets going uplink: Uplink, Broken Link, Outage Notification . . .

Packets going downlink: Downlink, Broadcast . . .

The number of packets belonging to each category should be monitored over time and is called nb_of_uplink_buffered_packets and nb_of_downlink_buffered_packets. There is a maximum number of packets that can be saved for each category.

nb_of_uplink_buffered_packets ≤ MAC_Max_nb_of_uplink_buffered_packets nb_of_downlink_buffered_packets ≤ MAC_Max_nb_of_downlink_buffered_packets nb_of_uplink_buffered_packets + nb_of_downlink_buffered_packets ≤ memory size To maintain this information it is necessary that the different layers indicate the category of the packet they send/receive. As the Cell Master only receives uplink traffic and sends downlink traffic, these categories can be respectively compared to ingoing and outgoing buffered packets.

Once a buffer of either type is full, if a message of the corresponding type of is received, the MAC layer should respond to the sender with a NACK message and discard the packet as there is no place to save it.

For the Cell Master case, if the WAN connectivity is good, the uplink (ingoing) buffer should in theory never be full. Indeed the throughput of the WAN is highly superior to the Linknet one. If the uplink buffer happens to be full, the same algorithm is used and the Cell Master starts sending NACK to incoming packets. This situation will in counterpart highly degrade network performances and can bring about network instability and packets losses.

With respect to the following discussion points on the present scheduling of messages, it should be understood that in this context a message refers to any packet other than an acknowledgement. When the application layer requests it, or when there is a received message to forward, the NET layer determines the destination address(es). The LLC layer deals with the fragmentation and retransmission of messages. These two layers send requests to the MAC layer who adds the MAC header to the packets and send them to the physical layer for transmission.

Among these layers the MAC is in charge of scheduling in which time slot the message will be sent. The main objective of this scheduling is to randomize in time the transmissions in order to avoid collisions with neighbors' packets.

The MAC layer must not only schedule the data messages coming from the upper layers but also its own packets (acknowledgements, requests and beacons).

Messages can accept some delay in their transmission, while acknowledgements must be sent within the timeslot of the reception. These restrictions and the need for time randomization are the base for the packets scheduling process.

With reference to present priorities for messages, present FIG. 32 is a table that shows an exemplary message priority list in accordance with the present protocol subject matter. In general, there are two main kinds of packets the MAC layer must schedule: The ones coming from the upper layers (LPDU) and the ones generated by the MAC layer. The first category can be divided into two types, data and power outage notification, while the second category includes synchronization requests (SYNC RQST) and acknowledgements (SYNC ACK or SYNC NACK), other messages acknowledgement (ACK or NACK), beacons, beacon requests and discovery beacons. The data messages can have different MAC header depending of their nature (monocast, broadcast, broadcast ITP . . . ) but they will all be treated in the same way from a scheduling standpoint.

Some messages must be sent in priority; among all these messages, acknowledgements are the most important. A (N)ACK must be sent in the time slot the reception of the corresponding monocast message occurred; in the same way the SYNC (N)ACK must be sent in the same time slot as the corresponding SYNC RQST.

The MAC should normally not send more than one message in a given time slot, except several forced beacons if the hardware can handle it. In the rare case an EP would need to acknowledge more than one message or synchronization requests in the same time slot, then one should be sent and the other cancelled. The reason is that the EP who transmitted the initial message or request expects an acknowledgement in this time slot and considers the transmission a failure after that (it is thus useless to transmit a (N)ACK or SYNC (N)ACK after the current time slot). Although packets other than acknowledgements are initially randomized in a window, they are not absolutely restricted to it and can be postponed.

The requests are next in the priority list, with the SYNC RQST just before the RQST_Beacon.

All these packets are needed for the network to work properly and are thus higher in priority than the data to transport. The data is next on this list of priority, followed by the beacons (on a forced channel or not). These beacons are actually MAC headers used to give synchronization information. Since the same information is in all MAC headers, if any message is transmitted in the window where an unforced beacon is requested, this beacon does not need to be transmitted. Concerning the forced beacons, which are triggered by the reception of a discovery beacon, they need to be sent in the corresponding listening window, but only if there is a time slot available: including a new node to the network must not disturb the nodes already synchronized.

There are two exceptions that supersede the order of priority defined above: the first one is when an EP experiences a power outage, the API layer notifies it to the NET layer. This request changes the normal receiving mode into a passive, power saving mode interrupted by transmission of short outage notifications. If another EP receives one of these notifications, it will re-transmit it with a priority order of a normal data. The second case is during the discovery phase, where this order is meaningless since the MAC only transmits discovery beacons or listens for "forced" beacons.

Scheduling a message consists in deciding in which time slot it will be transmitted. There are several restrictions that apply to this task. First it must follow the priority rules described in the previous section; this priority is applied when two messages should be sent in the same time slot. Additional rules are needed to define this scheduling task.

As said above the acknowledgements are the highest priority and they also must be sent in the same time slot as the message or synchronization request that triggered them. The acknowledgements cannot be pushed in time as the messages can (all message can be postponed, excepted the forced beacons which have also a defined window but are of the lowest priority and can be cancelled to make place to any other packet if needed).

As a result of this first rule, if a message was scheduled in the same time slot as the reception of monocast data, then this message must be pushed by 1 time slot, to allow the MAC layer to acknowledge the received packet. Only acknowledgements can be sent in a time slot where a LPDU packet was received.

In order to not overload the network any LPDU and SYNC RQST must be randomized over time. The SYNC RQST randomization is done at the MAC layer and is discussed in another section.

Each time a packet is received from the LLC layer, the MAC layer adds it to a FIFO dedicated to data messages. If no data packet is being sent the MAC layer checks if there is a message in this FIFO. If it is the case then the transmission window is updated (see Traffic load control section) and a countdown timer is randomly determined. This timer is decremented at each time slot beginning and when it reaches zero the message is sent during the time slot.

There are several exceptions to this rule. If a higher priority message is already scheduled or an acknowledgement is expected then the message is left in the FIFO and the countdown timer set to expire for the next timeslot. On the contrary if a forced beacon was scheduled in the same time slot the data message is scheduled (and/or in the next one for a monocast packet) then the forced beacon is cancelled.

The forced beacon should be sent in the listening window of the endpoint in discovery phase. It should be randomized in this window. If the time slot is already taken then the next time slot should be tested for availability, cycling to the beginning of the listening window if the end is reached. This procedure should continue until a space is found to transmit the forced beacon or the endpoint realizes that all time slots are already occupied, in which case it should cancel the forced beacon.

When a packet already scheduled is pushed in time to let the place for an acknowledgement, then all the packets scheduled later are pushed by the same time slot amount. This should concern only SYNC RQST and Beacon RQST, since the data packets stay in the FIFO until the time slot where they are sent (at which point it has already been determined that no acknowledgement was expected).

Finally, concerning there are several rules concerning the transmission inside a given time slot. The data messages are always sent at the beginning of the first sub-time slot; this maximizes the space available for data and allows the endpoints to send their acknowledgements in the last sub-time slot.

The synchronization acknowledgements should also be sent in the same time slot as the request; the SYNC RQST should be sent in the second sub-time slot and the corresponding acknowledgement in the last sub-time slot, whether the answer in negative or positive. If the SYNC RQST triggers a RQST Beacon to check the connection with one father then it should also be sent in the last sub-time slot (where the SYNC (N)ACK would be sent if the connection to a father was good).

The beacons should be randomized between the second and the fifth sub-time slot to not interfere with the start of data messages or the acknowledgements. The same rule should apply to the MAC outage packet.

In other present versions of the protocol the acknowledgments are made in the time slot following the message or the request, which meant that data packets could not be sent in successive time slots. The present version does not have this restriction, but it is compatible with the fact to not send data back to back if the hardware cannot handle it. The acknowledgements were put in the same time slot to be in the same frequency as the original packets and not to gain time. Summarized for the present version:

(N)ACK must be sent in the same time slot the reception of a monocast message occurred.
SYNC (N)ACK must be sent in the same time slot the reception of a SYNC RQST occurred.
(N)ACK, SYNC (N)ACK and RQST Beacon are sent in the last sub-time slot.
Beacons are randomized between the 2nd and the 5th sub-time slot.
If a packet is pushed by one time slot then all packets already scheduled are pushed.

The present discussion more particularly relates to various outage notification system aspects of the present subject matter. Specifically, it is noted that endpoints that experience a power outage possess important information that if it could be relayed to the data collection system, can be applied for very useful network management purposes. However, during a power outage, the supply of energy has been cut off. For low cost devices which do not contain energy storage devices, this means that they have limited energy available and will not be able to continue to participate to the network. The problem then arises how to move this valuable information to the cell relay under these circumstances.

The present solution is advantageously based on using to relay the information the endpoints that do not experience a power outage. At each power out, there will be a self-defining fringe where endpoints within the power out zone will be able to communicate with endpoints that are still having power.

Endpoints that experience the power outage will enter a power out mode once a power failure is detected. The will immediately cease normal network operation and will initiate a few short power out messages over a randomized time window to avoid collisions. As it is still able to keep time accurately due to oscillator drift compensation, it will be able to select correct frequency channels and time to ensure powered endpoints in range will be able to capture these messages. Once power endpoints capture a power outage message, it will be able to store this information and send it using normal network protocol.

If the network connectivity has been influenced by the power outage, endpoints will use the normal network self management functions to re-establish connectivity if possible. Power out information is stored during this time and is not lost. If the power outage zone is large only a percentage of power out messages will be reported but should be sufficient to infer true outage problems with correlation with electricity network information, at least from the perspective of network management purposes.

More particularly, per present subject matter, when a power outage occurs, the MAC layer enters in a special mode (requested by API). The MAC layer stops listening and sends 3 very short messages with the EP remaining energy. Each such message is randomized (but still aligned with the timeslots) in a 5 s window. These outage messages are processed by everyone that can hear them. These messages are also numbered with an outage number (1 increment by outage, not by sent messages). If before the first outage message is sent, the EP recovers its power, then it cancels the outage notifications (but the API layer is free to send a power recovery message). But if the power comes back after the first outage message is sent, then the EP will send the remaining two.

When a neighbor that is still powered hears an outage message, its MAC layer indicates to the NET layer (through the LLC) the outage notification, the neighbor address, the outage number and the time when the outage message arrived. It will be the task of the NET layer to forward this information to the Cell Relay in the same way that is used for regular (or classical) uplink messages.

The present protocol subject matter beneficially affords analysis of other aspects of network related performance. Specifically, an embedded RF environmental evaluation tool is provided to gauge the performance needs of RF transceivers. In particular, a statistical radio environment analysis tool is embedded in the nodes of a subject mesh network for the purpose of providing guidelines for the improvement of the hardware.

The present system is intended for use in ISM bands. These bands usually feature a very high level of uncontrolled interference. The specifications of the RF hardware, as well as the expected performance of the network, strongly depend on the electromagnetic environment in these bands. Two aspects of this environment need to be considered. The first one is the path loss or propagation conditions. Although a lot of information is available on this topic for ISM bands, no reliable statistical data is available for the specific electricity-meter-to-electricity-meter situation relevant to this network. The second aspect of the problem is the interference level. The knowledge of this parameter is very important because the largest part of the cost of an RF transceiver is associated with interferences and how to efficiently fight them. The present subject matter provides for the implementation of an embedded environment analysis tool in the protocol. This is potentially an invaluable tool for network diagnosis and planning. It will also be the stepping-stone for a next generation hardware definition for any system because it will provide a means to support any cost reduction of the RF hardware, by providing extensive environment analysis back up to ensure that any resulting new hardware has the required specifications to work in its environment. For such purposes, the nodes of the network will probe the electromagnetic environment with the RSSI (Received Signal Strength Indicator) function of the receiver. Due to the continuously changing nature of this environment, a very large number of RSSI measurements are necessary to be valid from a statistical standpoint. Therefore, to avoid cluttering the limited bandwidth with all these measurements, a statistical data processing will be applied in the node. In this way, only significant information will have to be reported to the application. Two different kinds of environment analysis are specified in this protocol. The first one is used to explore the time characteristics of the interference and is a measurement of the RSSI auto-correlation function. The second one focuses on the intensity of the interference and is a measurement of the RSSI probability density function. The first kind of analysis will help answering questions like: what is the optimal packet length to avoid collisions with the other users of the band? The second analysis will help answer questions like: what is the necessary adjacent channel rejection to avoid collisions? What is the probability for a collision to occur if two nodes are some distance away from each other?

A chief benefit is that it enables optimization of RF hardware that needs to work in specific conditions, for practice of the present subject matter in a particular field environment.

Considering such present environmental analysis tools in greater detail, it will be understood that the specifications of the RF hardware, as well as the expected performance of the network, strongly depend on the electromagnetic environment. Two aspects of this environment need to be considered. The first one is the path loss or propagation conditions. The second aspect of the problem is the interference level. The MAC layer can probe the electromagnetic environment with the RSSI function of the receiver, and obtain a relatively large number of RSSI measurements for statistical validity. Two different kinds of environment analysis are specified in this protocol. The first one is used to explore the time characteristics of the interference and uses the RSSI auto-correlation function. The second one focuses on the intensity of the interference and uses the RSSI probability density function.

With respect to the subject environmental analysis functionality, the objective of the RSSI Autocorrelation Acquisition Mode is to measure the average RSSI and its auto-correlation function on a single channel. In this mode, the endpoint will interrupt for some time its normal hopping sequence and its usual communication tasks. The MAC layer will configure its receiver in continuous reception mode and will request RSSI readings from the PHY layer at a rate given by the MAC layer parameter RSSI_Sampling_Rate. These readings will then be processed to extract the average value and the auto-correlation function. The LLC layer sends the request to the MAC layer with two input arguments: the channel number to perform the analysis on and a maximum number of samples used to terminate the environment analysis.

The average RSSI, RSSI_avg, will be computed iteratively as explained by the following algorithm:

Initialization:
RSSI_avg = 0
n = 0
For each RSSI reading do $$\begin{cases} n \leftarrow n+1 \\ RSSI\_avg(n) = \dfrac{RSSI(n)}{n} + \dfrac{n-1}{n} RSSI\_avg(n-1) \end{cases}$$

If n = maximum number of readings, then stop acquisition process
end where we have used the following definitions:

$$\begin{cases} RSSI(n) = \text{current } RSSI \text{ reading} \\ RSSI\_avg(n) = \text{new value of RSSI\_avg} \\ RSSI\_avg(n-1) = \text{old value of RSSI\_avg} \end{cases}$$

For the computation of the auto-correlation function it is necessary store in memory the last 100 values of the RSSI. The auto-correlation function will only be evaluated for a restricted set of delay values. This set of values is:

RSSI_AF_Delays={0,1,2,3,4,5,6,7,8,9,10,20,30,40, 50,60,70,80,90,100}

These values correspond to the time delays $$\dfrac{RSSI\_AF\_Delays}{RSSI\_Sampling\_Rate}.$$

At each RSSI reading, the averaged RSSI is first updated and then the auto-correlation function values are updated. The update process for the RSSI auto-correlation function values, AF_RSSI(m,n), is:

Initialization
    AF_RSSI(m) =0 for each m ∈ RSSI_AF_Delays
After each RSSI_avg update do
For each m ∈ RSSI_AF_Delays do
    If n ≥ m + 1
    temp = (RSSI(n) − RSSI_avg(n))(RSSI(n − m) − RSSI_avg(n))

$$AF\_RSSI(m, n) = \dfrac{temp}{n-m} + \dfrac{n-m-1}{n-m} AF\_RSSI(m, n-1)$$

end
end where we have used the following definitions:

$$\begin{cases} RSSI(n) = \text{current } RSSI \text{ reading} \\ RSSI\_avg(n) = \text{new value of RSSI\_avg} \\ AF\_RSSI(m, n) = \text{new value of } RSSI \text{ auto-correlation function for delay } m \\ AF\_RSSI(m, n-1) = \text{old value of } RSSI \text{ auto-correlation function for delay } m \end{cases}$$

When the requested number of RSSI readings is reached, the acquisition and update process stops. The RSSI_avg value and the AF_RSSI(m) values for each delay m are then reported to the LLC layer in the confirmation message. This report will then be forwarded to Net layer and to the API, which will send it to the Cell Relay. The structure of the output arguments for the confirmation is shown below:

| RSSI_avg | AF_RSSI(0) | AF_RSSI(1) | AF_RSSI(90) | AF_RSSI(100) |
|---|---|---|---|---|

RSSI_avg is a 1-byte field and the AF_RSSI(m) are 2-byte fields. After this environment analysis, the MAC layer resynchronizes its time slots and resumes its previous communication activities.

Per the present subject matter, it should also be noted that this environment analysis process must be short enough to prevent the endpoint from loosing its synchronization with the mesh network. Moreover, the auto-correlation acquisition mode should be used preferably in nodes not too close from the Cell Relay in order to avoid disrupting the data flow through the network.

With respect to the subject environmental analysis functionality, the objective of the RSSI PDF Acquisition Mode is to measure the probability density function (PDF) of the RSSI readings on three selected channels. In this mode, the endpoint keeps hopping its channel number according to cell hopping sequence, as in normal mode. The node carries on with all its usual communication tasks and uses its spare time to probe the environment.

Three different channels are designated for RSSI PDF acquisition and they are part of the basic hopping sequence. The LLC layer sends the request to the MAC layer with four input arguments: the three channel numbers to analyze and a maximum counter value (RSSI_PDF_Max_Count) used to terminate the environment analysis. The RSSI PDF acquisition procedure is described further herein, and present FIG. 33 provides representation illustrations concerning such subject matter.

Whenever the receiver hops to one the channels selected for RSSI measurement, it will request a RSSI reading of the PHY layer. Only one RSSI reading is requested per time slot. This RSSI value will then be used to update the RSSI PDF for that channel. The PDF is an array of 24 bins, each one of these bins corresponds to a RSSI range of 3 dB as shown in present FIG. 33. A counter is associated with each bin. For instance, if the RSSI reading is equal to −113 dBm, the counter associated with bin 2 will be incremented. In a general way:

```
Initialize all bin_k_counters to zero
RSSI_min = −118 dBm
RSSI_step = 3 dB
If RSSI_min + (k−1)*RSSI_step <= RSSI < RSSI_min +
k*RSSI_step then
bin_k_counter = bin_k_counter + 1
if bin_k_counter = RSSI_PDF_Max_Count then
    exit acquisition process
end
end
``` where bin_k_counter is the counter associated with bin k.

There are some exceptions to this rule. If the RSSI value is above the upper bound of the last bin, the counter associated will the last bin should be incremented. In a similar way, if the RSSI value is below the lower bound of the first bin, the counter associated with the first bin should be incremented. If a start of frame delimiter is detected in a time slot, prior to the RSSI reading, this time slot should not be used for RSSI PDF update. If a start of frame delimiter is detected in a time slot, after the RSSI reading, this time slot can be used for RSSI PDF update. The purpose of this is to prevent Linknet traffic from interfering with the PDF acquisition. The goal of this measurement is to get an image of the external interferences sources on the channels used by the network. Each one of the bin counters starts from zero when the process is initialized and has a max range of 4095. When any of these counters reaches the maximum value RSSI_PDF_Max_Count (≤4095), the RSSI PDF acquisition for that channel is stopped. When the RSSI PDF acquisition is completed for the three selected channels, the MAC layer can report the results to the LLC layer. The structure of the output is shown in present FIG. 34.

If the node loses synchronization, switches to another, cell or experiences a power outage (it could be done at power up), all the buffered messages should be deleted.

The MAC layer uses several types of messages to manage its numerous tasks. Not every message contains the same level of information. In order to save RF bandwidth and to not send useless bytes, the MAC header will be different for almost each message type. However, every message should provide synchronization information to anyone who can hear it. This way no message will be useless, even if a message is heard by an endpoint that is not the destination.

At the MAC layer level, the address of an endpoint is the serial number of the meter itself. Address is so fixed and unique, and is 4 Bytes long.

The message frame at MAC level is composed of:
  A MAC header: It represents all the parameters needed at the MAC level. We can split it in sub sections: a common part for all the message types, and a dynamic part.
  A frame body, which is the LLC Protocol Data Unit, called LPDU.
  A Frame Check Sequence section, which is the bytes needed to compute the error detection on the MAC header and the frame body.

Present FIG. 35 below shows all the fields that can be present at MAC level. The field and different message structures are otherwise described herein.

According to the present subject matter, there is a part of the header which is common to all types of messages:

LV, Layer Version: It indicates the version of the MAC layer.

FT, Frame Type: These bits indicate the type of the frame. See relative sections of present FIG. 36 for MAC frame type related information. Note that the message types are arranged in order of priority.

SA, Sender Address: The Sender/Source Address is 4 bytes long.

The MAC header has a dynamic section, in which the fields below don't appear in every message. They are described here in a general way, with more details otherwise stated herein for each message type.

RS, Registration State:
It indicates whether the endpoint is registered to a cell or not. This information is provided by the NET layer.
The RS bit of the Cell Master is always 1.

RSD, Reserved:
Not used for the moment. This field should be set to 0.

CD, Connectivity Degree
This field indicates the degree of connectivity of the node with its fathers. Depending on the number of potential SYNC fathers the node has, the Connectivity Degree takes a different value. The CD value of the Cell Master is always set to the maximal value.

Figure 47:
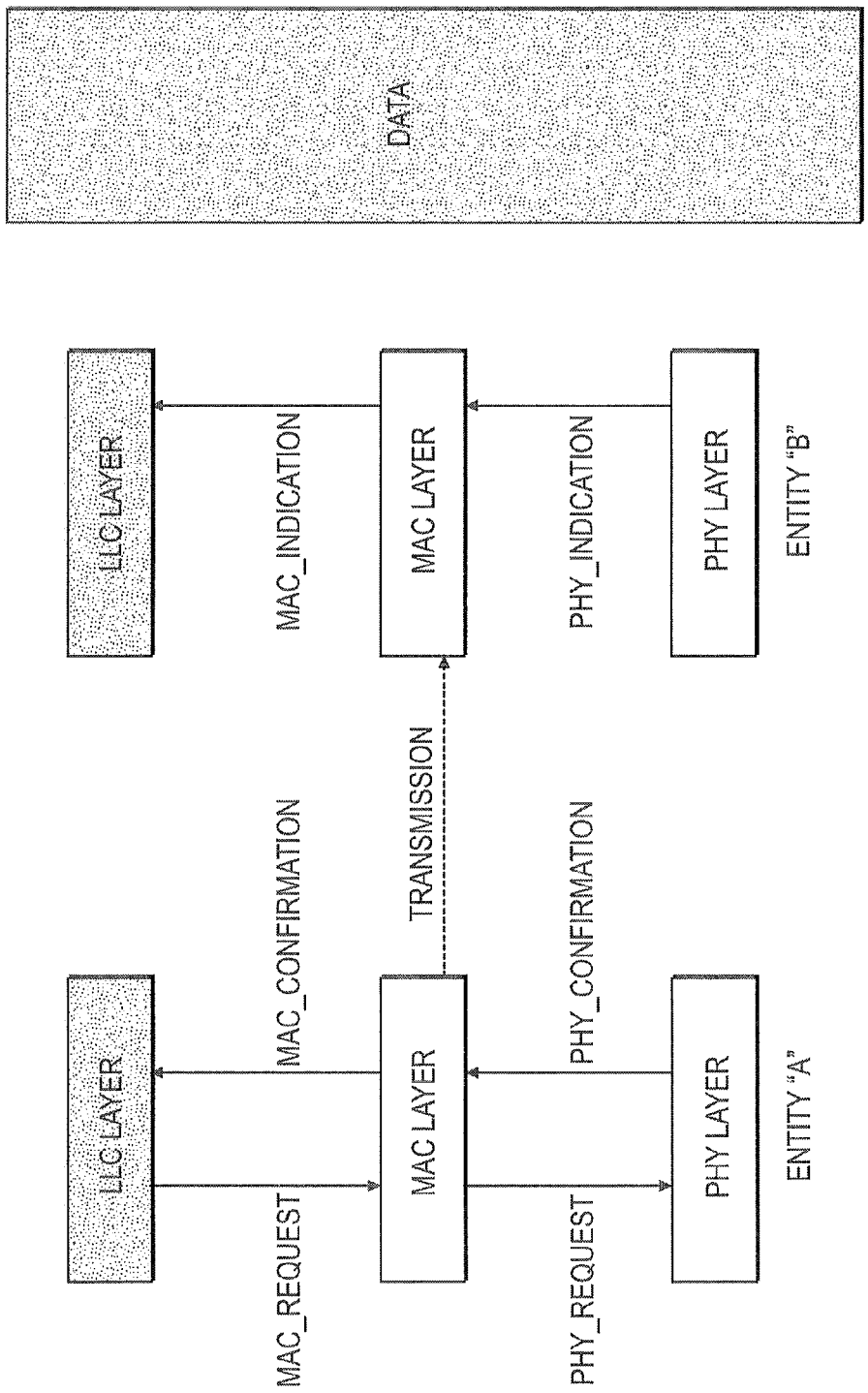
FIG. 47 depicts MAC LAYER SERVICES subject matter.

CSI, Cell Size Indicator:
It indicates how full the cell is.
LVL, Level:
This field indicates the level of the sender. A 0-level transmitter signals that the transmitter is not connected to the mesh network. A 1-level transmitter signals that the transmitter is a Cell Master. For the other value, if n is the number of hops to reach the Cell Master, the level is defined by LVL=n+1.
GPD, Global Propagation Delay:
This field gives the global propagation delay between the sender and the Cell Master.
SACT, Slotted Aloha Countdown Timer:
This field indicates the remaining time before the endpoint switches to the next time slot when the transmitter sends the message. SACT is expressed in MAC_SACT_Resolution_µs.
TSN, Time Slot Number.
This field gives the time slot number in which the message is sent. Combined with the cell address (CELL), any endpoint can deduce the channel of this time slot.
CELL, Cell address:
This field gives the address of the cell with which the endpoint is synchronized. These 2 bytes are used to compute the frequency hopping sequence used in the cell. In a Discovery Beacon, this field is used to specify the preferred cell in warm start. The Cell address is based on the C12.22 address of the Cell Relay WAN board.
FID, Frame ID:
The Frame ID number is incremented and sent at each Sync Request and monocast data; it is sent in the (N)ACK or SYNC_(N)ACK to specify the packet they are answering to.
OID, Outage ID:
The outage number of the endpoint that experiences a power failure.
DA, Destination Address.
The Destination Address is 4-byte long.
HFN, HyperFrame Number:
The hyperframe number can be used in several ways depending on the message type.
RITP, Relative ITP:
The relative ITP is propagated in the network through a dedicated type of message. This is the ITP timestamp of the beginning of the hyperframe number 0.
RxC, Reception Channel
This field indicates the channel number on which the EP will listen during the listening window of the discovery phase
NDB, Number of remaining Discovery Beacons
It gives the number of remaining discovery beacons to send before the beginning of the listening window.
The frame body is only present in data message, that is, messages from the above layers. This field doesn't exist for the other messages:
LPDU, LLC Protocol Data Unit: This field carries the message for the layers above the MAC layer.
The Frame Check Sequence (FCS) field is used to detect potential errors in the frame:
CRC, Cyclic Redundant Code: These 4 bytes are allocated for a CRC-32 value to check the integrity of the MAC header and the frame body.
Beacons are empty messages with no specific destination. They only contain synchronization information; an endpoint sends beacons periodically when it does not generate any other traffic. The beacon length at MAC level is 19 bytes, as graphically represented by present FIG. 37.
A SYNC request is sent by an endpoint which wants to become synchronized with another. The FID field is a counter, incremented at each sent SYNC Request or Monocast Data. The SYNC request length at MAC level is 24 bytes, as graphically represented by present FIG. 38.
The following types of messages are used to acknowledge or not data messages and SYNC requests. The FID field refers to the FID of the message which is (non-)acknowledged. The (N)ACK or SYNC NACK length at MAC level is 24 bytes, as graphically represented by present FIG. 39.
A SYNC ACK message is an acknowledgment of a SYNC request. The FID field refers to the FID of the SYNC request message which is acknowledged. It differs from the SYNC NACK because the current hyperframe number, HFN, and the relative ITP of this hyperframe are also transmitted. The SYNC ACK length at MAC level is 29 bytes, as graphically represented by present FIG. 40. One special note is that this message doesn't fit in a single sub time slot (for 1 byte).
If an endpoint needs to update the synchronization information of one of its neighbors or just checks that it is still present, it can send it a request beacon. The Request Beacon length at MAC level is 23 bytes, as graphically represented by present FIG. 41.
The monocast data message is a data message sent to only one destination. It contains in the frame body the LPDU to carry. The FID field is a counter, incremented at each sent Monocast Data or SYNC Request. The monocast MAC frame length is LPDU length+24 bytes, as graphically represented by present FIG. 42.
The broadcast is a data message not addressed to anybody in particular but intended to any endpoint receiving it. The broadcast MAC frame length is LPDU length+19 bytes, as graphically represented by present FIG. 43.
The ITP messages are dedicated messages, initialized by the Cell Master, to propagate the RITP in the entire cell. They are considered as broadcast data messages with no frame body. The RITP field is fixed by the Cell Master when it initializes the message as the HFN field, which is the hyperframe number of the creation of the RITP. When EPs forward the ITP message, they keep the same HFN and RITP fields as the ones created by the Cell Master. The ITP length at MAC level is 24 bytes, as graphically represented by present FIG. 44.
The discovery beacon is a short message sent during the discovery phase by non-synchronized EPs. RxC field indicates the listening channel of the discovery phase, NDB the number of remaining discovery beacons to send before the listening window, and CELL is set to the cell address the node wants to synchronize with, in warm start (set to 0 in cold start). The Discovery Beacon length at MAC level is 13 bytes, as graphically represented by present FIG. 45.
Outage messages are the simplest and shortest messages that can be sent. When an endpoint realizes that there is power failure, it uses its last gasp to send several of these messages. The OID gives the outage number. At each new outage, the EP increments this outage number, which rollovers on 1 byte. For each outage, three outage messages are sent randomized in three intervals of 5 seconds (the OID stays the same for these three packets). The Outage message length at MAC level is 10 bytes, as graphically represented by present FIG. 46.
Present FIG. 47 schematically represents MAC Layer Services, which reflect functionality advantageously provided per the present protocol subject matter. Specifically, with an objective to send a message to one destination, MAC_Request_Send_Mono_Data, there is use of requisite input arguments: LPDU, Destination Address. The operation may be described as the LLC layer requests the MAC layer to send a message to one neighbor. The message is sent with the standard traffic management rules. Note that the neighbor is not necessarily in the neighbor table.

With an objection to send a broadcast message, MAC_Request_Send_Broadcast, there is use of requisite input arguments: LPDU. The operation may be described as the LLC layer requests the MAC layer to send a message to everybody in the neighborhood. The message is sent with the standard traffic management rules.

With an objective to send an RITP timestamp, MAC_Request_Send_ITP, there is no required use of input arguments. The operation may be described as the NET layer requests the MAC layer, by the way of the LLC, to send an ITP message to everybody in the neighborhood. This request follows the same approach as a MAC_Request_Send_Broadcast, except that there is no LPDU to carry. Instead of LPDU, the MAC adds in its header the RITP and the HFN of the creation of this RITP. The message is sent with the standard traffic management rules.

With an objective to measure the medium interference level on a specified channel and its time auto-correlation function, MAC_Request_Environment_Analysis_Auto-Correlation, there is use of the requisite input arguments: Channel number, Number of samples. The operation may be described as the API layer requests, by the way of the LLC and NET layers, the MAC layer to measure the RSSI on a specified channel, a given number of times. The MAC layer will then compute the average value of this RSSI as well as its auto-correlation function. The sampling acquisition rate of the RSSI is a MAC parameter, MAC_RSSI_Sampling_Rate. The values of the delays for the computation of the auto-correlation function are given by another MAC parameter, MAC_RSSI_AF_Delays.

With an objective to measure the medium interference level on three specified channels and its probability density function, MAC_Request_Environment_Analysis_PDF, there is use of the requisite input arguments: Channel numbers (3), RSSI_PDF_Max_Count (maximum value of bin counters). The operation may be described as the API layer requests, by the way of the LLC and NET layers, the MAC layer to measure the RSSI on three specified channels taken from the hopping sequence. For each one of these channels, the MAC layer will compute the RSSI probability density function (PDF). The acquisition process stops when a bin counter reaches the maximum allowed value for that request.

With an objective to give to the MAC layer the information whether a cell is authorized or not, MAC_Request_Cell_Authorization, there is use of the requisite input arguments: Cell Address, Cell Status. The operation may be described as the NET layer gives, by the way of the LLC layer, to the MAC layer the status of a cell. This one can be authorized, or forbidden.

With an objective to give to the MAC layer the information whether the NET layer is registered, MAC_Request_Cell_Registration, there is use of the requisite input arguments: Cell Address, Registration Status. The operation may be described as the NET layer informs, by the way of the LLC layer, of the NET registration status in the cell. Then the MAC layer can put the RS (Registered State) bit to 0 or 1 in its header.

With an objective to answer a MAC_Request_Send_Mono_Data, MAC_Confirmation_Send_Mono_Data, there is use of the requisite output arguments: Status of the message (ACK, NACK, No ACK). The operation may be described as it gives to the LLC layer the status of a Send Mono Data Request. Each confirmation is linked to the number of the associated request to avoid confusion. The confirmation can be a ACK or NACK if such messages have been received, or a No ACK status if the destination has not answered in the time slot it should had.

With an objective to answer a MAC_Request_Send_Broadcast and MAC_Request_Send_ITP, MAC_Confirmation_Send_Broadcast and MAC_Confirmation_Send_ITP, there is use of the requisite output arguments: Status. The operation may be described as it confirms to the LLC when the broadcast or the ITP has been sent, Then the LLC can proceed to the repetition if necessary.

With an objective to answer a MAC_Request_Environment_Analysis_Auto-Correlation, MAC_Confirmation_Environment_Analysis_Auto-Correlation, there is the use of requisite output arguments: average RSSI, RSSI auto-correlation function values. The operation may be described as the MAC layer sends to the layer above the RSSI average value and the values of the auto-correlation function computed during the requested environment analysis. The number of values for the auto-correlation function is the number of delays at witch this function was calculated. These delays are defined by the MAC layer parameter MAC_RSSI_AF_Delays.

With an objective to answer a MAC_Request_Environment_Analysis_PDF, MAC_Confirmation_Environment_Analysis_PDF, there is use of the requisite output arguments: RSSI PDF values for the three requested channels (3×24 values). The operation may be described as the MAC layer sends to the layer above the RSSI PDF values (actually the values of the bin counters) for each one of the three requested channels.

With an objective to answer a MAC_Request_Cell_Authorization, MAC_Confirmation_Cell_Authorization, there is the use of the requisite output arguments: Status. The operation may be described as it just confirms that the request has been taken into account.

With an objective to answer a MAC_Request_Cell_Registration, MAC_Confirmation_Cell_Registration, there is use of the requisite output arguments: Status. The operation may be described as it just confirms that the request has been taken into account.

With an objective to forward a received LPDU message to the LLC layer, MAC_Indication_Received, there is use of the requisite output arguments: LPDU, Sender Address. The operation may be described as it gives to the LLC layer the LPDU that has been received with the sender address.

With an objective to inform that a broadcast ITP message has been received, MAC_Indication_ITP_Received, there is no use of any output arguments. The operation may be described as when a valid broadcast ITP message is received, the MAC layer updates the RITP field and informs the NET layer, by the way of the LLC layer, of that arrival. The result of this indication forces the NET layer to forward this ITP if not already done.

With an objective to update the ITP of the API layer, MAC_Indication_ITP_Update, there is the use of the requisite output arguments: Absolute ITP Timestamp. The operation may be described as the RITP can be updated after the reception of an ITP broadcast message or a SYNC ACK. The MAC layer then computes an update of the absolute ITP and sends it to the API layer. As soon as the ITP is computed, it should be given to the API layer very quickly. This indication has priority over all other indications.

With an objective to indicate to the above layer the MAC state, MAC_Indication_State, there is the use of the requisite output arguments: State, Cell address. The operation may be described as the MAC layer informs the upper layers after each state modification. The MAC layer can be not-synchronized or synchronized with a cell. In the last case, the address of the cell is indicated.

With an objective to indicate to the above layer that the MAC layer will soon leave the current cell, MAC_Indication_Cell_Leaving_process, there is no use of any output arguments. The operation may be described as the MAC layer informs the upper layers that it has found a new cell and it will leave soon the current one.

With an objective to inform that a power outage notification has been received, MAC_Indication_Outage_Received, there is use of the requisite output arguments: Outage ID, Sender Address, Outage Time. The operation may be described as it indicates to the NET layer, by the way of the LLC, that a neighbor has experienced an outage at a given time. It forces the Net layer to forward this notification to the Cell Master.

Figure 48:
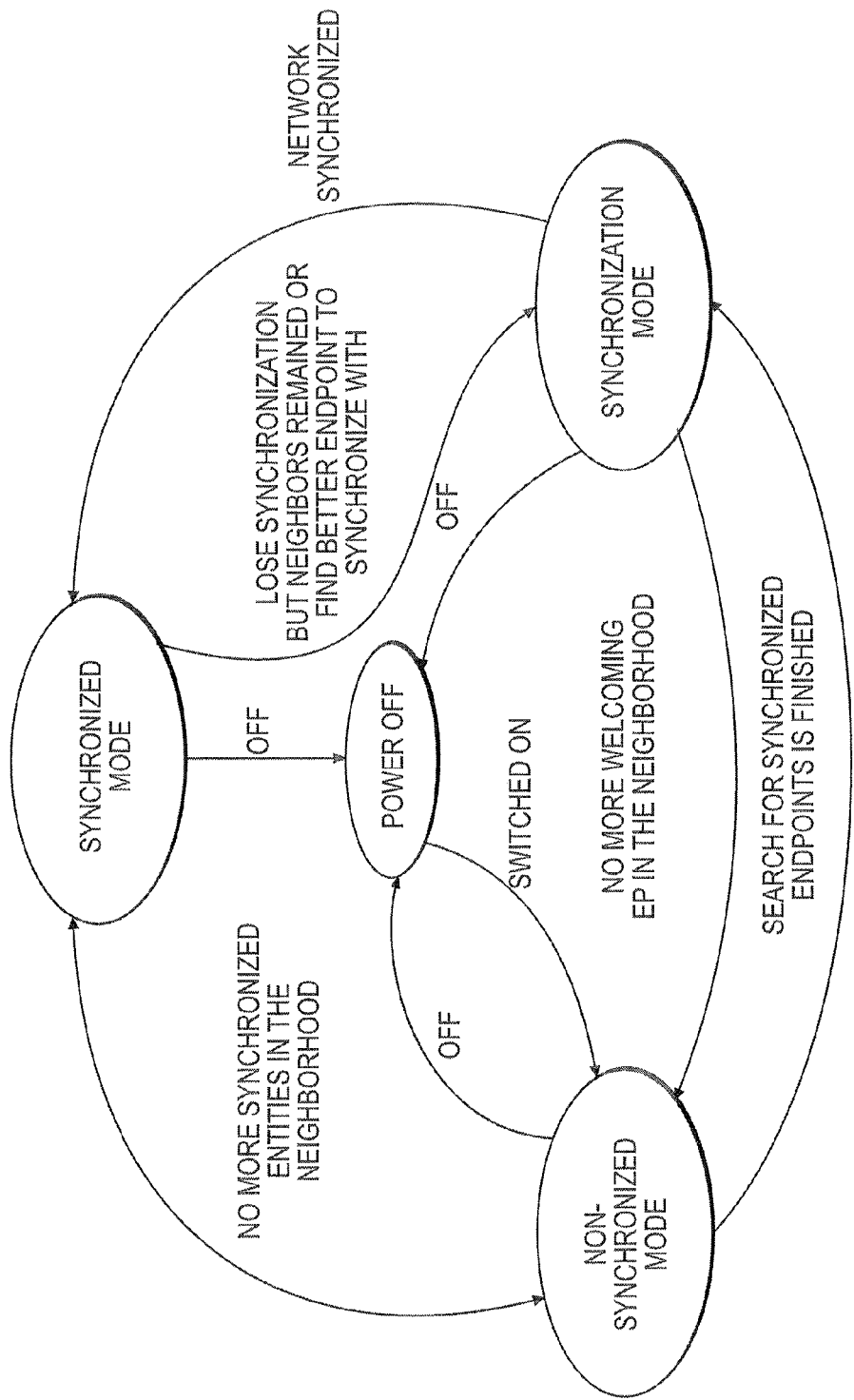
FIG. 48 depicts OVERALL STATES DIAGRAM subject matter.

The MAC layer is organized in three modes: Non-Synchronized Mode, Synchronization Mode, and Synchronized Mode. When the meter is switched on or after a Black Out, the MAC layer goes into Non-Synchronized Mode. Present FIG. 48 represents such features and other aspects, including additional disclosure regarding MAC State Diagram subject matter.

The Logical Link Control layer is the second sub-layer of the Data Link layer, next to the Net layer. Its goal is to provide other functionalities for the Data Link layer, without burdening the MAC layer. These functionalities can independently operate above the MAC layer ones but still have the goal to optimize access to the medium.

Some services provided by the MAC layer are useless to the LLC layer, they are rather intended for layers above the Data Link layer, such as the NET layer. Therefore, in order not to break the layer approach, some services are merely forwarded from the MAC to the NET layer, and vice versa, going through the LLC layer as if it was a pipe.

The following listing describes the adjustable (that is, tweakable) parameters of the LLC layer with their associated preferred default values being referenced in present FIG. 49.

LLC_Duplication_Table_Size
Description: The number of LLC message entries saved in memory to avoid duplicate messages when the same packet is received several times.
LLC_Max_Message_Length
Description: The maximum message length that the LLC layer allows the upper layer to send.
Comment: this includes the service of fragmentation and thus is directly obtained by the equation: LLC_Max_Message_Length=LLC_Max_Packet_Length*LLC_Max_Nb_of_Packets
LLC_Max_Nb_of_Packets
Description: The maximum number of packets the LLC can fragment a message into.
LLC_Max_Nb_of_Downlink_Transmissions:
Description: The maximum number of times a downlink packet should be sent if no acknowledgement is received.
LLC_Max_Nb_of_Uplink_Transmissions:
Description: The maximum number of times an uplink packet should be sent if no acknowledgement is received.
LLC_Max_Packet_Length
Description: The maximum NETPDU packet length that the LLC layer allows the upper layer to send in one time slot.
Comment: LLC_Max_Packet_Length=MAC_Max_Packet_Length−LLC_Header_Length
LLC_Message_Timeout
Description: Specifies a time limit for the transmission/reception of a fragmented message.
LLC_Nb_of_Broadcast_Transmissions
Description: The number of times a broadcast is sent.
LLC_Tx_Retry_Exp_Offset
Description: This parameter controls the initial slope of the exponential backoff law for repetition.
LLC_Tx_Retry_Exp_Range
Description: This is used to compute the repetition number from which the binary exponential backoff law is truncated.
LLC_Tx_Retry_Exp_Start
Description: The repetition number from which the binary exponential backoff law is applied for transmission retry randomization window computation.
Comment: This value must be smaller than the maximum number of transmissions for uplink and downlink packets for the exponential backoff to be used.
Comment: This value must be smaller than (LLC_Max_Nb_of_Transmissions−LLC_Tx_Retry_Exp_Start) for the truncation to take place.

Each monocast message sent by the LLC layer should be acknowledged at the MAC layer level. It will happen very often than the MAC layer will report that it didn't receive this acknowledgement. This can occur if the destination endpoint fails to receive the message or if the sender fails to receive the acknowledgement, due to collisions, interference or fading. In any case of failure, the LLC layer will send the message again until it is acknowledged or until the maximum number of attempts is reached. After LLC_Max_Nb_of_Downlink_Transmissions, or LLC_Max_Nb_of_Uplink_Transmissions, unsuccessful transmissions, the LLC layer reports a No-ACK failure status to the NET layer.

For broadcast data or ITP, the LLC will automatically repeat the message using the backoff algorithm once the MAC layer has notified that the former sending is gone and this until the specified number of attempts, Number_of_Broadcast_Transmissions, is reached.

When the LLC layer receives from the NET layer a request to send a packet, or when it reschedules a non-acknowledged transmission, it will introduce a random delay before actually sending the request to the MAC layer. The purpose of this delay is to avoid flooding the air interface with a large number of packets when the conditions of transmission are difficult. The LLC layer will compute the length of a randomization window, Tx_Wait, and will send the actual request to the MAC layer after a random delay with a uniform probability distribution between zero and Tx_Wait. The value of Tx_Wait is computed as a function of the repetition number. Tx_Wait is computed according to a truncated binary exponential backoff law as given by the following equation:

$$\text{Tx\_Wait} = \begin{cases} 0 & \text{if } R \leq R_{start} \\ 2^{R-R_{start}-1} & \text{if } R_{start} < R < R_{start} + R_{range} \\ 2^{R_{range}} - 1 & \text{if } R \geq R_{start} + R_{range} \end{cases}$$

Here R is the repetition number: it ranges from zero for the first transmission attempt to some maximal value given by (LLC_Max_Nb_of_Transmisions−1). The application of this exponential backoff law is delayed and truncated as can be seen from the above equation. This is also illustrated by present FIG. 50, which graphically represents delayed truncated binary exponential backoff for transmission retries if packets are not acknowledged. The rationale behind this is simple and can be explained in the following way. In the "no wait time" period, the transmitter is trying different channels to avoid interference or difficult propagation conditions. In the "binary exponential backoff" period, the transmitter is progressively increasing the wait time to allow the network to recover from unusually difficult conditions (whatever they are). The "truncated exponential backoff" is necessary to avoid introducing unrealistically long wait times in the system.

The beginning and end of the binary exponential backoff law are given by two LLC layer parameters:

$R_{start}$@LLC_Tx_Retry_Exp_Start $R_{range}$@LLC_Tx_Retry_Exp_Range

An additional parameter introduces an offset in the application of the exponential law and gives a way to control the initial slope:

$R_{offset}$@LLC_Tx_Retry_Exp_Offset

The following example illustrates the retransmission randomization window algorithm for Rstart=5, Rrange=5, Roffset=2, LLC_Max_Nb_of_Transmissions=15, and TS_Length=1. The first column (R=0) corresponds to the initial transmission attempt.

| | | | | | R | | | | | | | | | |
|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 |
| Tx_Wait 0 | 0 | 0 | 0 | 0 | 0 | 4 | 12 | 28 | 60 | 124 | 124 | 124 | 124 | 124 |

If a packet is negatively acknowledged (NACK), the "no wait time" phase of the retransmission strategy should be bypassed because in this case we know that what happened is not due to a propagation problem or interference (see appendix). For similar reasons, in the special case of broadcast transmission, the non delayed exponential backoff should be used. Broadcasts generate a burst of traffic and internal collisions between nodes of the network are likely to occur and slow down the broadcast. The immediate use of an exponential backoff can mitigate this problem. See also present FIG. 51, which graphically represents truncated binary exponential backoff for transmission retries if packets are negatively acknowledged. In all these cases the repetition law is given by:

$$\text{Tx\_Wait} = \text{TS\_Length} \times \begin{cases} 2^{R_{offset}}(2^R - 1) & \text{if } R < R_{range} \\ 2^{R_{offset}}(2^{R_{range}} - 1) & \text{if } R \geq R_{range} \end{cases}$$

If a packet is not acknowledged and later negatively acknowledged on a subsequent transmission attempt, the retry law for negatively acknowledged packets should be applied. In the same way, if a packet is negatively acknowledged and later a retry is not acknowledged, the retry law for negatively acknowledged packets should be kept.

The LLC layer offers a non-duplication service. Because RF media generate a large number of collisions, the LLC layer can send a message more than once, and also receive the same packet several times. To avoid forwarding the received message to the NET layer several times, each transmitted packet has a LLC number, LLC FID. See present FIG. 52, for an example of an LLC Duplication Table. Due to this number, the LLC layer knows whether the packet has already been received. Should this happen, the packet is discarded.

At each new reception, the message number, the packet number and the sender address are saved in a FIFO, which contains properties of the LLC_Duplication_Table_Size last messages. So the oldest entry is replaced by the new one if not already present in the table. If a duplicated message is received, the existing associated entry in the table needs to be removed and rewritten as a new entry. This will ensure that this entry remains longer in the table.

It should be noted that at the reception of a message, the detection of duplicated packets should be done before the operation of reconstitution of a fragmented message.

If the node loses synchronization, switches to another cell, or experiences a power outage (it could be done at power up), the duplication table should be cleared.

Another service offered by the LLC layer is the fragmentation of messages. The LLC layer offers the upper layer to send messages of length up to LLC_Max_Message_Length bytes, a size that can be longer than the one offered by the MAC layer, which is limited by the time slot length. LLC_Max_Message_Length is limited by the physical size of the device memory that runs the protocol and by the fact the LLC layer cannot handle more than 15 packets.

If the NET layer asks to send a message larger than what the MAC layer can send, the LLC layer splits the message into several shorter packets. The packet number and the number of packets are mentioned in the LLC header to enable the reconstitution of the entire message at reception.

Each packet corresponds to an individual request sent to the MAC layer. The MAC layer treats these packets as regular complete messages.

The LLC layer computes the required number of packets depending on the message length and the maximum size the MAC layer can handle.

From a transmitter side perspective, the LLC layer splits the message into packets. A MAC request is associated with each packet. When the first packet is sent, a timeout counter of LLC_Message_Timeout length is started. Each packet can be sent several times, with the same repetition limitation as for a standard packet, until the packet is acknowledged by the MAC layer. When all the packets have been acknowledged, the LLC layer confirms to the NET layer that the message has been sent with success. If one packet has not been sent correctly or if the counter reaches LLC_Message_Timeout, the LLC layer informs the NET layer that the transmission has failed.

From the receiver side perspective, the receiver LLC layer when it receives the first packet of a fragmented message, starts the same counter of LLC_Message_Timeout length as that of the transmitter side. When all the packets have been received, the LLC layer regenerates the entire message and gives it to the NET layer. If the counter reaches LLC_Message_Timeout value and at least one packet is still missing, all the other packets are deleted.

LLC_Message_Timeout value should be long enough to let the MAC layer send correctly all the packets. The value can depend on the number of packet to send.

The present protocol subject matter offers a kind of broadcast service, or more specifically, a multicast one. The function is that the same message can be sent to all the endpoints of a cell. This is a true broadcast, which is not acknowledged but simply transmitted Number_of_Broacast_Transmissions times by each endpoint. It is intended to any endpoint hearing it (except the Cell Master, where the broadcasts originate).

The LLC header is 3 bytes long, as represented by present FIG. 53, which otherwise represents the full LLC Frame. Within such representation, the following additional frame information is applicable, as will be understood by one of ordinary skill in the art without further detailed explanation.

LV, Layer Version:
The layer version number
RSD, Reserved:
Not initially used. Set to 0.
FID, Frame ID:
This byte indicates the message number to avoid duplication of a packet.
NOP, Number Of Packets:
These 4 bits give the number of packets that have to be transmitted to rebuild the data. It implies that the protocol can split messages in a maximum of 15 packets.
PN, Packet Number:
These 4 bits give the packet number of the fragmented data. Zero corresponds to the first packet.

Additionally, the NET Protocol Data Unit (NETPDU) contains information relative to the network layer.

Figure 54:
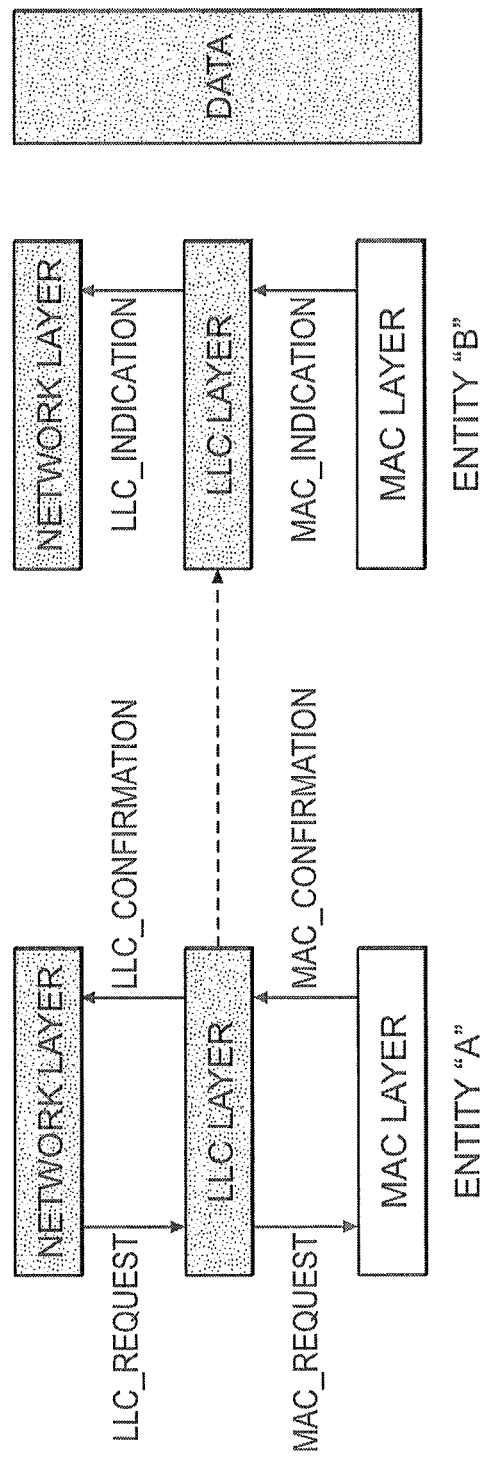
FIG. 54 depicts LLC LAYER SERVICES subject matter.

The LLC Layer has a variety of interfaces and associated services (functionality), as represented in detail per present FIG. 54. The LLC layer ensures reliable functionality, not only of itself but in the services it provides for those in relationship with it, such as resulting in the LLC layer managing repetition and fragmentation of messages. For example, depending on (non-) acknowledgements, the LLC layer chooses if the packet has to be retransmitted or not.

With an objective to send a message to one destination, LLC_Request_Send_Mono_Data, there is use of requisite input arguments: NETPDU, and Destination Address. The operation may be described as the NET layer requests the LLC layer to send a message to one of its neighbors. The LLC layer fragments the message into several packets if needed before giving it to the MAC layer. The LLC layer also tries to send the message several times before reporting a success or an error to the NET layer.

With an objective to send a message to the neighborhood, LLC_Request_Send_Broadcast, there is use of requisite input arguments NETPDU. The operation may be described as the NET layer requests the LLC layer to send a message to all the endpoint's neighbors. The LLC layer fragments the message into several packets if needed before giving it to the MAC layer. The broadcast is repeated Number_of_Broacast_Transmissions times.

With an objective to send an RITP timestamp to the neighborhood, LLC_Request_Send_ITP, there is no use of input arguments. The operation may be described as the NET layer requests the LLC layer to send an ITP message to all the endpoint's neighbors. This request follows the same approach as a LLC_Request_Send_Broadcast, except that there is neither NETPDU, nor LPDU. The LLC forwards the request to the MAC layer, which is in charge of time stamping the message. The LLC layer manages the repetition of this message as a regular broadcast.

With an objective to measure the medium interference level on a specified channel and its time auto-correlation function, LLC_Request_Environment_Analysis_Auto-Correlation, there is use of requisite input arguments: Channel number, Number of samples. The operation may be described as a request being forwarded directly to the MAC layer.

With an objective to measure the medium interference level on three specified channels and its probability density function, LLC_Request_Environment_Analysis_PDF, there is use of requisite input arguments: Channel numbers (3), Max value of counter. The operation may be described as being a request forwarded directly to the MAC layer.

With an objective to give to the MAC layer the information whether a cell is authorized or not, LLC_Request_Cell_Authorization, there is use of requisite input arguments: Cell Address, Cell Status. The operation may be described as a request being forwarded directly to the MAC layer.

With an objective to give to the MAC layer the information whether the NET layer is registered, LLC_Request_Cell_Registration, there is use of requisite input arguments: Cell Address, Registration Status. The operation may be described as a request being forwarded directly to the MAC layer.

With an objective to answer an LLC_Request_Send_Mono_Data, LLC_Confirmation_Send_Mono_Data, there is use of requisite output arguments: ACK, NACK, No ACK, Destination Address of the sent packet. The operation may be described as it confirms to the NET layer whether the message has been successfully sent to destination or not. If not and if at least a NACK has been received, it should be notified to the NET Layer. The NET layer is then able to choose whether it has to transmit the packet to another destination. Upon receiving a failure confirmation for an uplink message, the NET layer will update its routing probabilities and send a new request to the LLC.

With an objective to answer an LLC_Request_Send_Broadcast and LLC_Request_Send_ITP, LLC_Confirmation_Send_Broadcast and LLC_Confirmation_Send_ITP, there is use of requisite output arguments: OK. The operation may be described as confirms to the NET layer that the broadcast has been sent.

With an objective to answer an LLC_Request_Environment_Analysis_Auto-Correlation, LLC_Confirmation_Environment_Analysis_Auto-Correlation, there is use of requisite output arguments: average RSSI, RSSI auto-correlation function values. The operation may be described as a forward of MAC_Confirmation_Environment_Analysis_Auto-Correlation from the MAC layer to the NET layer.

With an objective to answer an LLC_Request_Environment_Analysis_PDF, LLC_Confirmation_Environment_Analysis_PDF, there is use of requisite output arguments RSSI PDF values for the three requested channels (3×24 values). The operation may be described as a forward of a MAC_Confirmation_Environment_Analysis_PDF from the MAC layer to the NET layer.

With an objective to answer an LLC_Request_Cell_Authorization, LLC_Confirmation_Cell_Authorization, there is the use of requisite output arguments: Status. The operation may be described as a forward of MAC_Confirmation_Cell_Authorization from the MAC layer to the NET layer.

With an objective to answer an LLC_Request_Cell_Registration, LLC_Confirmation_Cell_Registration, there is use of requisite output arguments: Status. The operation may be described as a forward of MAC_Confirmation_Cell_Registration from the MAC layer to the NET layer.

With an objective to forward a received NETPDU message to the NET layer, LLC_Indication_Received, there is use of requisite output arguments: NETPDU, Sender Address. The operation may be described as after assembling all the packets if the message was fragmented, the LLC layer gives the received NETPDU to the NET layer.

With an objective to inform that a broadcast ITP message has been received, LLC_Indication_ITP_Received, there is no use of any output arguments. The operation may be described as a direct forward of the MAC_Indication_ITP_Received from the MAC layer to the NET layer.

With an objective to update the ITP of the API layer, LLC_Indication_ITP_Update, there is use of the requisite output arguments: Absolute ITP Timestamp. The operation may be described as a direct forward of the MAC_Indication_ITP_Update from the MAC layer to the NET layer. This indication has priority over all other indications.

With an objective to indicate to the above layer the MAC state, LLC_Indication_State, there is the use of requisite output arguments: State, Cell address. The operation may be described as the LLC layer gets this indication directly from the MAC_Indication_State.

With an objective to indicate to the above layer that the MAC layer will soon leave the current cell, LLC_Indication_Cell_Leaving_process, there is no use of any output arguments. The operation may be described as a direct forward of the MAC_Indication_Cell_Leaving_process from the MAC layer to the NET layer. Before forwarding, the LLC layer frees its buffers and pending actions.

With an objective to inform that a power outage notification has been received, LLC_Indication_Outage_Received, there is the use of requisite output arguments: Outage ID, Sender Address, Outage Time. The operation may be described as a direct forward of the MAC_Indication_Outage_Received from the MAC layer to the NET layer.

The following relates more particularly to the network (NET) layer. The network layer is the third layer of the OSI model and the highest layer of the Linknet protocol. It is the heart of the routing mechanism. All endpoints have the same network layer except the Cell Master, which has extended routing functions. The NET layer main task is to decide what the destination of messages is, but it is also in charge of the cell registration process, which is internal to the RF LAN.

Per the EP (End Point) NET layer feature, the NET layer forwards any message to the next hop. It also provides data on its neighborhood to the cell relay. Per the CR (Cell Relay or Cell Master) NET layer, the Net layer offers to send a message to a particular EP (downlink message) in the cell or to the entire cell (broadcast message). The CR NET layer doesn't offer to send a message to a specific set of EPs in the cell. Also, the network layer is active only while the endpoint is synchronized, and it will let the application layer use the network only if it is registered at the NET level.

NET Parameters may be listed as follows, including their respective identifications, descriptions, and default values:
NET_Broadcast_Life_Expectancy:
Description: the maximum lifetime of a broadcast in a cell, in number of hyperframes.
NET_CR_Downlink_Duplication_Table_Size:
Description: The number of NET Downlink message entries saved in the Cell Master memory to avoid duplicate downlink messages when received several Broken Link messages from the same Downlink.
NET_CR_Duplication_Table_Size:
Description: The number of NET message entries saved in the Cell Master memory to avoid duplicate messages when the same packet is received several times.
NET_Downlink_Life_Expectancy.
Description: the maximum lifetime of a downlink in a cell, in number of hyperframes.
NET_Endpoint_TimeOut:
Description: The time after which an endpoint should be removed from the Cell Master routing table if no message has been received from it.
NET_EP_Duplication_Table_Size:
Description: The number of NET message entries saved in the endpoint memory to avoid duplicate messages when the same packet is received several times.

NET_Max_Registration_Attempts:
Description: The maximum number of attempts of Cell Registration Request an endpoint should send to a given cell before declaring this cell as forbidden.
NET_Max_Nb_of_EPs:
Description: The maximum number of endpoints by cell. This is useful for the Cell Master NET layer, which can decide to authorize or not a new endpoint in its cell. It is also the size of the Cell Master routing table.
NET_Nb_of_Fathers_Routing:
Description: When routing a message to the Cell Master, the NET layer will chose a father among a subset made up of the best fathers for routing. The size of this subset is NET_Nb_of_Fathers_Routing.
NET_Nb_of_Endpoints_Neighbor_List:
Description: It corresponds to the maximum number of endpoints present in a Neighbor List.
NET_Neighbor_List_First_Time:
Description: The time after which an endpoint should send its first Neighbor List to the Cell Master when it becomes synchronized with a cell, in a warm start case.
NET_Neighbor_List_Max_Period:
Description: The maximum period between two transmissions of the Neighbor List to the Cell Master, if this list didn't change.
NET_Neighbor_List_Min_Period:
Description: The minimum period between two transmissions of the Neighbor List to the Cell Master, if this list changed.
NET_Reg_Send_Config_Period:
Description: The rate at which the Cell Master should try to send the Registration Confirmations that are pending. It can be slower if the downlink buffer is full but it should not be faster.
NET_Registration_Retry:
Description: The period during which an endpoint is waiting for the Registration Confirmation to its first request. After the first request this time is multiplied by the number of request tries to get the wait period.
NET_Registration_Send_Max:
Description: this parameter defines the upper limit of the NET randomization window in which the Registration Request should be sent.
NET_Registration_Send_Min:
Description: this parameter defines the lower limit of the NET randomization window in which the Registration Request should be sent.
NET_Uplink_Life_Expectancy.
Description: the maximum lifetime of an uplink in a cell, in number of hyperframes.

With respect to the so-called Neighbor table, the network layer uses the Neighbor table of the MAC layer, with reading rights. That means that the network layer can't modify values in such table. Present FIG. 55 depicts NET LAYER PARAMETER DEFAULT VALUES subject matter.

Before authorizing upper layers to use the network, an endpoint should be registered at a NET layer level. NET registration process starts as soon as the endpoint gets its synchronization from the MAC layer. There are two ways to proceed whether the endpoint was previously registered with the cell, which leads to a warm start process, or if it is joining a new cell, which leads to a cold start process.

The behavior during this cell registration process can also be viewed from two sides, the endpoint or the Cell Master.

In the Cold Start scenario, the following events that must happen before the API layer can access the Network:

The MAC layer gets synchronization with one of its potential SYNC fathers and enters in a new cell.

The NET layer is informed of the synchronization status and sends, randomly between NET_Registration_Send_Min and NET_Registration_Send_Max, a Cell Registration request to the Cell Master.

Then the endpoint is waiting for the answer:
1. If there is no answer. There is a retry mechanism every (number of retries*NET_Registration_Retry). There is a maximum of NET_Max_Registration_Attempts registration attempts with this cell before giving up; after that the cell is declared as forbidden and the MAC layer should look for another cell (it is reminded that after MAC_Unsynchronized_Timeout days in discovery mode, the MAC layer will re-authorize all the cells).
   So with NET_Registration_Send_Min=5 min, NET_Registration_Send_Max=10 min, NET_Registration_Retry=1 hour, and NET_Max_Registration_Attempts=5, the requests will be done within the following windows:
   $1^{st}$ try: 5-10 min, $2^{nd}$: 65-70 min, $3^{rd}$: 185-190 min, $4^{th}$: 365-370 min, $5^{th}$: 605-610 min.
   The timeout corresponds to the window start of the next try (or to NET_Max_Registration_Attempts* NET_Registration_Retry for the last try; 15 hours)
2. If a NET Cell Out notification is received, the cell is immediately marked as forbidden and the MAC layer will looked for another cell.
3. If a NET Cell Registration confirmation is received, the endpoint switches to NET Registered state.

Once the endpoint is NET Registered:
1. The NET informs the MAC layer that will now set its RS bit to 1 in its header, which means that this endpoint can now be used as a SYNC father for its neighbors.
2. The NET informs the API layer that it is now authorized to send messages through the network.
3. The NET layer starts sending periodically neighbor lists (the Cell Registration request is considered as one, so the first real neighbor list is sent after one defined period; i.e. NET_Neighbor_List_Min_Period hour if no change occurred).

Several particular items of note are:
At any moment, if an endpoint receives a NET Cell Out notification, it should leave the cell
While the endpoint is not registered, it cannot be used as SYNC father, as it doesn't meet potential SYNC father condition (RS=0)
During the Registration confirmation waiting time, no neighbor list is sent.
As the API layer is not authorized to talk while the endpoint is not yet registered, the uplink with neighbor list packet type is never used. However, this packet definition is still defined in the spec., as it may be used one day.

In the Warm Start condition circumstances, it is much simpler and faster:
The MAC layer gets synchronization with one of its potential SYNC fathers and recovers the cell in which it was previously registered.
The NET layer directly goes in registered state and informs the MAC and API layers.
The NET layer starts sending periodically neighbor lists. Since no cell registration request, which contains neighbor list information, was sent, the first Neighbor List is sent Neighbor_List_First_Time minutes after.

When a Cell Master receives a Cell Registration requests it should send a Cell Registration confirmation and update its routing table with the new information (add the endpoint if it is not already there) unless the routing table is full, in which case it should send a Cell Out Notification. For more detail on the actions of a Cell Master when receiving a packet, see the remaining disclosure herewith.

During a cold start, the Cell Master is receiving a lot of Cell Registration Requests in a narrow time window. It has therefore not enough time to send all the Registration confirmation at the same rate it receives requests. As a consequence, the Cell Master should keep track of the requests it receives and then sends the confirmation when it has time to do it. During a cell cold start, the number of "pending registrations" can be very high (around half of cell size).

The pending registration list can be handled by setting a flag in the routing table the corresponding endpoints (1 bit*max cell size=1 kb=125 B) and periodically sweep the table to know which endpoints needs a registration confirmation.

The pending registration could also be done as a list of addresses to send confirmation to; this is a tradeoff between memory space and code execution time and the choice is let to the implementation.

In both cases, when there are many stacked confirmations, they should be sent at a maximum rate of NET_Reg_Config_Send_Period. It is to ensure that we are not ourselves flooding the network with downlink messages.

When an endpoint switches cell, it will register in the new cell. The issue is that it is still registered in the old cell; this is not an issue for routing since the API level will realize that the endpoint moved cell but this can be an issue for cell size management. Effectively the cell size indicator (CSI) used in the cell switching process is based on the number of endpoint in the NET routing table of the Cell Master and if this number does not reflect the reality then the switching process does no longer work properly. This is why it is important that the old Cell Master be informed of the departure of endpoints from its cell. This is the role of the Cell Leaving Notification message.

As soon as the MAC layer notifies that a neighbor from a better cell is reachable, it plans a SYNC request and waits for the SYNC ACK. The SYNC ACK received, the MAC layer triggers some actions at each layer:
MAC:
Save timing information relative to the new cell and neighbor.
Start a Cell Switching timer of MAC_CELL_Leaving_Process_Duration seconds.
LLC:
Free Buffers and pending actions
NET:
Free Buffers and pending actions
Send a Cell Leaving Notification to the current Cell Master. This message will allow the cell master to remove the Endpoint from its routing table and update the cell size.
During MAC_CELL_Leaving_Process_Duration seconds, the endpoint acts as usual except it cannot decide to start the same process with a third cell. It is implied that during this period the endpoint will have enough time to send the Net message AND also to forward the same kind of information from sons which decide themselves to change cell (they probably see the same new cell at the same time).

When the timer expires, whatever the status of remaining messages to send, the MAC layer resynchronizes its clock and switches to the new cell. LLC and NET layer are notified by this switching. Therefore, they free again their buffers, pending actions . . . . The NET layer (and the API) is then able to register with the new Cell Master.

The entire routing algorithm is based on the fact that every endpoint in the cell knows its 1-hop neighborhood and knows nothing beyond that 1-hop range. The situation is slightly different for the Cell Master and will be explained in a dedicated section.

The protocol features two different routing directions, uplink and downlink. Uplink is used by a meter to send a message to the Cell Master and downlink is used to convey a message from the Cell Master to a meter. These two routing directions use different mechanisms as explained below.

Another routing mechanism is the broadcast, used to convey a message to every endpoint of the cell.

Each packet that is going through the NET layer contains a timestamp of when it was generated. Each time a packet is routed at the NET layer level, the lifetime of the packet is checked against its life expectancy and it is deleted if is too old.

More particularly, to perform an uplink communication, the endpoint has to send its message to the Cell Master. The endpoint does not know where its Cell Master is but it knows that its fathers can reach it. Therefore, it has to send the uplink message to one of its fathers. The protocol should limit its choice to the NET_Nb_of_Fathers_Routing best fathers, based on the SYNC_Merit. It should randomly select one of these fathers with a probability for each father inversely proportional to its SYNC_Merit, and then send the uplink message to that father. Every synchronized and registered father of the cell is suitable for uplink routing.

If the LLC reports a failed transmission (after all the retries), the NET layer will look again in the neighbor table (which is now updated according to the results of the previous transmission attempts) and reselect a random father among the NET_Nb_of_Fathers_Routing best ones, using the same probabilistic selection algorithm as in the first instance. The uplink message is then forwarded to the LLC layer for transmission to the newly selected father. This process continues until the LLC reports a successful transmission or until the endpoint goes to power fail, becomes unsynchronized or switches to a new cell.

When the selected father receives this uplink message, it will proceed in a similar fashion. This process is repeated until the best father is the Cell Master.

Before an Uplink packet is routed to one of the endpoint's fathers, the NET layer check that it is not older than NET_Uplink_Life_Expectancy. If it is older then it is deleted.

In contrast, for a downlink path, that is, sending a message from the Cell Master to a specific endpoint, is a very easy thing as far as endpoints are concerned. Indeed the entire path is indicated in the network header. This path is specified by the Cell Master, which has a complete knowledge of all the endpoints in the cell.

When an endpoint receives a downlink message, it reads its network header and automatically finds the next destination to contact. This is repeated until the final destination is reached. Before forwarding the message to the next node, the endpoint removes its own address in the routing path of the NET header. The endpoint should forward the message to next address in the header, even if this address doesn't match any node in its own neighbor table.

Before a downlink packet is forwarded to the next hop, the NET layer check that it is not older than NET_Downlink_Life_Expectancy. If it is older then it is deleted.

If, for any reason, the next node cannot be reached (after the LLC layer retries), the message has to be sent back to the Cell Master by the uplink path. This message is called a Broken Link message. A Broken Link message is made of:
The original downlink message
The intended final destination address
The NET frame ID of the downlink message
A new NET frame ID for the Broken Link
The Addresses of the missing link.

It will be the task of the Cell Master to find another path, by taking into account network changes that occurred in the mid-time. The Cell Master will then re-send the downlink message if a path to the destination is still available.

There is no acknowledgement at network layer level. If the user of the protocol wants to be sure that its downlink message has reached the final destination, it has to request it in the application layer.

As noted later the Cell Registration Confirmation and the Cell Out Notification are special cases of downlink packets which do not generate a broken link.

A broadcast message is only initiated at the Cell Master level. All the endpoints connected to the cell should receive the broadcast message. In order to simplify this heavy operation in a large cell, the protocol does not guarantee that the message will be delivered to 100% of endpoints and does not provide for an acknowledgement at the network layer level. Upper layers should manage repetition of the message to those that haven't received it. This can be done by addressing the message to each remaining endpoint by a common downlink path. The network layer doesn't either inform upper layers of which endpoints haven't been reached (if it was the case, the network layer would proceed to the repetition itself).

The broadcast technique is based on the fact that each endpoint repeats the broadcast message Number_of_Broadcast_Transmissions number of times and each endpoint can receive the broadcast from any other endpoint. For one broadcast message sent by the Cell Master, an endpoint will receive as many replicas as it has neighbors; this mechanism allows a good coverage of the cell. Note that the Cell Master should never accept a broadcast message, as it always generate them.

A filter mechanism is implemented at the network layer level to send only once the broadcast message to the application layer and also to forward it once. A broadcast message number (NET FID) is contained in the NET header to remove messages that have already been received (same mechanism as in the LLC layer). With this duplication detection the broadcast will not be repeated infinitely in the cell.

The duplication detection will work as long as there are less broadcasts being forwarded in the cell than there are spaces in the table of duplication detection. This should normally be the case if the network is used properly. As a failsafe, a timeout mechanism has been added. At initialization of the broadcast, the Cell Master accesses the current Hyperframe Number (HFN) and inserts it into the NET header. When an endpoint in the cell receives this broadcast it should always accept it (after checking if it is not a duplication), but only retransmit it if the broadcast is not too old by comparing the HFN contained into the header and the current HFN. The maximum lifetime of a broadcast in the cell is NET_Broadcast_Life_Expectancy.

The NET layer offers a non-duplication service for:
Uplink path
Uplink (with or without Neighbor List)
Neighbor List
Broken Link
Outage Notification
Broadcast Broadcast and Outage Notifications can be relayed using several paths in the network. This redundancy contributes to a better quality of message delivery. But it can also increase drastically the amount of traffic. For other messages using uplink routing mechanism, duplication also happens but less often. Notice that the downlink path is not concerned here as it cannot be duplicated. Using this duplication detection feature with Downlink messages will even degrade performances of the service.

To avoid forwarding the received message several times to the API layer or to the next endpoint, each transmitted message has a NET identification number, NET FID or NET OID. Due to this number, the NET layer knows whether the packet has already been received. Should this happen, the packet is discarded.

Figures 56, 57A:
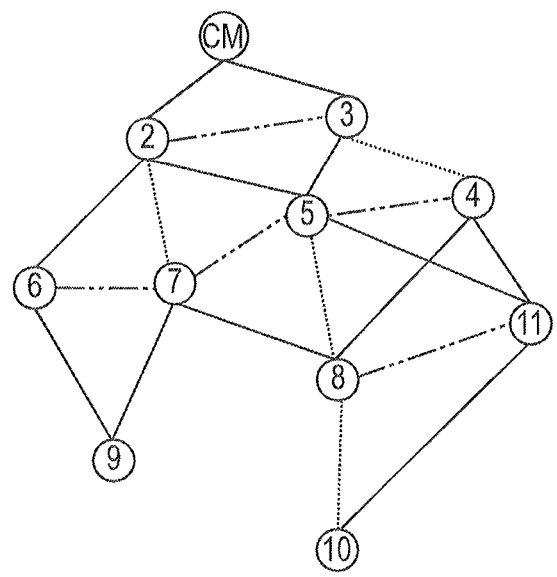
FIG. 56 depicts NET DUPLICATION TABLE subject matter.
FIG. 57A depicts Topology subject matter for a Downlink routing example.

At each reception of a message, the message number (NET FID or OID) and the sender address are written in a dedicated table called the NET duplication table (see, for example, present FIG. 56). This table contains the properties of the NET_EP_Duplication_Table_Size last messages and is managed as a FIFO buffer. If the table is full when a new message comes in, the oldest entry of the table is thrown out as the new one is entered into the table. If the new entry is identical to another entry in the table, this indicates that a duplicate message has been received. In this case the oldest copy is removed from the table as the new one is entered into the table. In this way the information will remain longer in the table.

The Cell Master duplication table size can be extended to NET_CR_Duplication_Table_Size. It will ensure a better filtering before forwarding messages to the API layer, mainly useful for Outage Notifications that can be very numerous in a short period of time. For a Broadcast (coming from the Cell Master), the sender address field should be set to zero. For an Outage Notification, the sender address should correspond to the original sender address specified in the ORG field. In the particular case of a Broken Link, the sender address is specified in the BRKS field. If the node loses synchronization, switches to another cell or experiences a power outage (it could be done at power up), the duplication table should be cleared.

With reference to a Neighbor list, if the knowledge of the 1-hop neighborhood is enough for an endpoint, it is not the case for the Cell Master. This one has to know the content of the cell to compute downlink paths. Therefore, all the endpoints should send regularly their NET Neighbor List using an uplink message.

The Neighbor List is generated from the NET neighbor table. It consists of the NET_Nb_of_Endpoints_Neighbor_List best fathers, i.e. fathers with lowest SYNC_Merit, represented by their MAC addresses. Endpoint addresses are sorted, the best one appears first in the list. This information is enough for the Cell Master to route packets to any specific endpoint.

As an option, if the number of fathers present in the neighbor table is inferior to NET_Nb_of_Endpoints_Neighbor_List, the Neighbor List can be completed with the best brothers (if they are valid for routing packets). However the downlink path algorithm should be clever enough to detect circular path.

Only synchronized and registered neighbors of the cell can be members of the Neighbor List.

The first Neighbor List is sent NET_Neighbor_List_First_Time after the endpoint becomes synchronized to a cell for a warm start, and NET_Neighbor_List_Min_Period for a cold start.

Neighbor Lists should be updated every time an endpoint is removed from the list or a new endpoint is added to the list. Neighbor Lists are then sent at a period of NET_Neighbor_List_Min_Period if a change occurred in the previous period. If an endpoints changes level this should raise a flag that will trigger the transmission of a Neighbor List at the end of the current period. If an endpoint undergoes a cell switch, then it should be in cold start in its new cell and should apply the corresponding process of registration.

If such a change doesn't occur, Neighbor Lists are sent with a period of NET_Neighbor_List_Max_Period.

A randomization time of ±20% should be added to these periods and times to avoid repetitive collisions.

The Cell Master is the only endpoint that can initialize a Broadcast message and in the same way the only one that can't receive one. It should indicate in the NET header the current hyperframe number (HFN) at the creation time.

Part of the advantageous features of the present protocol subject matter relate to a downlink routing mechanism. In particular, the downlink communication represents a transmission from the head of the network to a single node in the mesh network. However, the point is to find a node that could be everywhere but which one must be able to access it in the shortest time.

The following more particularly addresses cell relay functionality in relation to a routing table. To perform a downlink communication, the Cell Master (or relay) needs to have received first a minimal number of Neighbor Lists in order to compute the best path to reach the destination.

As every endpoint in the cell is supposed to have sent information of their best fathers, the Cell Master has the knowledge to reach any endpoint in the cell. It just has to arrange the information it receives inside a routing table. This routing table is updated each time a new Neighbor List (or Broken Link message; see dedicated section) is received.

Because each endpoint knows its fathers, the Cell Master can construct all the possible paths between any endpoint and itself (it is in fact limited by the number of fathers in the Neighbor List but this provides enough possible paths without overloading the Cell Master with too much data to collect and process). The fathers in the Neighbor lists are provided in order starting from the best one. The best path can be determined by choosing the first father in the list starting from the final destination up to the Cell Master.

The table will permanently move, therefore the algorithm needs to check that each hop of the creation, the path does not go through the same node. It could else lead to infinite loop or circular path. If the path reached such case, the algorithm should go reversely in the path and tries with the alternative fathers. If no path is found, the NET layer destroys the packet and reports a failure to the API layer. If there is an issue due to a broken link or circular path, this technique does not guarantee that the new path found will be the second best but it ensures that it will find a path if there is one.

Each time the Cell Master receives an updated Neighbor List, it will use it to update its routing table. It should be noticed that the Cell Master does only need to replace the corresponding entry in the table without re-computing anything.

When the Cell Master needs to send a downlink message to an endpoint, it selects the best path and mentions all the steps (node addresses) of the path in the network header. Then it sends the message to the first endpoint of the path, and this one will forward it to the second, and so on, until the final destination is reached. Every node present in the routing table can be selected for routing.

Finally if no message from an endpoint has been received for NET_Endpoint_TimeOut, the endpoint should be deleted from the table as well as the paths through it. The API layer can also request from the NET layer to remove a specified node from the table.

Present FIG. 57A is an example of a downlink path computation to reach endpoint 10. The 3 best fathers are mentioned in the Neighbor Lists. Some endpoint that doesn't have 3 fathers put their brothers as alternative paths. Each endpoint's neighbors are here sorted by their SYNC_Merit. The generated path is: 10←8←7←2←CM.

A downlink message follows the path indicated by the Cell Master, but due to the possible delay between the routing table update and this downlink packet, the network configuration can have and some endpoints may not be reachable anymore (power failure, cell switching, obstacles . . . ). When the LLC layer reports a failure to transmit the message to the next destination, the network layer should send back to the Cell Master a Broken Link. If, due to hardware limitation, there is no space into the memory to allocate the broken link in the up-going message buffer, this one should be destroyed.

When the Broken Link arrives at the Cell Master, this one should update its routing table by removing the link. The Downlink is then re-sent if a path still exists. This Broken Link mechanism does not apply to the Cell Registration confirmation or to the Cell Out Notification; for details see the cell size management section herein.

Present FIG. 57B is a CR Routing Table for a Downlink routing example. When the number of entries in the routing table changes bracket, the Cell Master updates its Cell Size Indicator according to the per present FIG. 57C and provides this information to the MAC layer. The MAC layer will indicate this information in its header and propagate it through the cell. When the cell is full, i.e. when the CSI takes its maximum value; no endpoint can request to join the cell.

When the routing table reaches NET_Max_Nb_of_EPs entries, the table and the cell are considered full. In this case every new Neighbor List that arrives at the Cell Master should be used to find a path to send a NET Cell Out Notification to this node, and then deleted. The node that receives this NET Cell Out Notification should acknowledge the packet at MAC layer and leave the cell after a couple of time slots (to make sure the acknowledgment was successfully received).

The NET Cell Out Notification is a particular case of a downlink message with no payload. It should be treated as a downlink message except that no Broken Link message should be sent if a link is broken on the path. This is justified by the fact that the Cell Master has destroyed all information relative to this endpoint and therefore will not be able to find an alternative path. Note that the NET Cell Out Notification can also be used by upper management software to suppress a selected endpoint in a cell. The NET Cell Registration Confirmation should not also trigger a broken link if the message fails to be delivered. The reason is that the Cell Registration process has its own retry mechanism which handles such failures. When the Cell Master receives a Cell Leaving Notification it should remove the corresponding endpoint from its routing table and update its Cell Size Indicator.

The table of present FIG. 57D summarizes actions in the Cell Master NET layer when the routing table is full or when a node is not in the routing table.

The following relates more particularly to outage notification transport and to the functional area of cell registration in accordance with present subject matter. As it is additionally explained in relation to the MAC layer section, an EP can hear, at MAC level, that a neighbor experiences a power outage. When this event occurs, the MAC layer indicates it to the Net layer, with the outage ID and the time when the message has been received as parameters. As a consequence, the Net layer should build a Net outage message, with all these parameters (Neighbor address, Outage ID, and Outage Time), and send it to the Cell relay as a normal uplink message. When the NET outage message reaches the Cell Relay, the message is given to the API layer.

When an endpoint is not NET registered, the API layer can't send any packet. The RFLAN should inform the API layer when the endpoint becomes registered or deregistered (this last case happens when the endpoint goes back to discovery phase or switches cell). Note that the Cell Master is always considered NET registered.

Once the Endpoint is NET registered, the API layer is authorized to communicate and it can start its own registration process.

When an endpoint switches to another cell, the NET and the API layers will need to register with this new cell. The NET layer informs first the API layer that it is no longer registered to a cell and cannot send packets. The process following is similar to the connection to a cell from the discovery phase.

The Linknet protocol will be implemented in an architecture that will have limited storage capacity. There is thus a non negligible probability that the allocated memory to save messages prior to be sent can be full. Each time the API layer asks to send a message, the NET layer confirms or refuses the request. It means that the NET layer can destroy the packet to send and report a failure to the API layer. The API layer should then be in charge of postponing its request and keep the packet into its own memory.

The Cell Master NET layer can also report a failure to the API layer if the path to the destination can't be computed or if the destination is not in the routing table.

With respect to the NET Frame, it should be understood that the network message is divided into two parts:
  The network header contains all the needed information to rout the network message from the source to the destination. It is divided in 2 parts, respective common and dynamic sections.
  The network body contains the message to transfer to the API layer.

Present FIG. 58 illustrates all the fields that can be present at NET level. The field and different message structures are otherwise described herein.

In the Common Section of the Network Header, there are the following aspects, with present FIG. 59 providing a Table which presents various facets regarding the NET Frame type information:
  LV, Layer Version:
  The version of the network layer
  FT, Frame Type:
  The network frame type
  In the Dynamic Section of the Network Header, there are the following aspects, some of which fields don't appear in every message (hence, the Dynamic nature of this Header Section). They are described here in general terms, with other details of various of the message types otherwise discussed herein.
  ORG, Original Sender:
  The address of the original sender of the message.
  FID, Frame ID:
  The network message number given by the original sender.
  PL, Path Length:
  The number of addresses in the Path field
  PATH:
  Addresses of the next destinations for the message.
  For a downlink, the entire path is mentioned. At each hop, the addressee removes its own address from the path.
  RSD, Reserved:
  Not used for the moment. This field should be set to 0.
  NBN, Number of Neighbors:
  Number of neighbors of the endpoint
  NA, Neighbor Address:
  Address of the neighbor relative to the mentioned properties.
  BRK S, BRoKen link Sender:
  The Sender Address of the Broken Link transmission BRK D, BRoKen link Destination:
The Destination Address of the Broken Link transmission
HFN, HyperFrame Number:
HFN field refers to the MAC hyperframe number when the Cell Master initializes the broadcast.
DW FD, Final Destination:
The final destination the non-received Downlink message was intended for. It concerns Broken Link message.
DW FID, DoWnlink Frame ID;
The NET frame ID of the non-received Downlink message. It concerns Broken Link message.
OID, Outage ID:
The Outage number of the endpoint which has experienced a power failure.
OT, Outage Time:
The time at which the endpoint experiences the power outage. It is an ITP format.

With further reference to the Frame Body, and related Application PDU (APIPDU), it contains information relative to the application layer. It is the final message the protocol delivers to application layer. It can be delivered to the destination endpoint or to the cell relay.

The following more particularly relates to NET messages. The NET header length for an uplink message is 8 bytes, as represented by present FIG. 60. The Trace packet is used for a debugging purpose. However, the NET header length for a downlink path is 5 bytes plus 4 bytes times the path length, as represented by present FIG. 61. This does not include the next destination which is passed in parameter to be placed in the MAC header. The ORG field is not included since all downlink messages originate in the cell relay. Additionally, per present FIG. 61, HOP-N is the address of the final destination of the downlink message, while HOP-1 is the address of the next destination of the downlink message.

When an endpoint wants to send its Neighbor List to the Cell Master, it inserts it at the location of the frame body. The Cell Registration Request uses the same format but with a different Frame Type. As represented by present FIG. 62, the Neighbor List or Cell Registration Request length at NET level is 21 bytes.

It is a combination of an uplink message and a Neighbor List message. As represented by present FIG. 63, the NET header length for an uplink with Neighbor List message is 21 bytes.

As represented by present FIG. 64, the broadcast NET header length is 4 bytes. HFN field refers to the MAC hyperframe number when the Cell Master initializes the broadcast.

When the Cell Master wants to reject one node from the cell, it sends a Cell Out Notification to this node. This message length is 5 bytes plus 4 bytes times the path length. As represented by present FIG. 65, the Cell registration Confirmation uses the same packet with a different frame type to confirm to a node that it is accepted in the Cell.

If during a downlink transmission an endpoint does not manage to forward the message to the next endpoint then a Broken Link is reported. The Broken Link message consists in the addresses of the 2 EPs defining the Broken Link and the original message (which was not stored in the Cell Master). This Broken Link message will be used by the Cell Master to update its routing table and compute a new best path. As represented by present FIG. 66, the NET header length of the Broken Link message is 18 bytes.

If an EP hears an outage message (at a MAC level) from an EP which experiences a power outage, it timestamps the outage notification with its local time using ITP format. It should then create a (NET) outage message and send it to the Cell Master in the same way as an uplink message. The OID is the same as in the original MAC outage message. And the OT field is the ITP timestamp of the reception of the (MAC) outage notification. As represented by present FIG. 67, the NET header length of the outage message is 11 bytes.

The Cell Leaving Notification is sent by an endpoint just before leaving a cell. This informs the Cell Master that this endpoint can be removed from the routing table and the CSI adjusted accordingly. As represented by present FIG. 67, the Cell Leaving Notification NET length is 8 bytes.

Figures 67, 68, 69:
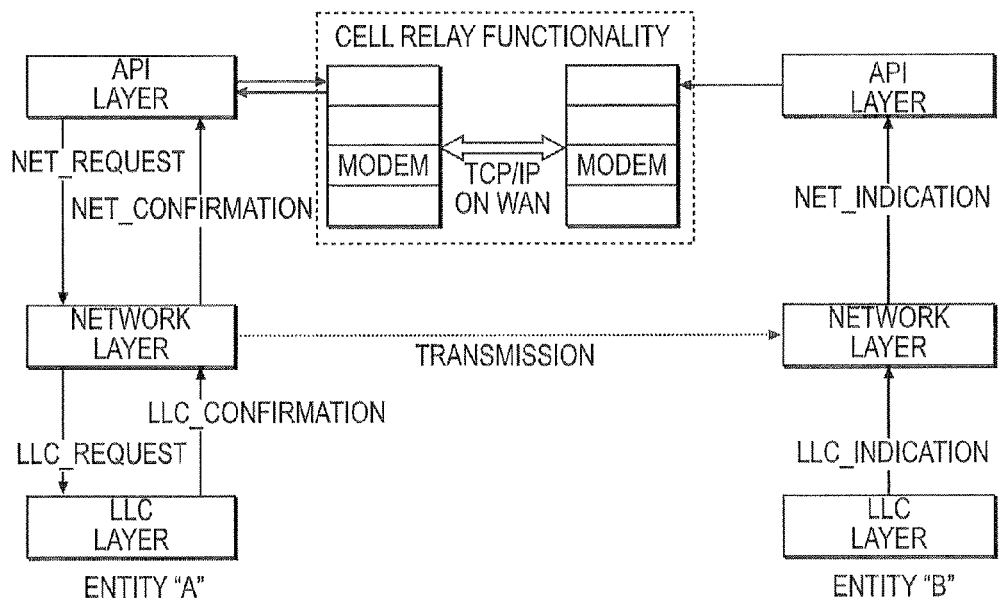
FIG. 67 depicts OUTAGE subject matter.
FIG. 68 depicts CELL LEAVING NOTIFICATION subject matter.
FIG. 69 depicts NETWORK LAYER SERVICES subject matter.

With reference to NET interfaces and services, it will be appreciated that the Network layer proposes a variety of different services, as illustrated in significant detail by the subject matter included in present FIG. 69. The network layer is in charge of routing. The network layer knows the 1-hop neighborhood and can make a decision as to the path to take to forward a packet in the Uplink or Downlink direction. If the message has arrived at its destination, either in an endpoint or a cell relay (Cell Master), it gives it to the API layer.

The following more particularly relates to functionality of the present protocol subject matter with reference to NET Requests.

With an objective to send a message to one destinations, NET_Request_Send_Mono_Data, there is use of input arguments: APIPDU, destination address. The operation may be described as the API layer asks the NET layer to send a message to the Cell Master. For the Cell Master: The API layer asks the NET layer to send a message to one particular endpoint.

With an objective to send a broadcast message to the entire cell, as far as Cell Relay only, NET_Request_Send_Broadcast, there is use of the requisite input arguments: APIPDU. The operation may be described as the API layer requests the NET layer to send a message to the entire cell.

With an objective to send an RITP broadcast to the entire cell, as far as Cell Relay only, NET_Request_Send_ITP, there is no use of any input arguments. The operation may be described that the API layer requests the NET layer to send an ITP message to the entire cell. This request follows the same approach as a NET_Request_Send_Broadcast, except that there is no NETPDU. The MAC layer will be in charge of time stamping the message.

With an objective to update the RITP of the MAC layer, as far as the Cell Relay (Cell Master) only, NET_Request_Update_ITP, there is use of requisite input arguments: Absolute ITP time stamp. The operation may be described as the API layer requests the MAC layer to update its RITP with a new value of ITP. This request has priority over all other requests and is forwarded directly to the LLC layer.

With an objective to measure the medium interference level on a specified channel and its time auto-correlation function, NET_Request_Environment_Analysis_Auto-Correlation, there is use of input arguments: Channel number, Number of samples. The operation may be described as a request that is forwarded directly to the LLC layer.

With an objective to measure the medium interference level on three specified channels and its probability density function, NET_Request_Environment_Analysis_PDF, there is use of requisite input arguments: Channel numbers (3), Max value of counter. The operation may be described as a request that is forwarded directly to the LLC layer.

With an objective to give to the MAC layer the information whether a cell is authorized or not, NET_Request_Cell_Authorization, there is use of requisite input arguments: Cell Address and Cell Status. The operation may be described as a request that is forwarded directly to the LLC layer.

With an objective to give to remove a node from the routing table, as far as the Cell Relay (Cell Master) only, NET_Request_Remove_Node, there is use of requisite input arguments: Node Address. The operation may be described as the API layer can inform the Linknet layers that a node is not belonging to the cell anymore. The NET layer will so remove the node from the routing table and update the number of endpoint in the cell.

With an objective to send a Cell Out notification to node, as far as the Cell Relay (Cell Master) only, NET_Request_Eject_Node, there is use of requisite input arguments: Node Address. The operation may be described as a request that the API layer can request the Net layer to get a node out of the cell. The NET layer will then send a Cell Out Notification to this node and remove it from the routing table.

The following more particularly relates to functionality of the present protocol subject matter with reference to NET Confirmations.

With an objective to answer a NET_Request_Send_Mono_Data, NET_Request_Send_Broadcast and NET_Request_Send_ITP, NET_Confirmation_Send_Mono_Data, NET_Confirmation_Send_Broadcast and NET_Confirmation_Send_ITP, there is use of requisite output arguments: Status. The operation may be described as giving the status of the request. It can be Message transmitted, Message failed to be transmitted, Buffer Full, Path to destination not found or any other kinds of errors.

With an objective to answer NET_Request_Update_ITP, as far as Cell Relay only, NET_Confirmation_Update_ITP, there is use of requisite output arguments: Status. The operation may be described as it gives the status of the request.

With an objective to answer NET_Request_Environment_Analysis_Auto-Correlation, NET_Confirmation_Environment_Analysis_Auto-Correlation, there is use of requisite output arguments: average RSSI and RSSI auto-correlation function values. The operation may be described as a forward of LLC_Confirmation_Environment_Analysis_Auto-Correlation from the LLC layer to the API layer.

With an objective to answer NET_Request_Environment_Analysis_PDF, NET_Confirmation_Environment_Analysis_PDF, there is the use of requisite output arguments: RSSI PDF values for the three requested channels (3×24 values). The operation may be described as a forward of LLC_Confirmation_Environment_Analysis_PDF from the LLC layer to the API layer.

With an objective to answer NET_Request_Cell_Authorization, NET_Confirmation_Cell_Authorization, there is use of requisite output arguments: Status. The operation may be described as a forward of LLC_Confirmation_Cell_Authorization from the LLC layer to the API layer.

With an objective to answer a NET_Request_Remove_Node, as far as Cell Relay (Cell Master) only, NET_Confirmation_Remove_Node, there is use of requisite output arguments: Status. The operation may be described as it gives the status of the request.

With an objective to answer a NET_Eject_Remove_Node, as far as Cell Relay (Cell Master) only, NET_Confirmation_Eject_Node, there is use of requisite output arguments: Status. The operation may be described as it gives the status of the request.

The following more particularly relates to functionality of the present protocol subject matter with reference to NET Indications.

With an objective to indicate to the API layer that a message was received for it and provide this message, NET_Indication_Received, there is use of output arguments: APIPDU. The operation may be described as when a message reaches its final destination, the NET layer gives the message to the API layer.

With an objective to update the ITP of the API layer, as far as the Cell Relay only, NET_Indication_ITP_Update, there is use of output arguments: Absolute ITP Timestamp. The operation may be described as a direct forward of the LLC_Indication_ITP_Update from the LLC layer to the API layer. This indication has priority over all other indications.

With an objective to indicate to the above layer the NET state, NET_Indication_State, there is use of requisite output arguments: State and Cell address. The operation may be described as the NET layer indicates to API layer whether the endpoint is synchronized and registered with a cell. Once it is, the API layer gets the rights to use the network.

With an objective to indicate to the API layer that a outage notification has been received, as far as Cell Relay only, NET_Indication_Outage_Received, there is use of requisite output arguments: EP address, Outage ID and Outage Time. The operation may be described as when a Cell relay (or Cell Master) receives an outage notification through the RF LAN, it should give it to the API layer. The API layer will report to the collection engine using C12.22 format.

The following relates to stability analysis of the crystal drift compensation algorithm and indicates how to compute the filter coefficients. To discuss the behavior of the drift correction process, present FIG. 70 provides a diagrammatical model of the feedback control loop.

Figure 70:
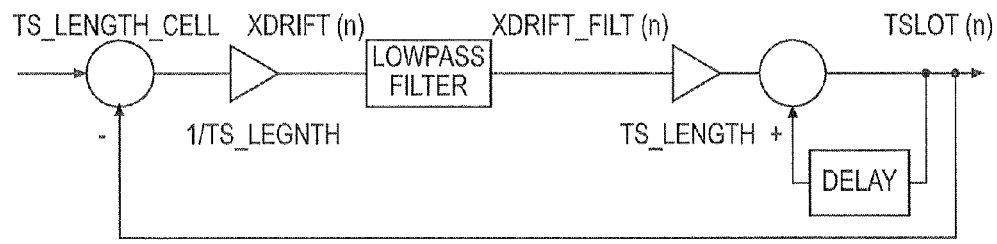
FIG. 70 depicts MODEL FOR CRYSTAL DRIFT COMPENSATION FEEDBACK LOOP subject matter.

With more specific reference to such FIG. 70, TS_Length_Cell is the default time slot length of the cell as seen from the endpoint (that is, as measured with the endpoint's own time reference). Any discrepancy between the endpoint time reference and the cell time reference will result in a difference between TS_Length and TS_Length_Cell. Considering the loop reaction to a sudden change in TS_Length_Cell, one can adjust the filter coefficients to make this response well-behaved.

Figure 71:
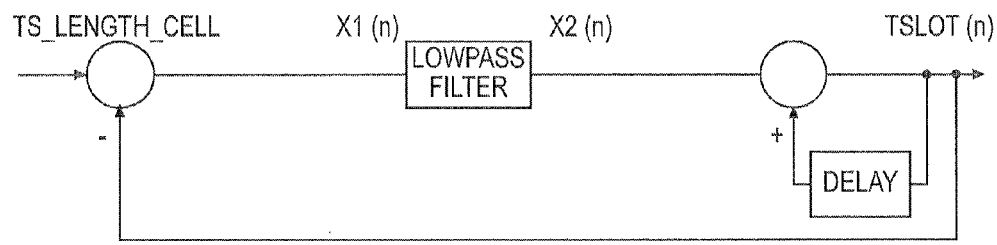
FIG. 71 depicts a simplified version of the MODEL FOR CRYSTAL DRIFT COMPENSATION FEEDBACK LOOP subject matter as represented in FIG. 70.

For such analytical purposes, present FIG. 71 is a simplification of the diagram of present FIG. 70. For such simplification, the represented loop may be described by the following recurrence equations:

$$X_2(n) = AX_1(n) + BX_2(n-1)$$

$$T_{slot}(n) = T_{slot}(n-1) + X_2(n)$$

$$X_1(n) = \text{TS\_Length\_Cell} - T_{slot}(n)$$

As is well understood by those of ordinary skill in the art, the z-transforms of these equations are:

$$X_2(z) = AX_1(z) + Bz^{-1}X_2(z)$$

$$T_{slot}(z) = z^{-1}T_{slot}(z) + X_2(z)$$

$$X_1(z) = \text{TS\_Length\_Cell} - T_{slot}(z)$$

Solving for $X_2$ and then for $T_{slot}$:

$$X_2(z) = \frac{AX_1(z)}{1 - Bz^{-1}}$$

$$T_{slot}(z) = \frac{X_2(z)}{1 - z^{-1}}$$

$$= \frac{AX_1(z)}{(1 - z^{-1})(1 - Bz^{-1})}$$

$$= \frac{A \times \text{TS\_Length\_Cell}}{(1 - z^{-1})(1 - Bz^{-1}) + A}$$

The final expression for $T_{slot}$ is:

$$T_{slot}(z) = \frac{A \times TS\_Length\_Cell}{1 + A - (1 + B)z^{-1} + Bz^{-2}}$$

And the transfer function of the loop is:

$$\frac{T_{slot}(z)}{TS\_Length\_Cell} = \frac{\frac{A}{1+A}}{1 - \left(\frac{1+B}{1+A}\right)z^{-1} + \left(\frac{B}{1+A}\right)z^{-2}}$$

This is a second order low-pass transfer function. To look at the dynamic behavior, one finds the poles of this function, written here in the standard form:

$$\frac{1}{1 + b_1 z^{-1} + b_2 z^{-2}}$$

where $$b_1 = -\left(\frac{1+B}{1+A}\right),$$

$$b_2 = \left(\frac{B}{1+A}\right)$$

The zeros of $z^2 + b_1 z + b_2$ are $$z_{1,2} = -\frac{b_1}{2} \pm \frac{j}{2}\sqrt{4b_2 - b_1^2}.$$

Simple relations between $b_1$, $b_2$ and the poles of the transfer function are represented by:

$$Re(z_{1,2}) = -\frac{b_1}{2},$$

$$|z_{1,2}|^2 = b_2$$

A simple time-saving approach to evaluate the filter coefficients is to map the poles of the discrete-time transfer function to the poles of the corresponding continuous-time transfer function. These poles are given by $s_{1,2} = -\zeta\omega_0 \pm j\omega_0\sqrt{1-\zeta^2}$, where $\zeta$ is the damping factor and $\omega_0$ is the angular frequency of the equivalent continuous-time system. These poles are related to the poles in the z-plane by $z = e^{sT}$, leading to the following expression for the poles in the z-plane:

$$z_{1,2} = e^{-\zeta\omega_0 T} e^{\pm j\omega_0 T\sqrt{1-\zeta^2}}$$

Thereafter, one may write the transfer function coefficients in terms of the continuous-time system parameters:

$$b_1 = -2e^{-\zeta\omega_0 T}\cos(\omega_0 T\sqrt{1-\zeta^2}) \text{ and } b_2 = e^{-2\zeta\omega_0 T}.$$

Solving for A and B gives:

$$\begin{cases} A = \dfrac{e^{2\zeta\omega_0 T}}{2e^{\zeta\omega_0 T}\cos(\omega_0 T\sqrt{1-\zeta^2}) - 1} - 1 \\ B = \dfrac{1}{2e^{\zeta\omega_0 T}\cos(\omega_0 T\sqrt{1-\zeta^2}) - 1} \end{cases}$$

The relevant design parameter is the number of samples used to compute the average (actually it is a low-pass filter and not an average). This is arbitrarily defined as the number of samples needed to reach the overshoot of the step response:

$$N_{avg} = \frac{\text{oscillation period}}{2T} = \frac{\pi}{T\omega_0\sqrt{1-\zeta^2}}$$

The following equations are obtained to compute the filter coefficients in terms of $N_{avg}$ and the damping factor $\zeta$:

$$\begin{cases} A = \dfrac{\exp\left(\dfrac{2\pi\zeta}{N_{avg}\sqrt{1-\zeta^2}}\right)}{2\exp\left(\dfrac{\pi\zeta}{N_{avg}\sqrt{1-\zeta^2}}\right)\cos\left(\dfrac{\pi}{N_{avg}}\right) - 1} - 1 \\ B = \dfrac{1}{2\exp\left(\dfrac{\pi\zeta}{N_{avg}\sqrt{1-\zeta^2}}\right)\cos\left(\dfrac{\pi}{N_{avg}}\right) - 1} \end{cases}$$

For example, $N_{avg} = 16.5$ and $\zeta = 0.7$ give $A = 1/16$ and $B = 0.732$.

Figure 72:
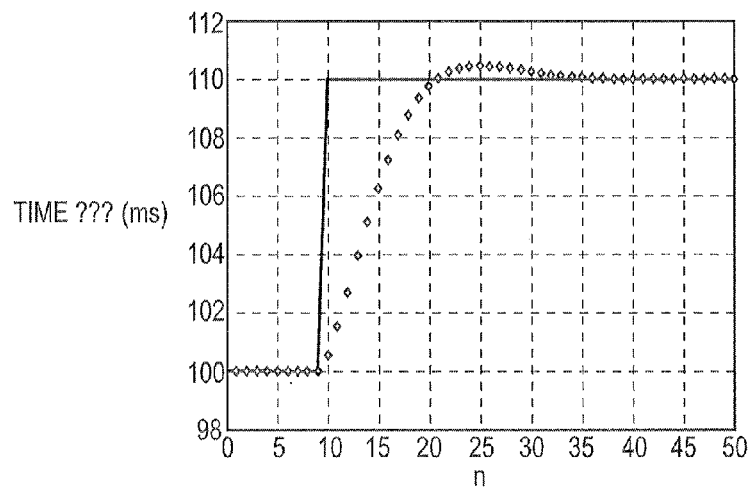
FIG. 72 depicts STEP RESPONSE OF CRYSTAL DRIFT CORRECTION subject matter.

Present FIG. 72 illustrates the step response of such loop in reaction to a change in the cell time slot length from 100 ms to 110 ms. The system reaches a stable value after about 20 resynchronizations with the expected overshoot of 4.6%. The following default values for the MAC layer parameters may be used for one preferred exemplary embodiment:

MAC_Xdrift_Filter_A = $\frac{1}{16}$

MAC_Xdrift_Filter_B = 0.732

The use of minimal propagation delay path to optimize a mesh network is another present advantageous feature set. In a mesh network, a method is presently proposed to compute to propagation delay between any node of the network and the root node of the network. This propagation delay is then used as criterion to select the best path among several in the network.

The stability and performance of the mesh network is based on its ability to self-optimize and to self-heal its topology. This self-optimization of the network is also fundamental to balance and limit the traffic load. It is therefore important to provide the protocol with a good path selection algorithm. The best path should have the following properties:

The best path should have the shortest latency from transmitter to receiver.

The best path should minimize the number of retransmissions.

The best path should cause as few interference as possible.

Figure 73A:
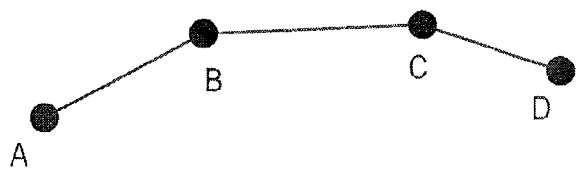
FIGS. 73A, 73B, and 73C, respectively, illustrate diagrammatical aspects of the present subject matter relating to optimization of a mesh network.

The present subject matter is to use the "shortest path" criterion to choose the best path among several. The shortest path is here defined as the path with the shortest average propagation delay. Reference is made herein to the diagrammatical illustrations of present FIGS. 73A, 73B, and 73C.

When a communication attempt from node A to node B fails, node A retransmits the message a second time or as many times as necessary to make the transmission successful. For practical purposes the number of retransmission attempts is limited to some maximum value in order to avoid losing time on a broken link. The average time spent to transmit a message from node A to node B is called in this protocol the local propagation delay (LPD) from A to B. It is straightforward to extend this concept to a more complex path. For instance the propagation delay between nodes A and D along the path ABCD (see present FIG. 73A) is the sum of the propagation delays from A to B, B to C and C to D.

In order to avoid using too much memory in a node, each node is only aware of its immediate neighbors and therefore cannot directly make the sum of all the propagation delays all the way to the root node. To solve this problem each node in the network will compute two kinds of delays: the local propagation delay (LPD) and the global propagation delay (GPD). A node will compute the LPD for each one if its neighboring nodes in the direction of the network root. The GPD of a node is defined as the shortest total propagation delay from the node all the way to the root node of the network. Here shortest means that if there are several possible paths from a node to the root node, the one with the shortest propagation delay is selected and used to define the node's global propagation delay (GPD).

Figure 73B:
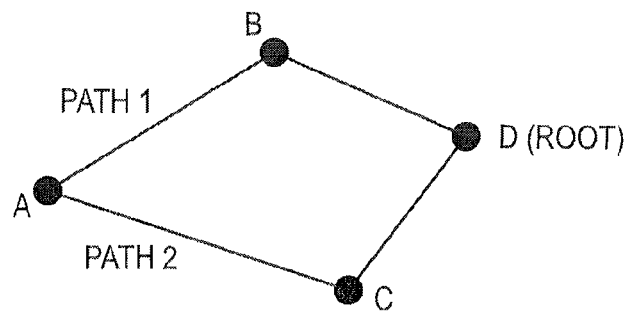

As an example, for the network illustrated in present FIG. 73B, the GPD from A to the root will be:

$$GPD(A)=Min\{[LPD(A,B)+LPD(B,D)],[LPD(A,C)+LPD(C,D)]\}$$

To make the GPD computation possible with only the knowledge of the immediate neighborhood, the GPD information is propagated step by step from the root to the nodes.

Figure 73C:
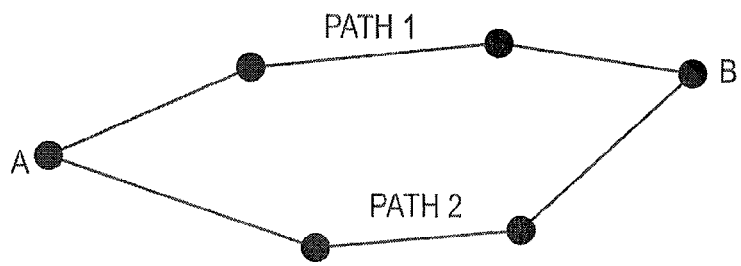

As an example, for the network illustrated in present FIG. 73C, the GPD from A to the root will be computed in this way:

$$GPD(A)=Min\{[LPD(A,B)+GPD(B)],[LPD(A,C)+GPD(C)]\},$$

where GPD(A) is the total propagation delay from A to the root and GPD(B) is the total propagation delay from B to the root.

The detailed operations to be performed inside a node are then:

Each node keeps a record of all communication attempts with each one of the nodes in the direction of the root of the network and computes a statistical communication success rate with each one of these nodes.

From this communication success rate an average local propagation delay is computed for each one-hop link.

From the GPD of the neighboring nodes, the node will compute the total propagation delay along each path to the root node and will select the shortest value to define its own GPD value.

The node will then make its GPD value accessible to every node within its range by updating its message header.

Mathematical details of such present subject matter may be outlined as follows. If we consider a single hop (point-to-point) link, in a collision free environment the average propagation delay D will be given by:

$$D=T_d,$$

where $T_d$ is the time needed by a packet to travel from the transmitter to the receiver.

Considering the effect of collisions on the average propagation delay means considering all the possible cases: no collision occurred, one collision occurred, two collisions, and so on. The propagation delay will be given by:

$$D=T_dP+(T_d+T_r)(1-P)P+(T_d+2T_r)(1-P)^2P+\ldots$$

Here P is the packet success rate and $T_r$ is the wait time between retransmissions.

To keep the further derivation simple, one may assume that this time is constant. The expression can be factored in this way:

$$D=T_dP[1+(1-P)+(1-P)^2+\ldots]+T_rP(1-P)[1+2(1-P)+3(1-P)^2\ldots]$$

Substituting the sum of the geometric series:

$$1+x+x^2+x^3+\ldots=\frac{1}{1-x}$$

$$1+2x+3x^2+\ldots=\frac{1}{(1-x)^2},$$

One finds a simple expression for the average propagation delay on a single point-to-point-link:

$$D=T_d+T_r\left(\frac{1-P}{P}\right)$$

Due to the constantly changing environment, this average propagation delay value should preferably be updated after each use of any given link. The expression of the average propagation delay as a function of the link utilization number n is written as follows:

$$D(n)=T_d+T_r\left(\frac{1-P(n)}{P(n)}\right)$$

This delay can be split in a static part and dynamic part:

$$D(n)=T_d+T_rD_r(n),$$

where $D_r(n)$ is the part of the propagation delay due to retransmissions, normalized to the retransmission wait time. $D_r(n)$ is directly related to the packet success rate by:

$$D_r(n)=\frac{1-P(n)}{P(n)}$$

After each packet transmission attempt on a given link, the packet success rate P(n) is updated with a sliding average as shown below:

$$P(n)=\frac{PS(n)}{N_{av}}+\frac{N_{av}-1}{N_{av}}P(n-1),$$

where $N_{av}$ is the number of transmissions used to compute the average and PS(n) is the success/failure at attempt n:

$$PS(n)=\begin{cases} 0 & \text{if transmission } n \text{ failed} \\ 1 & \text{if transmission } n \text{ succeeded} \end{cases}$$

From the PSR update equation, one can derive an equation to update the propagation delay:

$$D_r(n) = \frac{1}{P(n)} - 1 = \frac{1}{\frac{PS(n)}{N_{av}} + \frac{N_{av}-1}{N_{av}}P(n-1)} - 1$$

Expressing the delay as a function of the PSR, $$P(n) = \frac{1}{1+D_r(n)}$$

we find $$D_r(n) = \frac{1}{\frac{PS(n)}{N_{av}} + \frac{N_{av}-1}{N_{av}}\frac{1}{1+D_r(n-1)}} - 1$$

$$= \frac{N_{av}(1+D_r(n-1))}{PS(n)(1+D_r(n-1)) + N_{av}-1} - 1$$

The equations to update the propagation delay of any link are then:

$$D_r(n) = \begin{cases} \frac{N_{av}D_r(n-1)+1}{N_{av}-1} & \text{if } PS(n)=0 \\ \frac{(N_{av}-1)D_r(n-1)}{D_r(n-1)+N_{av}} & \text{if } PS(n)=1 \end{cases}$$

If a transmission attempt fails, we use the first equation; if it succeeds, we use the second one. This can be easily extended to a multi-hop path in the following way:

$$D(n) = N_{hop}T_d + T_r \sum_{k=1}^{N_{hop}} D_{r,k}(n)$$

where the summation is extended to all the individual hops of a path. When this equation is used for the purpose of comparing different paths, it can be normalized in the following way:

$$\frac{D(n)}{T_r} = N_{hop}\frac{T_d}{T_r} + \sum_{k=1}^{N_{hop}} D_{r,k}(n)$$

Main benefits include: leads to an optimal path selection; and can be implemented in each node with only the local knowledge of the neighborhood.

The following relates to present protocol subject matter regarding operation for traffic load management, particularly including response scenarios involving packet transmission failures.

In order to best convey present traffic management rules, one needs to make several simplifying assumptions because the problem of RF collisions is extremely complex. The issue at hand is not the same as trying to make accurate traffic load evaluations. Detailed traffic load management algorithms are set forth in the protocol description otherwise herein.

To begin with, one may analyze the possible causes for a packet transmission failure and corresponding possible cure for each case, assuming in a first step that the cause of the failure is known. This will consider analysis of the problem of traffic flow at the cell relay and derive a simple traffic limitation rule from this special case. Thereafter, a more global strategy can be outlined to deal with these failures through adequate wait times and retransmissions. This strategy is designed to optimize the latency and the throughput of individual links between nodes. It is not designed to evenly share the traffic between the different paths of the meshed network. The proposed load management will prevent the network from collapsing if demand exceeds the network capacity, but it does not replace load management at the application level. Load management at the application layer is expected to spread the traffic as evenly as possible in time and to avoid requesting too much data at the same time. LAN network overload should remain an exceptional situation.

Present FIG. 74 is a table relating to various scenarios of transmission failure causes and solutions, per present protocol subject matter, which are further commented on herein.

The following is with particular reference to the FIG. 74 "Possible cause (1)" set of conditions. Rayleigh fading is strongly frequency dependent. As a consequence, some channels will have a much better packet success rate than others. This will be particularly noticeable with long distance links with a weak link margin. It will not be uncommon to see more than 10-dB difference between the link budgets of two channels. Such a difference will make some channels unusable for data transmission purpose, even when no jamming signals are present. Rayleigh fading is due to multi-path interference and the environmental conditions that make a channel poor will vary in time and from node to node. It is therefore not simple to exclude these bad channels from the list. Furthermore, the radio regulations in the US prevent one from doing so entirely; all the channels must be used in the same way. When a packet fails to be acknowledged due to such conditions, the solution is to try again on another channel. There is no need to wait before the next transmission attempt in this case. Additional wait time here would only increase the system latency. In some extreme cases, the system will fail to transmit successfully its packets on all the available channels. This can be caused by harsh environmental conditions like a thunderstorm or by the presence of a big obstruction close to the endpoint. This condition can also come with a loss of synchronization. In this case, the endpoint will have to introduce a significant wait time and resume its transmissions later, as outlined in the table of present FIG. 74.

The following is with particular reference to the FIG. 74 "Possible cause (2)" set of conditions. The ISM band used by the present protocol subject matter is a shared band. Other users of the band will interfere with such transmissions and some packets will be lost due to collisions. Of course, this phenomenon will be more important for long distance links due to a weaker link margin. Interferers can be narrow-band low power transmitters, frequency hoppers or high-power wide-band transmitters. The bandwidth of any interferer will nonetheless be small compared to the whole ISM bandwidth and, in most cases, the retransmission on a different channel will be sufficient to avoid the interference. As in the previous case there is no need to wait before attempting a retransmission. Additional wait time here would only increase the system latency. In some extreme cases, the system will fail to transmit successfully its packets on all the available channels. This can be caused by a very high power jammer close enough to the endpoint to de-sense its receiver front end. In this case, the endpoint will have to introduce a significant wait time and resume its transmissions later, as outlined in the table of present FIG. 74.

The following is with particular reference to the FIG. 74 "Possible cause (3)" set of conditions. As the traffic generated by the present protocol subject matter grows higher, internal collisions between packets will occur. At some point, these internal collisions will be frequent enough to degrade the effective throughput of the system. In this case transmitting on another channel will not improve the situation because every endpoint follows the same hopping pattern. From a collision probability standpoint, the system behaves as if only one channel was used. The relation between collision probability and effective throughput is well known from slotted Aloha theory. Textbook theory deals with the case where no external jammer is present. Here the situation is more difficult to analyze because we have both types of collisions at the same type: internal collisions due to subject traffic and external collisions with the other users of the band. Hence, it is desirable to introduce a regulation mechanism to slow down the subject traffic when it grows above some limit, as outlined in the table of present FIG. 74.

The following is with particular reference to the FIG. 74 "Possible cause (4)" set of conditions. When an endpoint cannot handle an incoming message due to memory limitations, it will reply with a negative acknowledgment and discard the received message. This can also be caused by traffic congestion in a remote node of the network. When a node needs to slow down its traffic, it will reply with a negative acknowledgement when its input buffer fills up. This condition will propagate step by step along the upstream traffic path. The recipient of a negative acknowledgement should either try another destination or retransmit after some wait time, as outlined in the table of present FIG. 74.

The following provides additional discussion with reference to analysis of the upload traffic flow at the cell relay, in accordance with present protocol subject matter. The cell relay is the point where all the traffic converges. If a gridlock occurs, it will most likely occur at the cell relay, it is therefore important to analyze the traffic conditions in this specific case. Only the upload situation is considered here because this is the relevant case for traffic load management. Present FIG. 75 diagrammatically represents a model for the traffic load of the present subject matter, at the cell relay, and useful for the reference in the present discussion.

As the actual situation is extremely complex, some simplifications are desired in order to more readily characterize some present traffic management rules. An assumption is made, for instance, that the cell relay (endpoint A in present FIG. 75) can only hear the transmissions from level 2 endpoints (endpoints $B_i$ in FIG. 75). This is an idealized assumption. In an actual implementation, sporadic successful transmissions between level 3 endpoints and the cell relay will more likely occur. An assumption is also made that the level 2 endpoints are out of range of each other. This looks like an idealized situation for level 2 endpoints but it is a worst case from the cell relay standpoint because a level 2 endpoint has no knowledge of the traffic sent by its neighbors to the cell relay in this case. Another present simplifying assumption is that two packets, two acknowledgements, or a packet and an acknowledgement arriving in a receiver in the same time slot will always collide and result in nothing at all being received. This is of course a pessimistic assumption, but only extensive simulations will allow a more accurate modeling of the collision process.

The following notation is utilized to describe the traffic flow:

R(X,Y,Z)=average number of packets sent by endpoint X, intended for endpoint Y and above sensitivity threshold for endpoint Z, by time slot S(X,Y,Z)=average number of packets sent by endpoint X, intended for endpoint Y and successfully received by endpoint Z, by time slot T(X,Y,Z)=average number of unique packets sent by endpoint X, intended for endpoint Y and successfully received by endpoint Z, by time slot (i.e. without duplicated packets)

U(X,Y,Z)=average number of acknowledgements sent by endpoint X, intended for endpoint Y and above sensitivity threshold for endpoint Z, by time slot V(X,Y,Z)=average number of acknowledgements sent by endpoint X, intended for endpoint Y and successfully received by endpoint Z, by time slot The total traffic input density seen by the cell relay is the sum of the traffic densities generated by all the sons of the cell relay (endpoints $B_i$ in FIG. 75). The total traffic breaks down in data packets and acknowledgements. The data traffic is given by:

$$R(B, A, A) = \sum_{i=1}^{N} R(B_i, A, A)$$

where B means the set of all level 2 endpoints, B={$B_1,B_2,L B_N$}. The sum extends over all the sons of A (the level 2 endpoints). The acknowledgements sent by endpoint $B_i$ and intended for the sons of $B_i$ are heard by A and must be included in the total traffic seen by A. This acknowledgement traffic is given by:

$$U(B, C, A) = \sum_{i=1}^{N} U(B_i, Sof(B_i), A)$$

where C means the set of all level 3 endpoints, as given by $$C @ \bigcup_{i=1}^{N} Sof(B_i),$$

with the notation Sof (X) @{all the sons of X}. For the purpose of collision probability evaluation, these two kinds of traffic will be treated in the same way. The total traffic is then R(B,A,A)+U(B,C,A).

The data packet throughput at the cell relay is given by:

$$S(B, A, A) = \sum_{i=1}^{N} R(B_i, A, A) PSR(B_i, A)$$

where we have introduced the packet success rate for the transmission of a packet from endpoint $B_i$ to endpoint A:

$$PSR(B_i, A) = \exp\left[-\sum_{\substack{k=1 \\ k \neq i}}^{N} R(B_k, A, A) - \sum_{\substack{k=1 \\ k \neq i}}^{N} U(B_k, Sof(B_k), A)\right] PSR_e(A) Q(A)$$

The first term in the expression of the PSR is the probability for all other level 2 endpoints to be silent when $B_i$ transmits its packet. This probability is given by the Poisson distribution for "zero event". The expression in brackets is the average value of the number of events in a single time slot. The next term, $PSR_e(A)$, is the probability for the data packet to be received without collision with interferers outside the present subject matter network. Finally $Q(A)$ is the probability for endpoint A to be in the receiving state when the packet arrives. This probability is equal to one minus the probability for endpoint A to be acknowledging a previously received packet:

$$Q(A)=1-S(B,A,A)$$

The cell relay will acknowledge each received packet, this provides a relation between the number of packets successfully received by A and the number of acknowledgements arriving at $B_i$:

$$U(A,B_i,B_i)=S(B_i,A,A)$$

The number of acknowledgements successfully received by $B_i$ is given by:

$$V(A, B_i, B_i) = U(A, B_i, B_i)ASR(A, B_i)$$
$$= R(B_i, A, A)PSR(B_i, A)ASR(A, B_i)$$

where the acknowledgement success rate, $ASR(A, B_i)$, is introduced. This acknowledgement success rate is given by:

$$ASR(A,B_i)=\exp[-R(Sof(B_i),B_i,B_i)-U(Sof(B_i),Sof^2(B_i),B_i)]PSR_e(B_i)$$

where it is defined that $Sof^2(B_i)=Sof(Sof(B_i))$.

From the application standpoint the relevant traffic is the number of packets received by the cell relay after deletion of the duplicated packets. A duplicated packet is generated when the acknowledgement fails to be received by the sender of the packet. This number of unique packets should be equal to the number of acknowledgements successfully received by the level 2 endpoints, $T(B_i,A,A)=V(A,B_i,B_i)$.

It follows a relation between $T(B_i,A,A)$ and $R(B_i,A,A)$:

$$T(B_i,A,A)=R(B_i,A,A)PSR(B_i,A)ASR(A,B_i)$$

In this equation $PSR(B_i,A)ASR(A,B_i)$ is the success rate for the transmission of packet and the reception of the following acknowledgement. This is the "packet success rate" that the endpoint $B_i$ will measure when trying to send its packet to the cell relay. The total rate of reception of not duplicated packets is obtained by summing the preceding equation:

$$T(B, A, A) = \sum_{i=1}^{N} R(B_i, A, A)PSR(B_i, A)ASR(A, B_i)$$

The number of acknowledgements sent by A to $B_i$ is related to the traffic rate by:

$$U(A, B_i, B_i) = R(B_i, A, A)PSR(B_i, A) = \frac{T(B_i, A, A)}{ASR(A, B_i)}$$

In a similar way, the acknowledgements received by the cell relay but intended for the level 3 endpoints are also proportional to the total traffic:

$$U(B_i, Sof(B_i), A) = \frac{T(Sof(B_i), B_i, B_i)}{ASR(B_i, Sof(B_i))}$$

The total contribution of acknowledgements to the traffic at the cell relay is then:

$$U(B, C, A) = \sum_{i=1}^{N} \frac{T(Sof(B_i), B_i, B_i)}{ASR(B_i, Sof(B_i))}$$

To make the problem tractable, it is necessary to make further assumptions. A further such assumption is that the number of sons of A is large. In this case, the individual contributions of each $B_i$ to the total traffic is small and the packet success rate becomes independent of i as follows:

$$PSR(B,A)=\exp[-R(B,A,A)-U(B,C,A)]PSR_e(A)Q(A)$$

To simplify the expression for the acknowledgement success rate, we will notice that implementation of the present protocol subject matter does not result in a pure Aloha system. When a son of a level 2 endpoint hears its father sending a packet, it will postpone its own transmission to avoid interfering with the acknowledgement its father is expecting. The probability for $B_i$ to receive in the same time slot an acknowledgement from one its sons (intended for its grandson) and an acknowledgement from A is also much smaller than previously assumed. This would only occur if, in the previous time slot, $B_i$ had sent a packet to A and the son of $B_i$ had also sent a packet to its own son. This is likely to produce a collision. The acknowledgement success rate will therefore be approximated with:

$$ASR(A,B)=PSR_e$$

where we further assumed that the external collision rate is the same for all endpoints.

The relation between the throughput and the input traffic density at the cell relay simplifies to:

$$T(B,A,A)=PSR(B,A)ASR(A,B)R(B,A)$$

The acknowledgment rate from level 2 to level 3 is approximated in the same way:

$$ASR(B_i,Sof(B_i))=PSR_e$$

And the acknowledgement input density at the cell relay becomes:

$$U(B, C, A) = \frac{\sum_{i=1}^{N} T(Sof(B_i), B_i, B_i)}{PSR_e} = \frac{T(B, A, A)}{PSR_e}$$

where one uses the conservation of the number of packets from level to level. The PSR from B to A can now be expressed as:

$$PSR(B, A) = \exp\left[-R(B, A, A) - \frac{T(B, A, A)}{PSR_e}\right]PSR_e\left[1 - \frac{T(B, A, A)}{PSR_e}\right]$$

After substitution in the relation between T(B, A, A) and R(B, A, A), the following is obtained:

$$T(B, A, A) = R(B, A, A)\exp\left[-R(B, A, A) - \frac{T(B, A, A)}{PSR_e}\right]PSR_e^2\left[1 - \frac{T(B, A, A)}{PSR_e}\right]$$

This can be written in this way:

$$\frac{\frac{T(B, A, A)}{PSR_e}\exp\left[\frac{T(B, A, A)}{PSR_e}\right]}{PSR_e\left[1 - \frac{T(B, A, A)}{PSR_e}\right]} = R(B, A, A)\exp[-R(B, A, A)]$$

The left-hand side of this equation is a monotonic function of T (B, A, A), the right-hand side has a maximum value for R (B, A, A)=1, it follows an equation that can be solved to find the maximum possible value of T (B, A, A):

$$\frac{T(B, A, A)}{PSR_e}\exp\left[1 + \frac{T(B, A, A)}{PSR_e}\right] - PSR_e\left[1 - \frac{T(B, A, A)}{PSR_e}\right] = 0$$

Present FIGS. 76 and 77, respectively, illustrate various aspects of such relations. In particular, present FIG. 76 graphically illustrates Data throughput, T(B,A,A) and PSR (with acknowledgement) vs traffic input density, R(B,A,A) for PSRe=0.8, while present FIG. 75 graphically illustrates Data throughput, T(B,A,A) vs PSRe. In any event, whatever the external collision rate, the maximum throughput is always obtained for R (B, A, A)=1. Such interesting feature is used for traffic load management per the present protocol subject matter.

In contrast to the foregoing discussion concerning analysis of the upload traffic flow at the cell relay, in accordance with the present protocol subject matter, the following more particularly relates to evaluation of such upload traffic flow.

In order to control properly the traffic load per present subject matter, an endpoint needs to evaluate the amount of traffic going through the network. From electromagnetic theory, it is known that any transmission path from antenna to antenna is reciprocal. For simplicity, one may make the additional assumption that the links are balanced, that is, the transmitted powers and sensitivities are the same for all endpoints. One can then say that if node A is a father for node $B_i$, every packet transmitted by A will be heard by $B_i$, with the exceptions of the packets lost by collision or because $B_i$ was not in reception mode at the right moment. This provides node $B_i$ with a simple, approximate way to know the amount of traffic its father is handling at any moment. Node $B_i$ needs to listen to the acknowledgments transmitted by the cell relay. The acknowledgments will give enough information to assess the traffic load.

For each received packet, the cell relay sends an acknowledgement. It is therefore calculated that U (A, B, $B_i$)=S (B, A, A). The rate of acknowledgements successfully received by $B_i$ is given by:

$$V(A,B,B_i)=U(A,B,B_i)ASR(A,B_i)Q(B_i)$$

where $Q(B_i)$ is included because endpoint $B_i$ is monitoring acknowledgements intended for other endpoints and is not always in listening state when these acknowledgements arrive.

It is known that the traffic input density is given by R (B, A, A)=S (B, A, A)/PSR (A, B). The relation between R (B,A,A) and V (A, B, $B_i$) is:

$$R(B, A, A) = \frac{V(A, B, B_i)}{PSR(A, B)ASR(A, B_i)Q(B_i)}$$

When measuring V (A, B, $B_i$), one should consider all acknowledgements (positive or negative) sent by A and received by B. But the acknowledgements intended for $B_i$ are not taken into account in this computation. Only the acknowledgements addressed to other endpoints are recorded here because the purpose is to evaluate the external subject traffic the endpoint A has to deal with. V (A, B, $B_i$) can be measured by counting all the received acknowledgements occurring in a sliding time window. If one expresses the packet success rate in terms of the average propagation delay, the result is as follows:

$$PSR(B, A)ASR(A, B) = \frac{1}{1 + LPD_{BA}}$$

The traffic input density can be seen by endpoint A as a function of the propagation delay and the rate of reception of acknowledgments. The following equation will indicate how busy is endpoint A:

$$R(B, A, A) = \frac{V(A, B, B_i)(1 + LPD_{BA})}{Q(B_i)}$$

The following more particularly relates to traffic management algorithms per the present protocol subject matter. When the LLC layer receives from the NET layer a request to send a packet, or when it reschedules a non-acknowledged transmission, it will compute the length of the wait time (Tx_Wait) before the request to send can be forwarded to the MAC layer. This wait time is computed as a function of the repetition number. The purpose of such approach is to avoid flooding the air interface with a large number of packets when the conditions of transmission are difficult.

Figure 80:
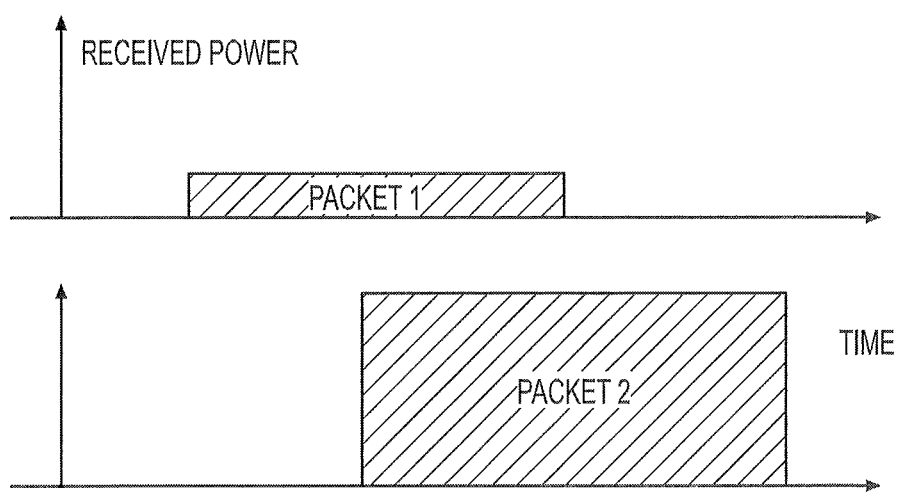
FIG. 80 depicts COLLISION, BOTH PACKETS MIGHT BE LOST subject matter.

When the MAC layer receives a request to send a packet from the LLC layer, the randomization window length (Tx_Window) is computed as a function the traffic load, its purpose is to avoid using the slotted Aloha interface above its optimal point. The transmission of a packet will always occur within the randomization window, after the wait time. Such facet of the present subject matter is illustrated by present FIG. 80, which graphically represents the wait time and randomization window for the (re-)transmission of a packet. Such wait time is preferably computed according to a binary exponential backoff law, as otherwise explained herein.

Figure 79:
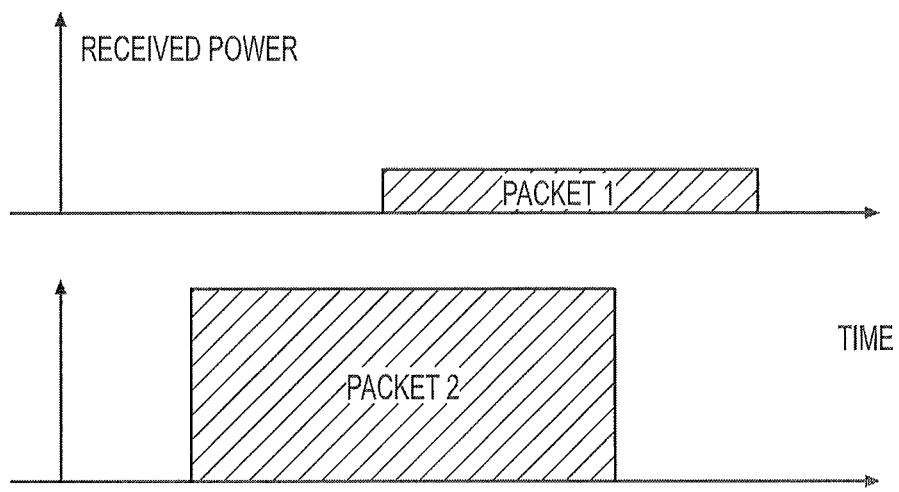
FIG. 79 depicts COLLISION, PACKET 1 IS LOST subject matter.

The following more particularly addresses advantageous mitigation of collision circumstances, per present subject matter. In this context, the simultaneous (or overlapping) reception of two or more packets is referred to as a collision. If the colliding packets have the same power, both will be lost. If one packet is received with a higher power (higher than some carrier to interference ratio) and if the more powerful packet arrives first, the stronger packet is received successfully and the weaker one is lost. Such a set of conditions and/or events are represented by present FIG. 79, that is, representing such a collision episode where one packet (designated as packet 1) is lost.

If the weaker packet arrives first, two scenarios are possible, depending on the type of receiver used in the pertinent portion of the implementation. If the receiver has relatively more limited functionalities, it will lock on the preamble of the first packet, go into sync word search and then into a demodulation phase. When the stronger packet arrives, the receiver is not in a preamble search state and misses the stronger packet sync word. Both packets are lost. Such a set of conditions and/or events are represented by present FIG. 80, that is, representing a collision episode where both packets (designated as packet 1 and packet 2) are lost. In the situation where the received happens to be a more sophisticated device, the receiver is able to demodulate a packet and concurrently search for a new preamble. In such case, it can receive the stronger packet. The weaker one (packet 1) is however lost in all cases.

To mitigate the probability of collision with any kind of receiver, it can be useful per present subject matter to avoid using the first sub time slot for acknowledgments. Such preferred approach will avoid the destruction of some packets by weaker acknowledgements arriving just before the packet.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

In addition, various discussion herein makes us of and/or relies on abbreviations and acronyms, having the intended meanings as set forth in the following Table of Definitions, which forms part of the present disclosure.

TABLE OF DEFINITIONS

ACK—Acknowledgement
AMI—Advanced Metering Initiative
API—Application Layer Interface
C12.22—ANSI standard protocol for interfacing to data communication networks. It is the recommended API protocol to be used with Linknet protocol.
CM—Cell Master
CR—Cell Relay
CRC—Cyclic Redundancy Check
ERC—European Radiocommunications Committee
EP—Endpoint, network node
EP_GPD—Global average Propagation Delay between an endpoint and the Cell Master through a specified neighbor.
ETSI—European Telecommunications Standards Institute
FCC—Federal Communications Commission
FCS—Frame Check Sequence
FEC—Forward Error Correction
FH—Frequency Hopping
FHSS—Frequency Hopping Spread Spectrum
GF—Galois Field
GPD—Global average Propagation Delay between an endpoint and the Cell Master (the minimum EP_GPD for an endpoint)
IEEE—Institute of Electrical and Electronics Engineers
ISM—Industrial, Scientific and Medical
ISO—International Standards Organization
ITP—Itron Time Protocol
Linknet—The name of the protocol described in the present document
LLC—Logical Link Control layer
LPDU—LLC PDU
LPD—Local PD. Propagation Delay between two neighboring EPs
MAC—Medium Access Control layer
MPDU—MAC PDU
NACK—Negative acknowledgement
NET—Network layer
NETPDU—NET PDU
OSI—Open Systems Interconnection
PDF—Probability Density Function
PDU—Protocol Data Unit
PHY—Physical layer
PPDU—Physical layer PDU
PSR—Packet Success Rate
RITP—Relative Itron Time Protocol
RS—Reed-Solomon or Registered State
RSSI—Received Signal Strength Indicator
RTOS—Real Time Operating System
SAP—Service Access Point
SFD—Start of Frame Delimiter
TS—Time Slot
RF2Net—Previous project name for Linknet development
WAN—Wide Area Network
Zigbee—Standard IEEE protocol.

What is claimed is:

1. A method for optimizing an advanced metering system mesh network, comprising:
    establishing a network including a central facility root node and a plurality of node devices, and at least some of the node devices comprise metrology devices;
    configuring the network for bi-directional communications between the central facility root node and each of the plurality of node devices;
    computing total propagation delay along each path to the central facility root node;
    selecting at each node device the lowest value of total propagation delay to define its own global propagation delay value;
    sharing the global propagation delay valve for each node device with every other node device accessible within its range;
    calculating a global propagation delay to the central facility root node for each respective node device using only local propagation delay for each respective node device and shared values from its immediate neighbors; and
    conducting communications using the path corresponding to the selected value,
    whereby communications among nodes within the network is optimized.

2. A method as in claim 1, wherein each node device shares its own global propagation delay value by updating its message header.

3. A method as in claim 1, wherein average local propagation delay is derived by:
    maintaining a record of all communication attempts with each one of the plurality of node devices in the direction of the central facility root node; and
    computing a statistical communication success rate for each one of the plurality of node devices.

4. A method as in claim 1, further including computing average local propagation delay for each one-hop link using the relationship:

$$D = T_d + T_r\left(\frac{1-P}{P}\right)$$

where D is the average local propagation delay, $T_d$ is time needed by a packet to travel from a transmitter to a receiver, P is packet success rate, and $T_r$ is wait time between transmissions.

5. A method as in claim 4, wherein the average local propagation delay is updated after each use of any given link.

6. A method as in claim 4, wherein the packet success rate is updated after each packet transmission attempt with a sliding average using the relationship:

$$P(n) = \frac{PS(n)}{N_{av}} + \frac{N_{av} - 1}{N_{av}} P(n-1)$$

where P(n) is the packet success rate for a given node n, $N_{av}$ is the number of transmissions used to compute the average, and PS(n) is an indication of success or failure at attempt n where PS(n)=0 if transmission n failed and PS(n)=1 if transmission n succeeded.

7. A method as in claim 6, wherein the propagation delay of any link is updated using the relationship:

$$D_r(n) = \begin{cases} \dfrac{N_{av} D_r(n-1) + 1}{N_{av} - 1} & \text{if } PS(n) = 0 \\ \dfrac{(N_{av} - 1) D_r(n-1)}{D_r(n-1) + N_{av}} & \text{if } PS(n) = 1 \end{cases}$$

where $D_r(n)$ is the propagation delay of a link for transmission n and PS(n) is an indication of success or failure at attempt n where PS(n)=0 if transmission n failed and PS(n)=1 if transmission n succeeded.

8. A method for optimizing an advanced metering system mesh network, comprising:
 establishing a network including a central facility root node and a plurality of node devices, at least some of the node devices comprise metrology devices;
 configuring the network for bi-directional communications between the central facility root node and each of the plurality of node devices;
 propagating global propagation delay information from the central facility root node to each of the node devices on a step by step basis;
 storing global propagation delay information at each node device; and
 conducting communications using a path corresponding to the lowest value of total propagation delay based on the stored global propagation delay information and average local propagation delay,
 whereby each node device selects a communications path based only on knowledge of its own average local propagation delay and the global propagation delay information from immediate neighbor node devices.

9. A method as in claim 8, wherein each node makes available its own global propagation delay value by updating its message header.

10. A method as in claim 8, wherein the average local propagation delay is derived by:
 maintaining a record of all communication attempts with each one of the plurality of node devices in the direction of the central facility root node; and
 computing a statistical communication success rate for each one of the plurality of node devices.

11. A method as in claim 8, further including computing average local propagation delay for each one-hop link using the relationship:

$$D = T_d + T_r \left( \frac{1 - P}{P} \right)$$

where D is the average local propagation delay, $T_d$ is time needed by a packet to travel from a transmitter to a receiver, P is packet success rate, and $T_r$ is wait time between transmissions.

12. A method as in claim 11, wherein the average local propagation delay is updated after each use of any given link.

13. A method as in claim 11, wherein the packet success rate is updated after each packet transmission attempt with a sliding average using the relationship:

$$P(n) = \frac{PS(n)}{N_{av}} + \frac{N_{av} - 1}{N_{av}} P(n-1)$$

where P(n) is the packet success rate for a given node n, $N_{av}$ is the number of transmissions used to compute the average, and PS(n) is an indication of success or failure at attempt n where PS(n)=0 if transmission n failed and PS(n)=1 if transmission n succeeded.

14. A method as in claim 13, wherein the propagation delay of any link is updated using the relationship:

$$D_r(n) = \begin{cases} \dfrac{N_{av} D_r(n-1) + 1}{N_{av} - 1} & \text{if } PS(n) = 0 \\ \dfrac{(N_{av} - 1) D_r(n-1)}{D_r(n-1) + N_{av}} & \text{if } PS(n) = 1 \end{cases}$$

where $D_r(n)$ is the propagation delay of a link for transmission n and PS(n) is an indication of success or failure at attempt n where PS(n)=0 if transmission n failed and PS(n)=1 if transmission n succeeded.

15. An advanced metering system mesh network, comprising;
 a central facility root node; and
 a plurality of node devices, each node device configured for bi-directional communications with said central facility root node, and at least some of the node devices comprise metrology devices;
 wherein each node device is further configured to compute an average propagation delay for each one-hop link to itself in the mesh network and to select the shortest transmission path to said central facility root node based only on its own computed average propagation delay and global propagation delay information stored in its immediate neighbors;
 whereby communications between said central facility root node and said plurality of node devices are optimized.

16. An advanced metering system mesh network as in claim 15, wherein said central facility root node is configured to propagate global propagation delay information to each node device on a step by step basis.

17. An advanced metering system mesh network as in claim 15, wherein each node device is configured to calculate its own average local propagation delay by maintaining a record of all communication attempts with each one of the plurality of node devices in the direction of said central facility root node and computing a statistical communication success rate for each one of said plurality of node devices.

18. An advanced metering system mesh network as in claim 15, wherein each node device is configured to compute its average local propagation delay for each one-hop link using the relationship:

$$D = T_d + T_r\left(\frac{1-P}{P}\right)$$

where D is the average local propagation delay, $T_d$ is time needed by a packet to travel from a transmitter to a receiver, P is packet success rate, and $T_r$ is wait time between transmissions.

19. An advanced metering system mesh network as in claim 18, wherein each node device is configured to update its average local propagation delay calculation after each use of any given link.

20. An advanced metering system mesh network as in claim 18, wherein each node device is configured to update its packet success rate after each packet transmission attempt with a sliding average using the relationship:

$$P(n) = \frac{PS(n)}{N_{av}} + \frac{N_{av}-1}{N_{av}}P(n-1)$$

where P(n) is the packet success rate for a given node n, $N_{av}$ is the number of transmissions used to compute the average, and PS(n) is an indication of success or failure at attempt n where PS(n)=0 if transmission n failed and PS(n)=1 if transmission n succeeded.

21. An advanced metering system mesh network as in claim 20, wherein each node device is configured to update the propagation delay to any other linked node device using the relationship:

$$D_r(n) = \begin{cases} \dfrac{N_{av}D_r(n-1)+1}{N_{av}-1} & \text{if } PS(n) = 0 \\ \dfrac{(N_{av}-1)D_r(n-1)}{D_r(n-1)+N_{av}} & \text{if } PS(n) = 1 \end{cases}$$

where $D_r(n)$ is the propagation delay of a link for transmission n and PS(n) is an indication of success or failure at attempt n where PS(n)=0 if transmission n failed and PS(n)=1 if transmission n succeeded.

* * * * *

UNITED STATES PATENT AND TRADEMARK OFFICE
CERTIFICATE OF CORRECTION

| | | |
|---|---|---|
| PATENT NO. | : 8,848,571 B2 | Page 1 of 1 |
| APPLICATION NO. | : 13/780001 | |
| DATED | : September 30, 2014 | |
| INVENTOR(S) | : Gilles Picard | |

It is certified that error appears in the above-identified patent and that said Letters Patent is hereby corrected as shown below:

In the Claims

Claim 1, in Column 126, line 38, please delete the word "valve" and replace with the word --value--.

Signed and Sealed this
Twenty-seventh Day of January, 2015

Michelle K. Lee
*Deputy Director of the United States Patent and Trademark Office*